US010062850B2

(12) United States Patent
Jung et al.

(10) Patent No.: US 10,062,850 B2
(45) Date of Patent: *Aug. 28, 2018

(54) AMINE-BASED COMPOUNDS AND ORGANIC LIGHT-EMITTING DEVICES COMPRISING THE SAME

(71) Applicant: Samsung Display Co., Ltd., Yongin, Gyeonggi-do (KR)

(72) Inventors: Hyejin Jung, Yongin (KR); Sanghyun Han, Yongin (KR); Jino Lim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

This patent is subject to a terminal disclaimer.

(21) Appl. No.: 14/550,801

(22) Filed: Nov. 21, 2014

(65) Prior Publication Data

US 2015/0171337 A1 Jun. 18, 2015

(30) Foreign Application Priority Data

Dec. 12, 2013 (KR) ........................ 10-2013-0154837
Oct. 23, 2014 (KR) ........................ 10-2014-0144285

(51) Int. Cl.
*H01L 51/00* (2006.01)
*H01L 51/50* (2006.01)
*C09K 11/06* (2006.01)

(52) U.S. Cl.
CPC .......... *H01L 51/0058* (2013.01); *C09K 11/06* (2013.01); *H01L 51/0056* (2013.01); *H01L 51/0072* (2013.01); *H01L 51/0073* (2013.01); *H01L 51/006* (2013.01); *H01L 51/0061* (2013.01); *H01L 51/0081* (2013.01); *H01L 51/5016* (2013.01)

(58) Field of Classification Search
None
See application file for complete search history.

(56) References Cited

U.S. PATENT DOCUMENTS 3,968,051 A 7/1976 Stamm et al.
5,635,308 A 6/1997 Inoue et al.
5,972,247 A 10/1999 Shi et al.
6,465,115 B2 10/2002 Shi et al.
6,582,837 B1 6/2003 Toguchi et al.
6,596,415 B2 7/2003 Shi et al.
7,053,255 B2 5/2006 Ikeda et al.
7,233,019 B2 6/2007 Ionkin et al.
7,732,063 B2 6/2010 Matsuura et al.
7,839,074 B2 11/2010 Ikeda et al.
8,221,905 B2 7/2012 Lin et al.
8,324,802 B2 12/2012 Matsuura et al.
8,334,648 B2 12/2012 Matsuura et al.
9,711,736 B2 * 7/2017 Han .................... H01L 51/0073
(Continued)

FOREIGN PATENT DOCUMENTS

CN 102925139 A 2/2013
JP 8-12600 A 1/1996
(Continued)

OTHER PUBLICATIONS

Machine English tranlsation of Yumiko et al. (KR 10-2010-0097182). Mar. 10, 2017.*
(Continued)

*Primary Examiner* — J. L. Yang
(74) *Attorney, Agent, or Firm* — Lewis Roca Rothgerber Christie LLP

(57) ABSTRACT

An organic light-emitting device includes an amine-based compound represented by Formula 1 as a dopant, and an anthracene-based compound represented by Formula 2 as a host:

Formula 1

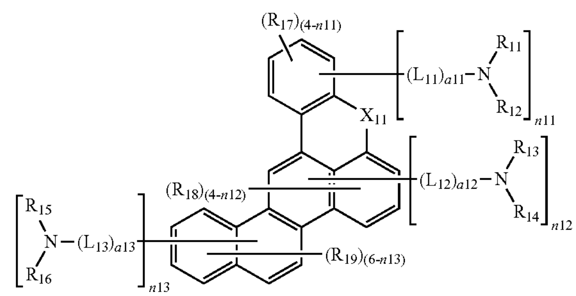

Formula 2

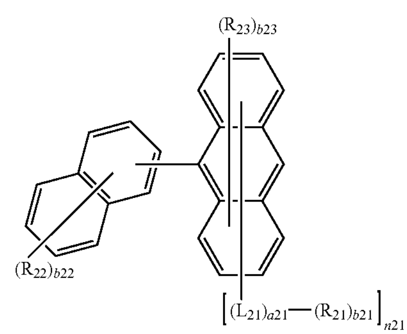

Organic light-emitting devices including the amine-based compound of Formula 1 and the anthracene-based compound of Formula 2 may have an improved efficiency, a low driving voltage, and improved lifetime characteristics.

20 Claims, 1 Drawing Sheet

(56) References Cited

U.S. PATENT DOCUMENTS

| | | | |
|---|---|---|---|
| 2004/0076853 | A1 | 4/2004 | Jarikov |
| 2004/0137270 | A1 | 7/2004 | Seo et al. |
| 2004/0214036 | A1 | 10/2004 | Bentsen et al. |
| 2005/0064233 | A1 | 3/2005 | Matsuura et al. |
| 2005/0089717 | A1 | 4/2005 | Cosimbescu et al. |
| 2005/0156164 | A1 | 7/2005 | Sotoyama |
| 2005/0214565 | A1 | 9/2005 | Ikeda et al. |
| 2005/0245752 | A1 | 11/2005 | Conley et al. |
| 2005/0249972 | A1 | 11/2005 | Hatwar et al. |
| 2006/0052641 | A1 | 3/2006 | Funahashi |
| 2006/0083945 | A1 | 4/2006 | Morishita et al. |
| 2006/0113905 | A1 | 6/2006 | Nakamura |
| 2006/0152146 | A1 | 7/2006 | Funahashi |
| 2006/0159952 | A1 | 7/2006 | Ricks et al. |
| 2007/0114917 | A1 | 5/2007 | Funahashi et al. |
| 2007/0152565 | A1 | 7/2007 | Kubota et al. |
| 2007/0155991 | A1 | 7/2007 | Funahashi |
| 2007/0170419 | A1 | 7/2007 | Gerhard et al. |
| 2007/0237984 | A1 | 10/2007 | Matsuura et al. |
| 2008/0160342 | A1 | 7/2008 | Meng et al. |
| 2008/0193796 | A1 | 8/2008 | Arakane et al. |
| 2009/0004458 | A1 | 1/2009 | Falster et al. |
| 2009/0004485 | A1 | 1/2009 | Zheng et al. |
| 2009/0026930 | A1 | 1/2009 | Shin et al. |
| 2010/0013381 | A1 | 1/2010 | Stoessel et al. |
| 2010/0032658 | A1 | 2/2010 | Lee et al. |
| 2010/0052526 | A1 | 3/2010 | Je et al. |
| 2010/0127618 | A1 | 5/2010 | Ohrui et al. |
| 2010/0187521 | A1 | 7/2010 | Park et al. |
| 2010/0244012 | A1 | 9/2010 | Mazur et al. |
| 2010/0270913 | A1 | 10/2010 | Matsuura et al. |
| 2010/0277061 | A1 | 11/2010 | Matsuura et al. |
| 2010/0279156 | A1 | 11/2010 | Kim et al. |
| 2010/0295445 | A1 | 11/2010 | Kuma et al. |
| 2010/0314615 | A1 | 12/2010 | Mizuki et al. |
| 2011/0001130 | A1 | 1/2011 | Nishimura et al. |
| 2011/0006289 | A1 | 1/2011 | Mizuki et al. |
| 2011/0057116 | A1 | 3/2011 | Trogler et al. |
| 2011/0156016 | A1 | 6/2011 | Kawamura et al. |
| 2011/0210320 | A1 | 9/2011 | Shin et al. |
| 2011/0284832 | A1 | 11/2011 | In et al. |
| 2012/0001158 | A1 | 1/2012 | Asari et al. |
| 2012/0032152 | A1 | 2/2012 | Kim et al. |
| 2012/0056165 | A1 | 3/2012 | Kawamura et al. |
| 2012/0091885 | A1 | 4/2012 | Kim et al. |
| 2012/0138915 | A1 | 6/2012 | Nishimura et al. |
| 2012/0181518 | A1 | 7/2012 | Ogiwara et al. |
| 2012/0181922 | A1 | 7/2012 | Kawamura et al. |
| 2012/0235561 | A1 | 9/2012 | Ikeda et al. |
| 2012/0305904 | A1 | 12/2012 | Kai et al. |
| 2012/0313511 | A1 | 12/2012 | Tsurutani et al. |
| 2013/0001526 | A1 | 1/2013 | Kwak et al. |
| 2013/0049581 | A1 | 2/2013 | Nishide et al. |
| 2013/0090446 | A1 | 4/2013 | Zhou et al. |
| 2013/0105786 | A1 | 5/2013 | Watanabe et al. |
| 2013/0112949 | A1 | 5/2013 | Sim et al. |
| 2013/0119355 | A1 | 5/2013 | Han et al. |
| 2013/0221332 | A1 | 8/2013 | Xia et al. |
| 2013/0228752 | A1 | 9/2013 | Shin et al. |
| 2013/0295706 | A1 | 11/2013 | Goto et al. |
| 2013/0306958 | A1 | 11/2013 | Ito et al. |
| 2014/0008641 | A1 | 1/2014 | Kubota et al. |
| 2014/0048792 | A1 | 2/2014 | Chun et al. |
| 2014/0124763 | A1 | 5/2014 | Funahashi |
| 2014/0175395 | A1 | 6/2014 | Kim et al. |
| 2014/0264301 | A1 | 9/2014 | Takaku et al. |
| 2014/0332772 | A1 | 11/2014 | Han et al. |
| 2014/0346406 | A1 | 11/2014 | Lee et al. |
| 2014/0346464 | A1 | 11/2014 | Kim et al. |
| 2014/0346482 | A1 | 11/2014 | Mizuki et al. |
| 2015/0001479 | A1 | 1/2015 | Lee et al. |
| 2015/0053946 | A1 | 2/2015 | Kim et al. |
| 2015/0069344 | A1 | 3/2015 | Kim et al. |
| 2015/0090964 | A1 | 4/2015 | Hwang et al. |
| 2015/0090965 | A1 | 4/2015 | Park et al. |
| 2015/0108448 | A1 | 4/2015 | Dai et al. |
| 2015/0171337 | A1 | 6/2015 | Jung et al. |
| 2015/0236273 | A1 | 8/2015 | Jang et al. |
| 2015/0255736 | A1 | 9/2015 | Kim et al. |
| 2015/0318508 | A1 | 11/2015 | Kim et al. |
| 2015/0333266 | A1 | 11/2015 | Ito et al. |
| 2015/0333268 | A1 | 11/2015 | Han et al. |
| 2015/0349265 | A1 | 12/2015 | Hwang et al. |
| 2015/0357574 | A1 | 12/2015 | Ito et al. |
| 2015/0364693 | A1 | 12/2015 | Ito et al. |
| 2016/0005980 | A1 | 1/2016 | Ito et al. |
| 2016/0020404 | A1 | 1/2016 | Ito et al. |
| 2016/0133845 | A1* | 5/2016 | Jung .................. H01L 51/0058 257/40 |

FOREIGN PATENT DOCUMENTS

| | | | |
|---|---|---|---|
| JP | 11-003782 | A | 1/1999 |
| JP | 2002-63989 | | 2/2002 |
| JP | 2003-306454 | | 10/2003 |
| JP | 2005-041843 | A | 2/2005 |
| JP | 2006-273737 | A | 10/2006 |
| JP | 2008-291263 | | 12/2008 |
| JP | 2009-212238 | | 9/2009 |
| JP | 2011-176267 | A | 9/2011 |
| JP | 2012-82209 | | 4/2012 |
| JP | 2012-119592 | A | 6/2012 |
| JP | 2012-156499 | A | 8/2012 |
| JP | 2013-063930 | | 4/2013 |
| JP | 2013-063931 | | 4/2013 |
| JP | 52-08271 | B2 | 6/2013 |
| JP | 5281304 | | 9/2013 |
| KR | 10-2005-0058465 | | 6/2005 |
| KR | 10-2005-0086518 | A | 8/2005 |
| KR | 10-2005-0107809 | | 11/2005 |
| KR | 10-2006-0006760 | A | 1/2006 |
| KR | 10-2006-0109524 | | 10/2006 |
| KR | 10-2006-0113954 | | 11/2006 |
| KR | 10-2006-0127138 | | 12/2006 |
| KR | 10-2007-0009074 | | 1/2007 |
| KR | 10-2007-0015195 | | 2/2007 |
| KR | 10-2007-0050393 | A | 5/2007 |
| KR | 10-2008-0068720 | A | 7/2008 |
| KR | 10-2009-0010763 | * | 1/2009 |
| KR | 10-2009-0010763 | A | 1/2009 |
| KR | 10-2009-0033493 | A | 4/2009 |
| KR | 10-2009-0122922 | A | 12/2009 |
| KR | 10-2010-0007552 | | 1/2010 |
| KR | 10-2010-0007780 | A | 1/2010 |
| KR | 10-2010-0024894 | | 3/2010 |
| KR | 10-2010-0048203 | | 5/2010 |
| KR | 10-2010-0057465 | | 5/2010 |
| KR | 10-2010-0070979 | | 6/2010 |
| KR | 10-2010-0070992 | | 6/2010 |
| KR | 10-2010-0093085 | | 8/2010 |
| KR | 10-2010-0097182 | A | 9/2010 |
| KR | 10-2010-0099327 | | 9/2010 |
| KR | 10-2010-0105099 | | 9/2010 |
| KR | 10-2011-0015213 | | 2/2011 |
| KR | 10-2011-0041728 | | 4/2011 |
| KR | 10-2011-0043625 | A | 4/2011 |
| KR | 10-2011-0047278 | A | 5/2011 |
| KR | 10-2011-0094271 | | 8/2011 |
| KR | 10-2011-0107679 | | 10/2011 |
| KR | 10-2011-0134885 | | 12/2011 |
| KR | 10-2012-0002865 | | 1/2012 |
| KR | 10-2010-0026513 | | 3/2012 |
| KR | 10-2012-0039470 | | 4/2012 |
| KR | 10-2012-0041110 | | 4/2012 |
| KR | 10-1132635 | B1 | 4/2012 |
| KR | 10-2012-0057611 | | 6/2012 |
| KR | 10-2012-0066390 | | 6/2012 |
| KR | 10-2012-0093354 | | 8/2012 |
| KR | 10-2012-0117622 | | 10/2012 |
| KR | 10-2012-0117675 | | 10/2012 |
| KR | 10-2013-0007495 | | 1/2013 |
| KR | 10-2013-0009765 | | 1/2013 |
| KR | 10-1233377 | | 2/2013 |
| KR | 10-1262420 | | 5/2013 |

(56) References Cited

FOREIGN PATENT DOCUMENTS

| | | | |
|---|---|---|---|
| KR | 10-2013-0100948 | | 9/2013 |
| WO | WO 2010/050781 | A1 | 5/2010 |
| WO | WO 2010/058995 | A1 | 5/2010 |
| WO | WO 2010/107244 | A2 | 9/2010 |
| WO | WO 2010/137678 | A1 | 12/2010 |
| WO | WO 2012/070226 | A1 | 5/2012 |
| WO | WO 2012/070234 | A1 | 5/2012 |
| WO | WO 2013/051875 | A2 | 4/2013 |

OTHER PUBLICATIONS

A. Katritzky et al., Polycyclic Fused Phenanthridines: An Alternative Approach from Benzotriazoles, pp. 1-27, Center for Heterocyclic Compounds, Department of Chemistry, University of Florida, Gainesville.
U.S. Office Action dated Apr. 20, 2016, issued in cross-reference U.S. Appl. No. 14/075,573 (10 pages).
Ding et al., "A Succinct Synthesis of the Vaulted Biaryl Ligand Vanol via a Dienone-Phenol Rearrangement", Full Papers, 2011 Wiley-VCH Verlag GmbH & Co., KGaA, Weinheim, Chem. Asian J. 2011, 6, 2130-2146, 17 pages.
Notice of Allowance dated Jul. 15, 2016, for cross reference U.S. Appl. No. 14/533,004.
STIC Search Report for cross reference U.S. Appl. No. 14/533,004, dated Dec. 1, 2015 (15 pages).
U.S. Office action dated Dec. 8, 2015, for cross referenced U.S. Appl. No. 14/533,004, (12 pages).
U.S. Office action dated Feb. 19, 2016, for cross referenced U.S. Appl. No. 14/072,478, (12 pages).
U.S. Office action dated May 5, 2016, for cross referenced U.S. Appl. No. 14/195,836, (18 pages).
Leem et al., "Highly efficient tandem p-i-n organic light-emitting diodes adopting a low temperature evaporated rhenium oxide interconnecting later," Applied Physics Letters, 93, 103304-1-3, 2008.
Kaminaga, et al., Machine Translation of JP 2011-176267A, Published Sep. 2011, Retrieved from Google Patents on Feb. 3, 2017, pp. 1-44.
U.S. Notice of Allowance dated Feb. 10, 2017, issued in cross-reference U.S. Appl. No. 14/533,004 (12 pages).
U.S. Office Action dated Feb. 16, 2017, issued in cross-reference U.S. Appl. No. 14/075,573 (14 pages).
U.S. Office Action dated May 18, 2017, issued in cross-reference U.S. Appl. No. 14/789,672 (18 pages).
Machine translation for JP 2012-119592 A, publication date Jun. 21, 2012, 27 pages.
Machine Translation for KR 10-2011-0041728, publication date Apr. 22, 2011, 19 pages.
U.S. Office Action dated Jul. 13, 2017, issued in cross-reference U.S. Appl. No. 14/508,677 (10 pages).
Machine English translation of Shin et al. (KR 10-2009-0010763), 27 pages.
U.S. Notice of Allowance dated Mar. 15, 2017, issued in U.S. Appl. No. 14/513,144 (9 pages).
U.S. Office Action dated Aug. 23, 2017, issued in U.S. Appl. No. 14/702,970 (9 pages).
U.S. Office Action dated Sep. 7, 2017, issued in U.S. Appl. No. 14/789,672 (16 pages).
U.S. Notice of Allowance dated Mar. 13, 2018, issued in U.S. Appl. No. 14/789,672 (10 pages).
Machine translation for JP 2012-119592 A (publication date: Jun. 2012), 52 pages.
U.S. Office Action dated Dec. 20, 2017, issued in U.S. Appl. No. 14/195,836 (9 pages).
U.S. Notice of Allowance dated Jan. 25, 2018, issued in U.S. Appl. No. 14/075,573 (8 pages).

* cited by examiner

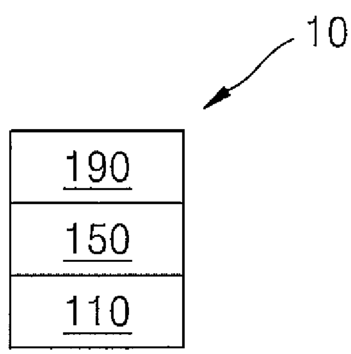
10
190
150
110

AMINE-BASED COMPOUNDS AND ORGANIC LIGHT-EMITTING DEVICES COMPRISING THE SAME

CROSS-REFERENCE TO RELATED APPLICATION

This application claims priority to and the benefit of Korean Patent Application No. 10-2013-0154837, filed on Dec. 12, 2013, and Korean Patent Application No. 10-2014-0144285, filed on Oct. 23, 2014, in the Korean Intellectual Property Office, the entire content of each of which is incorporated herein by reference.

BACKGROUND

1. Field

One or more aspects of embodiments of the present disclosure relate to an amine-based compound, and an organic light-emitting device including the same.

2. Description of the Related Art

Organic light-emitting devices (OLEDs) are self-emitting devices that have wide viewing angles, high contrast, quick response time, high brightness, low driving voltage characteristics, and can provide multicolored images.

A typical organic light-emitting device may have a structure in which a first electrode, a hole transport region, an emission layer, an electron transport region, and a second electrode are sequentially positioned (in the stated order) on a substrate. Holes injected from the first electrode move to the emission layer via the hole transport region, while electrons injected from the second electrode move to the emission layer via the electron transport region. Carriers (e.g. the holes and the electrons) recombine in the emission layer to generate excitons. When the excitons drop from an excited state to a ground state, light is emitted.

SUMMARY

One or more aspects of embodiments of the present disclosure are directed to an amine-based compound, and an organic light-emitting device including the same.

Additional aspects will be set forth in part in the description which follows and, in part, will be apparent from the description.

According to one or more embodiments of the present disclosure, there is provided an amine-based compound represented by Formula 1:

Formula 1

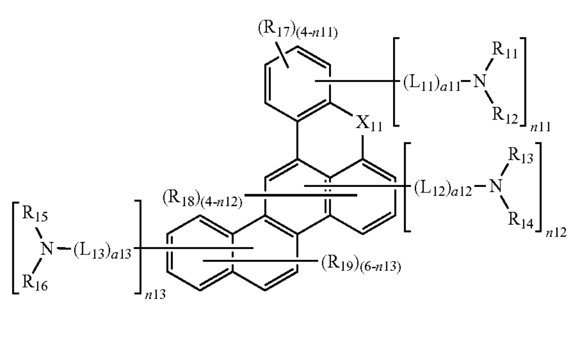

In Formula 1, $X_{11}$ is an oxygen atom (—O—) or a sulfur atom (—S—);

$L_{11}$ to $L_{13}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 are each independently selected from 0, 1, 2, and 3;

$R_{11}$ to $R_{16}$ are each independently selected from a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

n11 to n13 are each independently selected from 0, 1, and 2, and a sum of n11, n12, and n13 is selected from 2, 3, 4, 5, and 6;

$R_{17}$ to $R_{19}$ are each independently selected from a hydrogen, a deuterium, F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$, and —$N(Q_{31})(Q_{32})$, —$Si(Q_{33})(Q_{34})(Q_{35})$, and —$B(Q_{36})(Q_{37})$;

$Q_1$ to $Q_3$) $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to one or more embodiments of the present disclosure, an organic light-emitting device includes: a first electrode; a second electrode; and an organic layer between the first electrode and the second electrode, the organic layer including an emission layer and at least one of the amine-based compounds represented by Formula 1.

The organic light-emitting device may further include an anthracene-based compound represented by Formula 2 as a host:

Formula 2

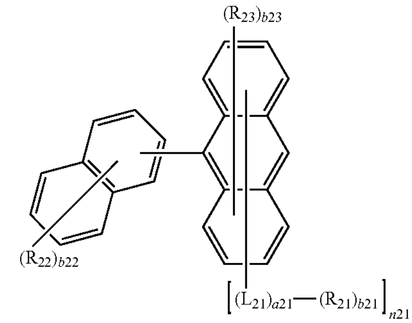

In Formula 2, $L_{21}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 may be selected from 0, 1, 2, and 3;

$R_{21}$ to $R_{23}$ may be each independently selected from a hydrogen, a deuterium, F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

b21 to b23 may be each independently selected from 1, 2, 3, 4, 5, and 6;

n21 may be selected from 1, 2, and 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_1$-$C_{60}$ alkoxy group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), where $Q_1$ to $Q_7$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

The accompanying drawing, together with the specification, illustrate embodiments of the present disclosure, and, together with the description, serve to explain the principles of the present disclosure.

The drawing is a schematic cross-sectional view of a structure of an organic light-emitting device according to an embodiment of the present disclosure.

DETAILED DESCRIPTION

Reference will now be made to embodiments, examples of which are illustrated in the accompanying drawing, wherein like reference numerals refer to like elements throughout. However, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

According to an embodiment of the present disclosure, there is provided an amine-based compound represented by Formula 1:

Formula 1

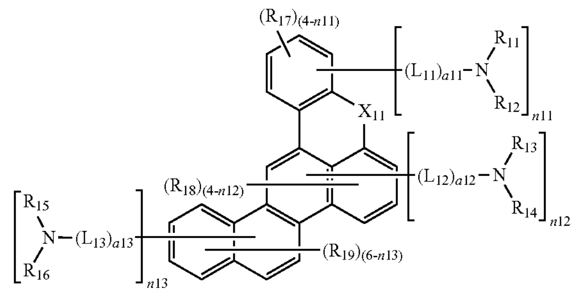

In Formula 1, $X_{11}$ may be an oxygen atom (—O—) or a sulfur atom (—S—).

For example, $X_{11}$ in Formula 1 may be an oxygen atom, but $X_{11}$ is not limited thereto.

In Formula 1, $L_{11}$ to $L_{13}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$, and —$N(Q_{31})(Q_{32})$, —$Si(Q_{33})(Q_{34})(Q_{35})$, and —$B(Q_{36})(Q_{37})$, where $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{11}$ to $L_{13}$ in Formula 1 may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group. However, embodiments of the present disclosure are not limited thereto.

In some embodiments, $L_{11}$ to $L_{13}$ in Formula 1 may be each independently selected from a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group, and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In some embodiments, $L_{11}$ to $L_{13}$ in Formula 1 may be each independently a group represented by one of Formulae 3-1 to 3-31, but $L_{11}$ to $L_{13}$ are not limited thereto.

3-1

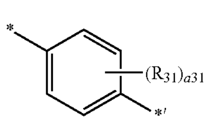

-continued 3-2

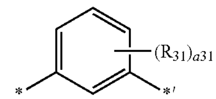

3-3

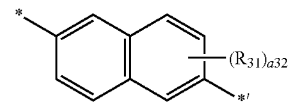

3-4

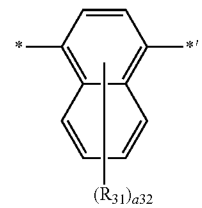

3-5

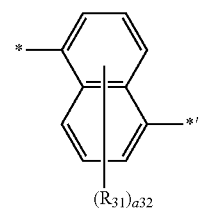

3-6

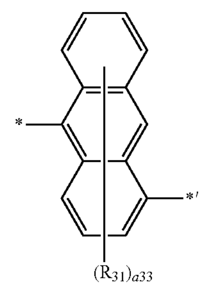

3-7

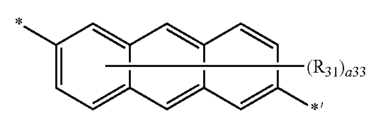

3-8

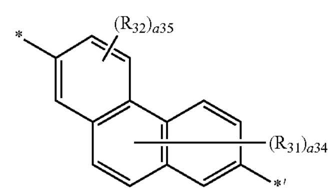

3-9

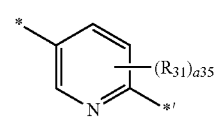

3-10

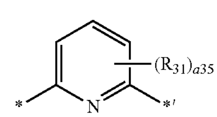

3-11

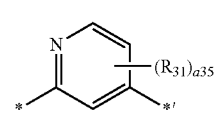

-continued
3-12
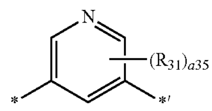
3-13
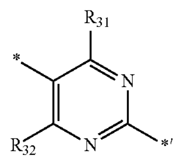
3-14
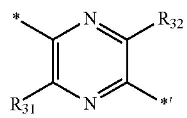
3-15
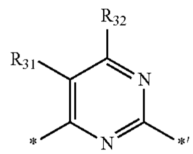
3-16
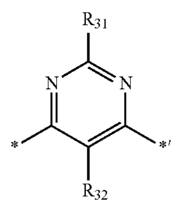
3-17
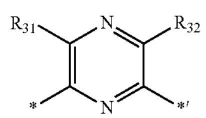
3-18
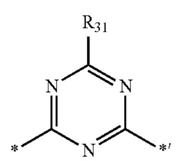
3-19
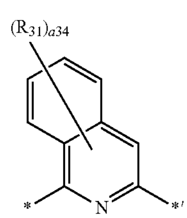
3-20
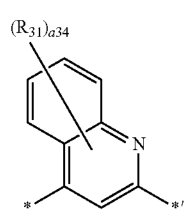
-continued
3-21
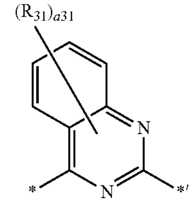
3-22
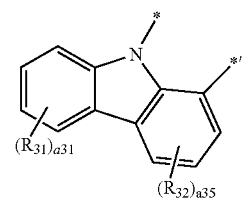
3-23
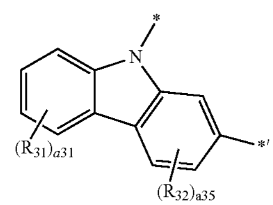
3-24
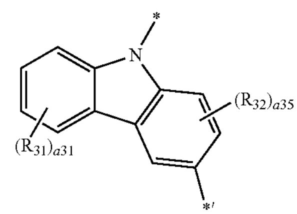
3-25
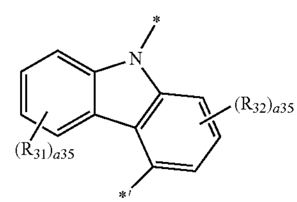
3-26
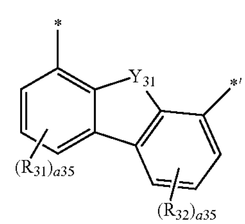
3-27
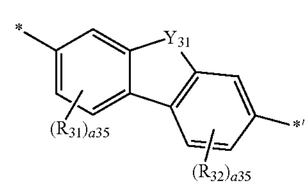
3-28
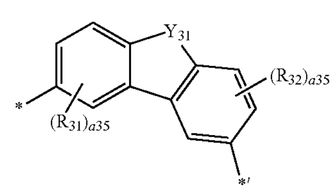

-continued 3-29

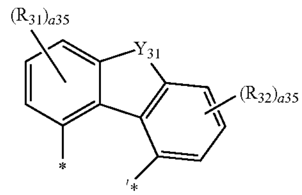

3-30

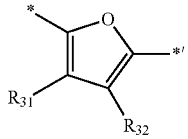

3-31

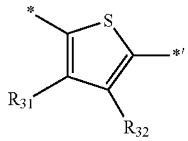

In Formulae 3-1 to 3-31, $Y_{31}$ may be selected from $C(R_{33})(R_{34})$, $N(R_{33})$, O, S, and $Si(R_{33})(R_{34})$;

$R_{31}$ to $R_{34}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' may each independently indicate a binding site with an adjacent atom.

In some embodiments, in Formula 1, $L_{11}$ to $L_{13}$ may be each independently a group represented by one of Formulae 3-1 to 3-31, in which:

$Y_{31}$ may be selected from $C(R_{33})(R_{34})$, $N(R_{33})$, O, and S;

$R_{31}$ to $R_{34}$ may be each independently selected from a hydrogen, a deuterium, —F, —Cl, —Br, —I, a methyl group, an ethyl group, a tert-butyl group, a methoxy group, an ethoxy group, a tert-butoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are embodiments of the present disclosure are not limited thereto.

In some embodiments, $L_{11}$ to $L_{13}$ in Formula 1 may be each independently a group represented by one of Formulae 4-1 to 4-56, but $L_{11}$ to $L_{13}$ are not limited thereto.

4-1

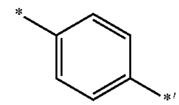

4-2

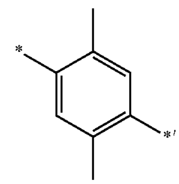

4-3

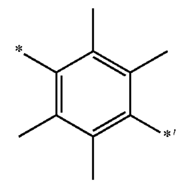

4-4

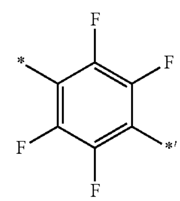

4-5

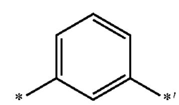

4-6

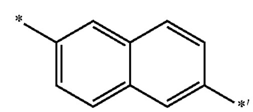

4-7

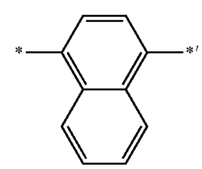

4-8

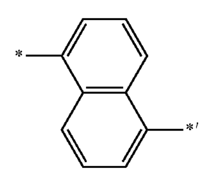

4-9

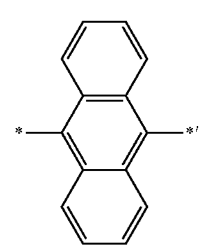

4-10

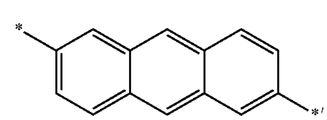

-continued
4-11
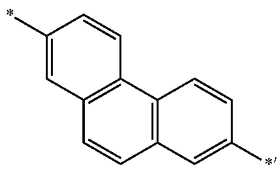
4-12
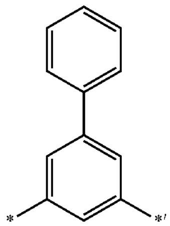
4-13
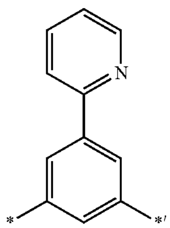
4-14
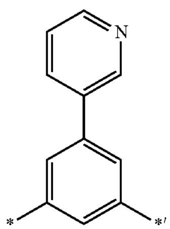
4-15
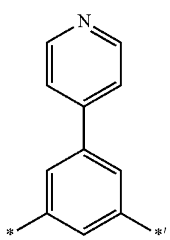
4-16
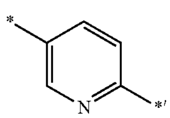
4-17
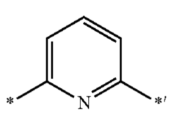
4-18
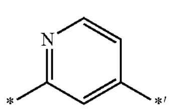
4-19
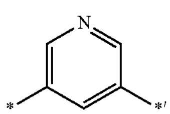
-continued
4-20
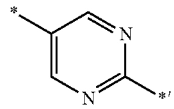
4-21
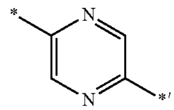
4-22
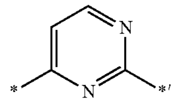
4-23
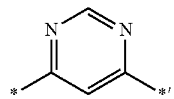
4-24
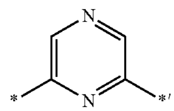
4-25
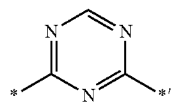
4-26
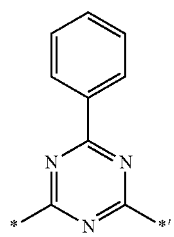
4-27
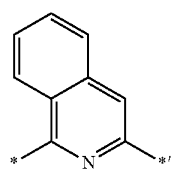
4-28
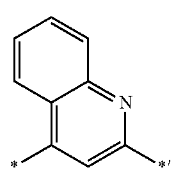
4-29
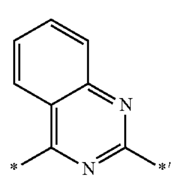

-continued
4-30
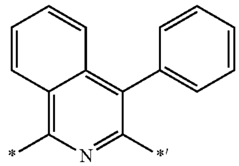
4-31
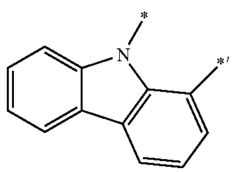
4-32
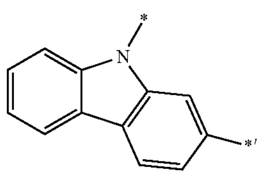
4-33
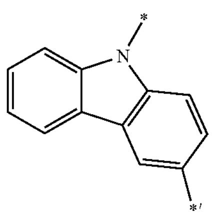
4-34
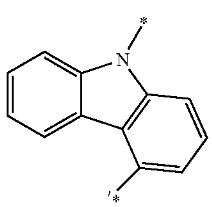
4-35
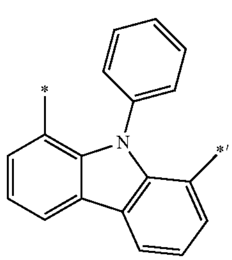
4-36
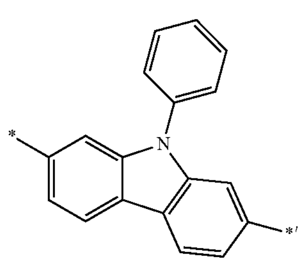
-continued
4-37
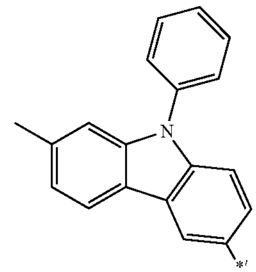
4-38
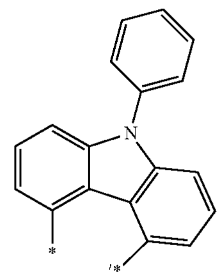
4-39
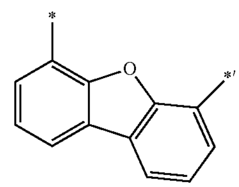
4-40
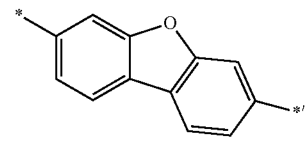
4-41
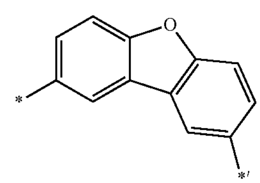
4-42
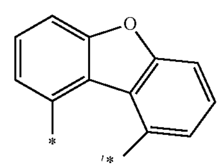
4-43
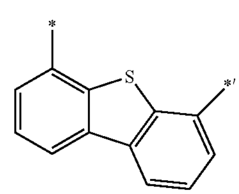
4-44
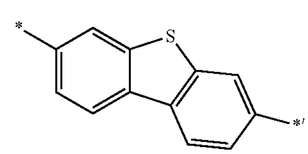

-continued 4-45

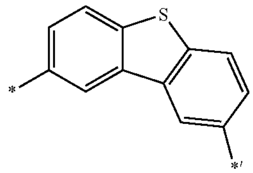

4-46

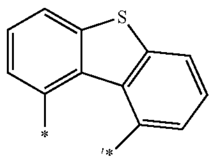

4-47

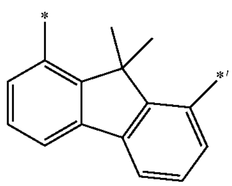

4-48

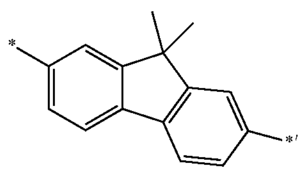

4-49

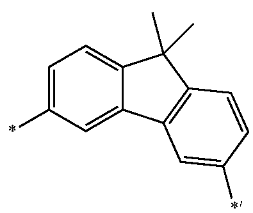

4-50

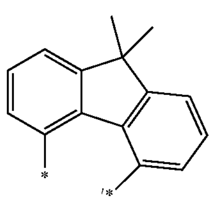

4-51

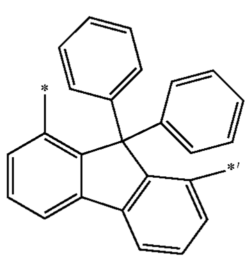

4-52

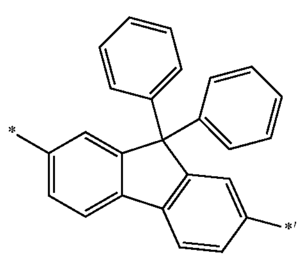

-continued 4-53

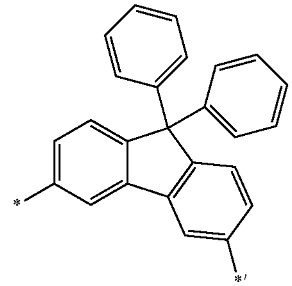

4-54

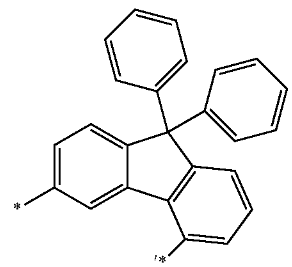

4-55

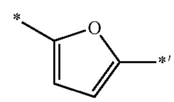

4-56

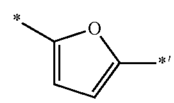

In Formulae 4-1 to 4-56,

* and *' may each independently indicate a binding site with an adjacent atom.

In some embodiments, $L_{11}$ to $L_{13}$ in Formula 1 may be each independently selected from groups represented by Formulae 4-1 to 4-8, Formulae 4-12 to 4-26, and Formulae 4-39 to 4-56, but $L_{11}$ to $L_{13}$ are not limited thereto.

In Formula 1, a11, which represents the number of $L_{11}$s, may be selected from 0, 1, 2, and 3. For example, a11 in Formula 1 may be selected from 0 and 1, but is not limited thereto. When a11 is 0, $L_{11}$ may be a single bond. When a11 is 2 or more, the 2 or more $L_{11}$s may be the same as or different from each other. The definitions for a12 and a13 may be each independently understood based on the above-described definition of a11 and the structure of Formula 1. For example, in Formula 1, a12 and a13 may be each independently selected from 0 and 1, but are not limited thereto. In some embodiments, in Formula 1, a sum of a11, a12, and a13 may be selected from 0, 1, and 2, but is not limited thereto.

In Formula 1, $R_{11}$ to $R_{16}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one substituent of the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_6$-$C_{60}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $R_{11}$ to $R_{16}$ in Formula 1 may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$), where $Q_{33}$ to $Q_{35}$ may be each independently selected from a $C_1$-$C_{60}$ alkyl group and a $C_6$-$C_{60}$ aryl group. However, embodiments of the present disclosure are not limited thereto.

In some embodiments, $R_{11}$ to $R_{16}$ in Formula 1 may be each independently selected from a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), and a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with a $C_1$-$C_{20}$ alkyl group that is substituted with at least one selected from a deuterium, —F, —Cl, —Br, —I, a cyano group, and a nitro group, where $Q_{33}$ to $Q_{35}$ may be each independently selected from a $C_1$-$C_{20}$ alkyl group and a $C_6$-$C_{60}$ aryl group. However, embodiments of the present disclosure are not limited thereto.

In some embodiments, $R_{11}$ to $R_{16}$ in Formula 1 may be each independently selected from a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, and a dibenzothiophenyl group, and a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), where $Q_{33}$ to $Q_{35}$ may be each independently selected from a methyl group, an ethyl group, a ter-butyl group, a phenyl group, and a naphthyl group. However, embodiments of the present disclosure are not limited thereto.

In some embodiments, $R_{11}$ to $R_{16}$ in Formula 1 may be each independently a group represented by one of Formulae 5-1 to 5-33, but $R_{11}$ to $R_{16}$ are not limited thereto.

5-1

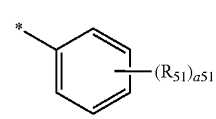

5-2

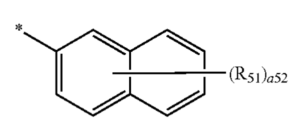

5-3
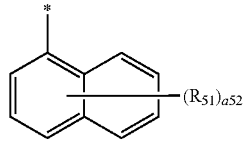
5-4
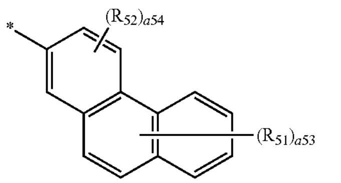
5-5
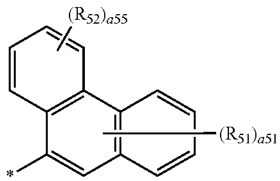
5-6
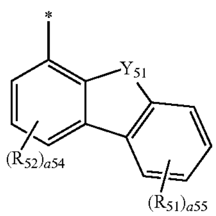
5-7
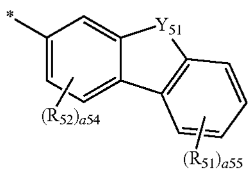
5-8
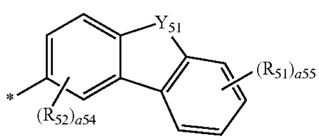
5-9
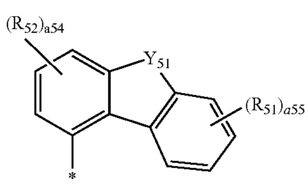
5-10
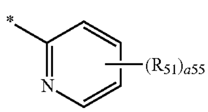
5-11
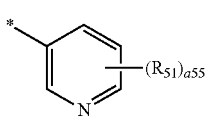
5-12
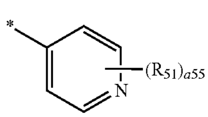
5-13
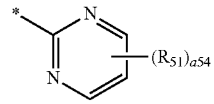
5-14
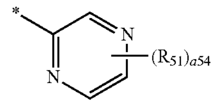
5-15
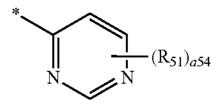
5-16
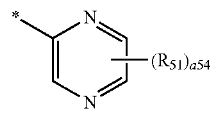
5-17
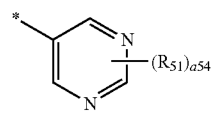
5-18
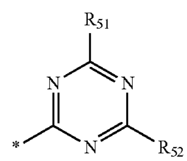
5-19
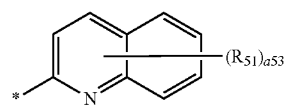
5-20
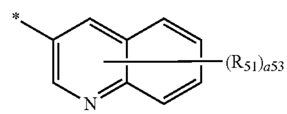
5-21
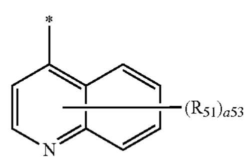
5-22
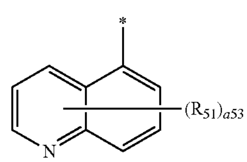
5-23
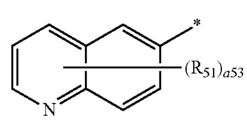
5-24
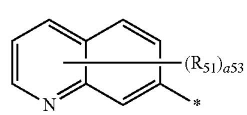

-continued 5-25

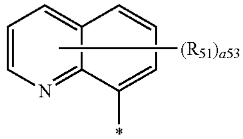

5-26

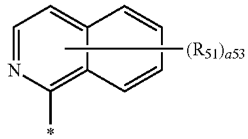

5-27

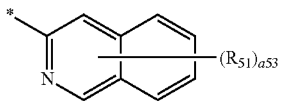

5-28

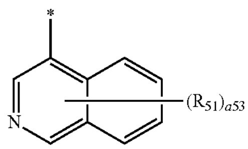

5-29

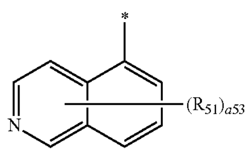

5-30

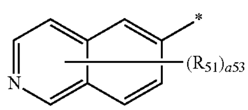

5-31

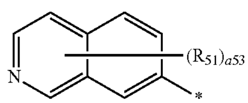

5-32

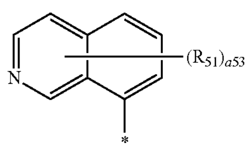

5-33

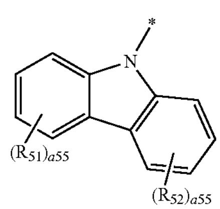

In Formulae 5-1 to 5-33, $Y_{51}$ may be selected from $C(R_{53})(R_{54})$, $N(R_{53})$, O, and S;

$R_{51}$ to $R_{54}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$;

$Q_{33}$ to $Q_{35}$ may be each independently selected from a methyl group, an ethyl group, a tert-butyl group, a phenyl group, and a naphthyl group;

a51 may be selected from 1, 2, 3, 4, and 5;

a52 may be selected from 1, 2, 3, 4, 5, 6, and 7;

a53 may be selected from 1, 2, 3, 4, 5, and 6;

a54 may be selected from 1, 2, and 3;

a55 may be selected from 1, 2, 3, and 4; and

* may indicate a binding site with an adjacent atom.

In some embodiments, $R_{11}$ to $R_{16}$ in Formula 1 may be each independently selected from groups represented by Formulae 6-1 to 6-155, but $R_{11}$ to $R_{16}$ are not limited thereto.

6-1

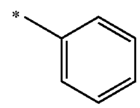

6-2

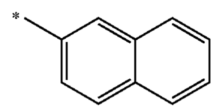

6-3

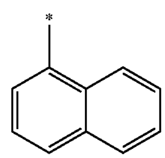

6-4

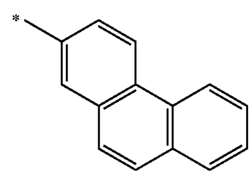

6-5

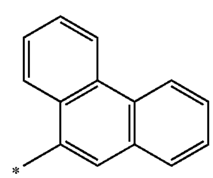

6-6

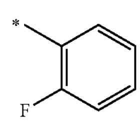

6-7

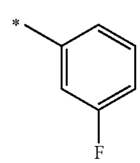

6-8

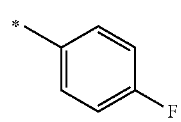

-continued
6-9
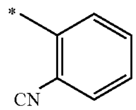
6-10
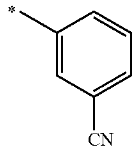
6-11
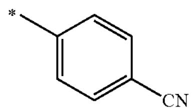
6-12
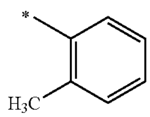
6-13
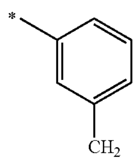
6-14
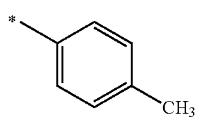
6-15
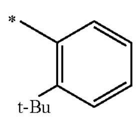
6-16
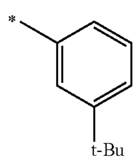
6-17
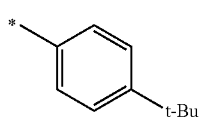
6-18
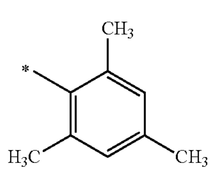
6-19
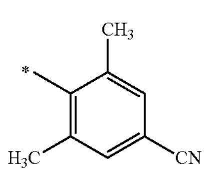
-continued
6-20
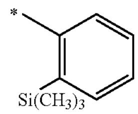
6-21
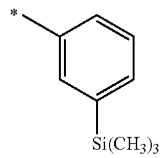
6-22
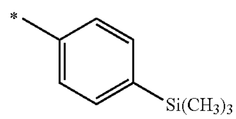
6-23
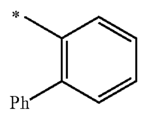
6-24
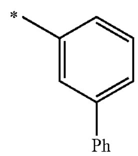
6-25
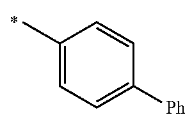
6-26
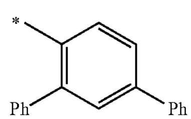
6-27
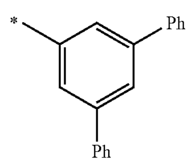
6-28
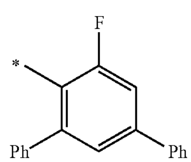
6-29
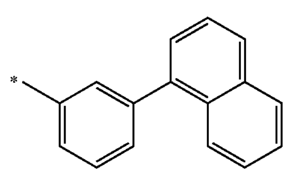
6-30
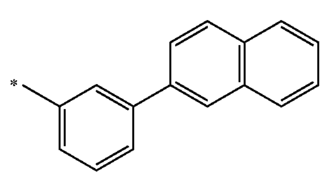

-continued
6-31
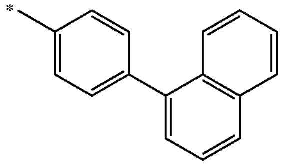
6-32
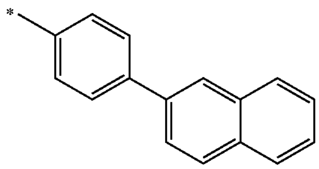
6-33
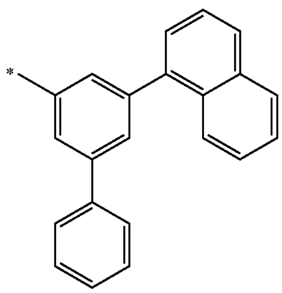
6-34
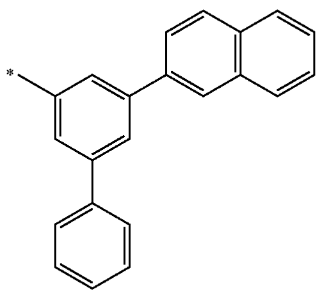
6-35
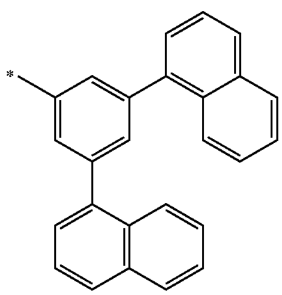
6-36
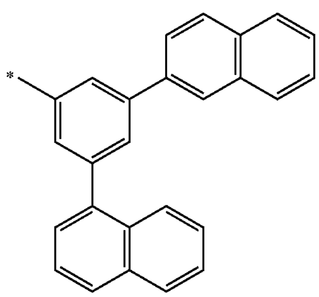
-continued
6-37
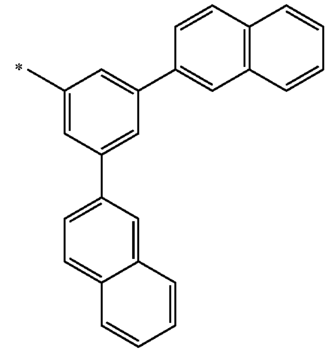
6-38
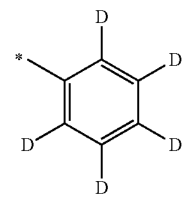
6-39
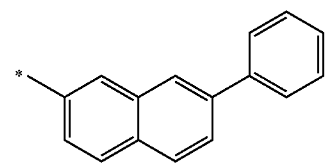
6-40
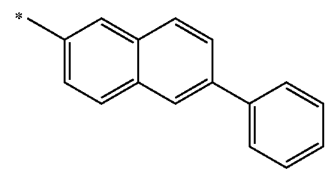
6-41
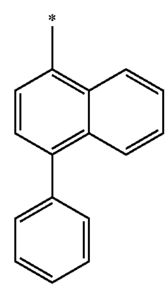
6-42
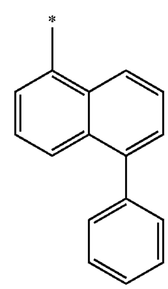
6-43
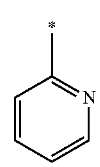

-continued
6-44
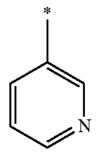
6-45
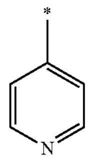
6-46
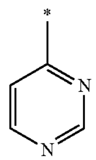
6-47
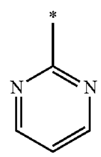
6-48
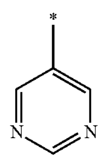
6-49
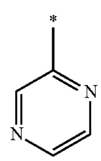
6-50
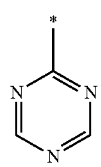
6-51
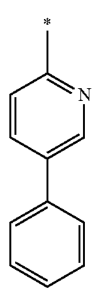
-continued
6-52
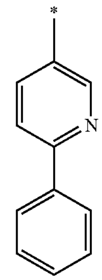
6-53
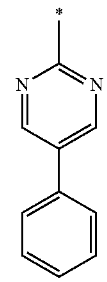
6-54
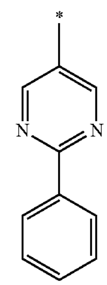
6-55
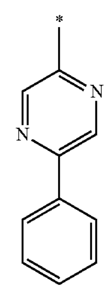
6-56
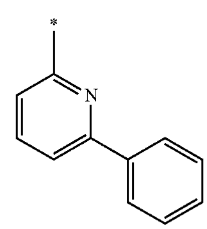
6-57
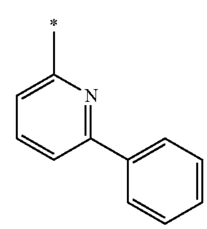

-continued
6-58
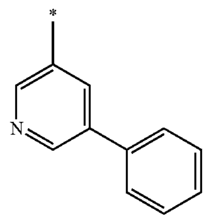
6-59
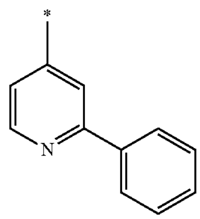
6-60
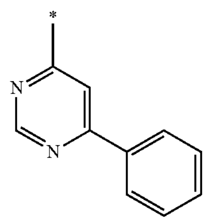
6-61
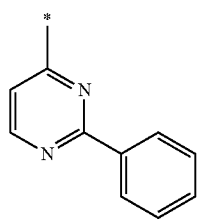
6-62
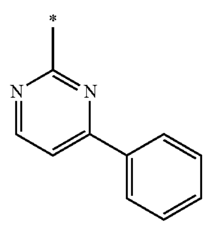
6-63
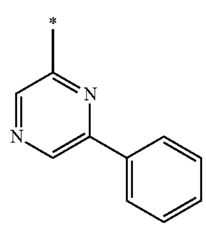
6-64
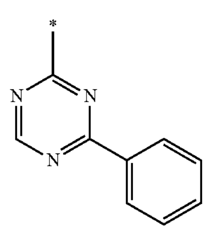
-continued
6-65
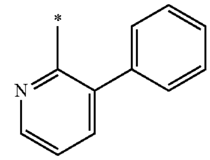
6-66
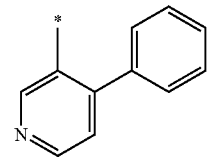
6-67
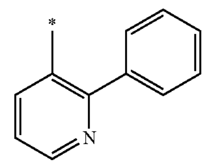
6-68
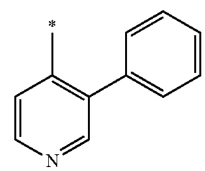
6-69
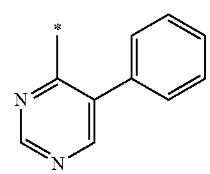
6-70
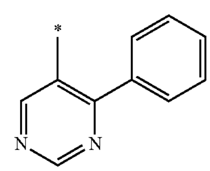
6-71
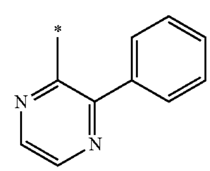
6-72
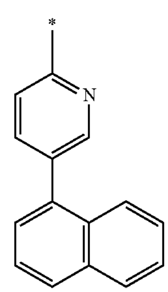

-continued
6-73
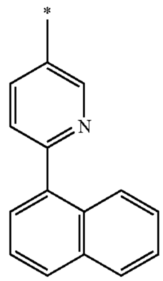
6-74
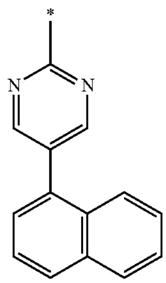
6-75
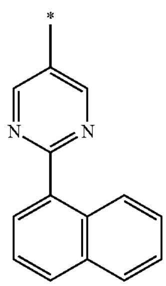
6-76
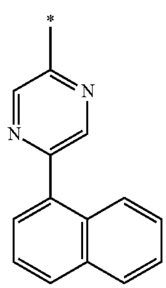
6-77
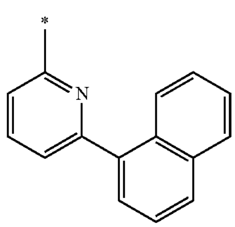
6-78
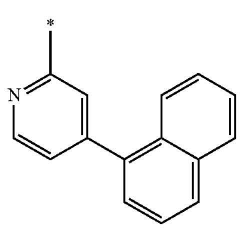
-continued
6-79
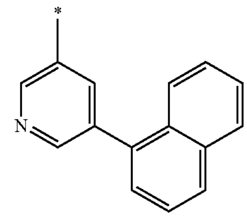
6-80
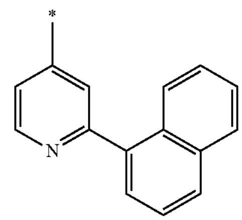
6-81
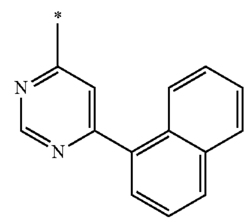
6-82
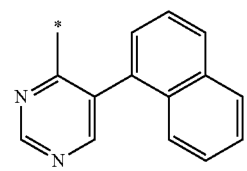
6-83
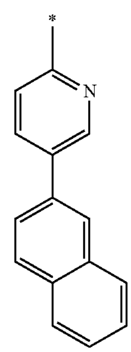
6-84
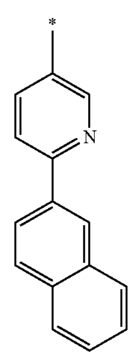

6-85
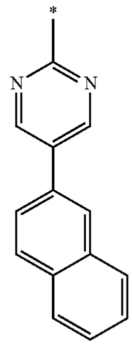
6-86
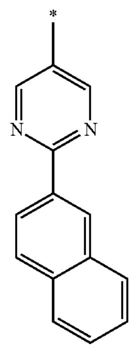
6-87
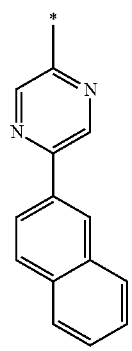
6-88
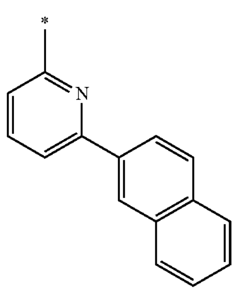
6-89
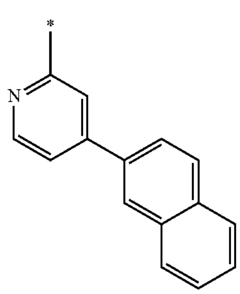
6-90
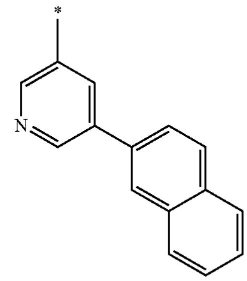
6-91
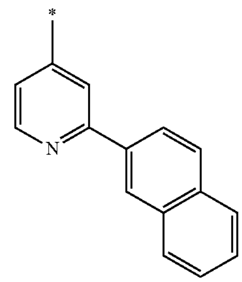
6-92
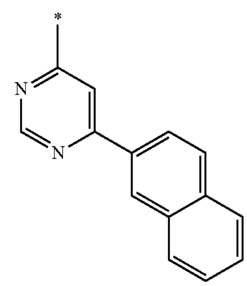
6-93
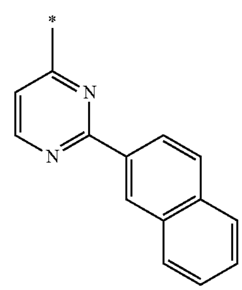
6-94
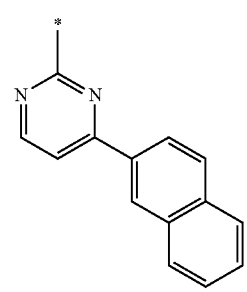

-continued
6-95
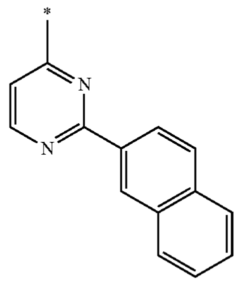
6-96
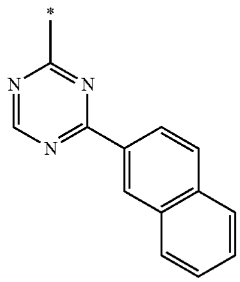
6-97
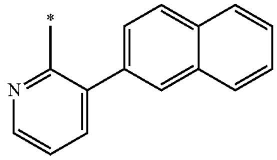
6-98
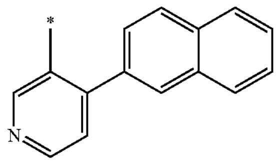
6-99
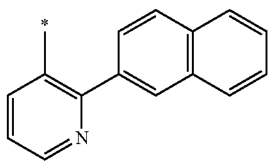
6-100
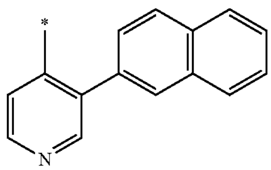
6-101
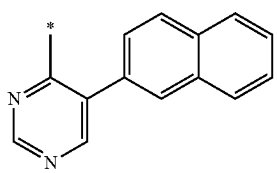
6-102
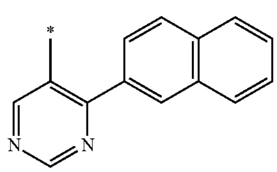
-continued
6-103
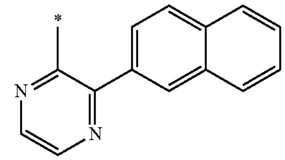
6-104
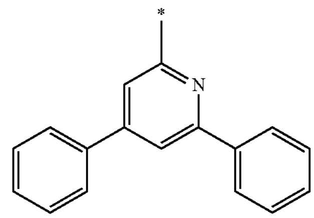
6-105
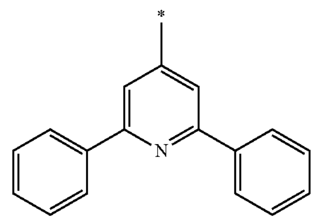
6-106
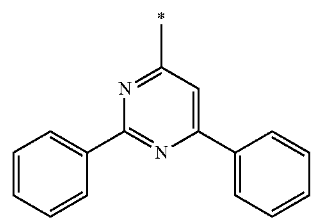
6-107
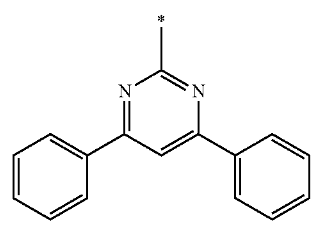
6-108
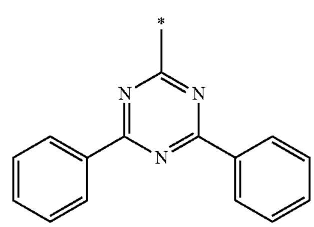
6-109
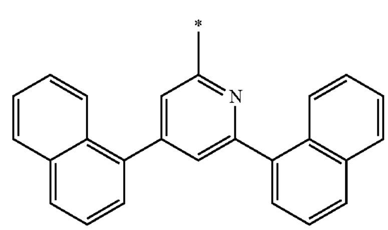

-continued
6-110
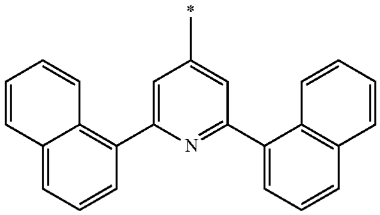
6-111
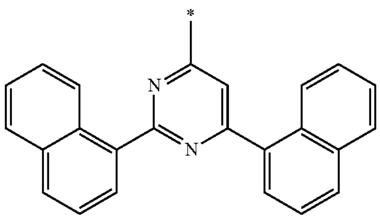
6-112
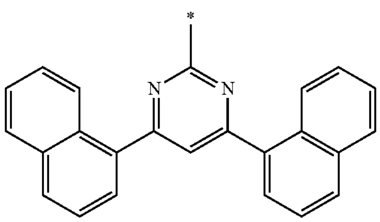
6-113
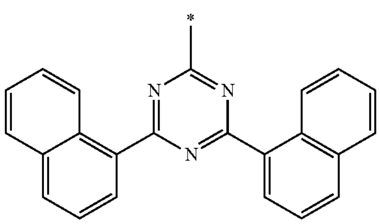
6-114
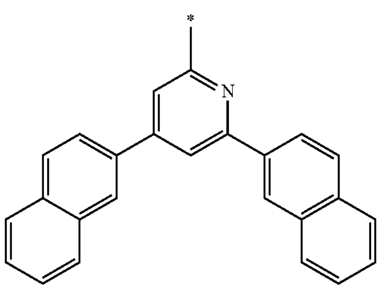
6-115
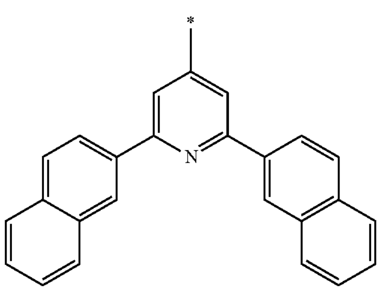
-continued
6-116
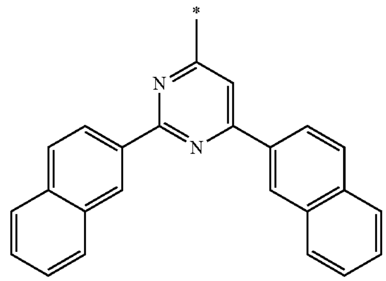
6-117
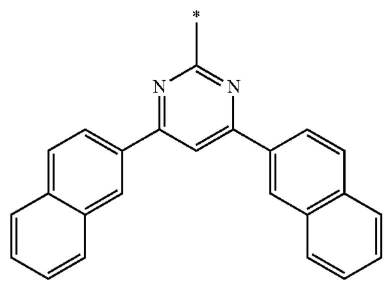
6-118
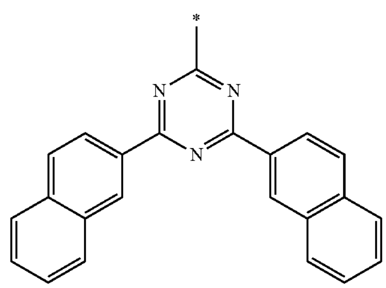
6-119
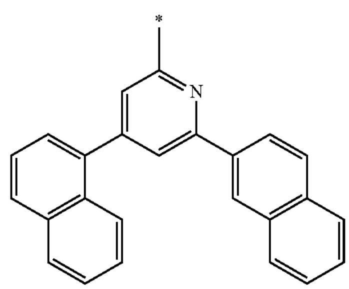
6-120
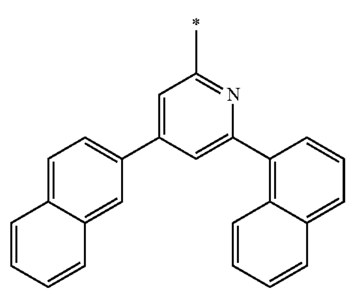

6-121
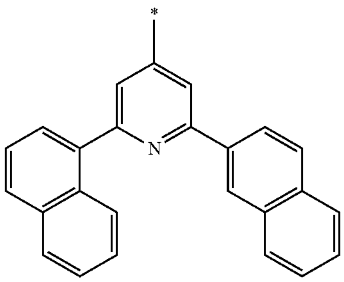
6-122
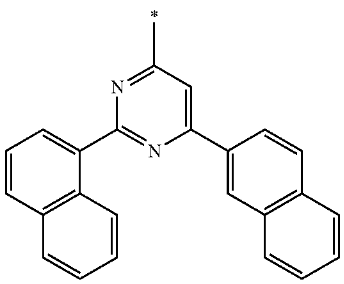
6-123
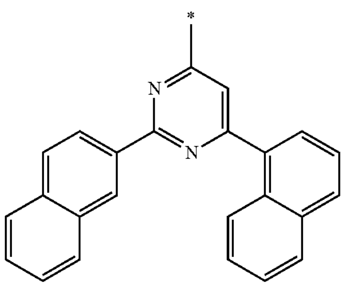
6-124
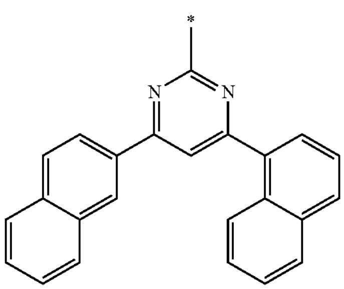
6-125
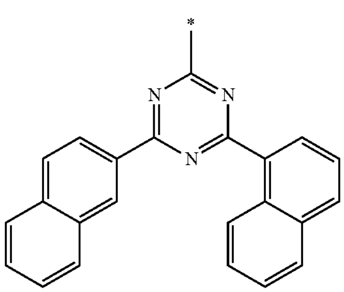
6-126
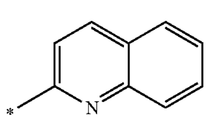
6-127
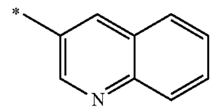
6-128
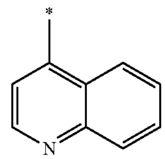
6-129
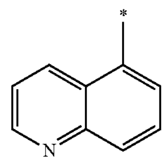
6-130
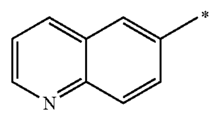
6-131
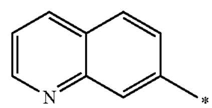
6-132
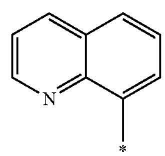
6-133
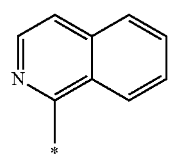
6-134
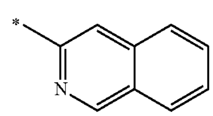
6-135
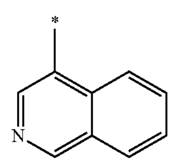
6-136
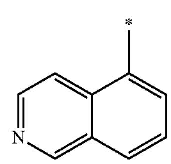
6-137
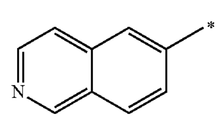

-continued
6-138
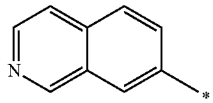
6-139
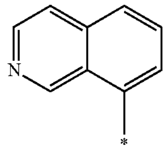
6-140
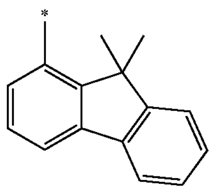
6-141
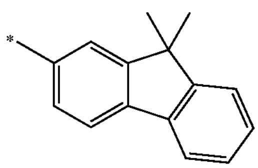
6-142
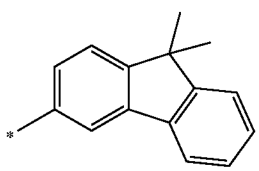
6-143
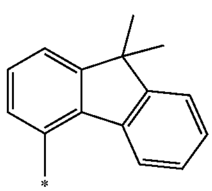
6-144
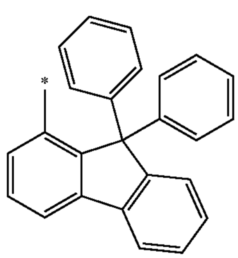
6-145
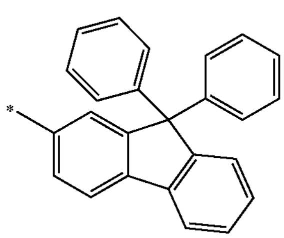
-continued
6-146
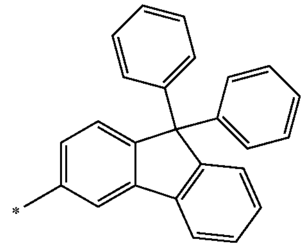
6-147
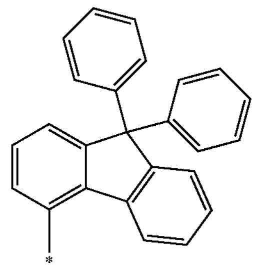
6-148
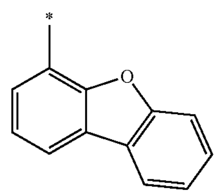
6-149
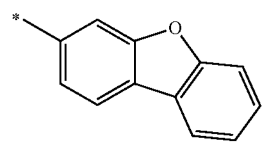
6-150
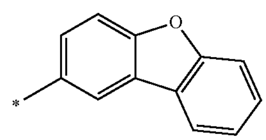
6-151
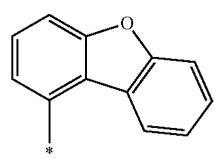
6-152
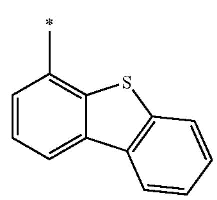
6-153
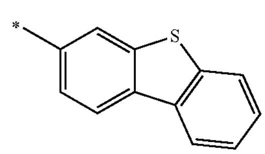

-continued

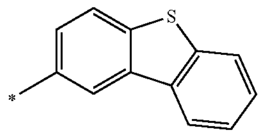

6-154

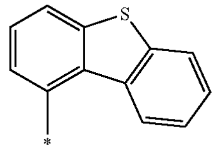

6-155

In Formulae 6-1 to 6-155, t-Bu indicates a tert-butyl group;

Ph indicates a phenyl group; and

* indicates a binding site with an adjacent atom.

For example, $R_{11}$ to $R_{16}$ in Formula 1 may be each independently selected from groups represented by Formulae 6-1 to 6-42 and Formulae 6-140 to 6-155, but $R_{11}$ to $R_{16}$ are not limited thereto.

In Formula 1, n11, which indicates the number of moieties represented by

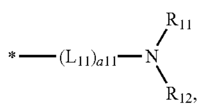

may be selected from 0, 1, and 2. When n11 is 2 or more, the two or more moieties represented by

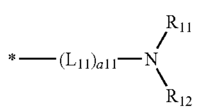

may be the same as or different from each other. The definitions for n12 and n13 may be each independently understood based on the above-described definition of n11 and the structure of Formula 1.

In Formula 1, n11 to n13 may be each independently selected from 0 and 1, but are not limited thereto.

A sum of n11, n12, and n13 in Formula 1 may be selected from 2, 3, 4, 5, and 6.

In some embodiments, the sum of n11, n12, and n13 in Formula 1 may be selected from 2, 3, and 4, in some embodiments, may be selected from 1 and 2, and in some embodiments, may be 2. However, embodiments of the present disclosure are not limited thereto.

In some embodiments, in Formula 1, n11 may be 1, n12 may be 0, and n13 may be 1. However, embodiments of the present disclosure are not limited thereto.

In Formula 1, $R_{17}$ to $R_{19}$ may be each independently selected from a hydrogen, a deuterium, F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$), and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$), where $Q_1$ to $Q_3$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $R_{17}$ to $R_{19}$ in Formula 1 may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —Si($Q_1$)($Q_2$)($Q_3$), where $Q_1$ to $Q_3$ may be each independently selected from a $C_1$-$C_{60}$ alkyl group and a $C_6$-$C_{60}$ aryl group. However, embodiments of the present disclosure are not limited thereto.

In some embodiments, $R_{17}$ to $R_{19}$ in Formula 1 may be each independently selected from a hydrogen, a deuterium, —F, —Cl, —Br, —I, a cyano group, a nitro group, $C_1$-$C_{60}$ alkyl group, a $C_1$-$C_{60}$ alkoxy group, a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, —Si($CH_3$)$_3$, and —Si(Ph)$_3$, but $R_{17}$ to $R_{19}$ are not limited thereto.

In some embodiments, $R_{17}$ to $R_{19}$ in Formula 1 may each be a hydrogen atom, but $R_{17}$ to $R_{19}$ are not limited thereto.

In some embodiments, the amine-based compound of Formula 1 may be represented by Formula 1-1, but the amine-based compound is not limited thereto.

Formula 1-1

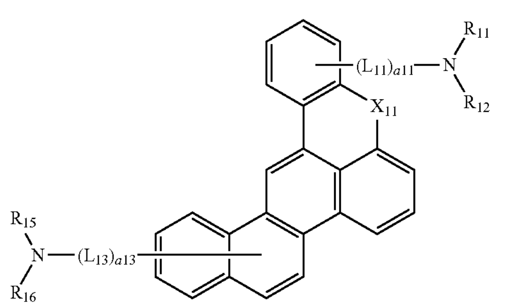

In Formula 1-1, $X_{11}$, $L_{11}$, $L_{13}$, a11, a13, $R_{11}$, $R_{12}$, $R_{15}$, and $R_{16}$ may be the same as those defined above.

For example, $L_{11}$ and $L_{13}$ in Formula 1-1 may be each independently selected from groups represented by Formulae 4-1 to 4-56, but are not limited thereto.

For example, $R_{11}$, $R_{12}$, $R_{15}$, and $R_{16}$ in Formula 1-1 may be each independently selected from groups represented by Formulae 6-1 to 6-155, but are not limited thereto.

In some embodiments, the amine-based compound of Formula 1 may be represented by Formula 1-1A.

Formula 1-1A

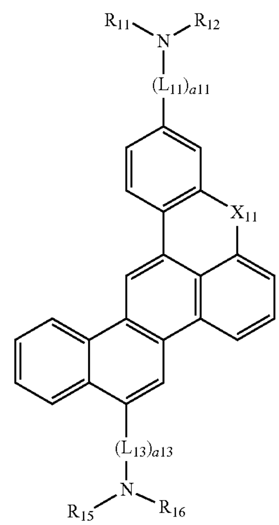

In Formula 1-1A, $X_{11}$, $L_{11}$, $L_{13}$, a11, a13, $R_{11}$, $R_{12}$, $R_{15}$, and $R_{16}$ may be the same as those defined above.

For example, $L_{11}$ and $L_{13}$ in Formula 1-1A may be each independently selected from groups represented by Formulae 4-1 to 4-56, but are not limited thereto.

For example, $R_{11}$, $R_{12}$, $R_{15}$, and $R_{16}$ in Formula 1-1A may be each independently selected from groups represented by Formulae 6-1 to 6-155, but are not limited thereto.

In some embodiments, the amine-based compound of Formula 1 may be one of Compounds 1 to 162, but the amine-based compound of Formula 1 is not limited thereto.

1

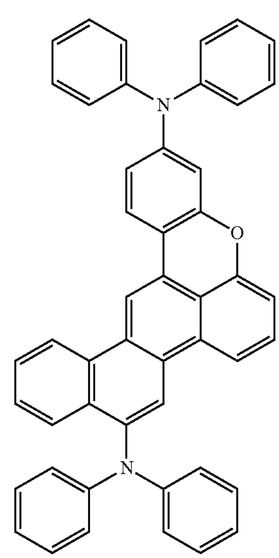

-continued
2
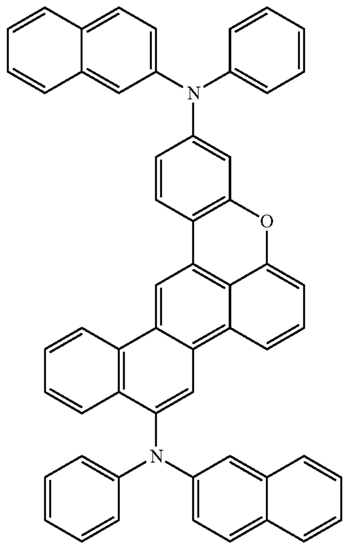
3
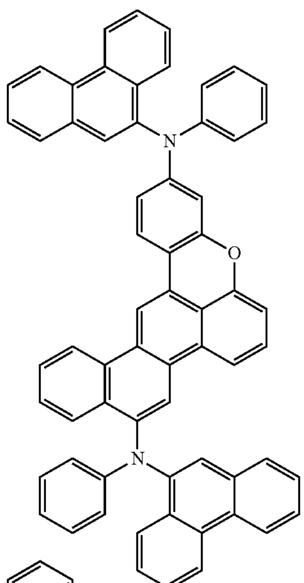
4
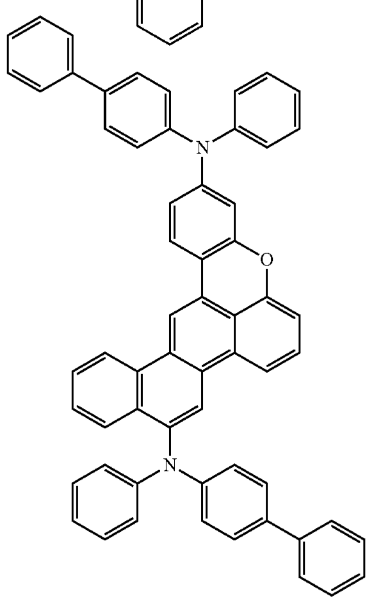
-continued
5
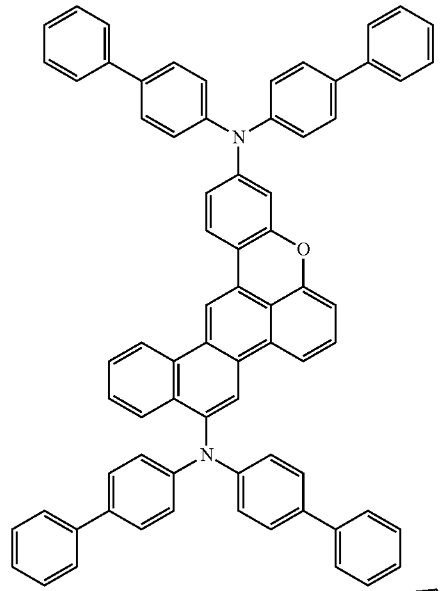
6
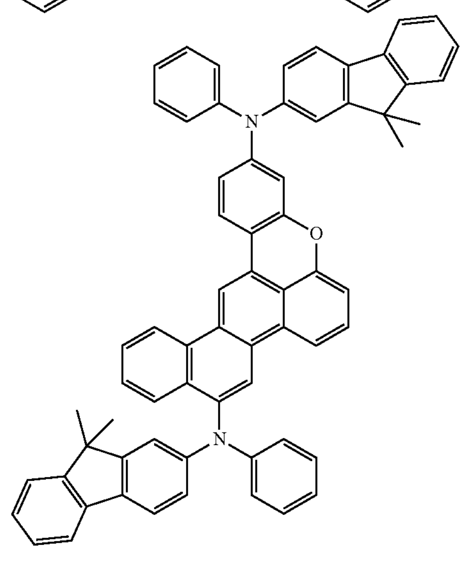
7
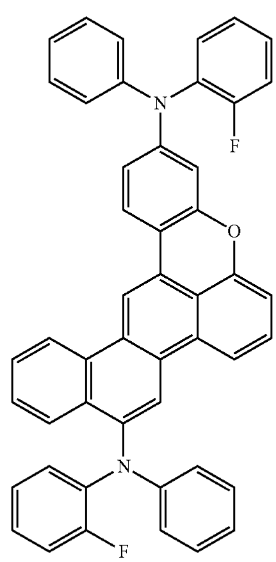

-continued
8
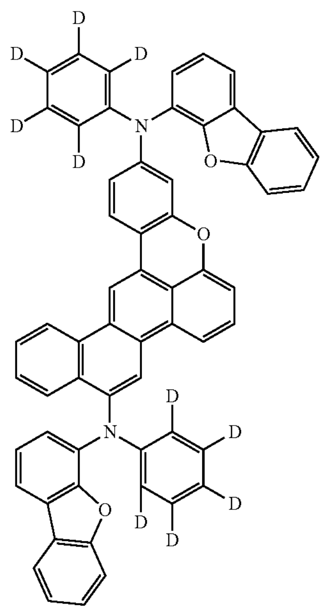
10
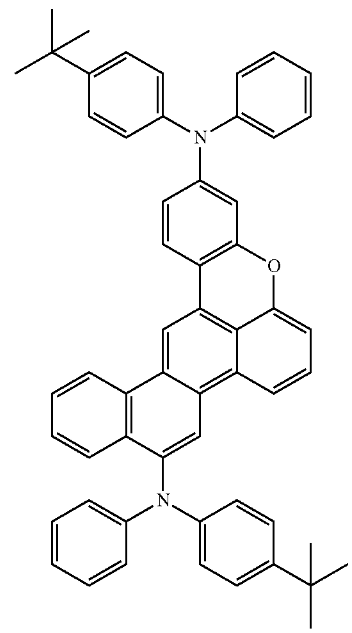
9
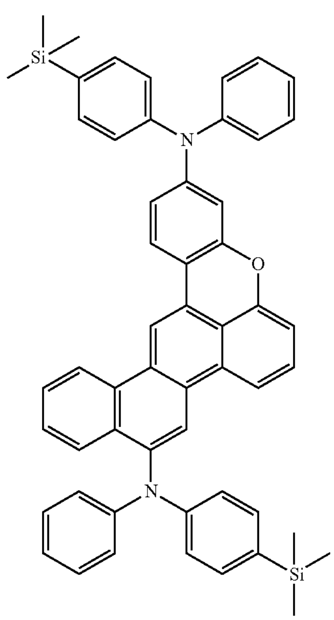
11
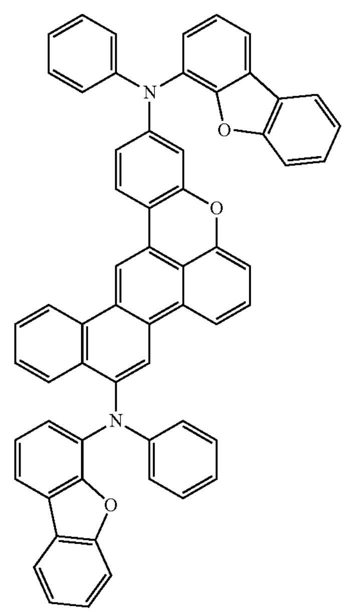

12
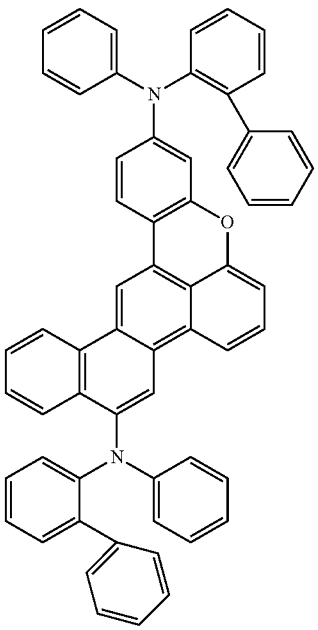
14
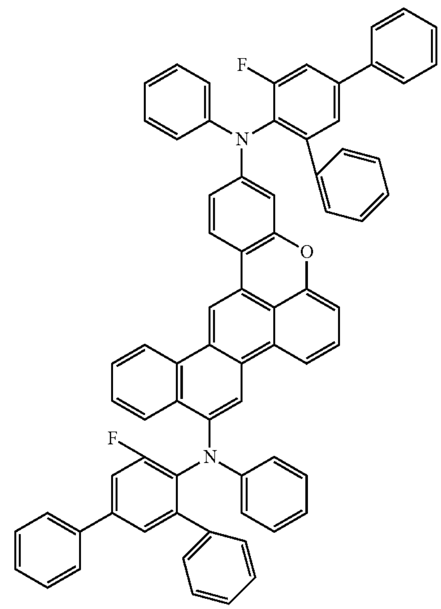
13
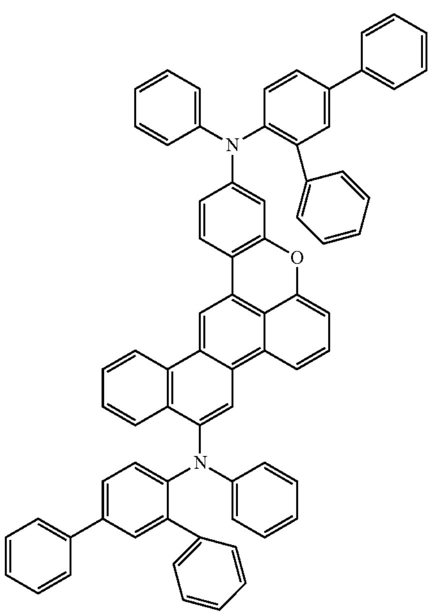
15
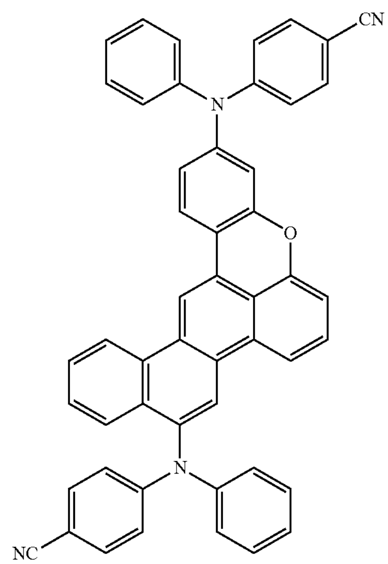

-continued
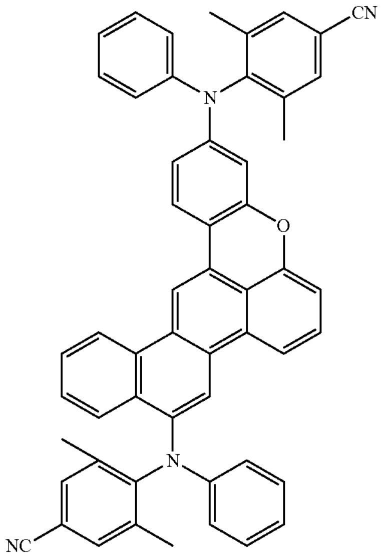
16
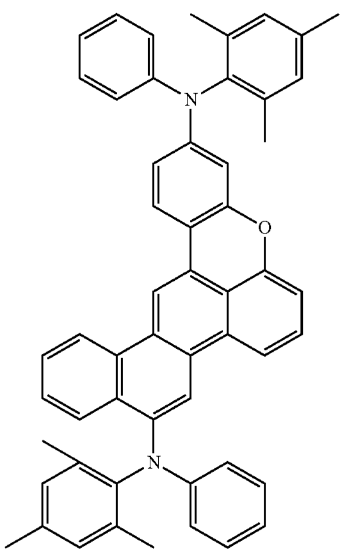
17
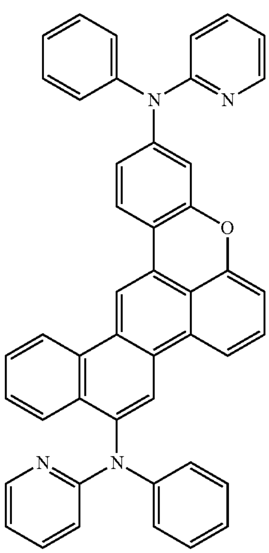
18
-continued
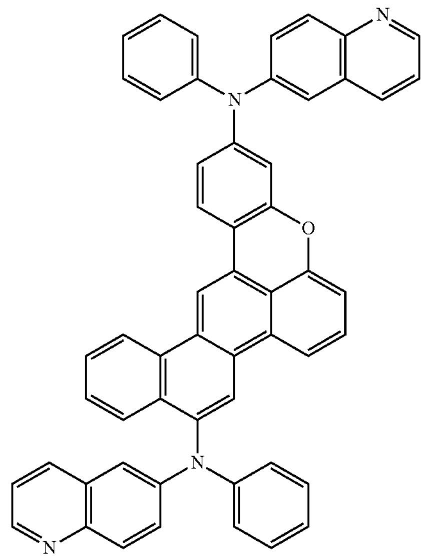
19
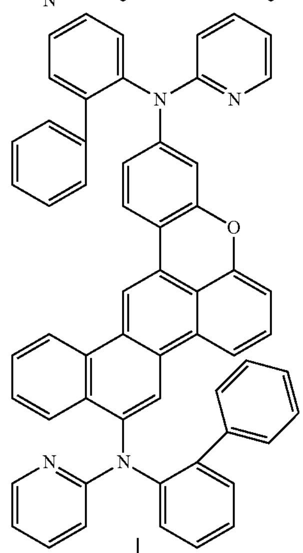
20
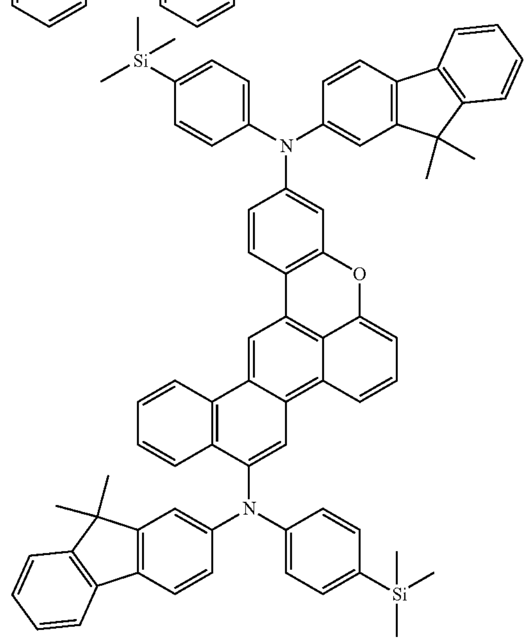
21

-continued
22
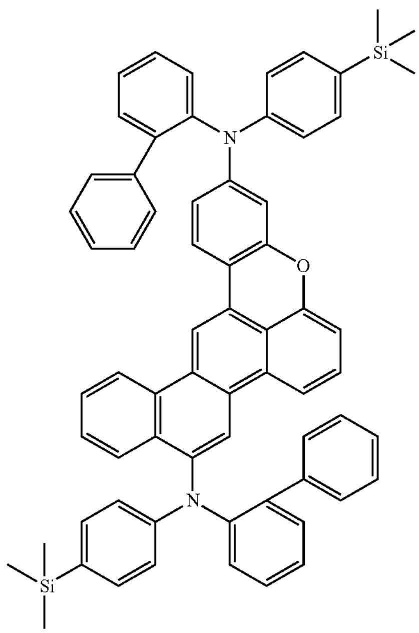
23
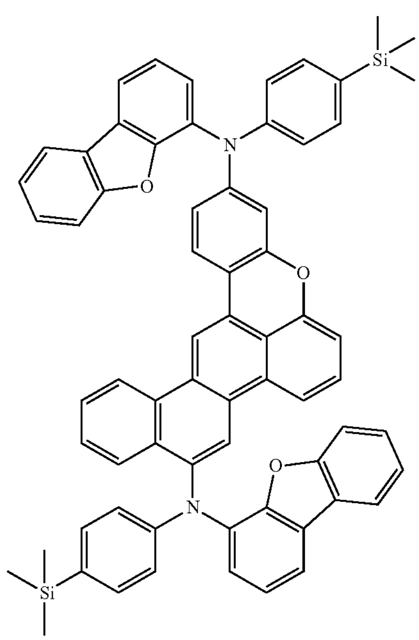
-continued
24
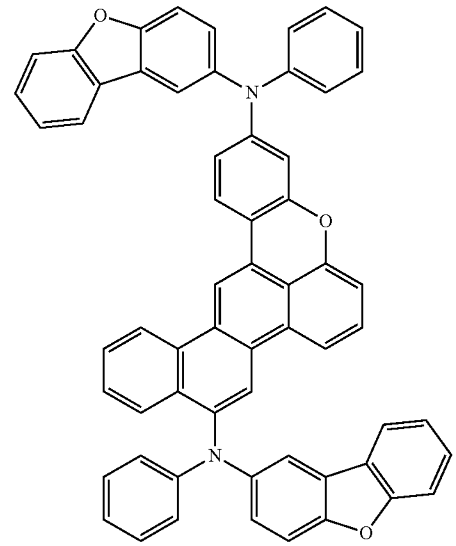
25
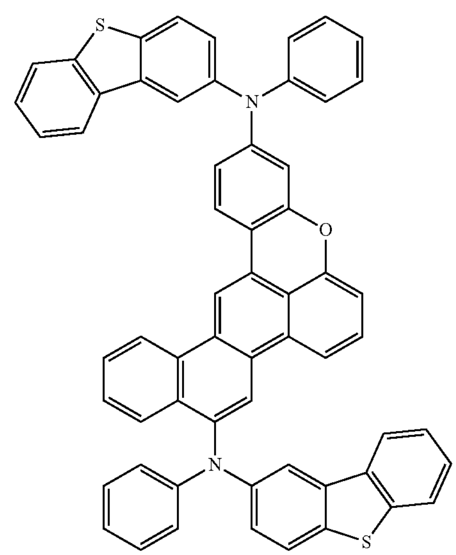

-continued
26
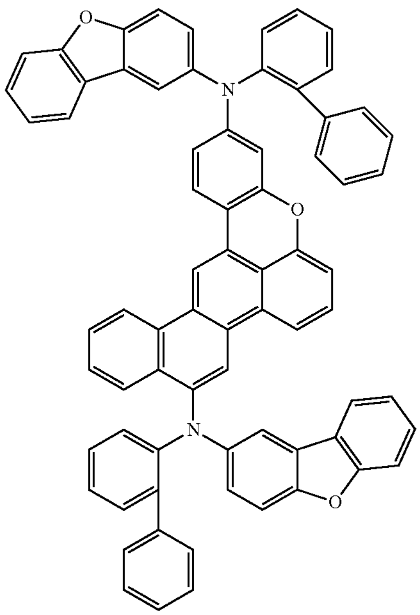
27
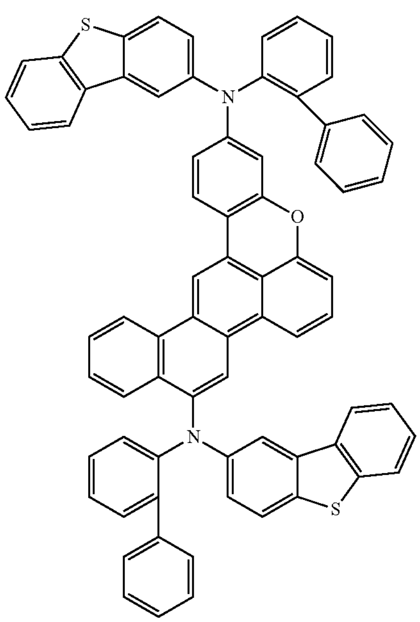
-continued
28
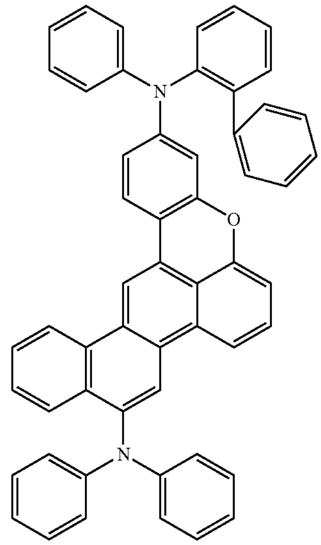
29
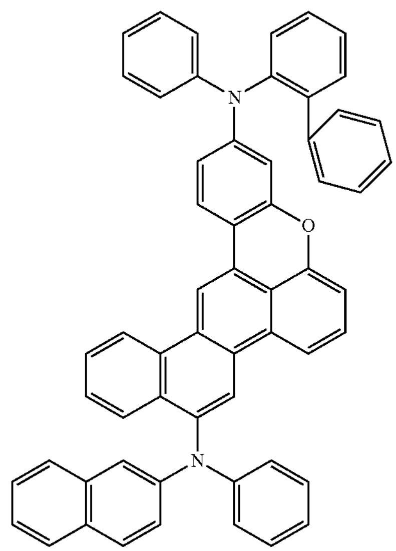
30
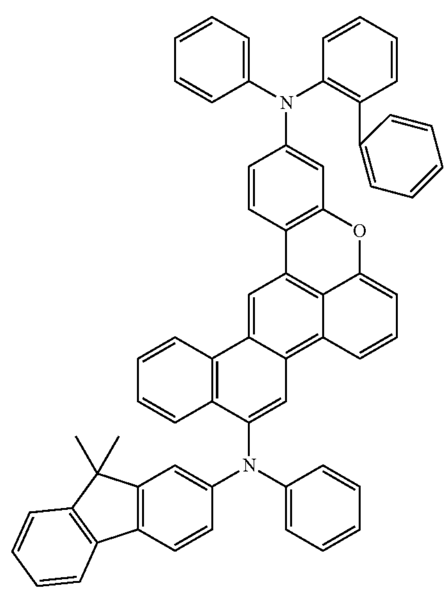

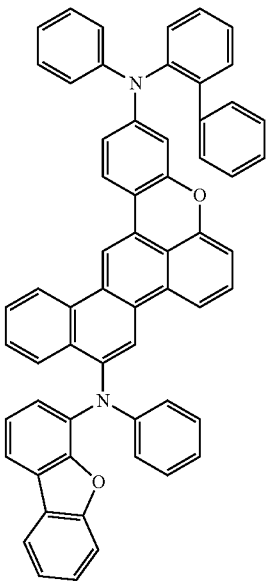
31
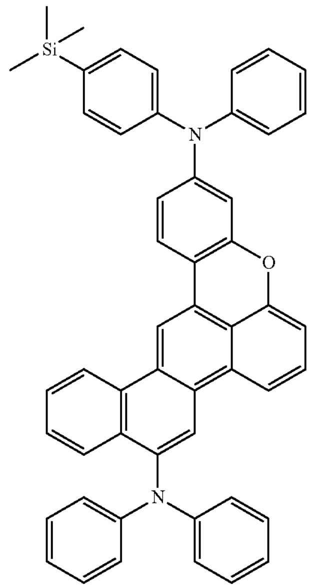
33
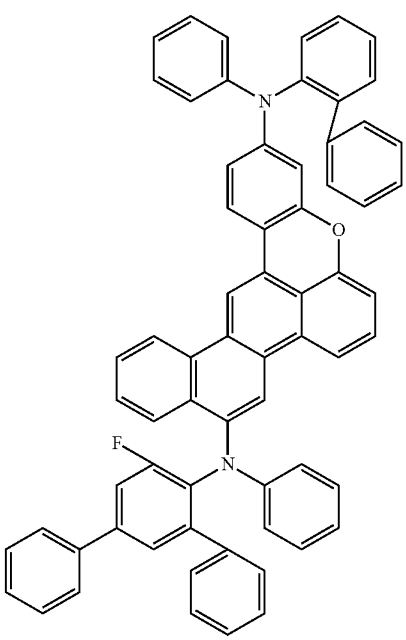
32
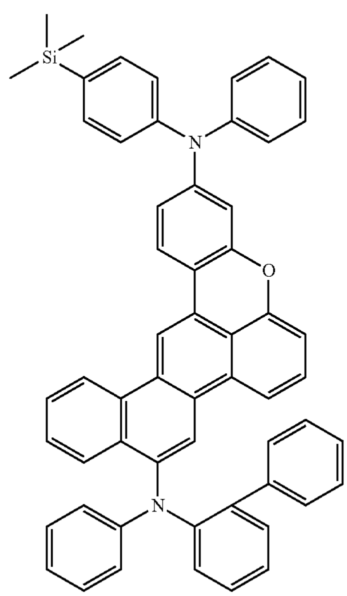
34

-continued
35
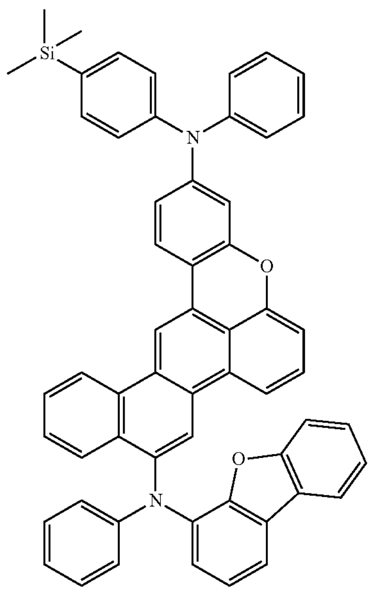
36
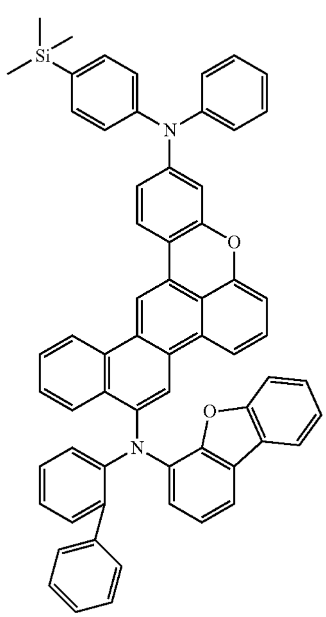
-continued
37
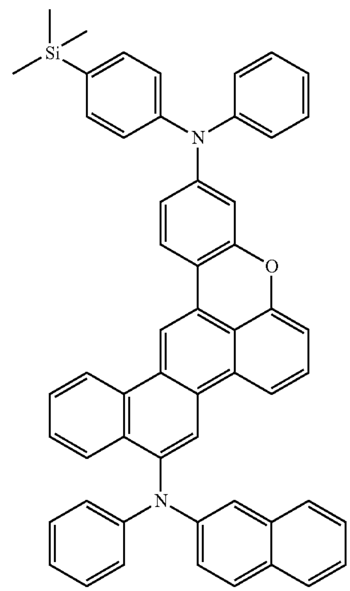
38
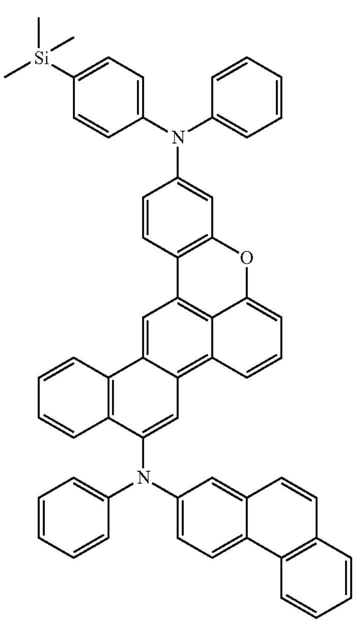

39
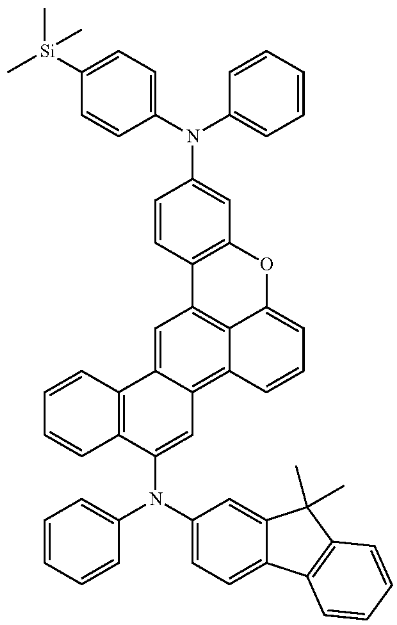
41
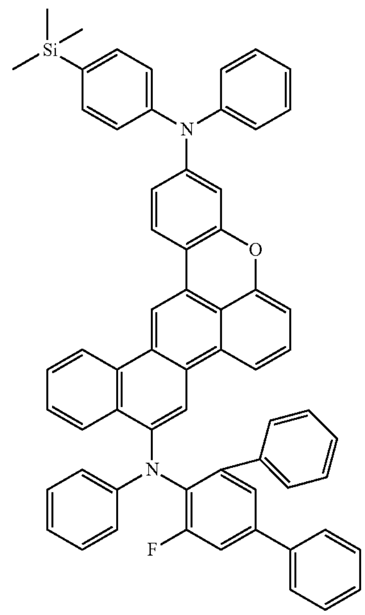
40
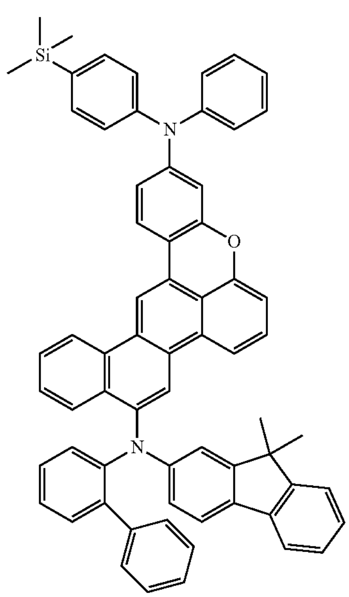
42
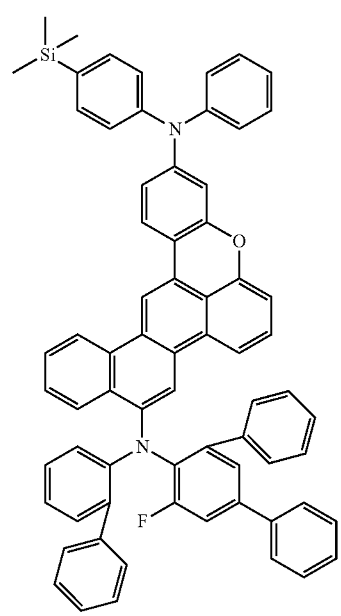

-continued
43
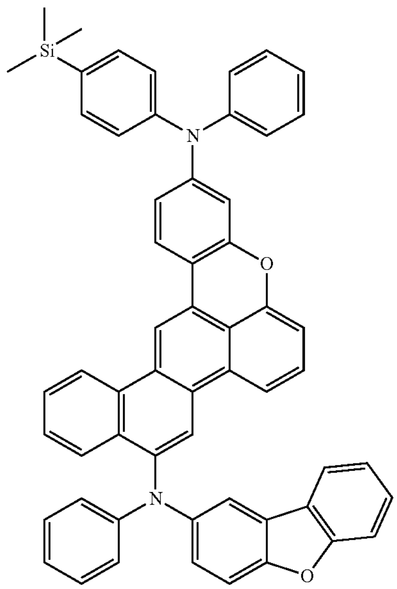
44
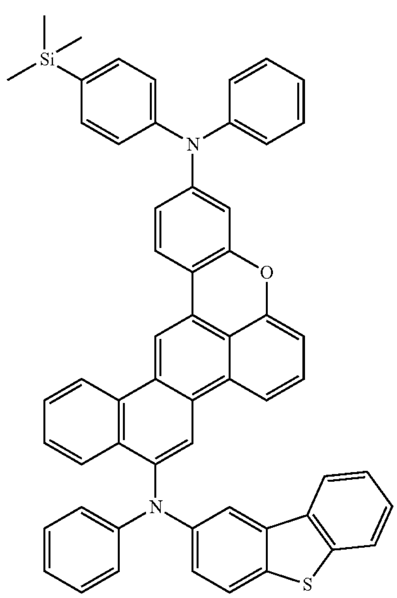
-continued
45
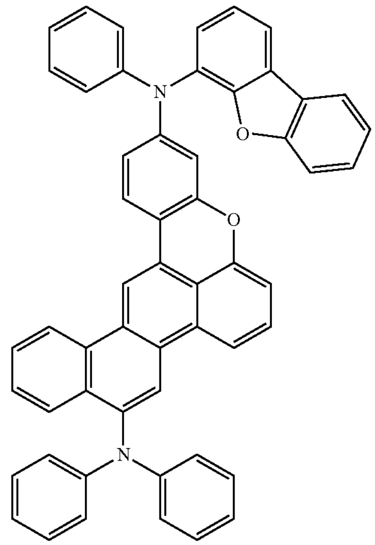
46
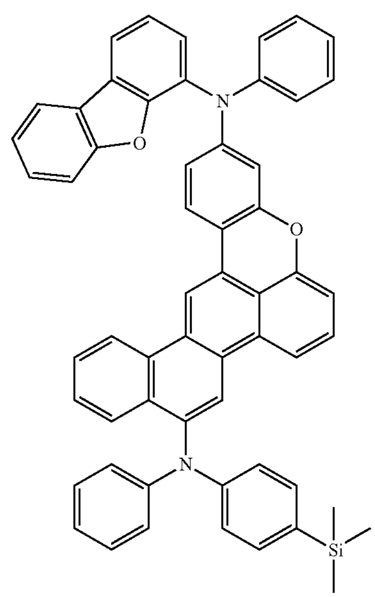

-continued
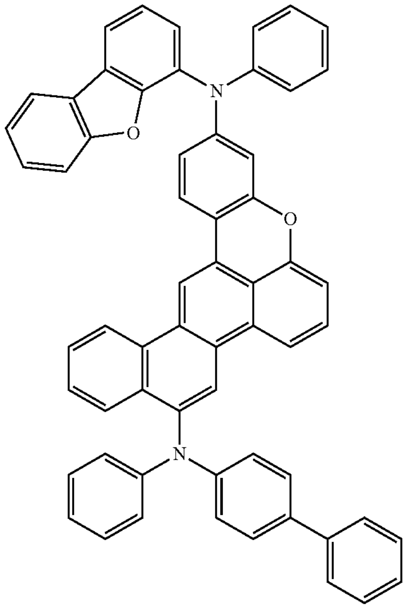
47
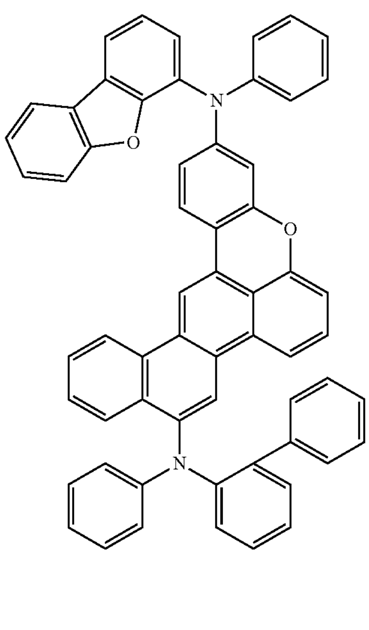
48
-continued
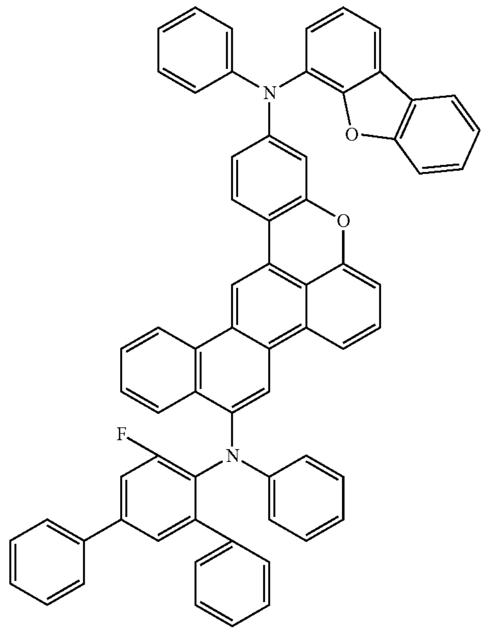
49
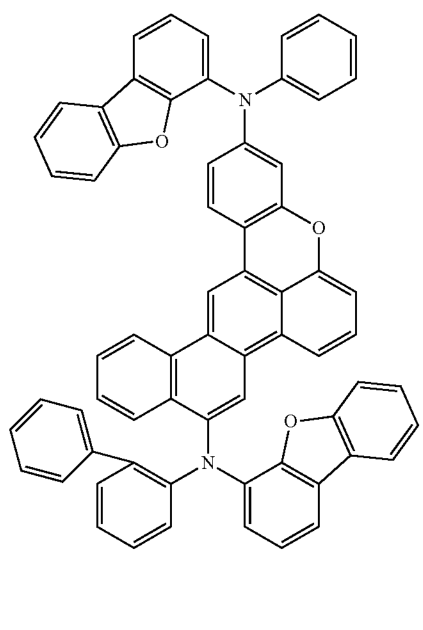
50

51
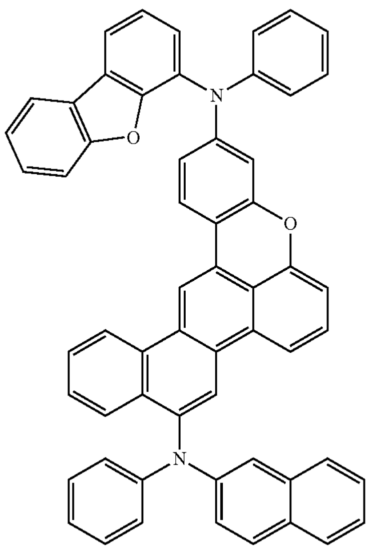
53
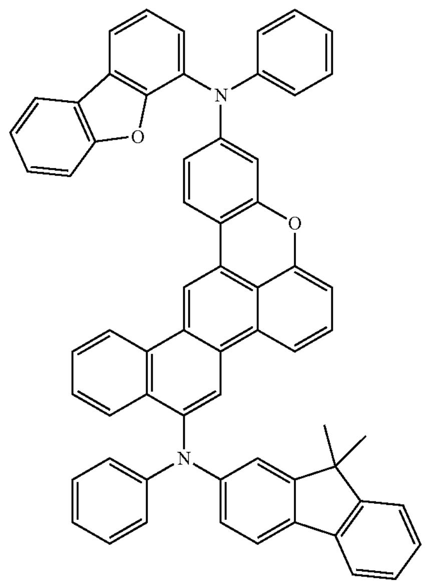
52
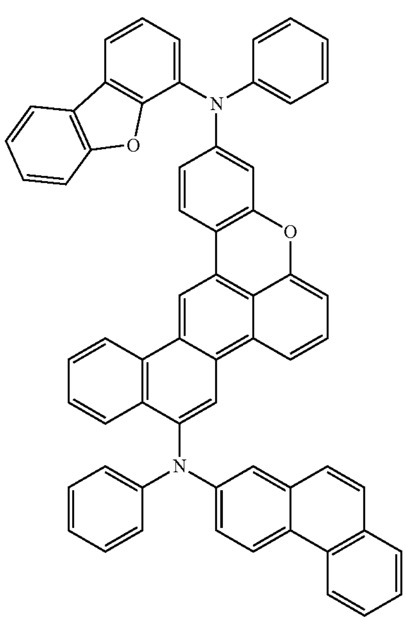
54
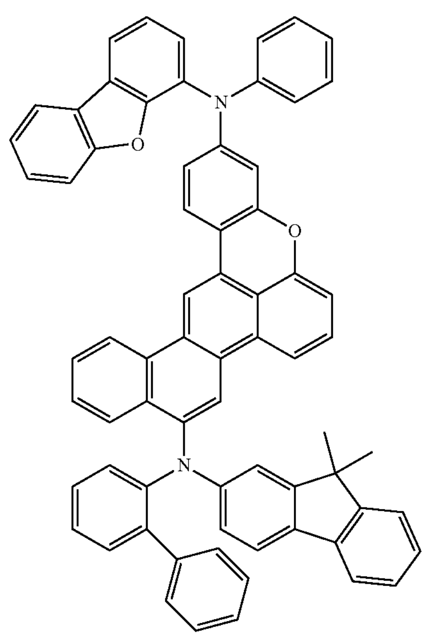

-continued
55
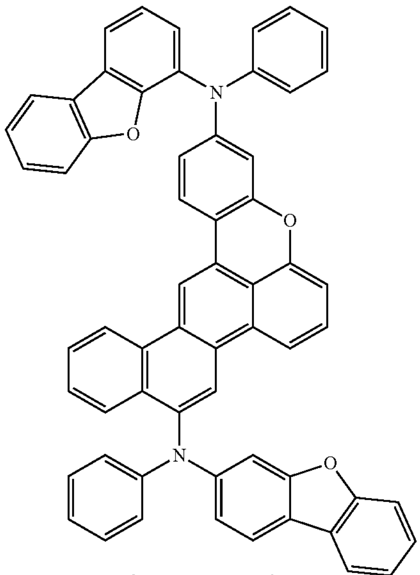
56
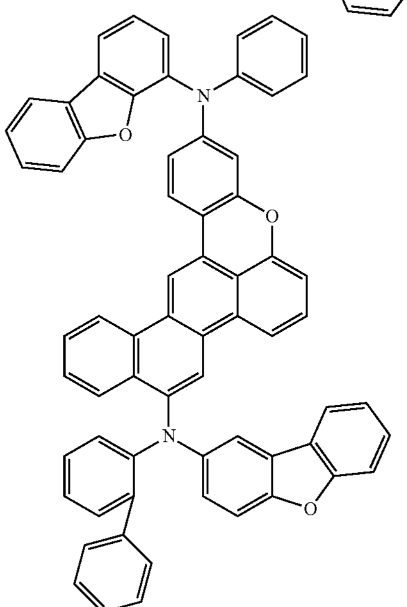
57
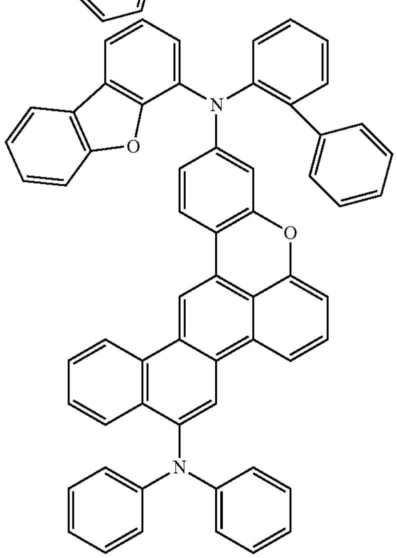
-continued
58
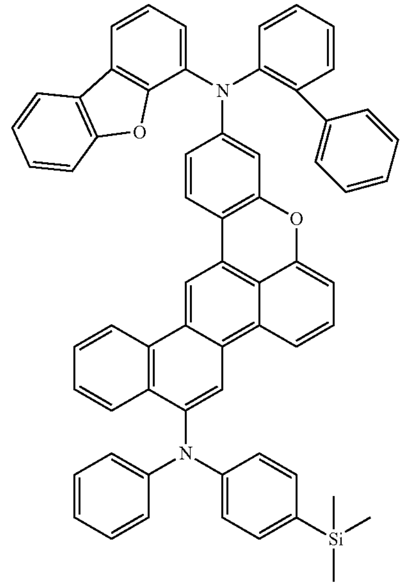
59
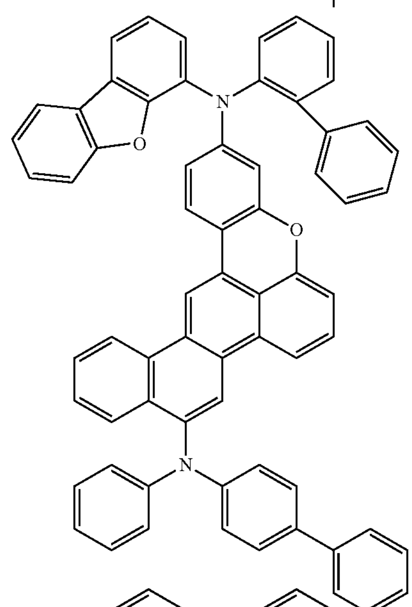
60
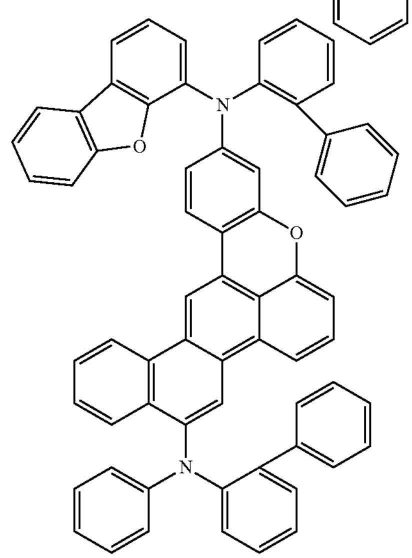

-continued
61
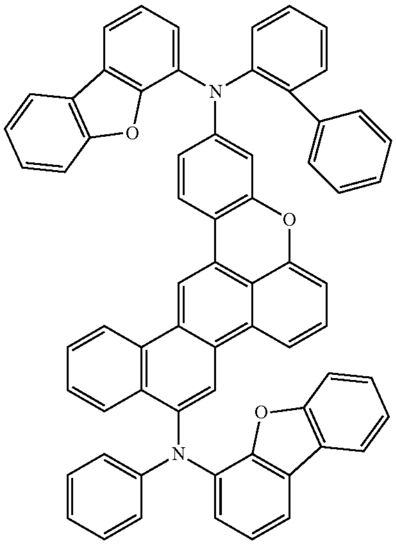
62
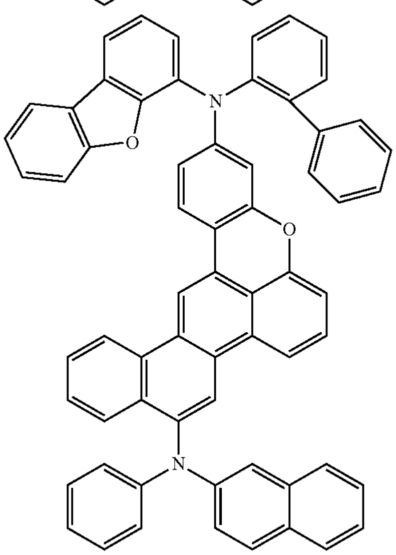
63
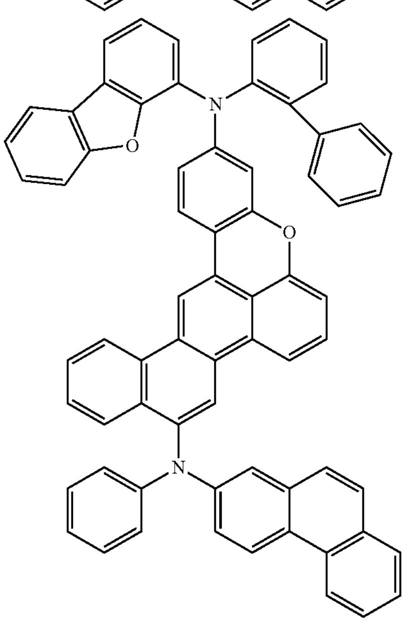
-continued
64
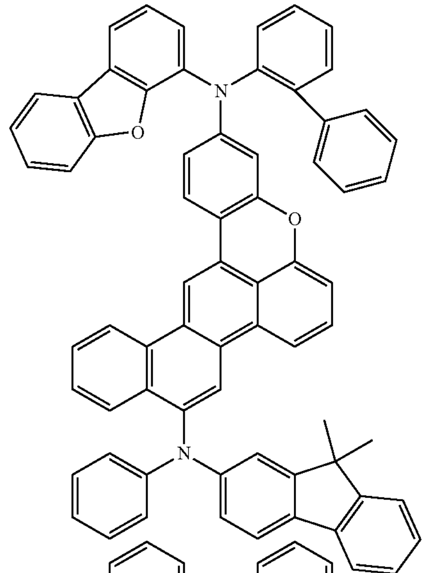
65
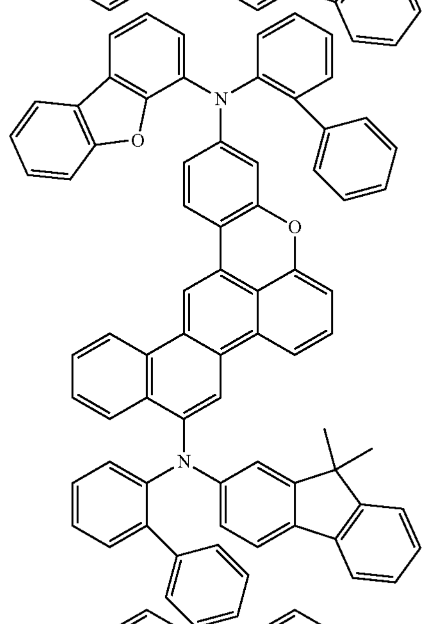
66
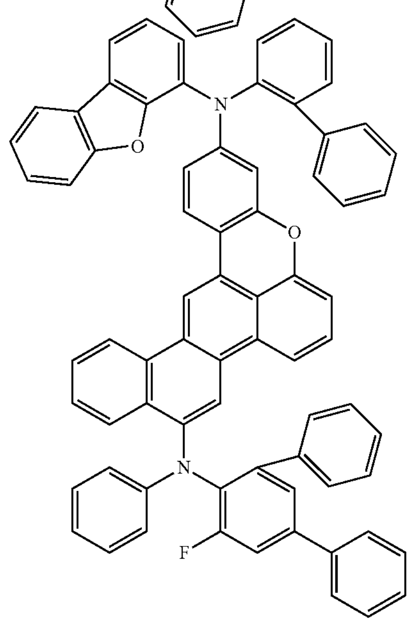

-continued
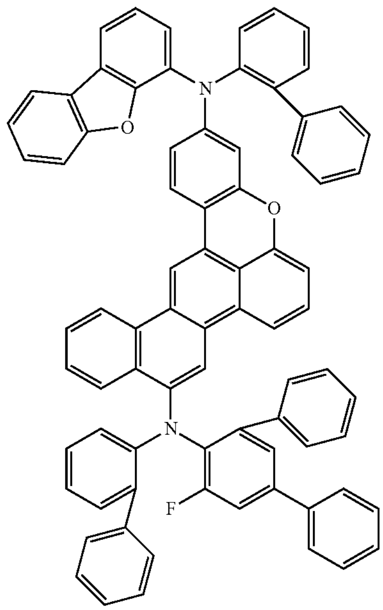
67
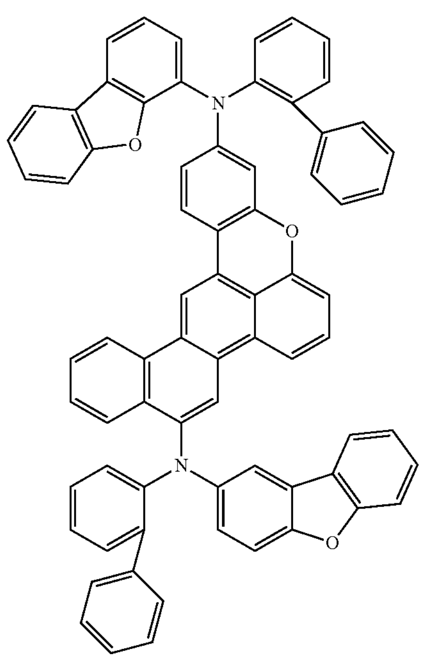
68
-continued
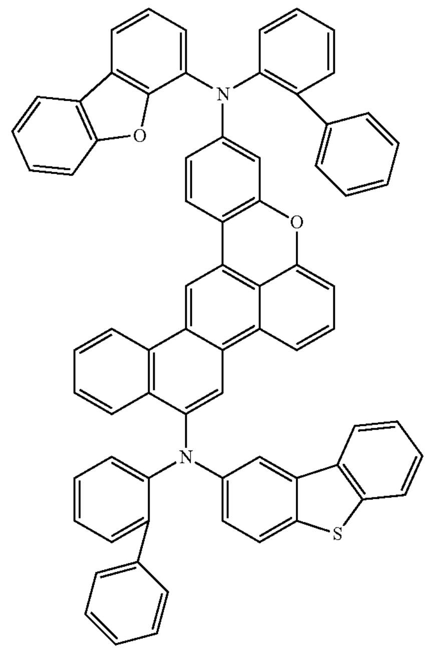
69
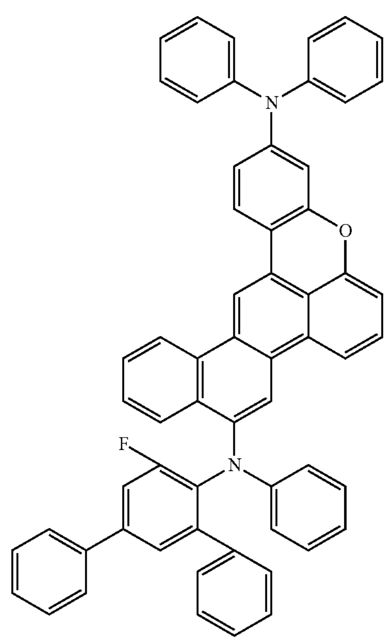
70

-continued
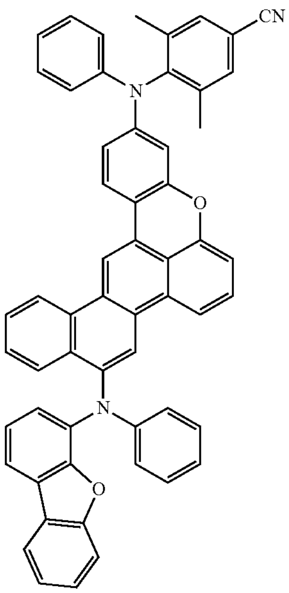
71
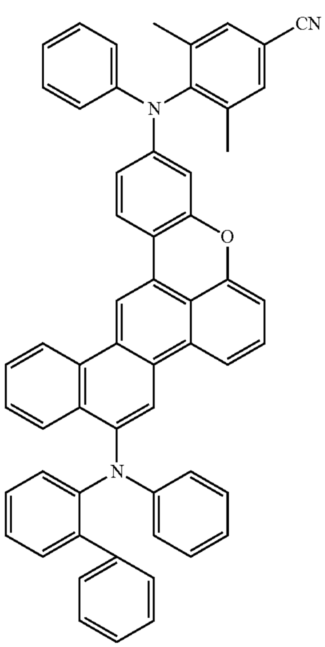
72
-continued
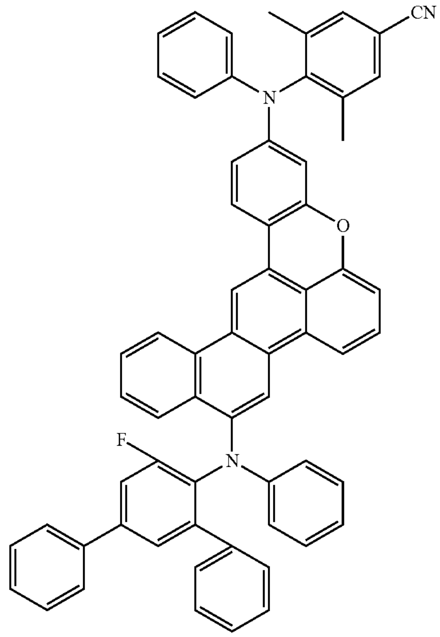
73
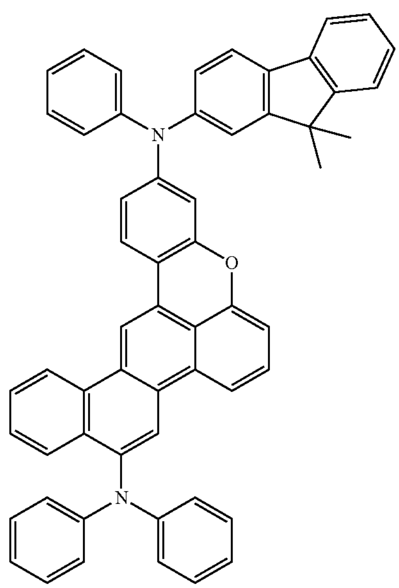
74

-continued
75
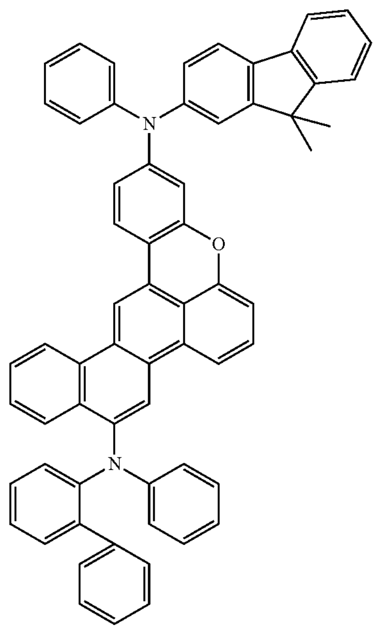
76
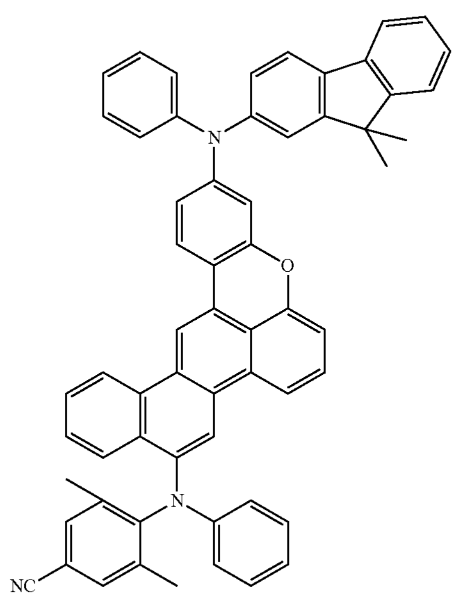
-continued
77
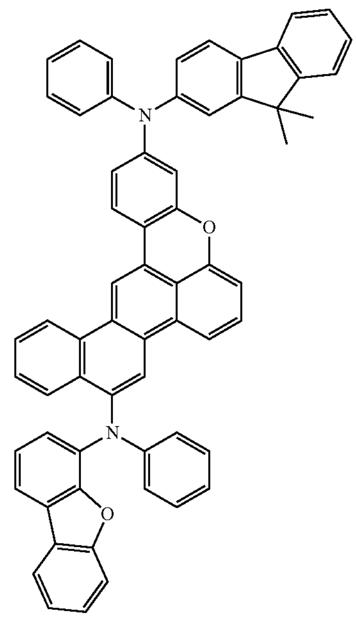
78
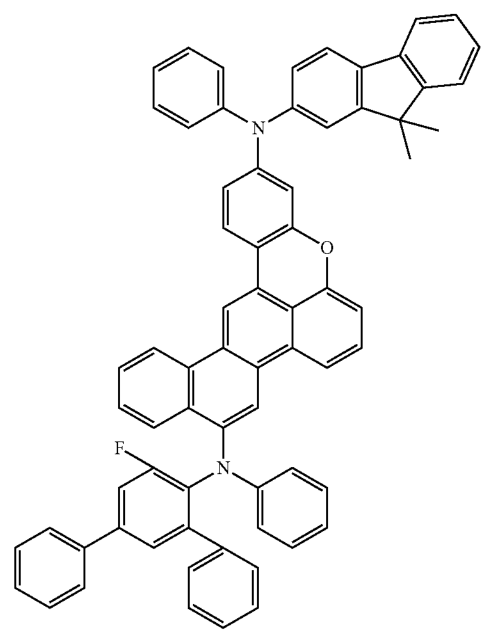

-continued
79
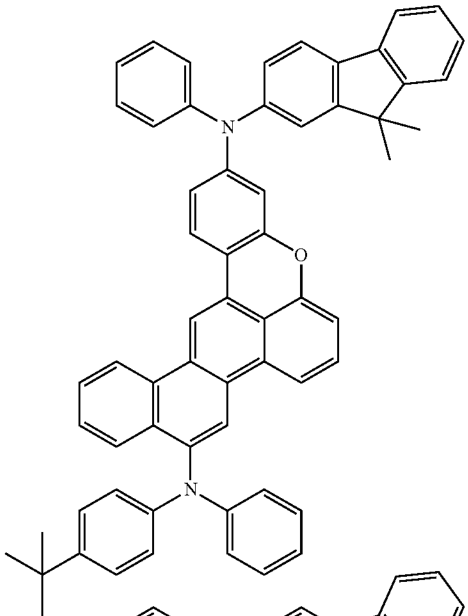
80
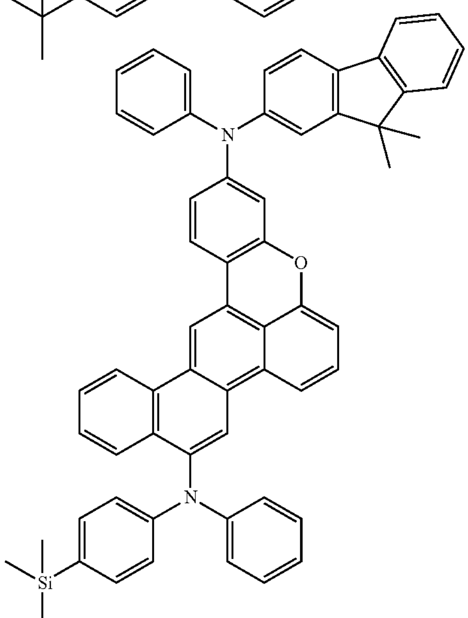
81
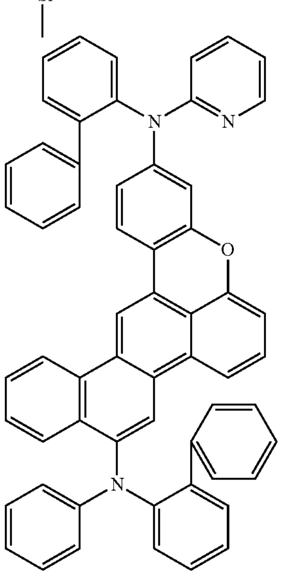
-continued
82
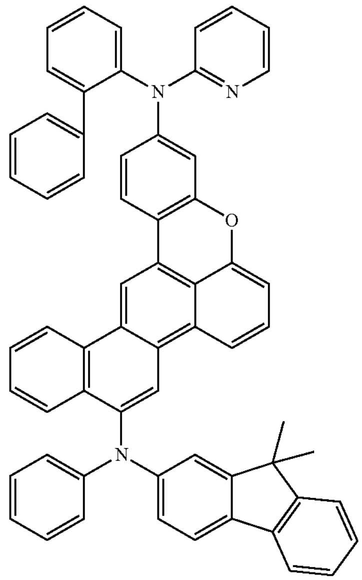
83
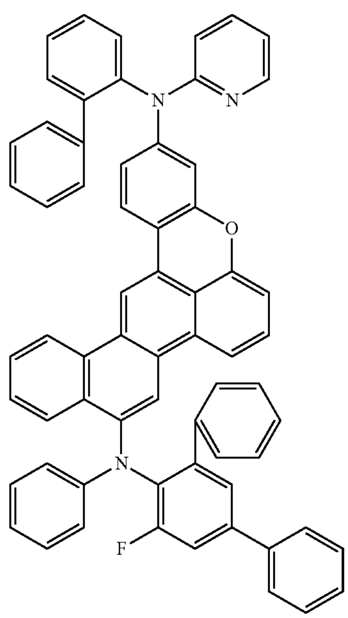

84
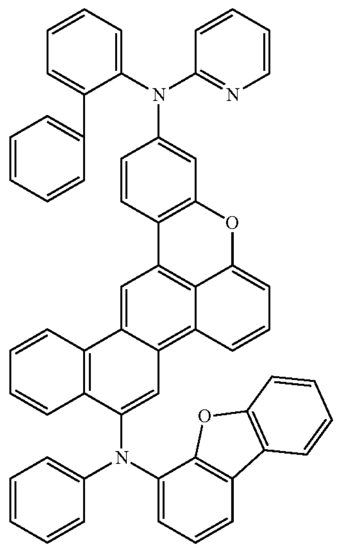
86
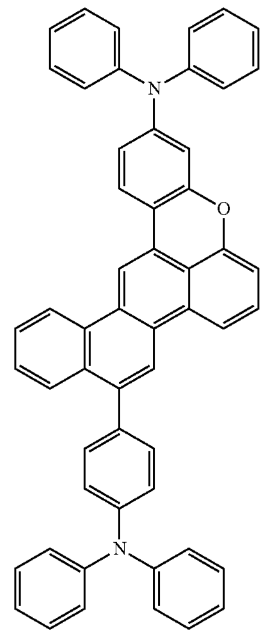
85
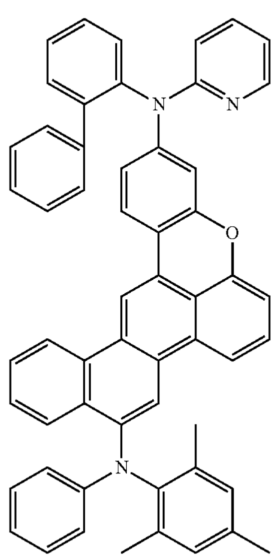
87
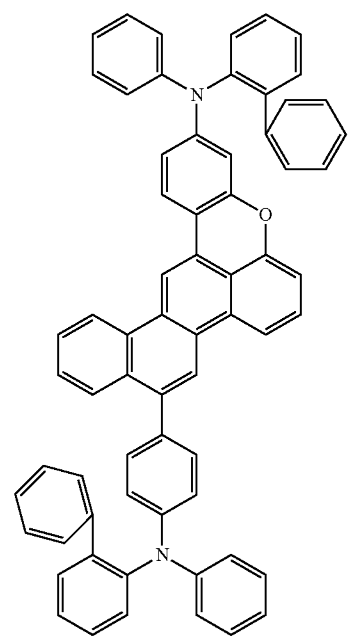

-continued
88
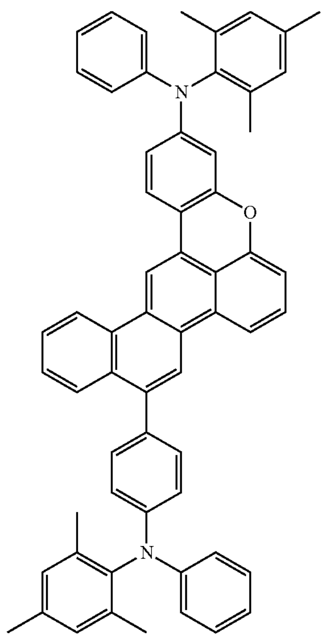
89
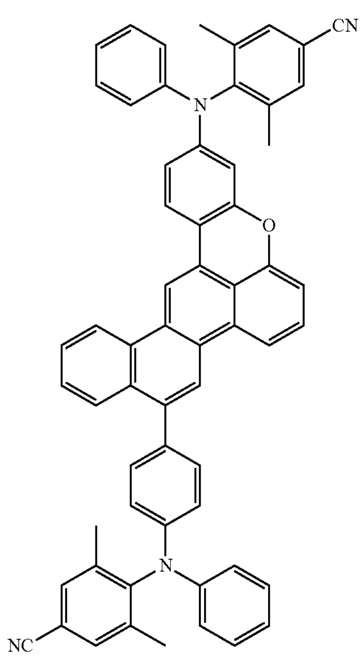
-continued
90
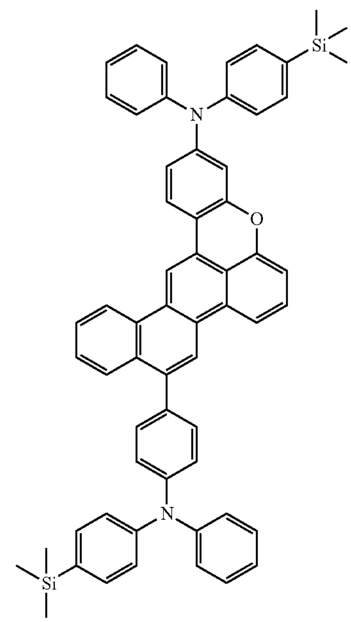
91
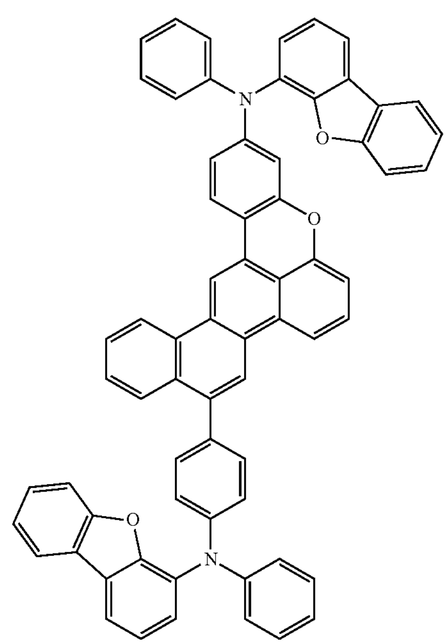

-continued
92
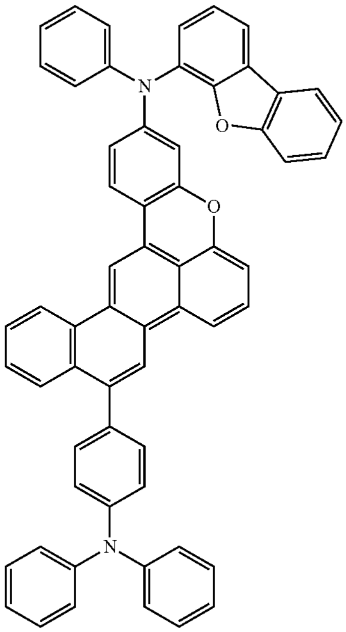
93
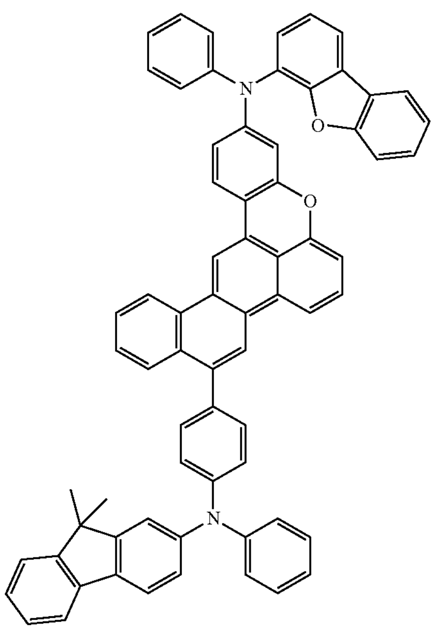
-continued
94
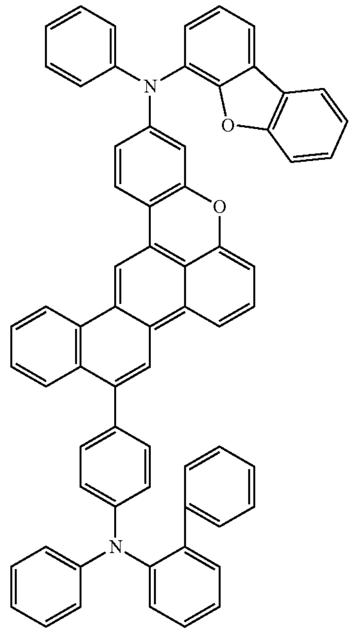
95
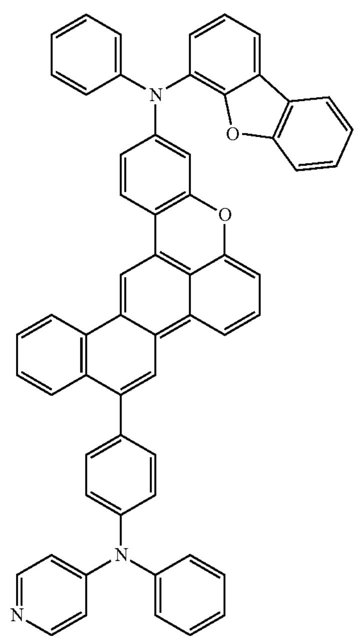

96
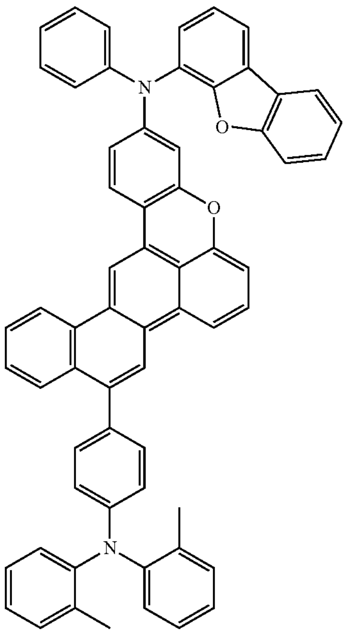
97
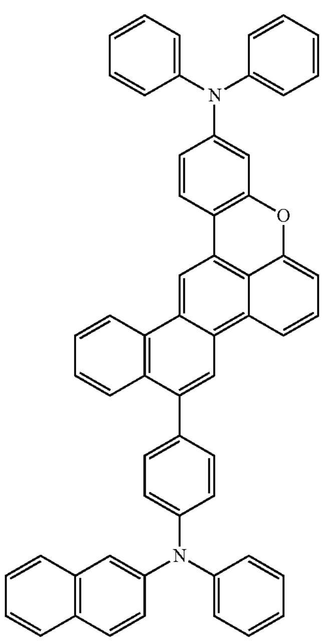
98
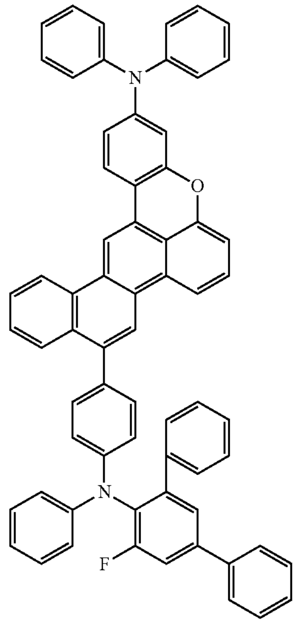
99
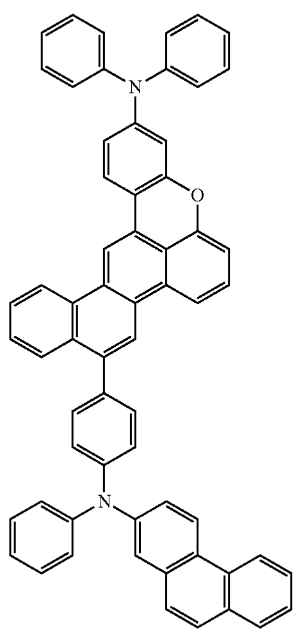

-continued
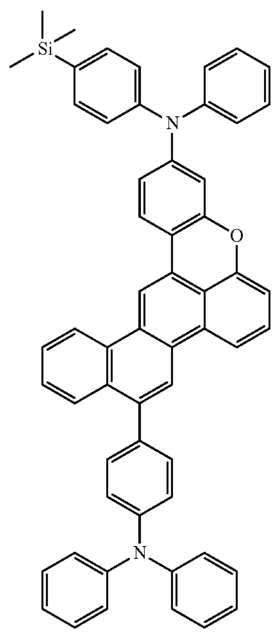
100
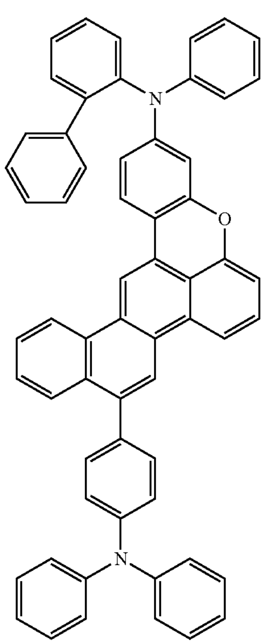
101
-continued
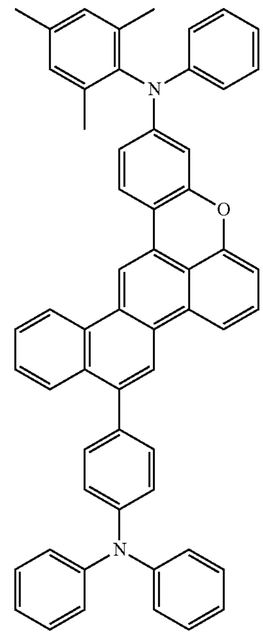
102
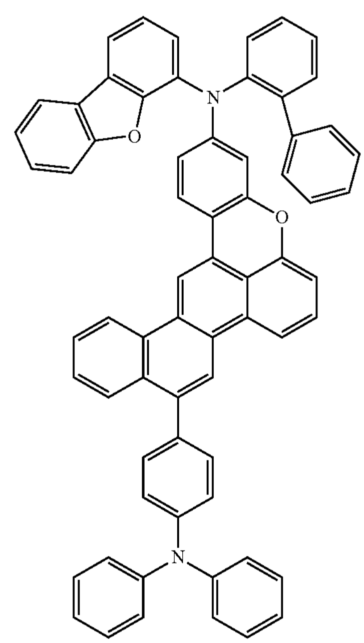
103

-continued
104
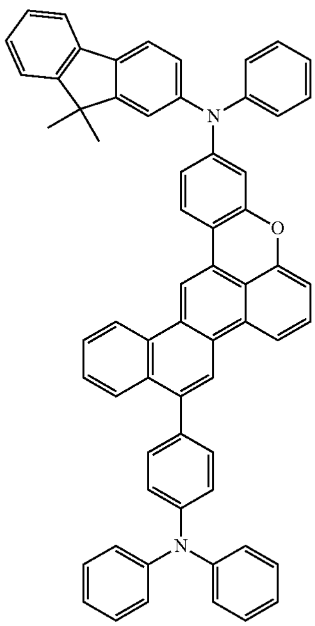
105
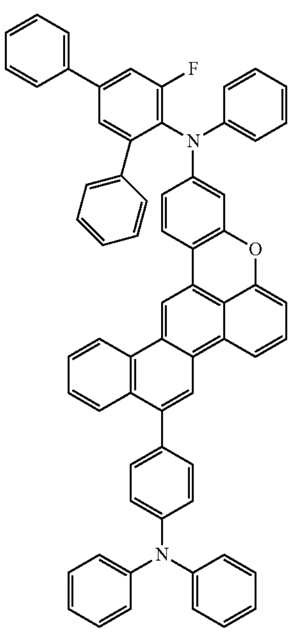
-continued
106
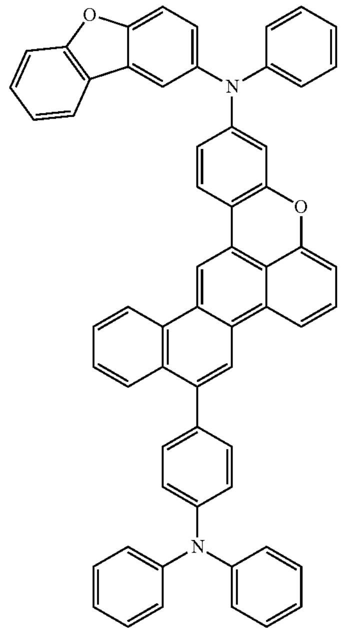
107
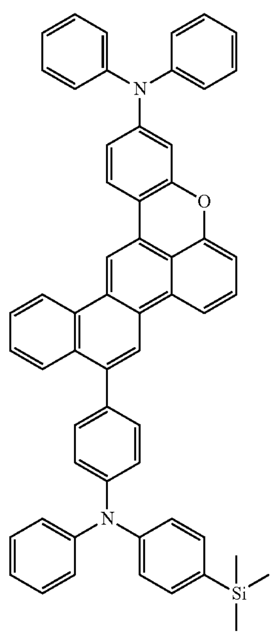

-continued
108
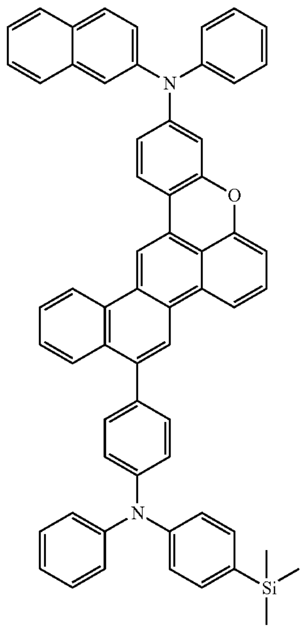
110
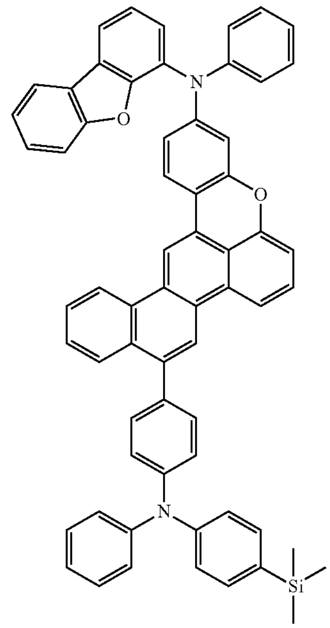
109
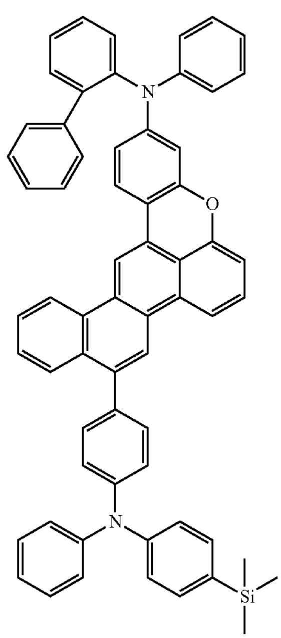
111
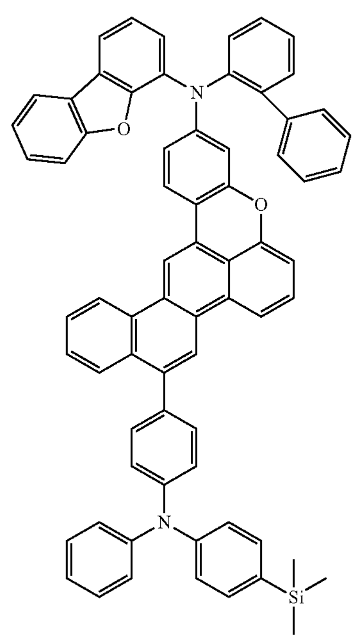

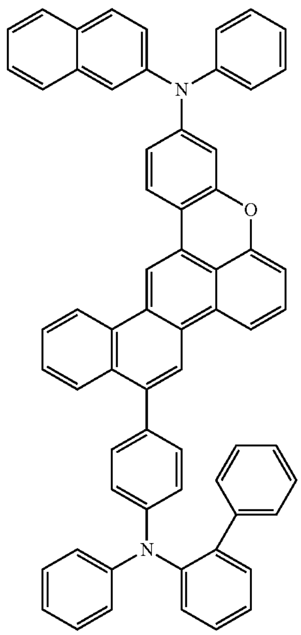
112
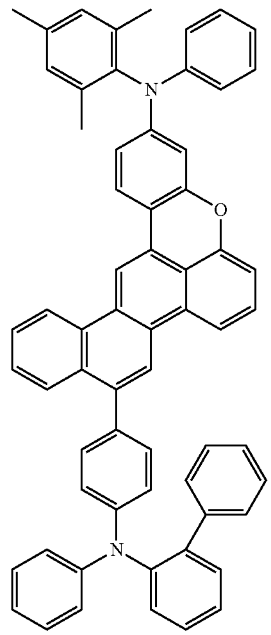
114
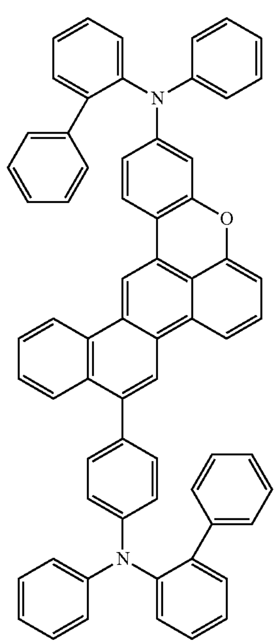
113
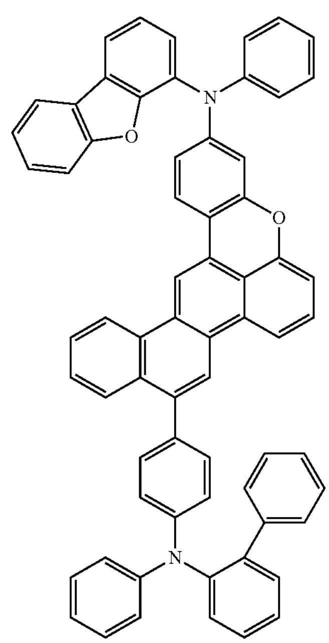
115

116
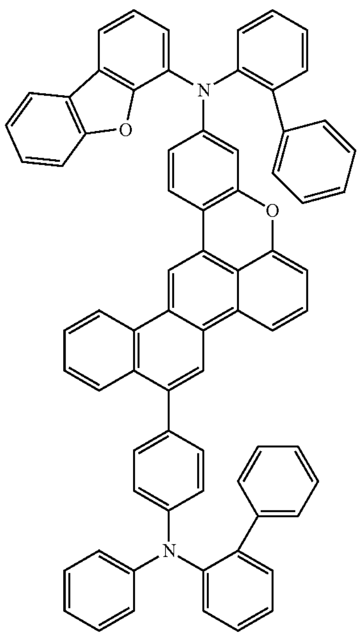
118
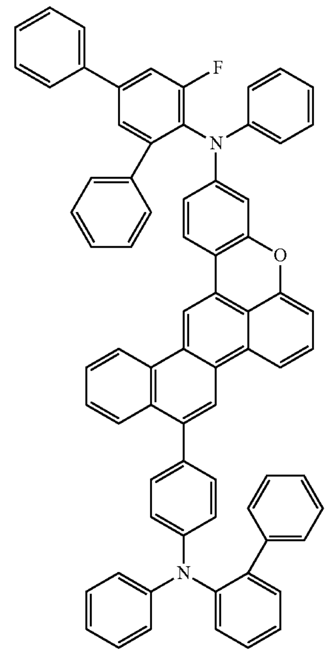
117
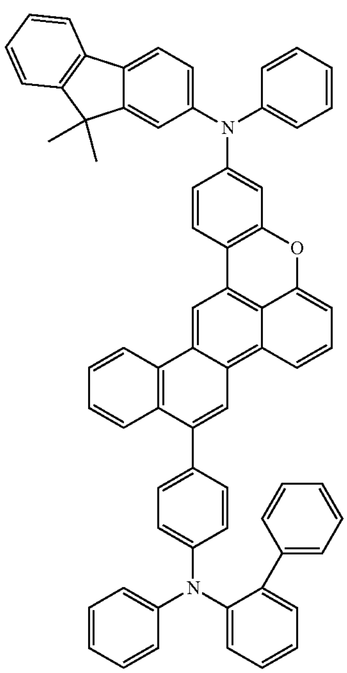
119
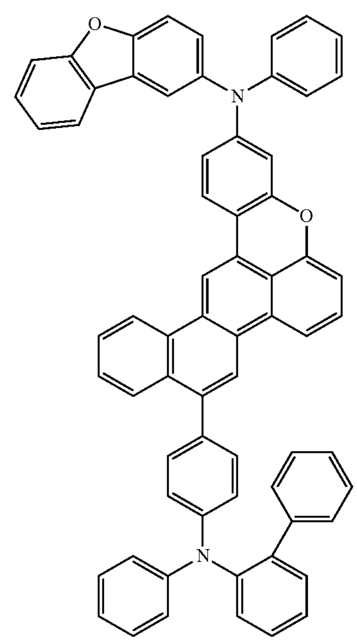

-continued
120
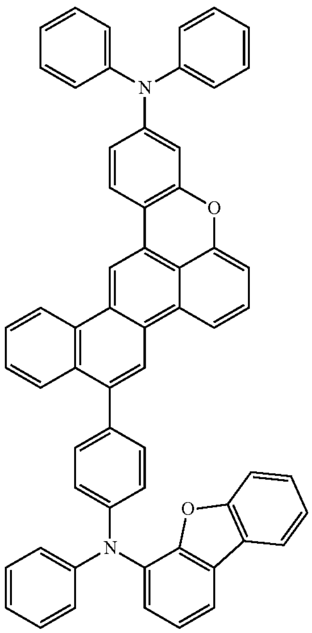
121
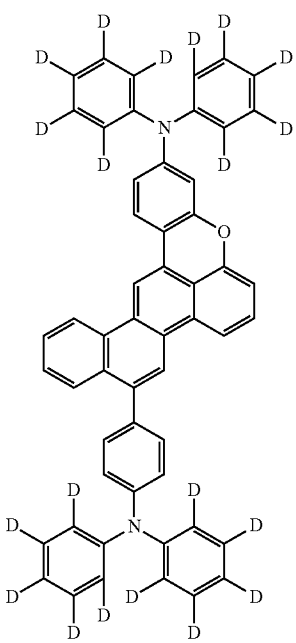
-continued
122
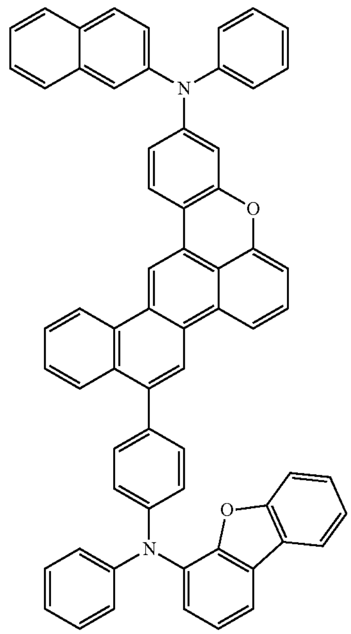
123
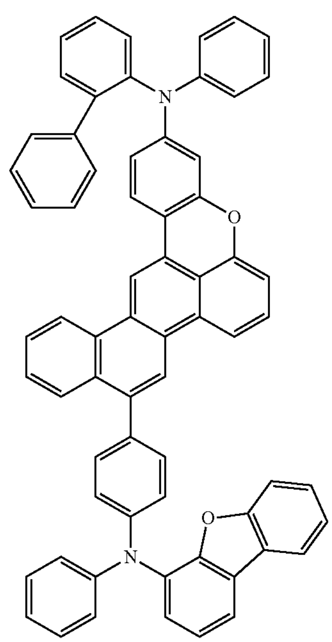

124
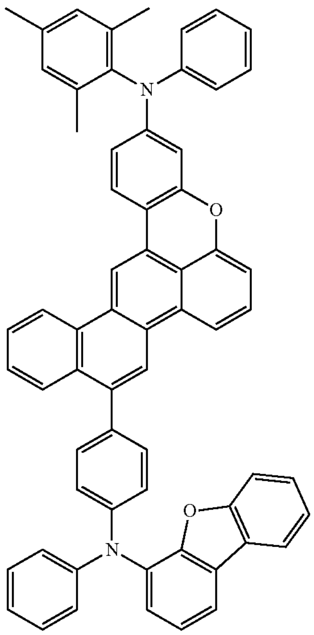
126
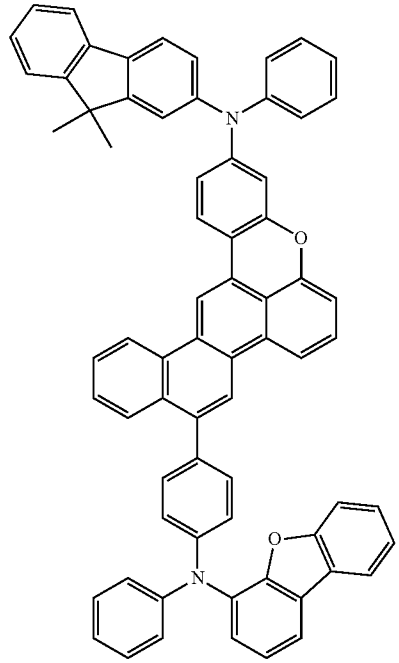
125
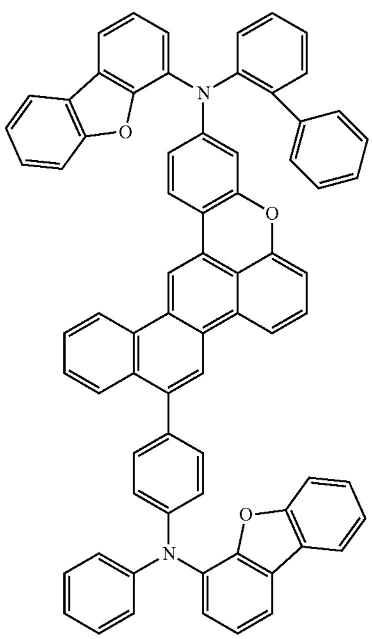
127
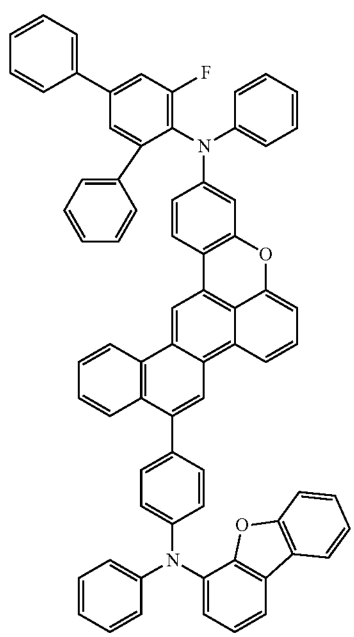

-continued
128
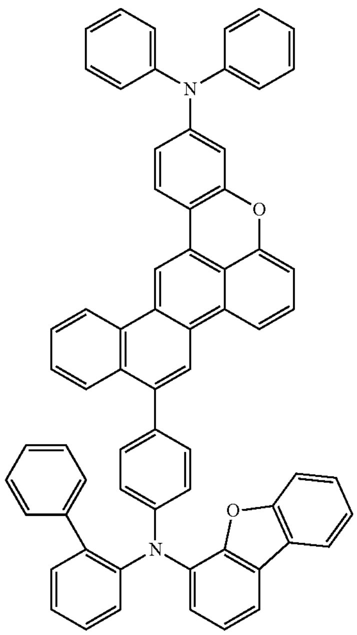
129
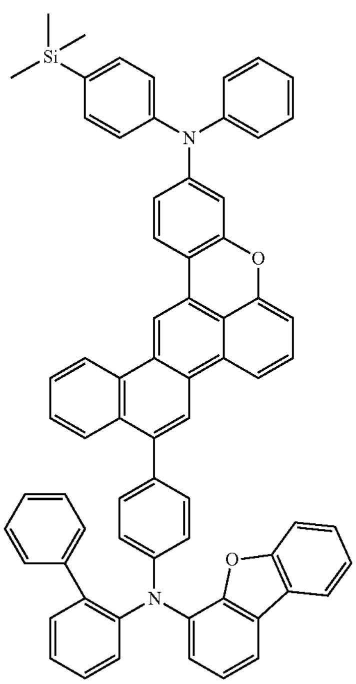
-continued
130
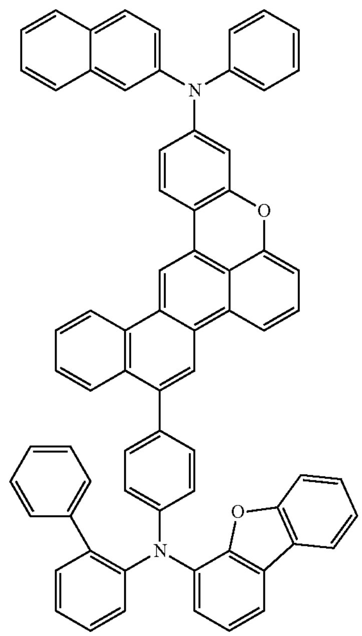
131
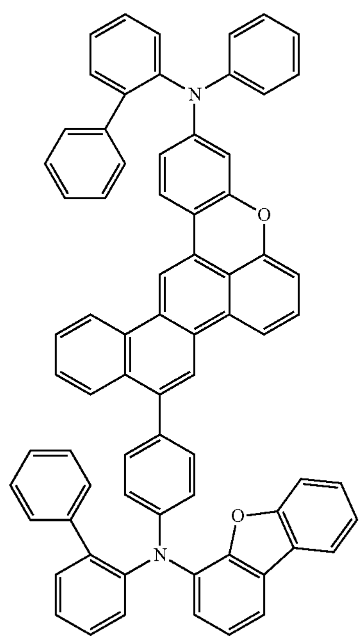

-continued
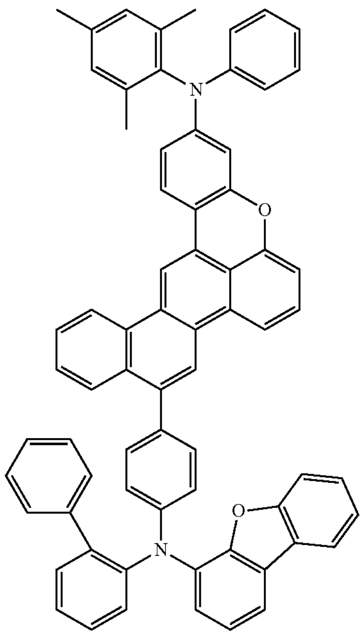
132
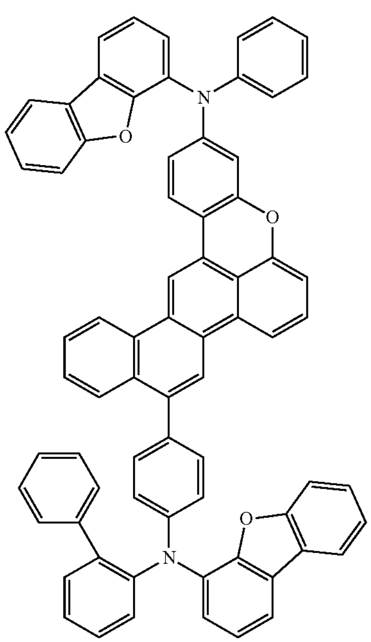
133
-continued
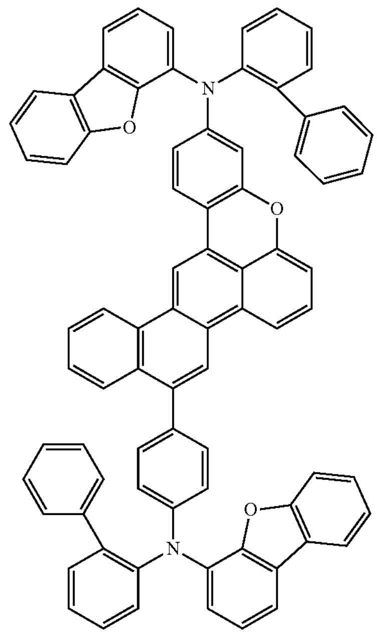
134
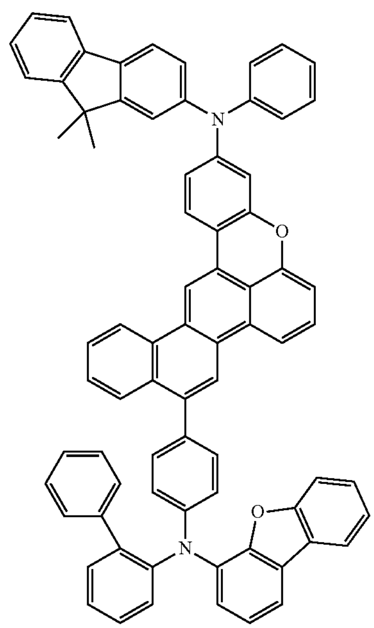
135

-continued
136
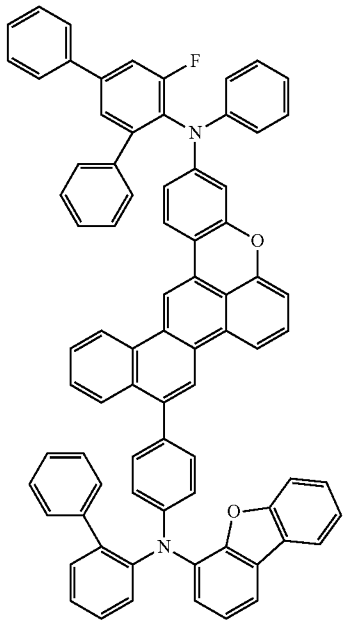
138
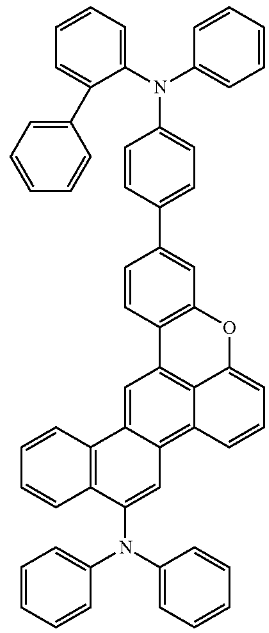
137
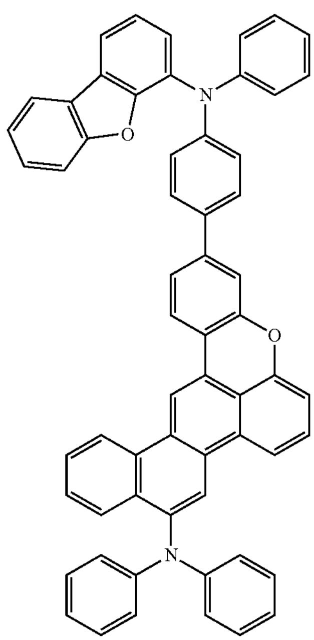
139
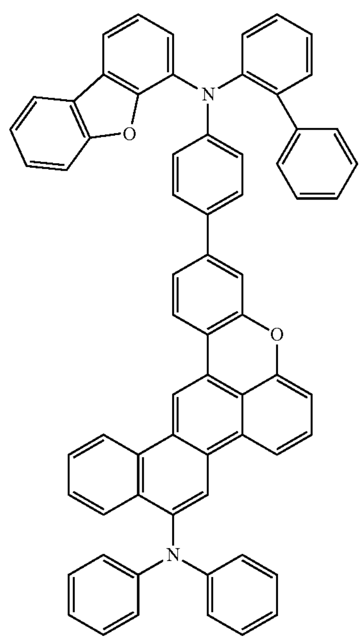

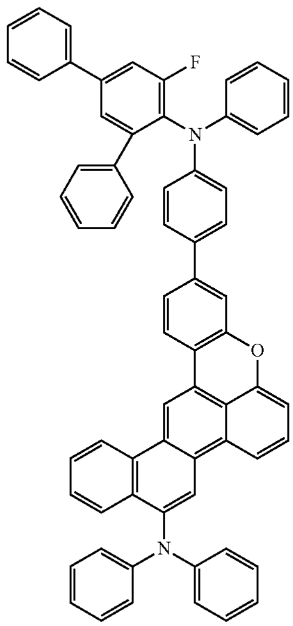
140
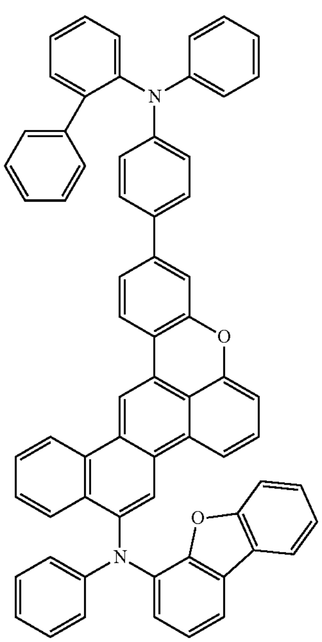
141
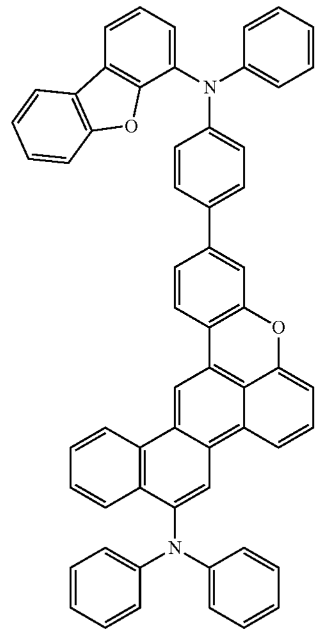
142
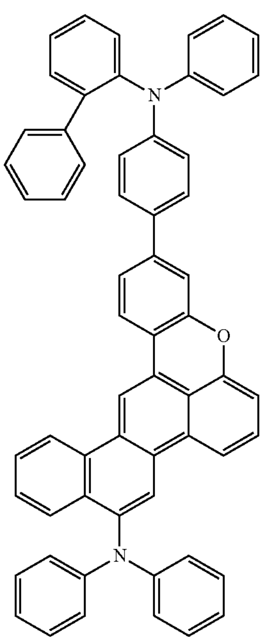
143

-continued
144
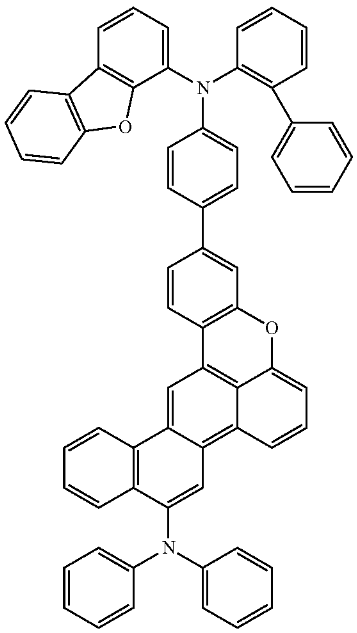
145
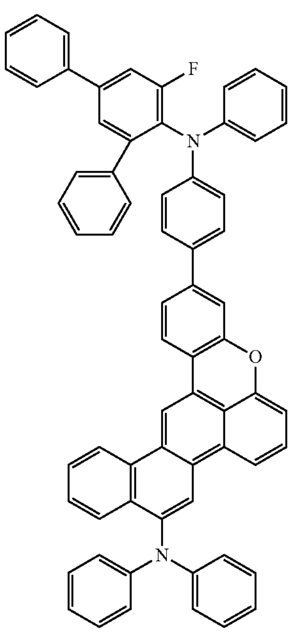
-continued
146
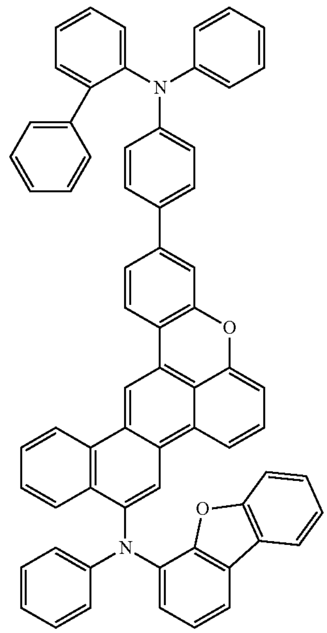
147
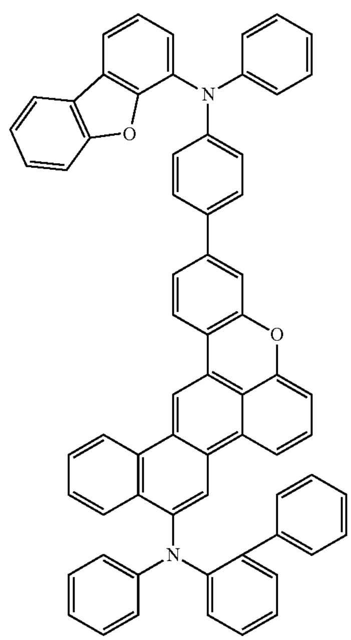

-continued
148
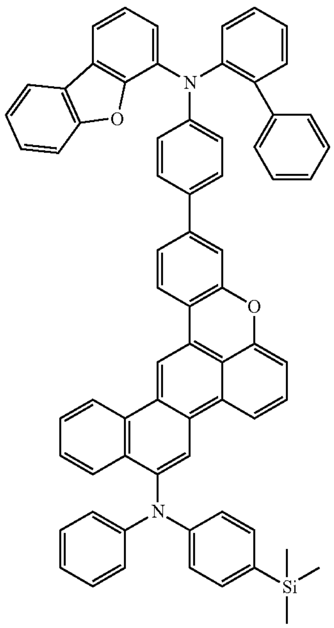
149
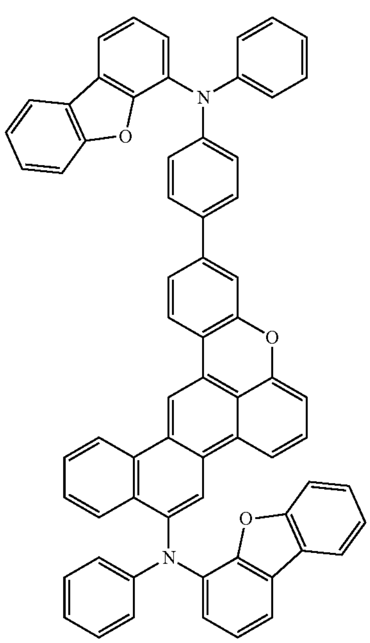
-continued
150
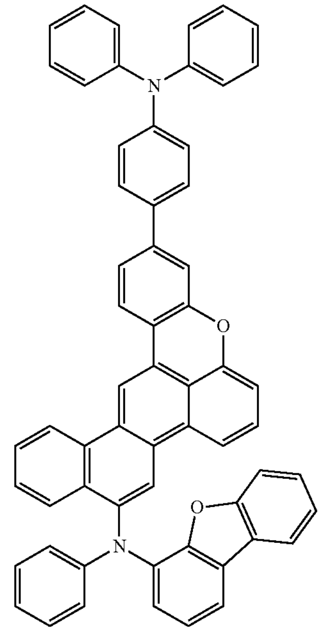
151
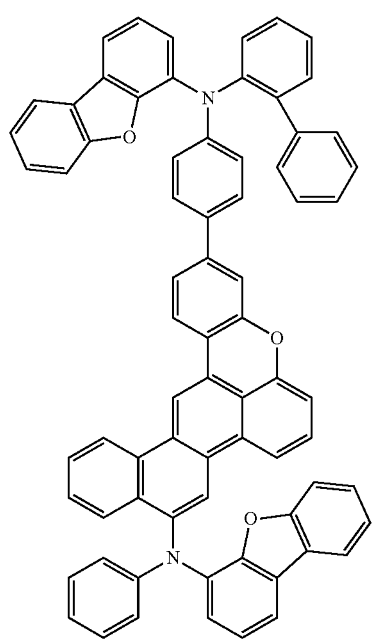

-continued
152
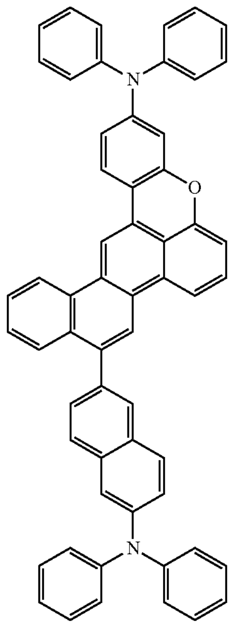
153
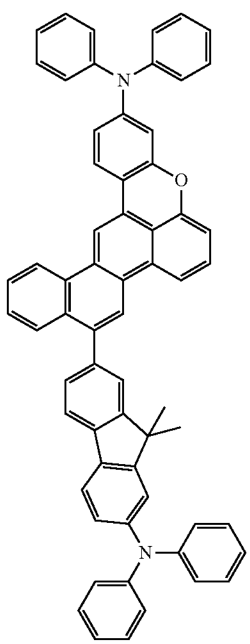
-continued
154
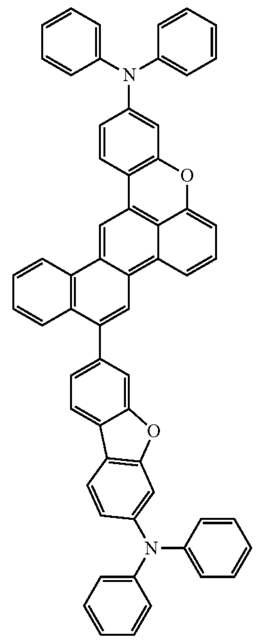
155
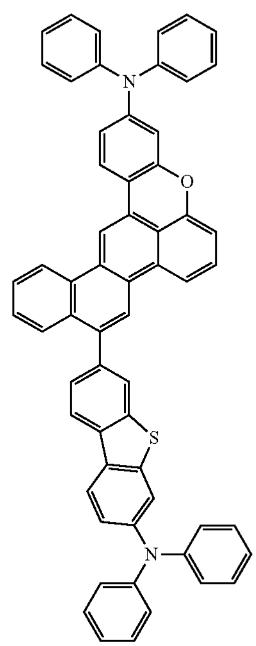

-continued
156
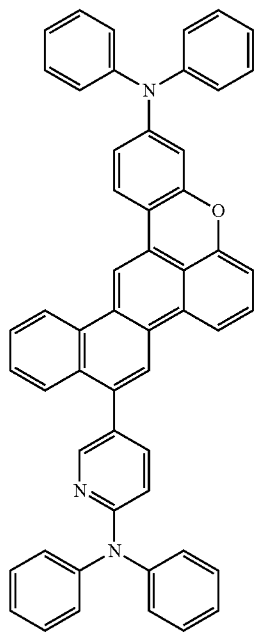
157
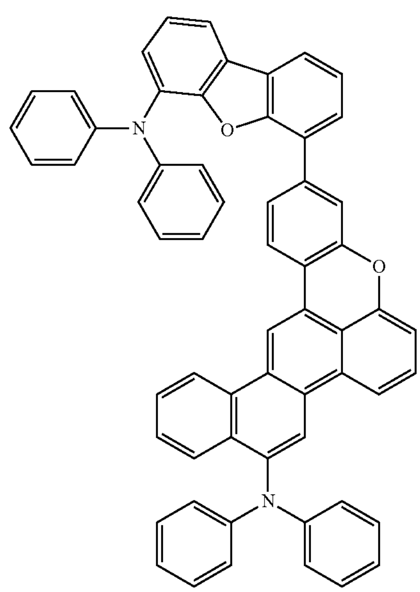
-continued
158
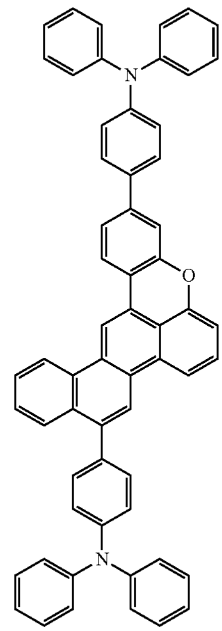
159
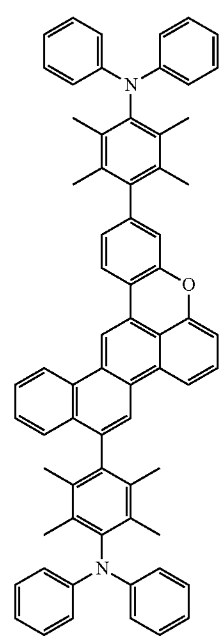

-continued

160

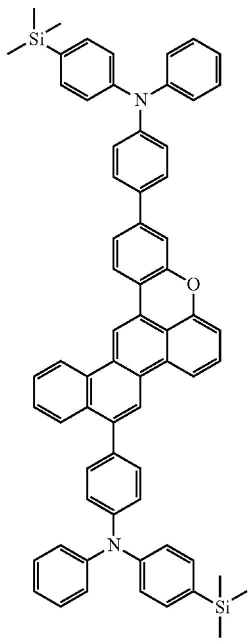

161

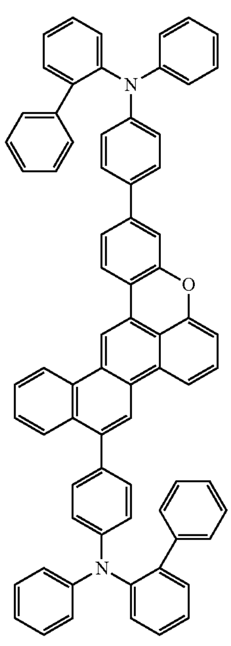

-continued

162

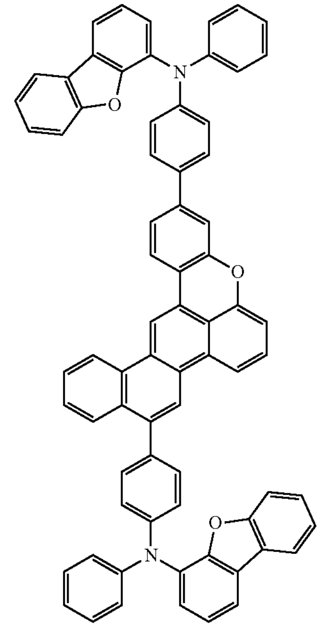

The amine-based compound represented by Formula 1 may include a core including a benzene moiety and a chrysene moiety linked via an oxygen atom or sulfur atom, as illustrated by Formula 1'.

Formula 1′

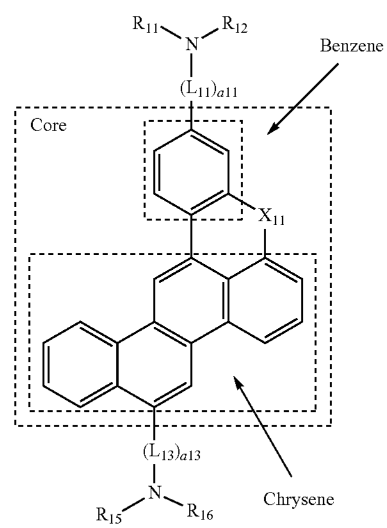

As illustrated in Formula 1', benzene and chrysene moieties in the amine-based compound are linked by $X_{11}$ (where $X_{11}$ is an oxygen atom or sulfur atom), so that π-electrons in the core of the amine-based compound are delocalized. Additional delocalization of π-electrons in the core of the amine-based compound represented by Formula 1' may be provided due to additional electrons from the lone pairs of electrons of $X_{11}$.

Additionally, since the core of the amine-based compound represented by Formula 1' includes abundant π-electrons, a π→π* transition and an n→π* transition are more likely to occur, for example, due to a lower transition energy.

The amine-based compound of Formula 1 may be synthesized utilizing a suitable organic synthesis method. Methods of synthesizing the amine-based compounds should be apparent to those of ordinary skill in the art and may be further understood based on the examples described below.

The amine-based compound represented by Formula 1 may be suitable for use as a dopant in an organic layer of an organic light-emitting device, for example, in an emission layer of an organic light-emitting device.

According to some embodiments of the present disclosure, an organic light-emitting device includes: a first electrode; a second electrode; and an organic layer between the first electrode and the second electrode, the organic layer including an emission layer and at least one of the amine-based compounds of Formula 1.

The organic light-emitting device including at least one of the amine-based compounds of Formula 1 in the organic layer may have high efficiency, low driving voltage, and improved lifetime characteristics.

The amine-based compound of Formula 1 may be included in a layer positioned between a pair of electrodes of an organic light-emitting device. In some embodiments, the amine-based compound of Formula 1 may be in at least one of a hole transport region positioned between the first electrode and the emission layer (where the hole transport region includes at least one of a hole injection layer, a hole transport layer, and an electron blocking layer), and an electron transport region positioned between the emission layer and the second electrode (where the electron transport region includes at least one of a hole blocking layer, an electron transport layer, and an electron injection layer). For example, the amine-based compound of Formula 1 may be in the emission layer. The emission layer may further include a host, and the amine-based compound of Formula 1 may act as a dopant in the emission layer. The emission layer may be a green emission layer emitting green light, or a red emission layer emitting red light. The dopant may be a fluorescent dopant.

As used herein, "at least one of the amine-based compounds of Formula 1" refers to "one amine-based compound represented by Formula 1, or at least two different amine-based compounds, both of which are represented by Formula 1".

In some embodiments, the organic layer may include only Compound 1 above as the amine-based compound. For example, Compound 1 may be present in the emission layer of the organic light-emitting device. In some embodiments, the organic layer may include Compounds 1 and 2 as the amine-based compounds. Compounds 1 and 2 may be both present in the same layer (for example, in the emission layer) or may be present in different layers (for example, in the emission layer and the electron transport region, respectively).

The first electrode may be an anode and may be a hole injection electrode, and the second electrode may be a cathode and may be an electron injection electrode. In some embodiments, the first electrode may be a cathode and may be an electron injection electrode, and the second electrode may be an anode and may be a hole injection electrode.

In embodiments where the first electrode is an anode, and the second electrode is a cathode, the organic layer may further include i) a hole transport region between the first electrode and the emission layer and including at least one of a hole injection layer, a hole transport layer, a buffer layer, and an electron blocking layer; and ii) an electron transport region between the emission layer and the second electrode and including at least one of a hole blocking layer, an electron transport layer, and an electron injection layer.

As used herein, the term "organic layer" refers to a single layer and/or a plurality of layers between the first and second electrodes of the organic light-emitting device. A material in the "organic layer" is not limited to an organic material, and may include, for example, an organic metal complex including a metal.

Hereinafter, a structure of an organic light-emitting device according to an embodiment of the present disclosure and a method of manufacturing the same is described with reference to the drawing.

The drawing is a schematic sectional view of an organic light-emitting device 10 according to an embodiment of the present disclosure. Referring to the drawing, the organic light-emitting device 10 includes a first electrode 110, an organic layer 150, and a second electrode 190.

A substrate may be positioned under the first electrode 110 or on the second electrode 190, as these are illustrated in the drawing. The substrate may be a glass substrate or a transparent plastic substrate with good mechanical strength, thermal stability, transparency, surface smoothness, ease of handling, and water resistance.

In some embodiments, the first electrode 110 may be formed by depositing or sputtering a first electrode-forming material on the substrate. When the first electrode 110 is an anode, a material having a high work function and capable of facilitating hole injection may be utilized as the first electrode-forming material. The first electrode 110 may be a reflective electrode, a semi-transmissive electrode, or a transmissive electrode. Materials that are transparent and conductive, such as, for example, ITO, IZO, $SnO_2$, and ZnO, may be utilized to form the first electrode. In embodiments where the first electrode 110 as a semi-transmissive electrode or a reflective electrode, the first electrode 110 may be formed of at least one material selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including a plurality of layers. For example, the first electrode 110 may have a three-layered structure of ITO/Ag/ITO, but is not limited thereto.

The organic layer 150 may be positioned on the first electrode 110. The organic layer 150 may include an emission layer (EML).

The organic layer 150 may further include a hole transport region between the first electrode and the EML. The organic layer 150 may further include an electron transport region between the EML and the second electrode.

The hole transport region may include at least one selected from a hole injection layer (HIL), a hole transport layer (HTL), a buffer layer, and an electron blocking layer (EBL). The electron transport region may include at least one selected from a hole blocking layer (HBL), an electron transport layer (ETL), and an electron injection layer (EIL). However, embodiments of the present disclosure are not limited thereto.

The hole transport region may have a single-layered structure including a single material, a single-layered structure including a plurality of materials (e.g. a plurality of different materials), or a multi-layered structure including a plurality of layers including different materials.

In some embodiments, the hole transport region may have a single-layered structure including a plurality of materials, or a multi-layered structure of HIL/HTL, HIL/HTL/buffer layer, HIL/buffer layer, HTL/buffer layer, or HIL/HTL/EBL, where the layers forming a multi-layered structure are sequentially stacked on the first electrode 110 in the order stated above. However, embodiments of the present disclosure are not limited thereto.

When the hole transport region includes a HIL, the HIL may be formed on the first electrode 110 by any of a variety of methods, for example, by vacuum deposition, spin coating, casting, Langmuir-Blodgett (LB) deposition, inkjet printing, laser printing, laser induced thermal imaging (LITI), or the like.

When the HIL is formed by vacuum deposition, the deposition conditions may vary depending on the material for forming the HIL and the structure of the HIL to be formed. For example, the deposition conditions may include a deposition temperature of about 100° C. to about 500° C., a degree of vacuum of about $10^{-8}$ to about $10^{-3}$ torr, and a deposition rate of about 0.01 to about 100 Å/sec.

When the HIL is formed using spin coating, the coating conditions may vary depending on the material for forming the HIL and the structure of the HIL to be formed. For example, the coating conditions may include a coating rate of about 2,000 rpm to about 5,000 rpm and a heat treatment temperature of about 800° C. to about 200° C.

When the hole transport region includes a HTL, the HTL may be formed on the first electrode 110 or on the HIL by any of a variety of methods, for example, by vacuum deposition, spin coating, casting, Langmuir-Blodgett (LB) deposition, inkjet printing, laser printing, laser induced thermal imaging (LITI), or the like. When the HTL is formed using vacuum deposition or spin coating, the conditions for deposition and coating may be similar to the above-described deposition and coating conditions for forming the HIL.

In some embodiments, the hole transport region may include at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl) triphenylamine (TCTA). polyaniline/dodecylbenzene sulfonic acid (Pani/DBSA), poly(3,4-ethylenedioxythiophene) poly(4-styrenesulfonate)(PEDOT/PSS), polyaniline/camphor sulfonic acid (Pani/CSA), polyaniline/poly(4-styrenesulfonate) (PANI/PSS), a compound represented by Formula 201 below, and a compound represented by Formula 202 below.

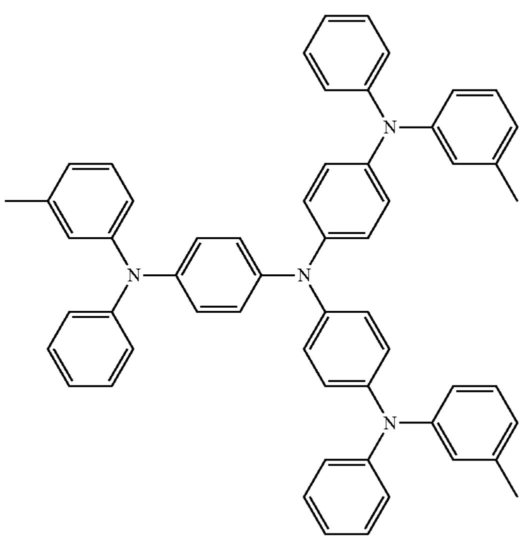

m-MTDATA

-continued

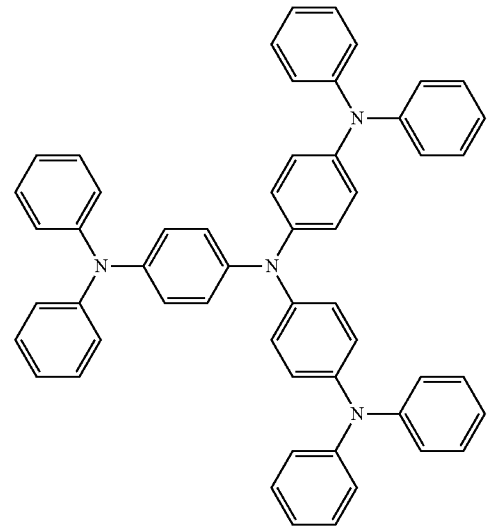

TDATA

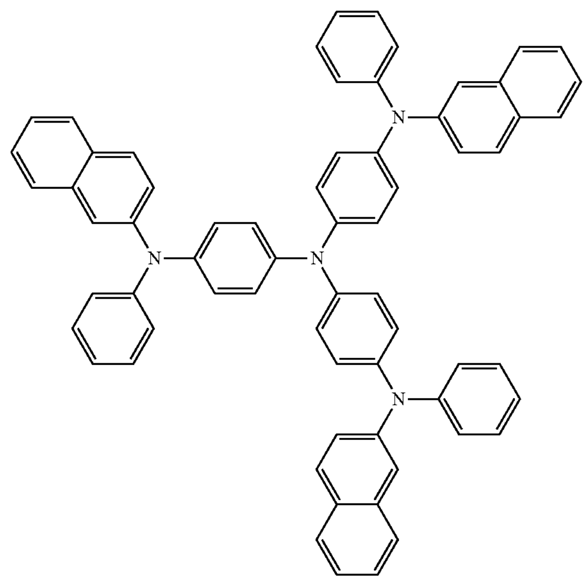

2-TNATA

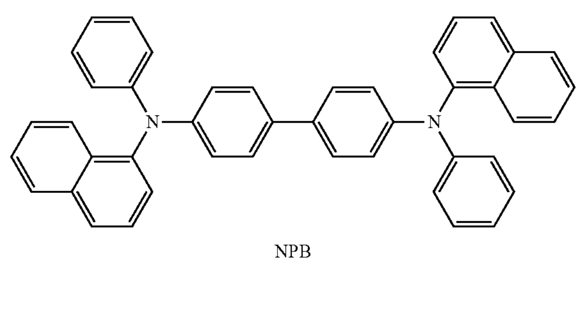

NPB

-continued

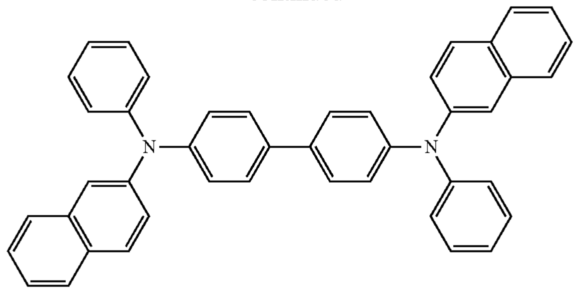

β-NPB

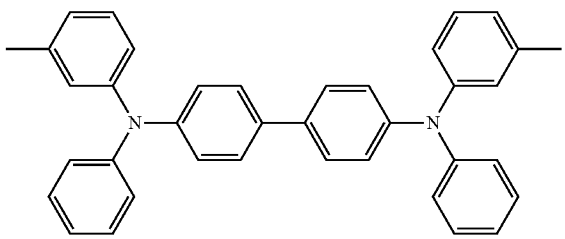

TPD

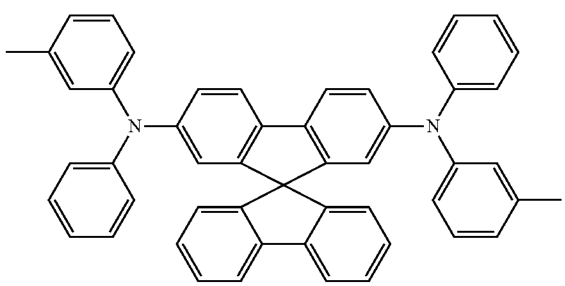

Spiro-TPD

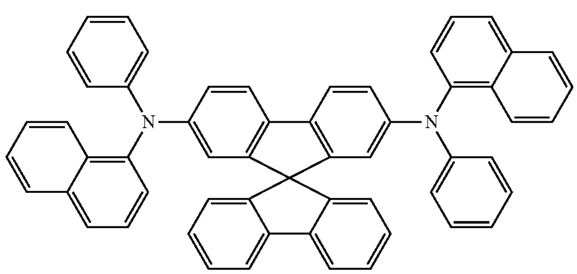

Spiro-NPB

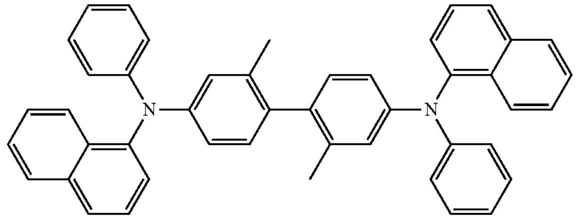

methylated NPB

-continued

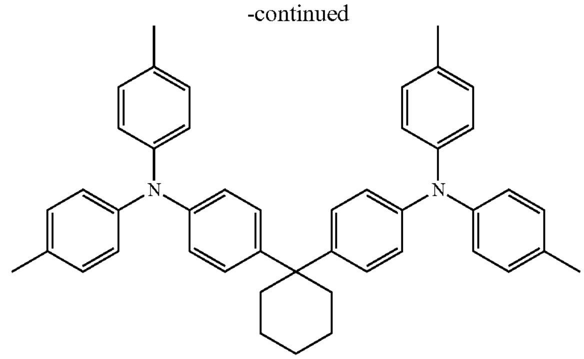

TAPC

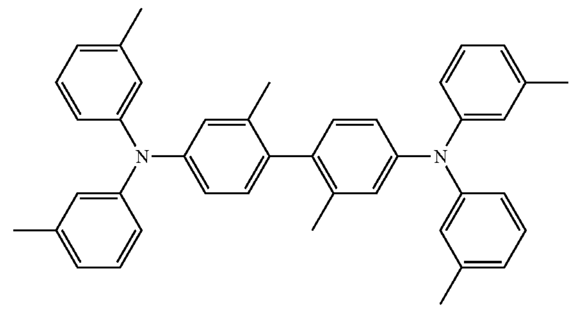

HMTPD

Formula 201

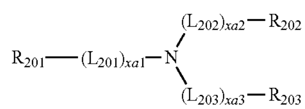

Formula 202

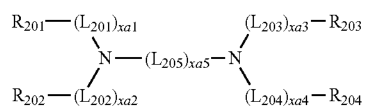

In Formulae 201 and 202, $L_{201}$ to $L_{205}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted a divalent non-aromatic condensed polycyclic group, and the divalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{201}$)($Q_{202}$), —Si($Q_{203}$)($Q_{204}$)($Q_{205}$), and —B($Q_{206}$)($Q_{207}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{211}$)($Q_{212}$), —Si($Q_{213}$)($Q_{214}$)($Q_{215}$), and —B($Q_{216}$)($Q_{217}$), and —N($Q_{221}$)($Q_{222}$), —Si($Q_{223}$)($Q_{224}$)($Q_{225}$), and —B($Q_{226}$)($Q_{227}$);

xa1 to xa4 may be each independently selected from 0, 1, 2, and 3;

xa5 may be selected from 1, 2, 3, 4, and 5;

$R_{201}$ to $R_{204}$ may be each independently selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{231}$)($Q_{232}$), —Si($Q_{233}$)($Q_{234}$)($Q_{235}$), and —B($Q_{236}$)($Q_{237}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{241}$)($Q_{242}$), —Si($Q_{243}$)($Q_{244}$)($Q_{245}$), and —B($Q_{246}$)($Q_{247}$);

$Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201 and 202, $L_{201}$ to $L_{205}$ may be each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3; and $R_{201}$ to $R_{204}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In some embodiments, the compound of Formula 201 may be a compound represented by Formula 201A below:

Formula 201A

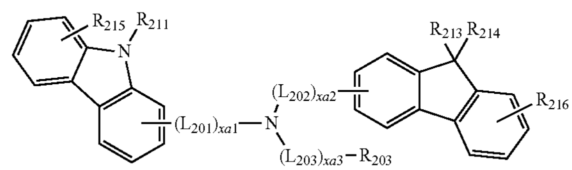

In some embodiments, the compound of Formula 201 may be a compound represented by Formula 201A-1, but the compound of Formula 201 is not limited thereto:

Formula 201A-1

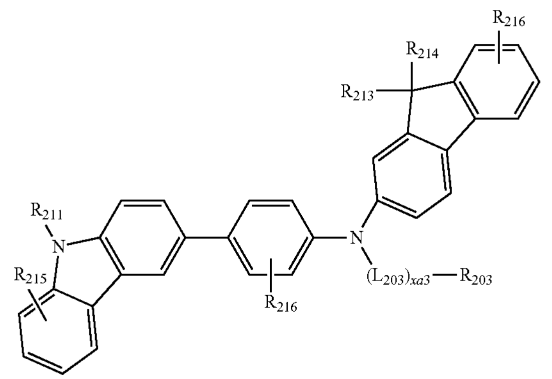

The compound of Formula 202 may be a compound represented by Formula 202A, but compound of Formula 202 is not limited thereto:

Formula 202A

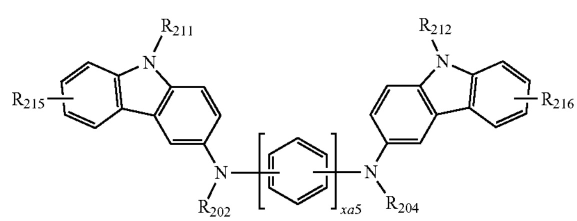

In Formulae 201A, 201A-1, and 202A, $L_{201}$ to $L_{203}$, xa1 to xa3, xa5, and $R_{202}$ to $R_{204}$ may be as described above, $R_{211}$ and $R_{212}$ may be defined as described above in connection with $R_{203}$, $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be linked to each other to form a saturated or unsaturated ring.

The compound of Formula 201 and the compound of Formula 202 may each independently be selected from Compounds HT1 to HT20, but are not limited thereto.

HT1

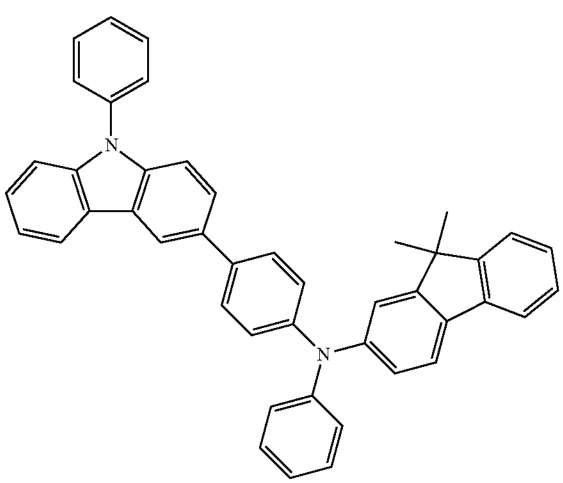

-continued

HT2

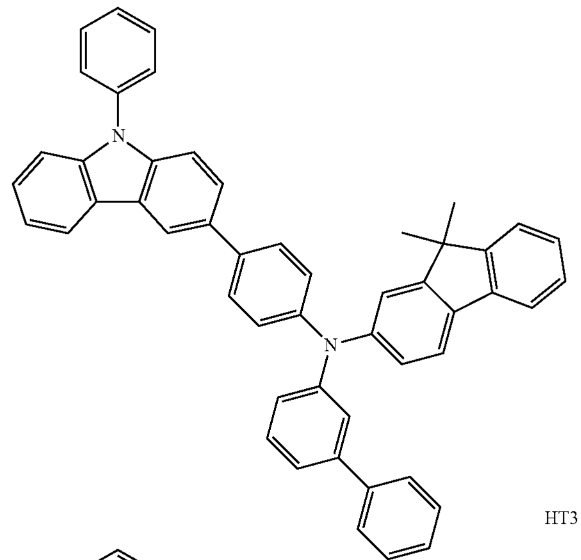

HT3

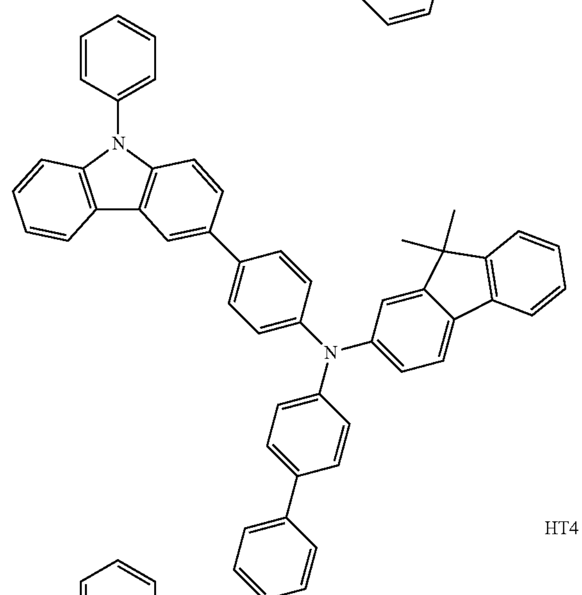

HT4

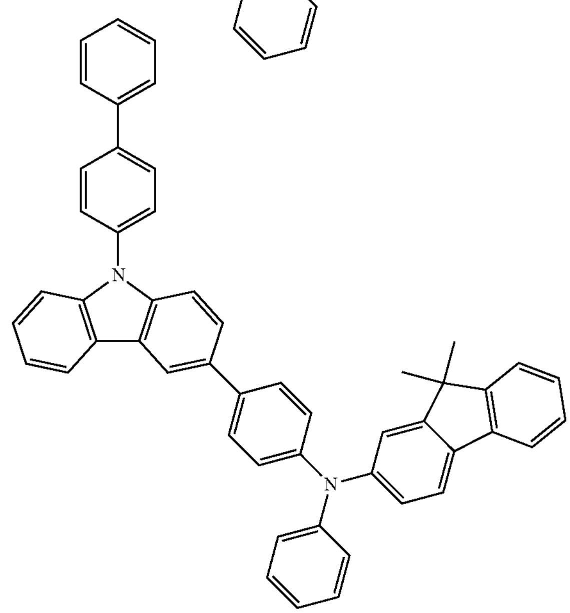

-continued
HT5
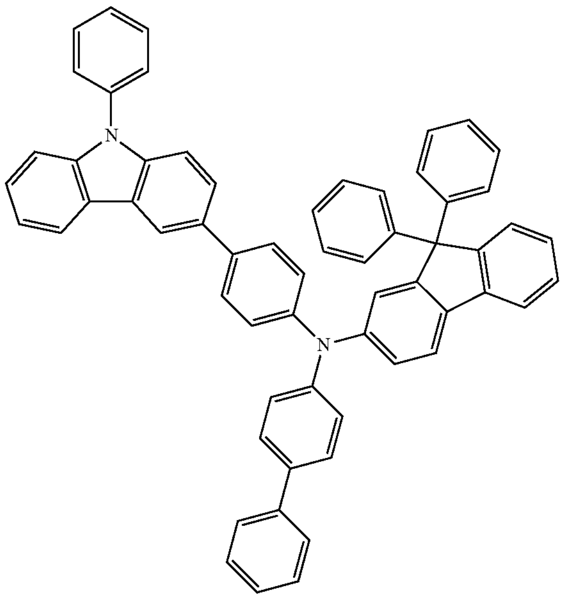
HT6
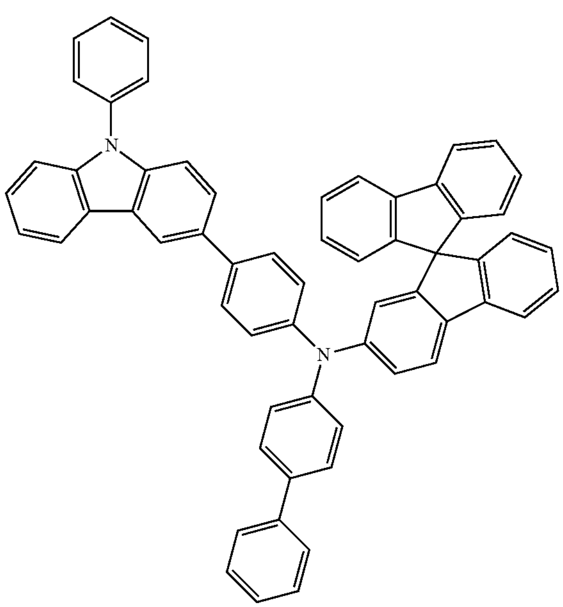
-continued
HT7
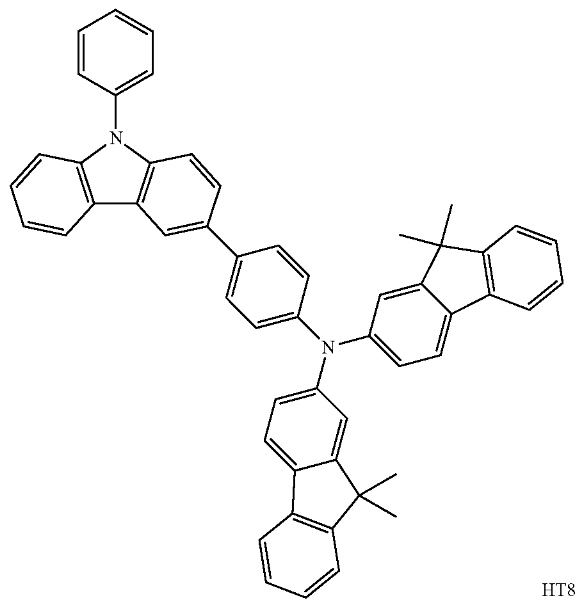
HT8
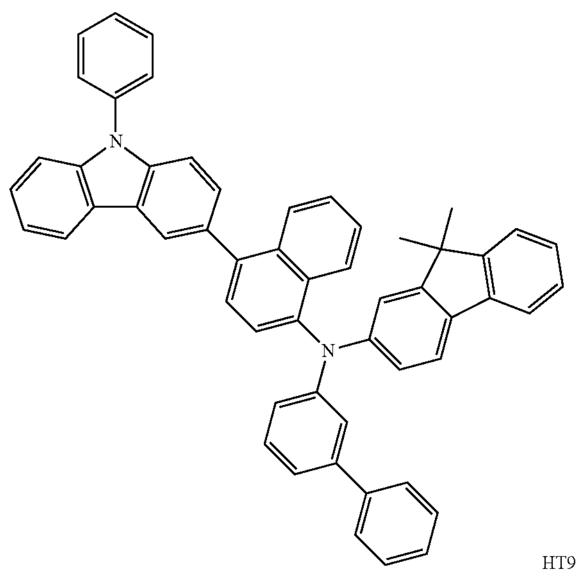
HT9
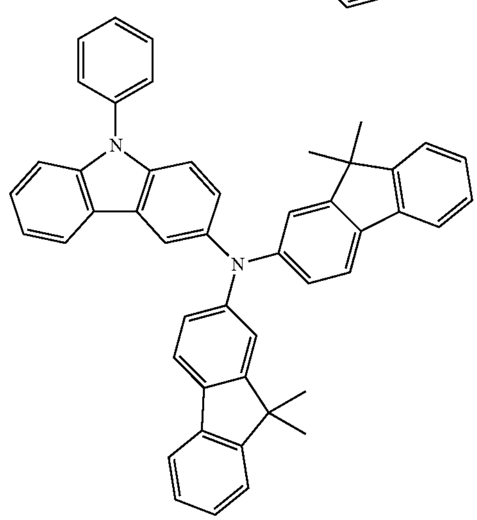

-continued
HT10
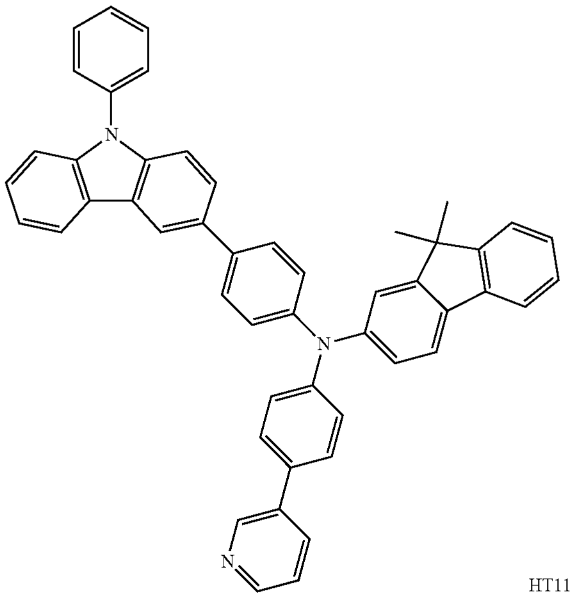
HT11
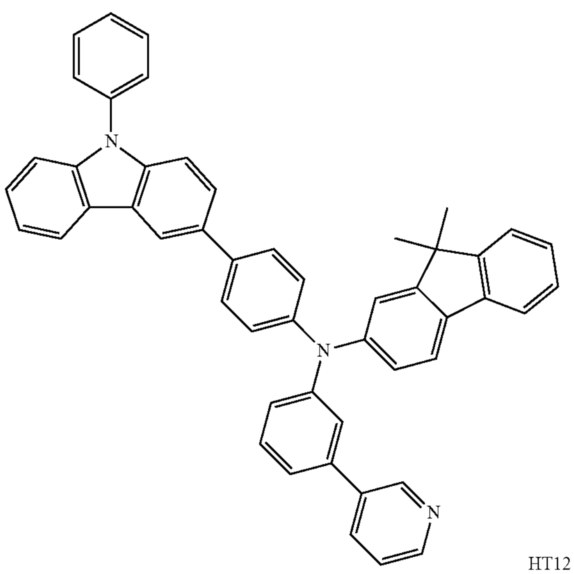
HT12
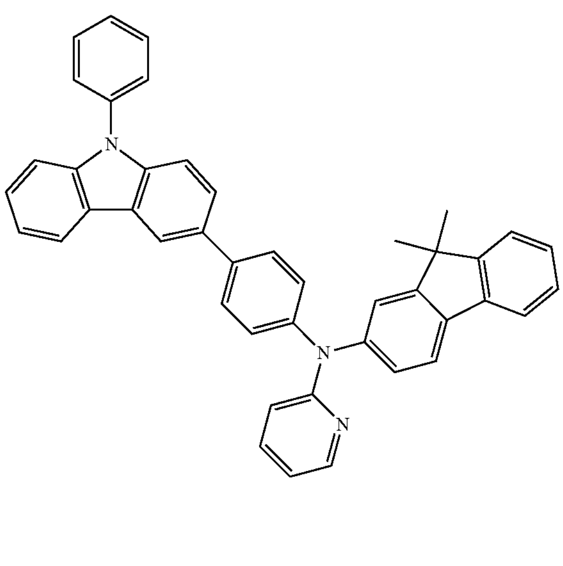
-continued
HT13
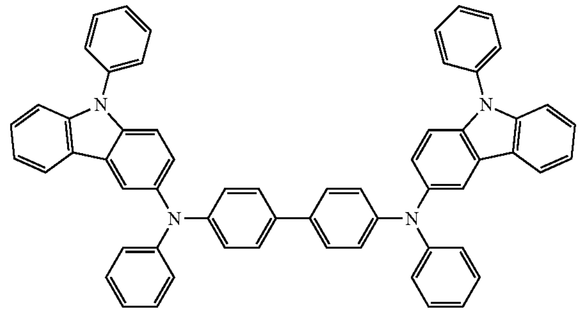
HT14
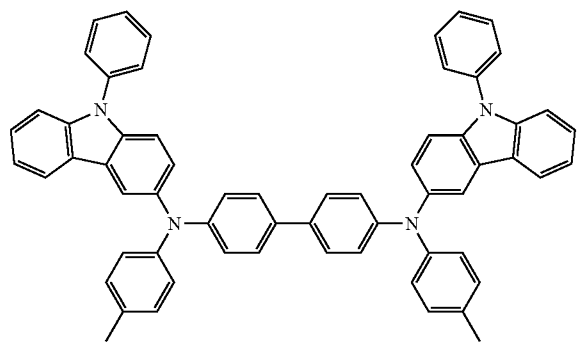
HT15
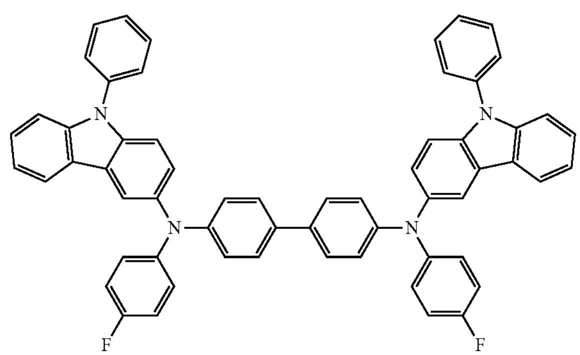
HT16
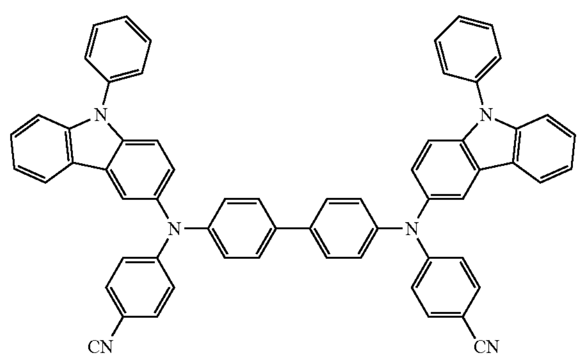

-continued

HT17

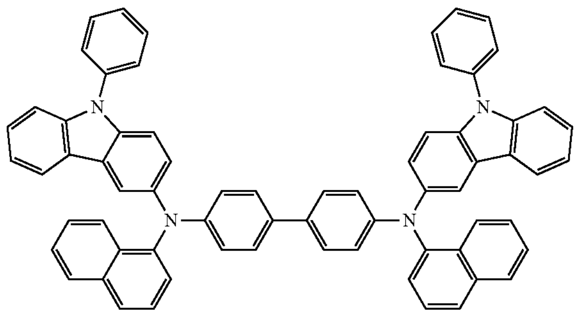

HT18

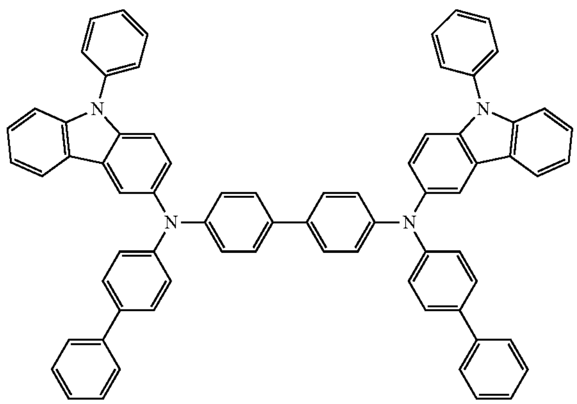

HT19

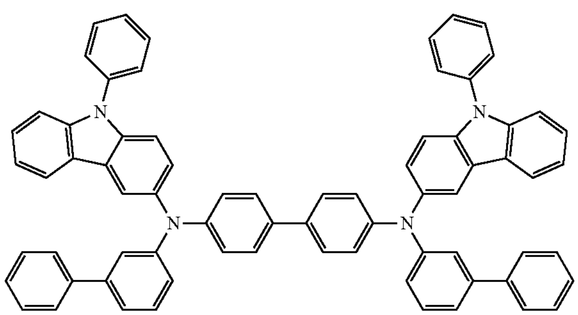

HT20

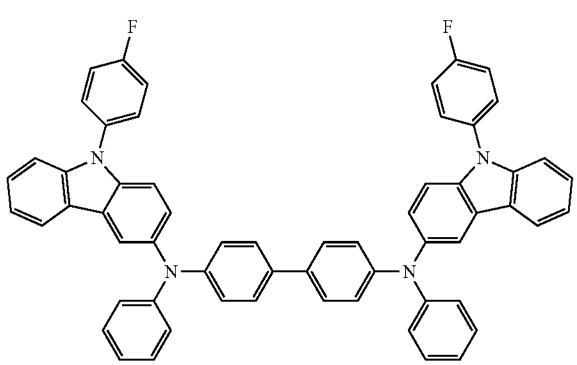

A thickness of the hole transport region may be from about 100 Å to about 10,000 Å, and in some embodiments, from about 100 Å to about 1,000 Å. When the hole transport region includes both a HIL and a HTL, a thickness of the HIL may be from about 100 Å to about 10,000 Å, and in some embodiments, from about 100 Å to about 1,000 Å, and a thickness of the HTL may be from about 50 Å to about 2,000 Å, and in some embodiments, from about 100 Å to about 1,500 Å. In some embodiments, the thickness of the HIL may be from about 100 Å to about 9,950 Å, and in some embodiments, from about 100 Å to about 950 Å, and the thickness of the HTL may be from about 50 Å to about 2,000 Å, and in some embodiments, from about 100 Å to about 1,500 Å. When the thicknesses of the hole transport region, the HIL, and the HTL are within any of these ranges, satisfactory hole transport characteristics may be obtained without a substantial increase in driving voltage.

The hole transport region may further include a charge-generating material to improve conductivity, in addition to the materials described above. The charge-generating material may be homogeneously or inhomogeneously dispersed in the hole transport region.

The charge-generating material may be, for example, a p-dopant. The p-dopant may be one of quinone derivatives, metal oxides, and cyano group-containing compounds, but is not limited thereto. Non-limiting examples of the p-dopant include quinone derivatives such as tetracyanoquinonedimethane (TCNQ), 2,3,5,6-tetrafluoro-7,7,8,8-tetracyanoquinodimethane (F4-TCNQ), and the like; metal oxides such as tungsten oxide, molybdenum oxide, and the like; and a Compound HT-D1.

Compound HT-D1

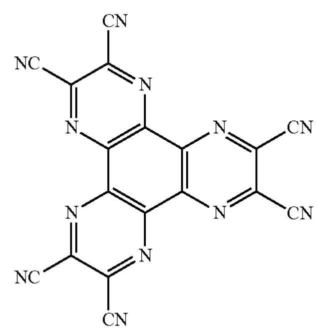

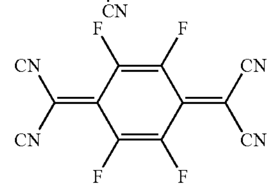

F4-TCNQ

The hole transport region may further include at least one selected from a buffer layer and an EBL, in addition to the HIL and HTL described above. The buffer layer may compensate for an optical resonance distance of light according to a wavelength of the light emitted from the EML, and thus may improve light-emission efficiency. A material in the buffer layer may be any suitable material that can be utilized in the hole transport region. The EBL may block migration of electrons from the electron transport region into the EML.

The EML may be formed on the first electrode 110 or on the hole transport region by any of a variety of methods, for example, by vacuum deposition, spin coating, casting, Langmuir-Blodgett (LB) deposition, inkjet printing, laser printing, laser induced thermal imaging (LITI), or the like. When the EML is formed by vacuum deposition or spin coating, the deposition and coating conditions for forming the EML may be similar to the above-described deposition and coating conditions for forming the HIL.

When the organic light-emitting device 10 is a full color organic light-emitting device, the EML may be patterned into a red emission layer, a green emission layer, and a blue emission layer, each of which corresponds to an individual subpixel. In some embodiments, the EML may emit white light and may have a structure in which a red emission layer, a green emission layer and a blue emission layer are stacked upon one another, or a structure in which a red light-emitting material, a green light-emitting material, and a blue light-emitting material are mixed, without separation of layers for the different color emission. In some embodiments, the EML may be a white EML. The white EML may further include a color conversion layer or a color filter to convert white light into light of a desired color.

The EML may include a host and a dopant.

In some embodiments, the host may include a compound represented by Formula 301.

$$Ar_{301}\text{-}[(L_{301})_{xb1}\text{-}R_{301}]_{xb2} \qquad \text{Formula 301}$$

In Formula 301, $Ar_{301}$ may be selected from a naphthalene, a heptalene, a fluorene, a Spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (where $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

$L_{301}$ may be defined as $L_{201}$ described above;

$R_{301}$ may be selected from a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and xb2 may be selected from 1, 2, 3, and 4.

For example, in Formula 301, $L_{301}$ may be selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group. However, embodiments of the present disclosure are not limited thereto.

The compound of Formula 301 may include at least one of Compounds H1 to H25. However, embodiments of the present disclosure are not limited thereto:

H1

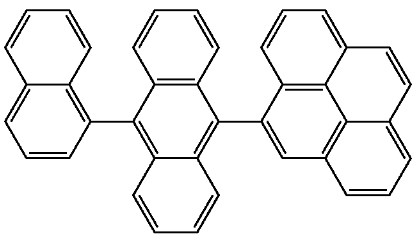

H2

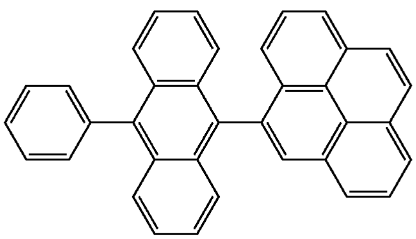

H3

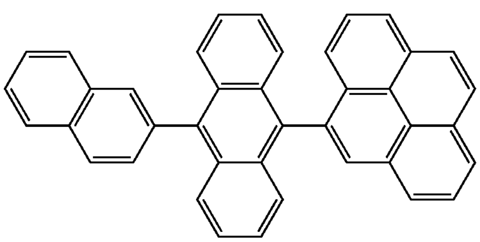

H4

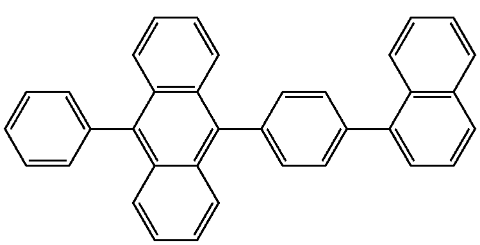

-continued

H5

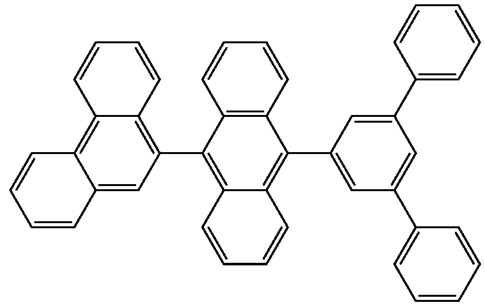

H6

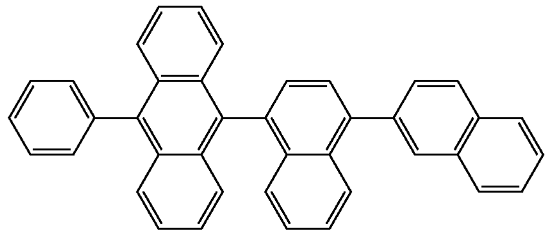

H7

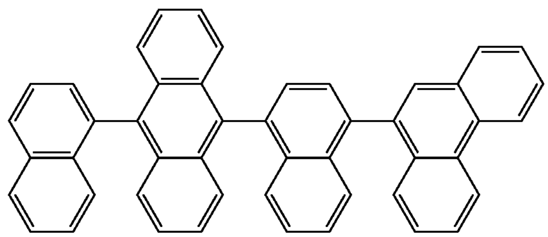

H8

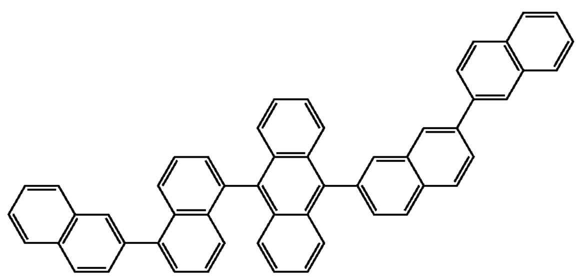

H9

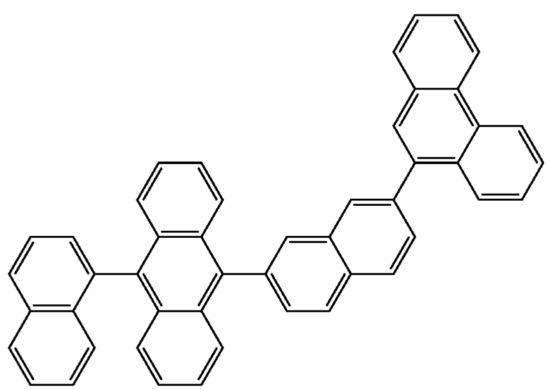

-continued
H10
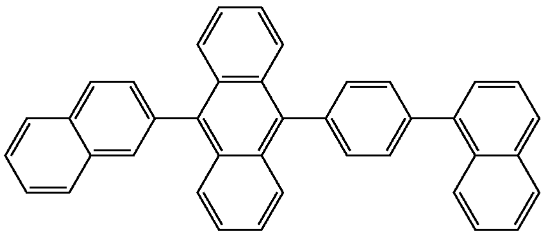
H11
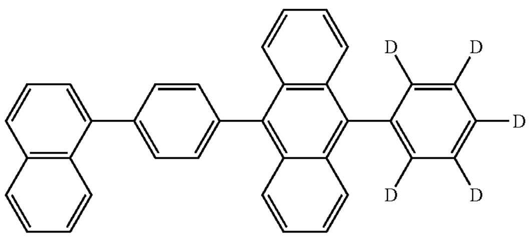
H12
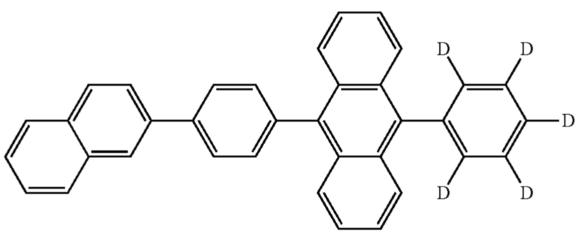
H13
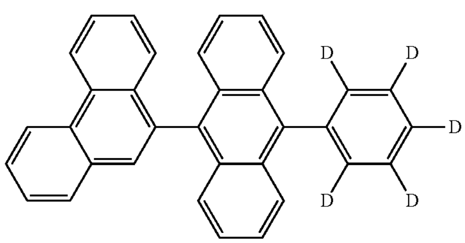
H14
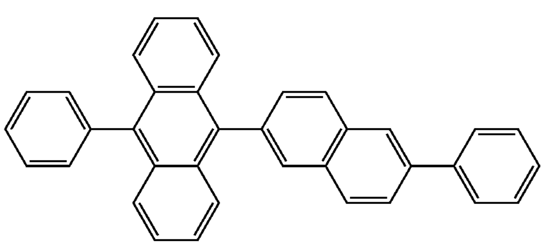
H15
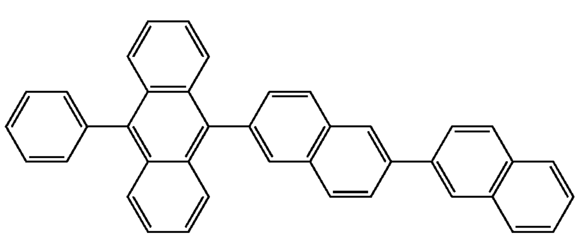
-continued
H16
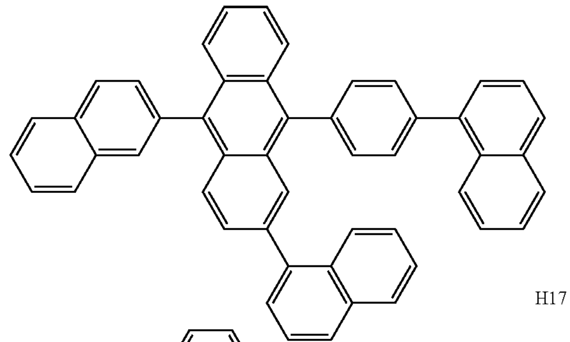
H17
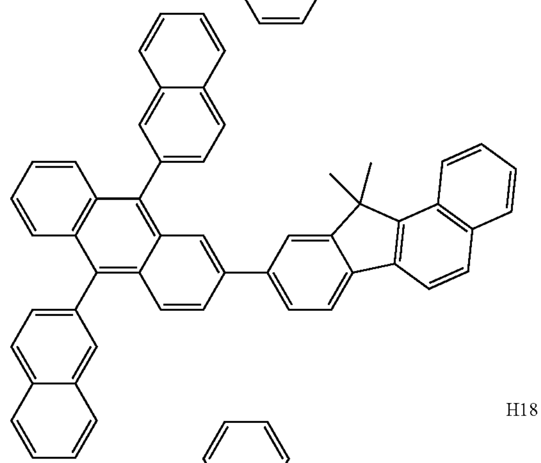
H18
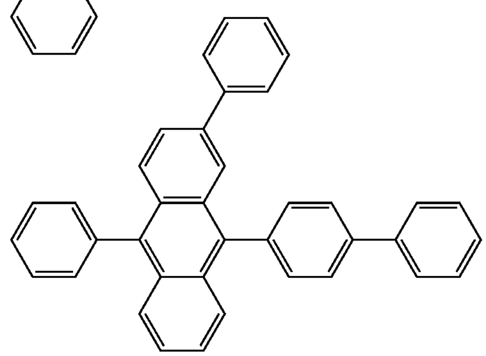
H19
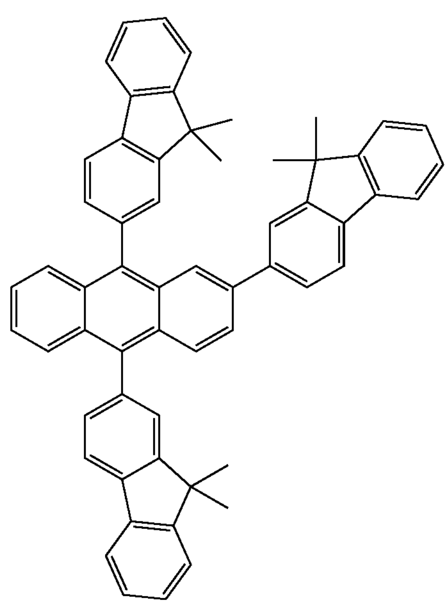

-continued
H20
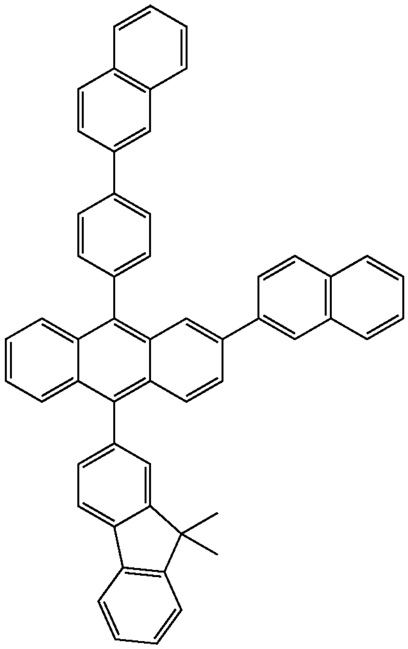
H21
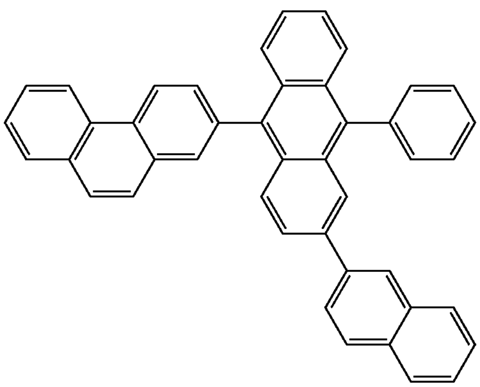
H22
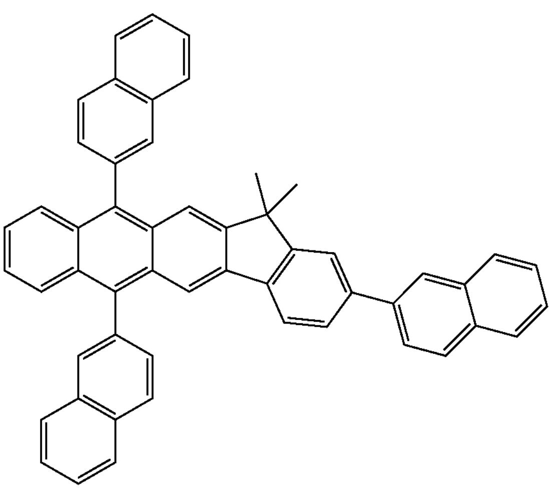
-continued
H23
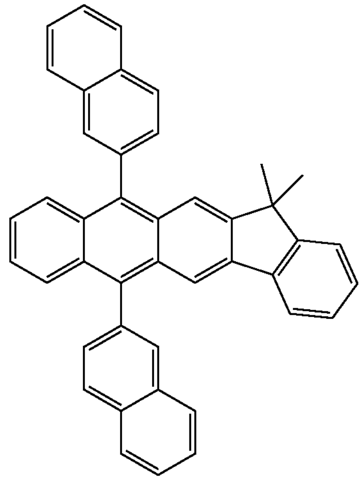
H24
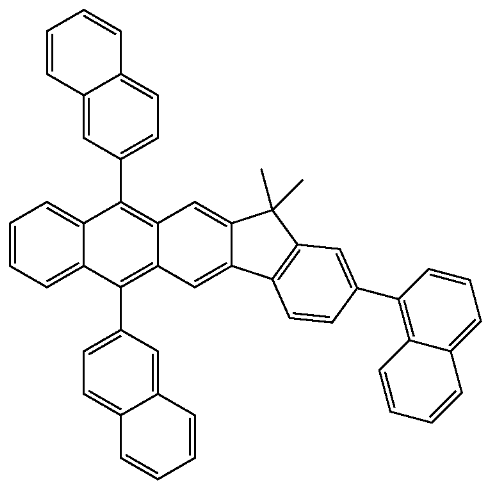
H25
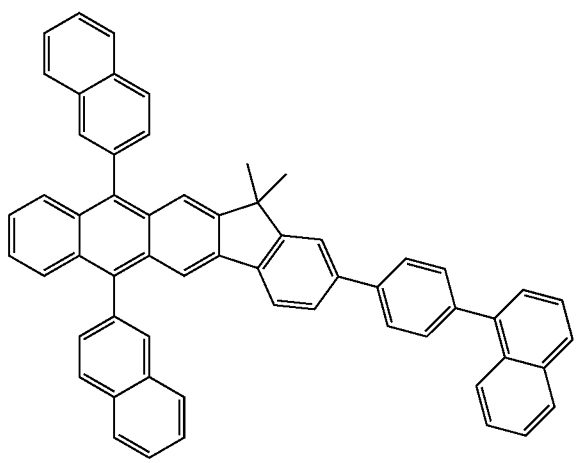
In some embodiments, the host may include at least one of Compounds H26 to H32, but is not limited thereto.

-continued
H26
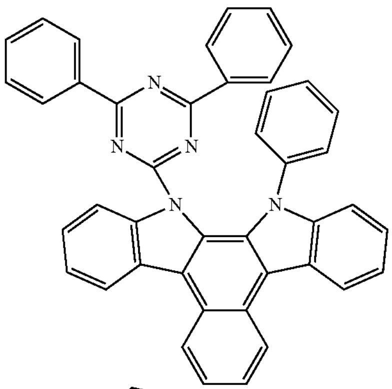
H27
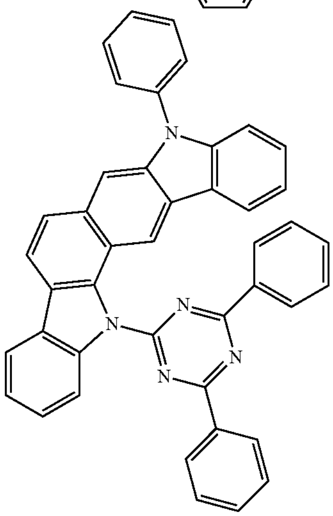
H28
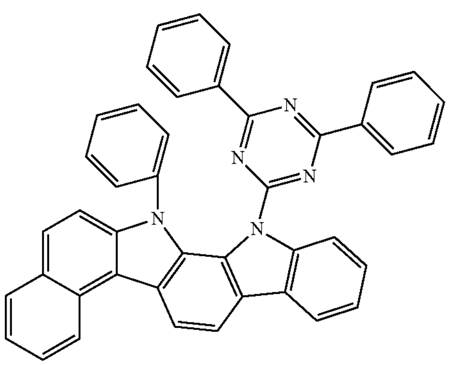
H29
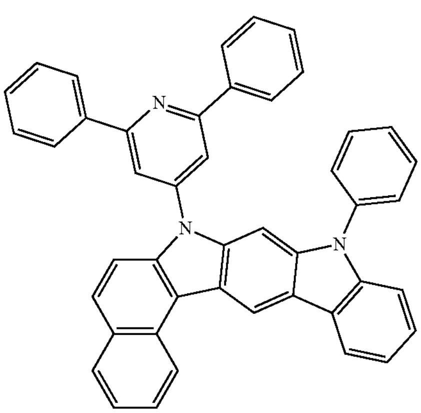
H30
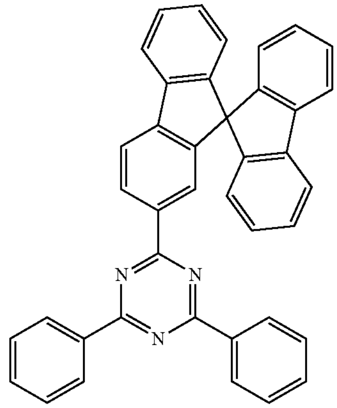
H31
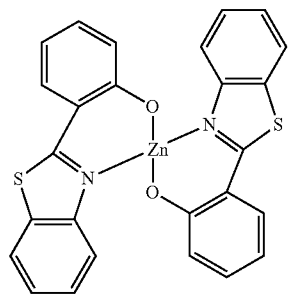
H32
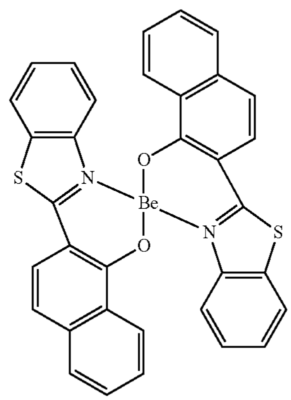
In some embodiments, the host may include an anthracene-based compound represented by Formula 2.
Formula 2
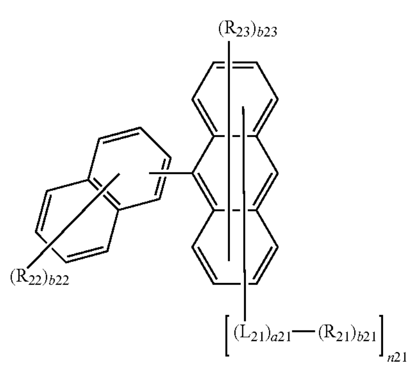

In Formula 2, $L_{21}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 may be selected from 0, 1, 2, and 3, and when a21 is 2 or more, the plurality of $L_{21}$s may be the same as or different from each other;

$R_{21}$ to $R_{23}$ may be each independently selected from a hydrogen, a deuterium, F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

b21 to b23 may be each independently selected from 1, 2, 3, 4, 5, and 6;

n21 may be selected from 1, 2, and 3; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted a divalent non-aromatic condensed polycyclic group, the substituted a divalent non-aromatic condensed heteropolycyclic group, the substituted $C_1$-$C_{60}$ alkyl group, the substituted $C_2$-$C_{60}$ alkenyl group, the substituted $C_1$-$C_{60}$ alkoxy group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$, and —$N(Q_{31})(Q_{32})$, —$Si(Q_{33})(Q_{34})(Q_{35})$, and —$B(Q_{36})(Q_{37})$, where $Q_1$ to $Q_7$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 2, $L_{21}$ may be selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group. However, embodiments of the present disclosure are not limited thereto.

In some embodiments, in Formula 2, $L_{21}$ may be selected from a phenylene group, a naphthylene group, a fluorenylene group, a phenanthrenylene group, an anthracenylene group, a triphenylenylene group, a carbazolylene group, a dibenzofuranylene group, and a dibenzothiophenylene group, and a phenylene group, a naphthylene group, a fluorenylene group, a phenanthrenylene group, an anthracenylene group, a triphenylenylene group, a carbazolylene group, a dibenzofuranylene group, and a dibenzothiophenylene group, each substituted with at least one selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In some embodiments, in Formula 2, $L_{21}$ may be selected from groups represented by Formulae 3-1 to 3-8 and Formulae 3-22 to 3-29, but $L_{21}$ is not limited thereto.

3-1

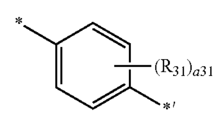

3-2

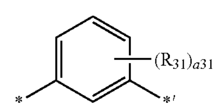

3-3

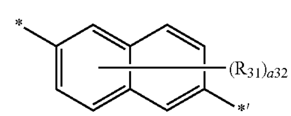

3-4

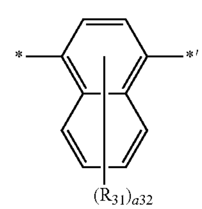

3-5

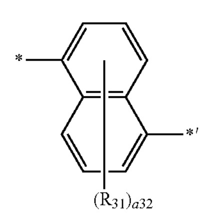

-continued 3-6

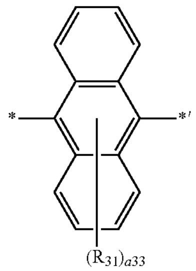

3-7

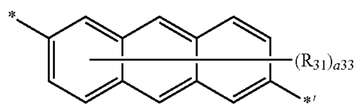

3-8

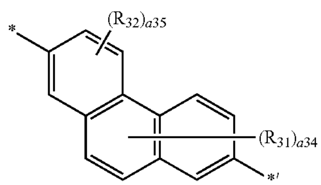

3-22

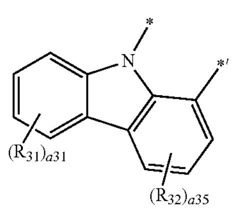

3-23

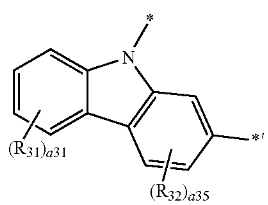

3-24

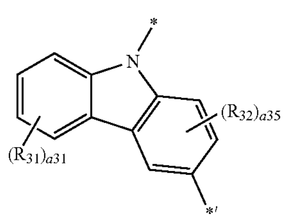

3-25

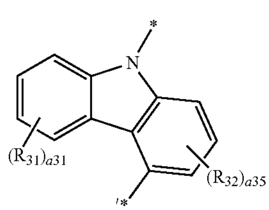

3-26

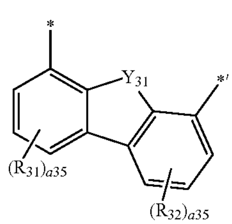

-continued 3-27

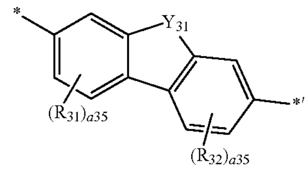

3-28

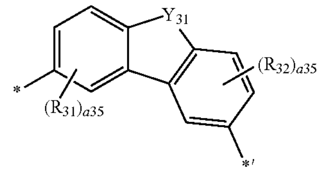

3-29

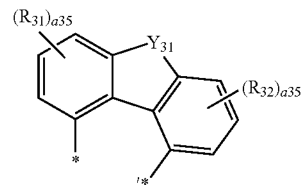

In Formulae 3-1 to 3-8 and Formulae 3-22 to 3-29, $Y_{31}$ may be selected from $C(R_{33})(R_{34})$, $N(R_{33})$, O, S, and $Si(R_{33})(R_{34})$;

$R_{31}$ to $R_{34}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 may be selected from 1, 2, 3, and 4;

a32 may be selected from 1, 2, 3, 4, 5, and 6;

a33 may be selected from 1, 2, 3, 4, 5, 6, 7, and 8;

a34 may be selected from 1, 2, 3, 4, and 5;

a35 may be selected from 1, 2, and 3; and

* and *' may each independently indicate a binding site with an adjacent atom.

In some embodiments, $L_{21}$ in Formula 2 may be a group represented by one of Formulae 3-1 to 3-8 and Formulae 3-22 to 3-29, and $R_{31}$ to $R_{34}$ in Formulae 3-1 to 3-8 and Formulae 3-22 to 3-29 may be each independently selected from a hydrogen, a deuterium, —F, —Cl, —Br, —I, a methyl group, an ethyl group, a tert-butyl group, a methoxy group, an ethoxy group, a tert-butoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group. However, embodiments of the present disclosure are not limited thereto.

In some embodiments, $L_{21}$ in Formula 2 may be selected from groups represented by Formulae 4-1 to 4-11 and Formulae 4-31 to 4-54, but is not limited thereto.

4-1
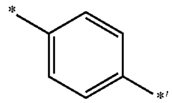
4-2
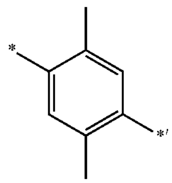
4-3
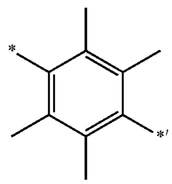
4-4
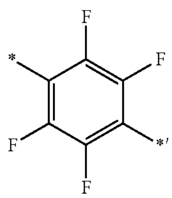
4-5
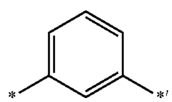
4-6
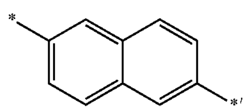
4-7
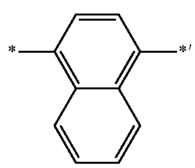
4-8
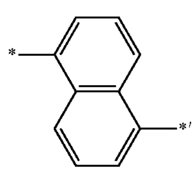
4-9
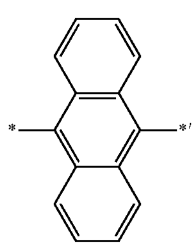
4-10
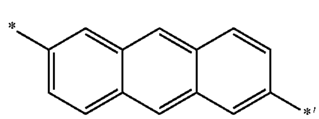
-continued
4-11
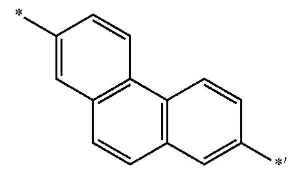
4-31
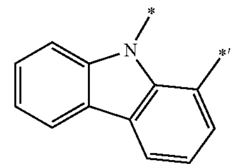
4-32
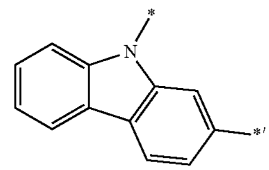
4-33
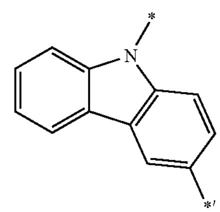
4-34
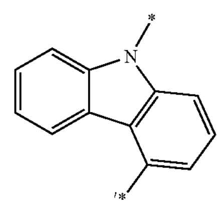
4-35
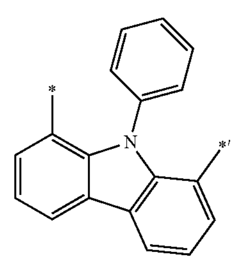
4-36
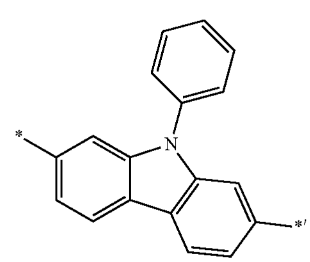

-continued
4-37
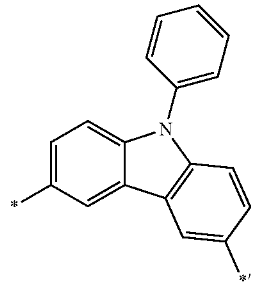
4-38
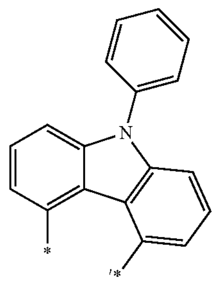
4-39
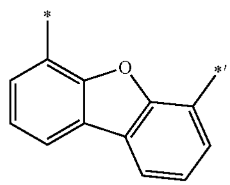
4-40
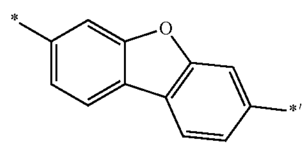
4-41
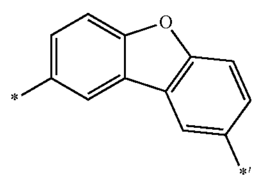
4-42
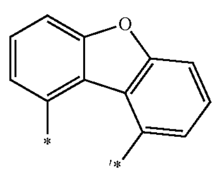
4-43
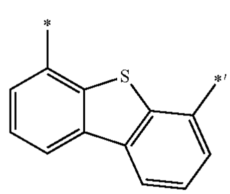
4-44
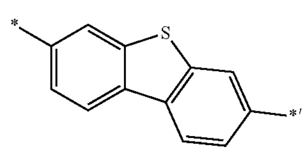
-continued
4-45
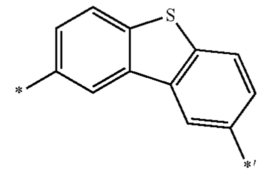
4-46
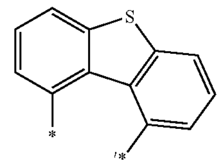
4-47
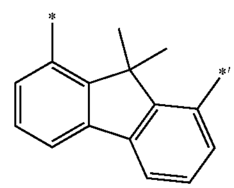
4-48
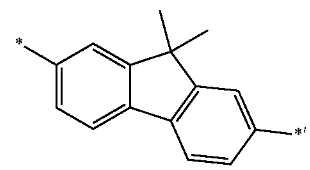
4-49
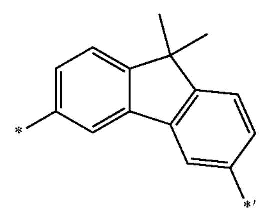
4-50
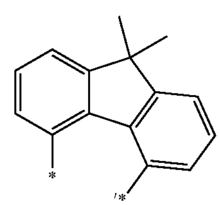
4-51
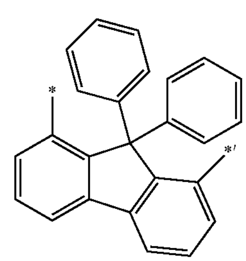

-continued 4-52

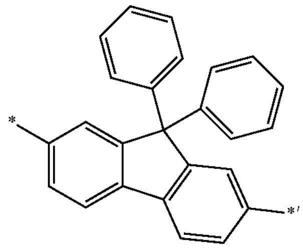

4-53

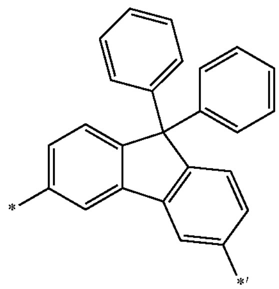

4-54

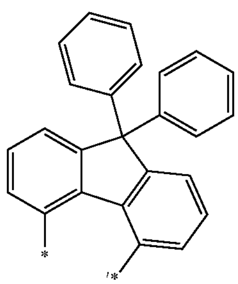

In Formulae 4-1 to 4-11 and Formulae 4-31 to 4-54,

* and *' may each independently indicate a binding site with an adjacent atom.

For example, in Formula 2, a21 may be selected from 0 and 1, but is not limited thereto.

For example, in Formula 2, $R_{21}$ and $R_{22}$ may be each independently selected from a hydrogen, a deuterium, —F, —Cl, —Br, —I, a cyano group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, an imidazopyrimidinyl group, —N($Q_1$)($Q_2$), and —Si($Q_3$)($Q_4$)($Q_5$), a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a benzoquinoxalinyl group, a quinazolinyl group, a benzoquinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$), where $Q_1$ to $Q_5$ and $Q_{33}$ to $Q_{35}$ may be each independently selected from a $C_1$-$C_{60}$ alkyl group and a $C_6$-$C_{60}$ aryl group. However, embodiments of the present disclosure are not limited thereto.

In some embodiments, in Formula 2, $R_{21}$ and $R_{22}$ may be each independently selected from a hydrogen, a deuterium, —F, —Cl, —Br, —I, a cyano group, a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, a dibenzosilolyl group, —N($Q_1$)($Q_2$), and —Si($Q_3$)($Q_4$)($Q_5$), and a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with a $C_1$-$C_{20}$ alkyl group that is substituted with at least one selected from a deuterium, —F, —Cl, —Br, —I, a cyano group, and a nitro group, where $Q_1$ to $Q_5$ and $Q_{33}$ to $Q_{35}$ may be each independently selected from a $C_1$-$C_{20}$ alkyl group and a $C_6$-$C_{60}$ aryl group. However, embodiments of the present disclosure are not limited thereto.

In some embodiments, in Formula 2, $R_{21}$ and $R_{22}$ may be each independently selected from a hydrogen, a deuterium, —F, —Cl, —Br, —I, a cyano group, a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, a dibenzothiophenyl group, —N($Q_1$)($Q_2$), and —Si($Q_3$)($Q_4$)($Q_5$), and a phenyl group, a naphthyl group, a fluorenyl group, a phenanthrenyl group, a pyridinyl group, a pyrazinyl group, a pyrimidinyl group, a quinolinyl group, an isoquinolinyl group, a naphthyridinyl group, a quinoxalinyl group, a quinazolinyl group, a cinnolinyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), where $Q_1$ to $Q_5$ and $Q_{33}$ to $Q_{35}$ may be each independently selected from a methyl group, an ethyl group, a tert-butyl group, a phenyl group, and a naphthyl group. However, embodiments of the present disclosure are not limited thereto.

In some embodiments, in Formula 2, $R_{21}$ and $R_{22}$ may be each independently selected from a hydrogen, a deuterium, —F, —Cl, —Br, —I, a cyano group, —N(Ph)$_2$, —Si(CH$_3$)$_3$, —Si(Ph)$_3$, and groups represented by Formulae 5-1 to 5-9 and Formula 5-33. However, embodiments of the present disclosure are not limited thereto.

5-1

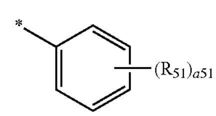

5-2

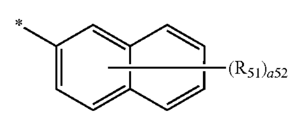

5-3

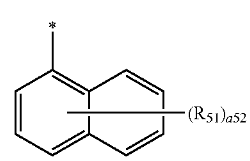

5-4

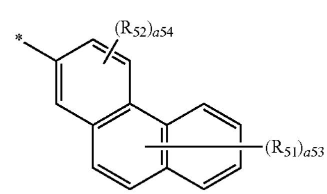

-continued 5-5

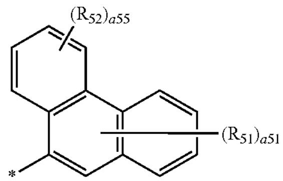

5-6

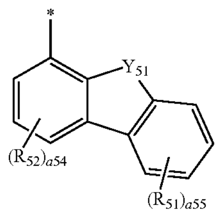

5-7

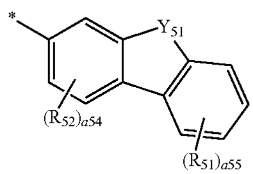

5-8

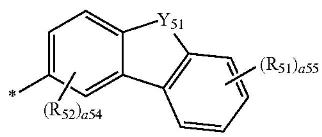

5-9

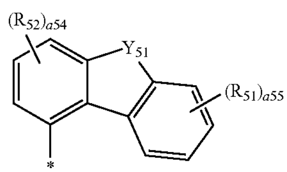

5-33

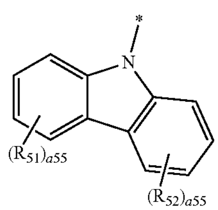

In Formulae 5-1 to 5-9 and Formula 5-33, $Y_{51}$ may be selected from $C(R_{53})(R_{54})$, $N(R_{53})$, O, and S;

$R_{51}$ to $R_{54}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, where $Q_{33}$ to $Q_{35}$ may be each independently selected from a methyl group, an ethyl group, a ter-butyl group, a phenyl group, and a naphthyl group;

a51 may be selected from 1, 2, 3, 4, and 5;

a52 may be selected from 1, 2, 3, 4, 5, 6, and 7;

a53 may be selected from 1, 2, 3, 4, 5, and 6;

a54 may be selected from 1, 2, and 3;

a55 may be selected from 1, 2, 3, and 4; and

* indicates a binding site with an adjacent atom.

In some embodiments, in Formula 2, $R_{21}$ and $R_{22}$ may be each independently selected from groups represented by Formulae 6-1 to 6-42 and Formulae 6-140 to 6-155. However, embodiments of the present disclosure are not limited thereto.

6-1

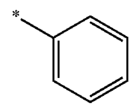

6-2

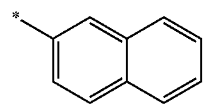

6-3

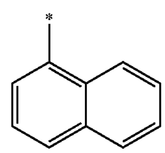

6-4

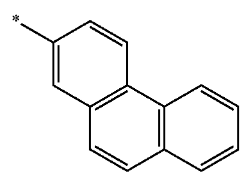

6-5

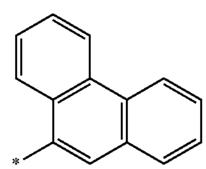

6-6

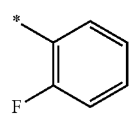

6-7

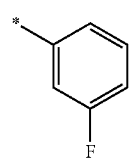

6-8

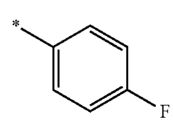

6-9

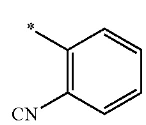

-continued
6-10
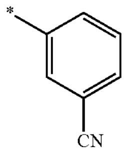
6-11
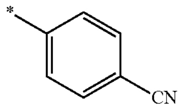
6-12
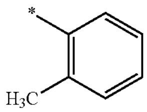
6-13
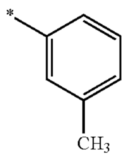
6-14
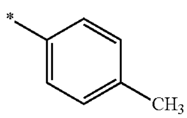
6-15
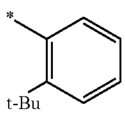
6-16
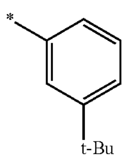
6-17
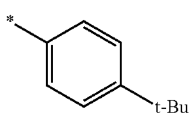
6-18
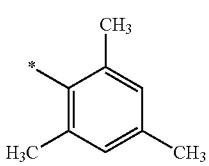
6-19
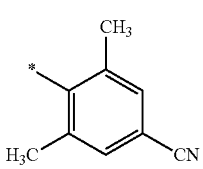
6-20
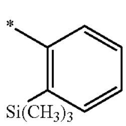
-continued
6-21
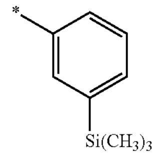
6-22
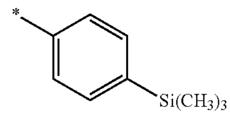
6-23
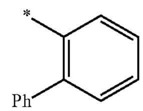
6-24
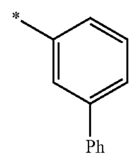
6-25
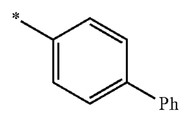
6-26
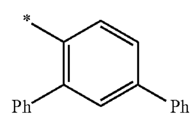
6-27
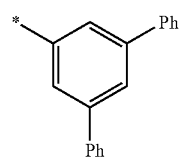
6-28
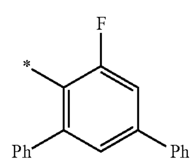
6-29
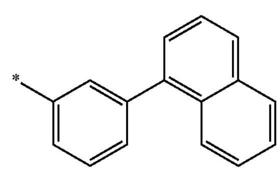
6-30
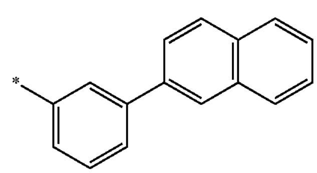

6-31
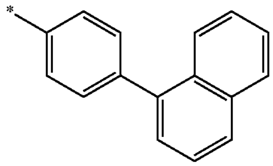
6-32
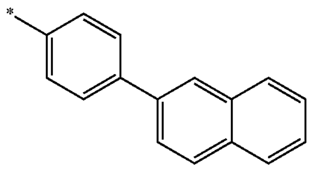
6-33
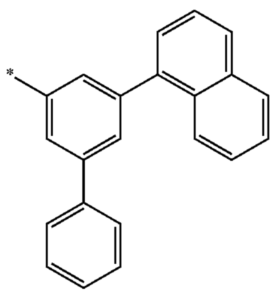
6-34
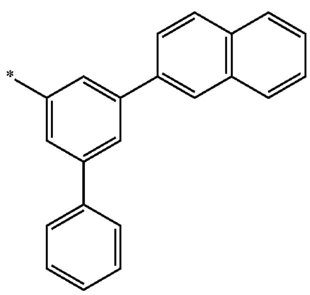
6-35
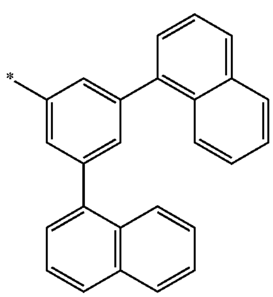
6-36
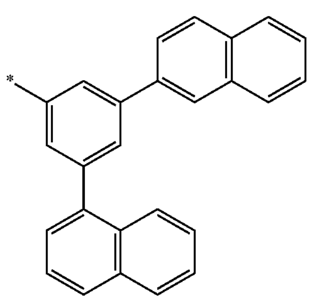
6-37
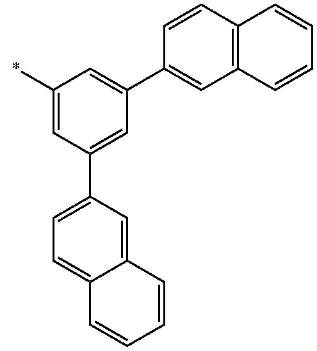
6-38
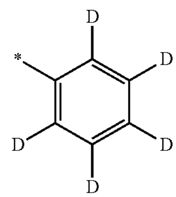
6-39
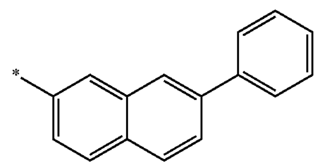
6-40
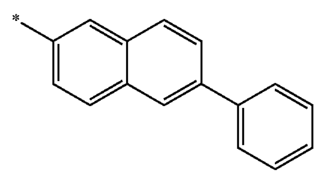
6-41
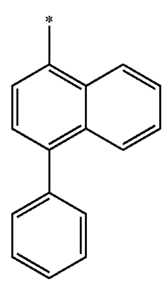
6-42
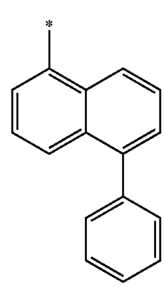

-continued
6-140
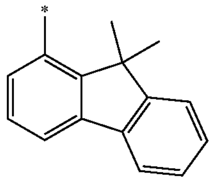
6-141
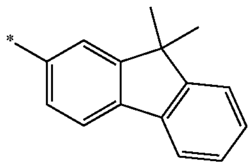
6-142
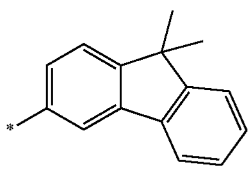
6-143
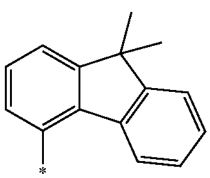
6-144
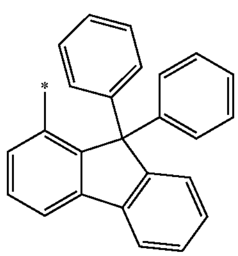
6-145
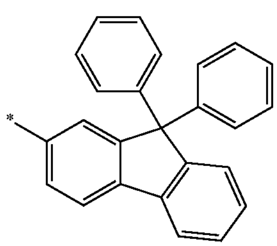
6-146
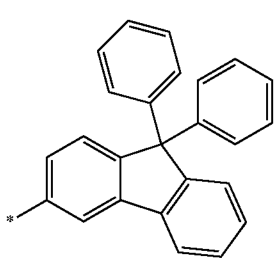
-continued
6-147
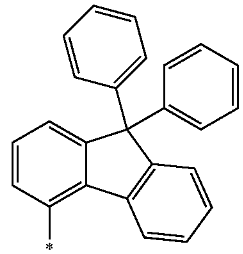
6-148
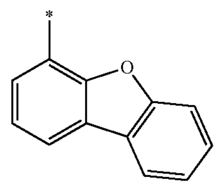
6-149
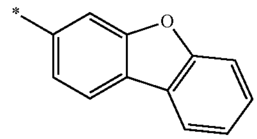
6-150
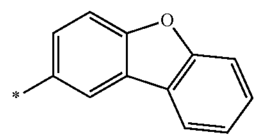
6-151
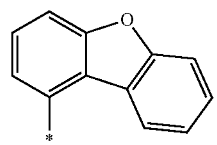
6-152
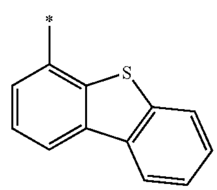
6-153
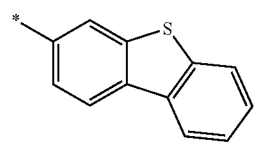
6-154
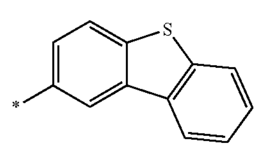
6-155
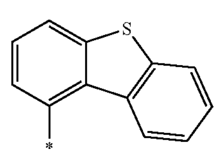
In Formulae 6-1 to 6-42 and Formulae 6-140 to 6-155, t-Bu indicates a tert-butyl group;
Ph indicates a phenyl group; and
* indicates a binding site with an adjacent atom.

For example, in Formula 2, $R_{23}$ may be selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —Si($Q_3$)($Q_4$)($Q_5$), where $Q_3$ to $Q_5$ may be each independently selected from a $C_1$-$C_{60}$ alkyl group and a $C_6$-$C_{60}$ aryl group. However, embodiments of the present disclosure are not limited thereto.

In some embodiments, in Formula 2, $R_{23}$ may be selected from a hydrogen, a deuterium, —F, —Cl, —Br, —I, a cyano group, a nitro group, $C_1$-$C_{60}$ alkyl group, a $C_1$-$C_{60}$ alkoxy group, a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, —Si($CH_3$)$_3$, and —Si(Ph)$_3$, but $R_{23}$ is not limited thereto.

In some embodiments, in Formula 2, $R_{23}$ may be selected from a hydrogen, a methyl group, an ethyl group, a tert-butyl group, a methoxy group, an ethoxy group, a ter-butoxy group, —Si($CH_3$)$_3$, a phenyl group, and a naphthyl group, but is not limited thereto.

In some embodiments, in Formula 2, b21 to b23 may be each independently selected from 1 and 2, but are not limited thereto.

In some embodiments, in Formula 2, n21 may be 1, but is not limited thereto.

In some embodiments, the anthracene-based compound of Formula 2 may be selected from compounds represented by Formulae 2-1 and 2-2, but is not limited thereto.

Formula 2-1

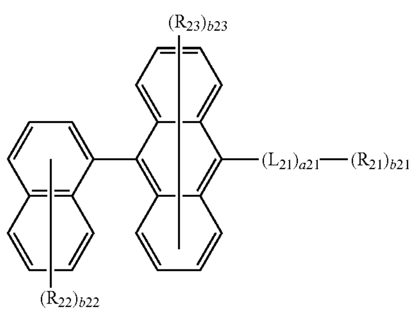

Formula 2-2

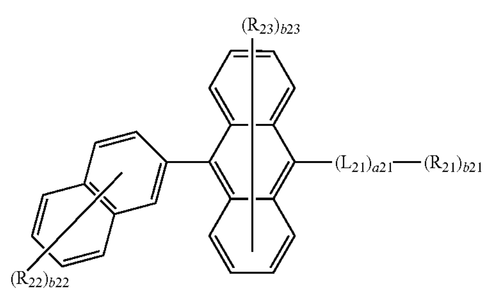

In Formulae 2-1 and 2-2, $L_{21}$, a21, $R_{21}$ to $R_{23}$, and b21 to b23 may be as defined above.

In some embodiments, the anthracene-based compound of Formula 2 may be selected from compounds represented by Formulae 2-1A and 2-2A, but is not limited thereto.

Formula 2-1A

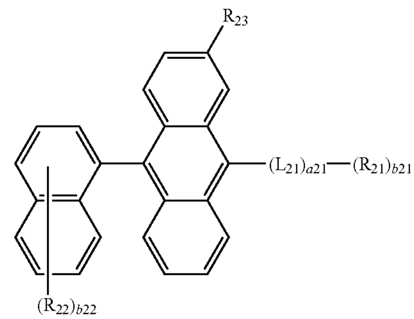

Formula 2-2A

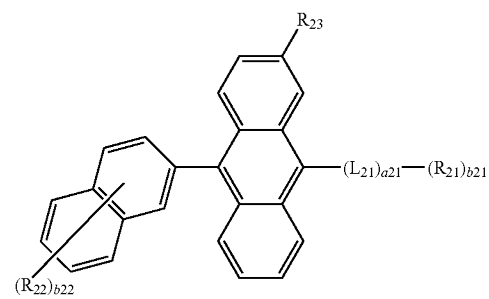

In Formulae 2-1A and 2-2A, $L_{21}$, a21, $R_{21}$ to $R_{23}$, b21, and b22 may be as defined above.

In some embodiments, the anthracene-based compound of Formula 2 may be selected from Compounds H101 to H188 and Compounds H201 to H218, but is not limited thereto.

H101

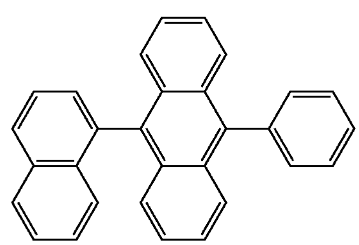

H102

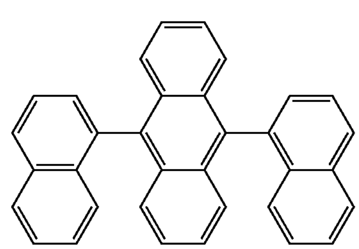

-continued
H103
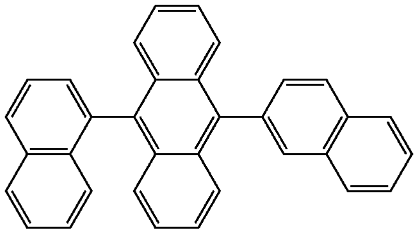
H104
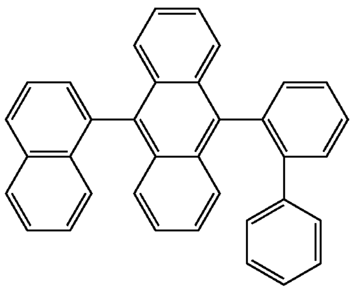
H105
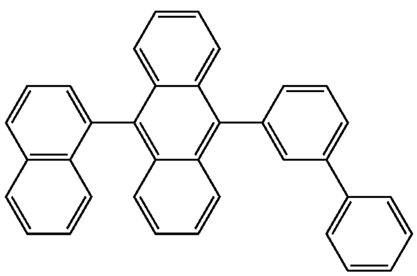
H106
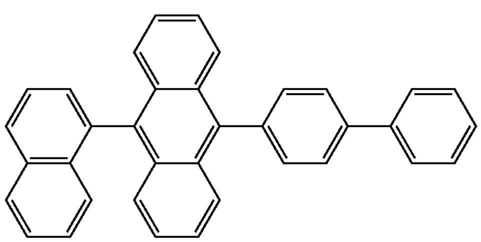
H107
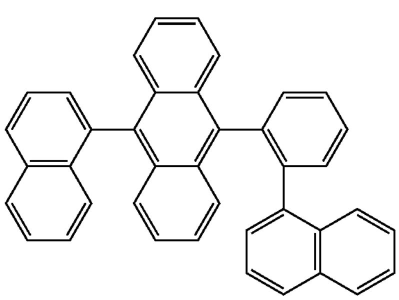
-continued
H108
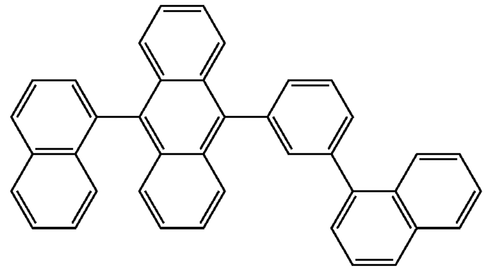
H109
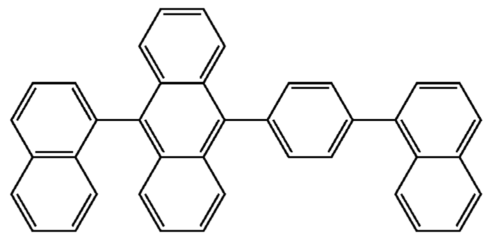
H110
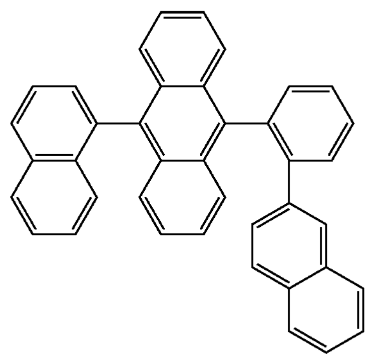
H111
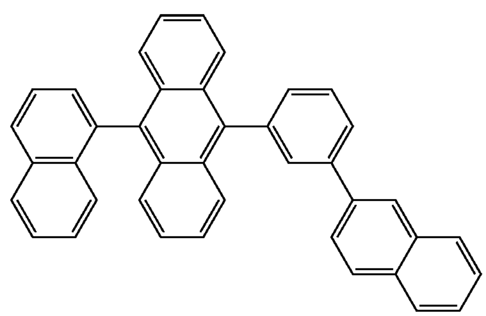
H112
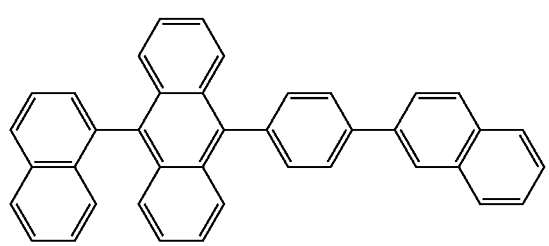

-continued
H113
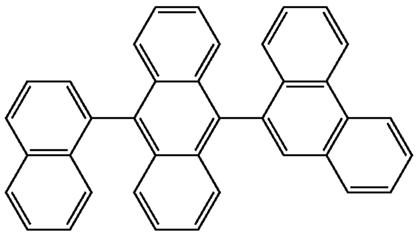
H114
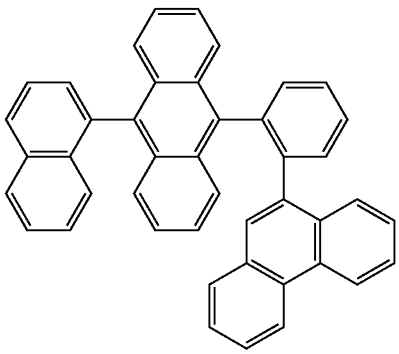
H115
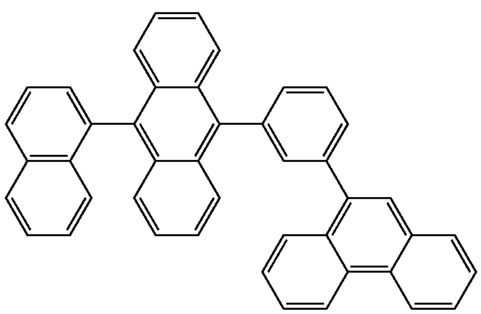
H116
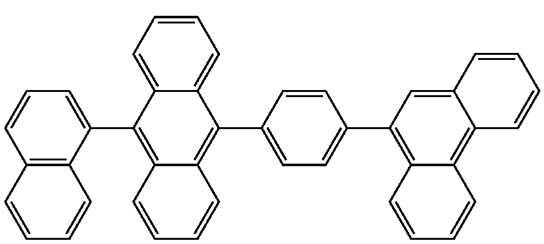
H117
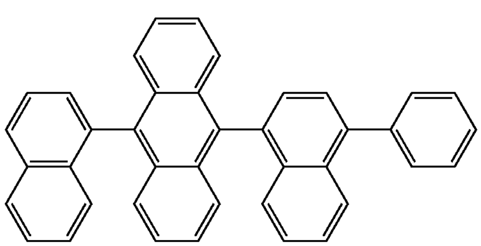
-continued
H118
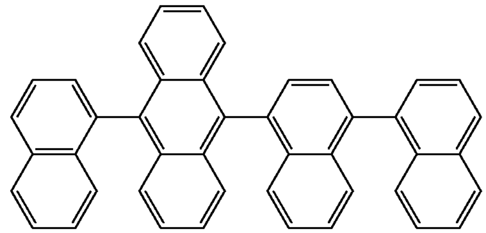
H119
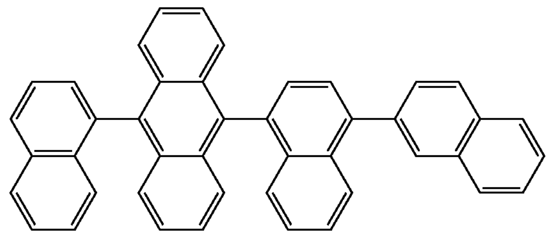
H120
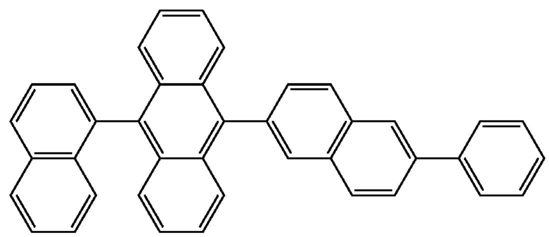
H121
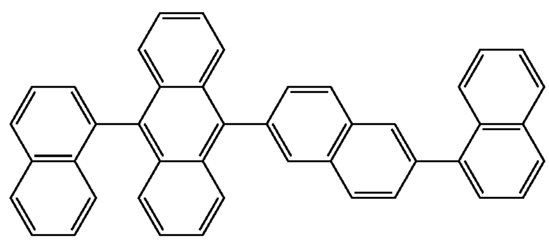
H122
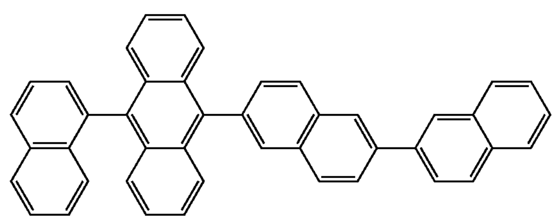
H123
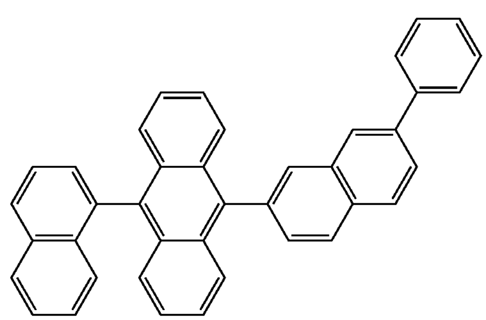

-continued
H124
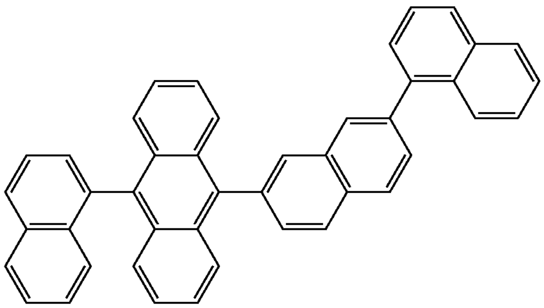
H125
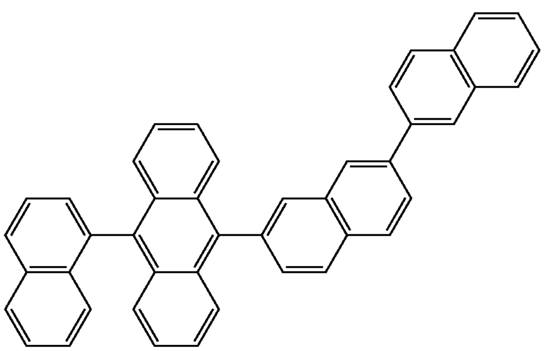
H126
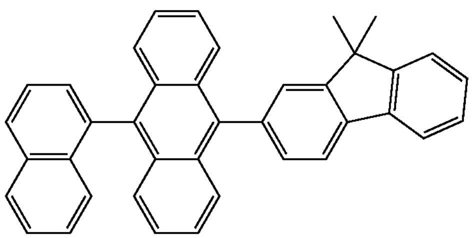
H127
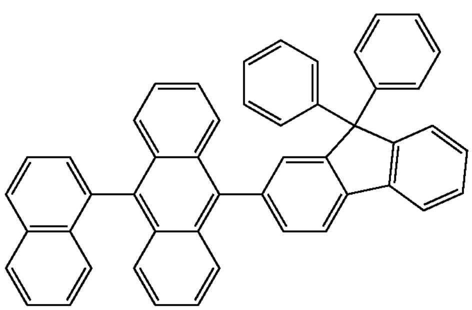
H128
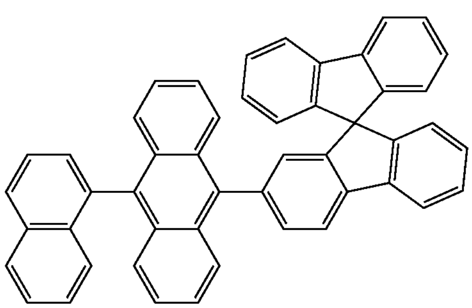
-continued
H129
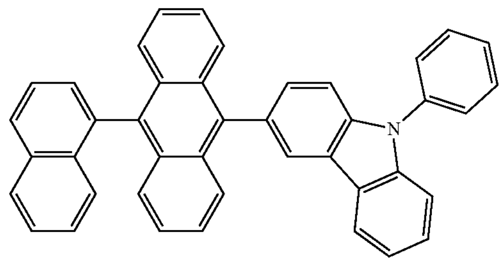
H130
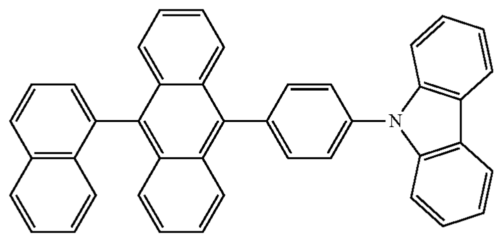
H131
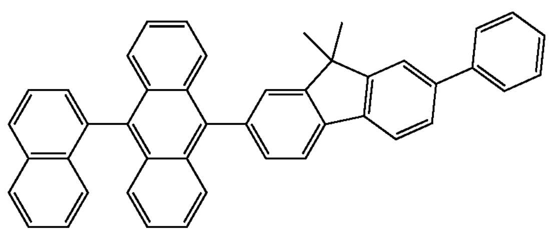
H132
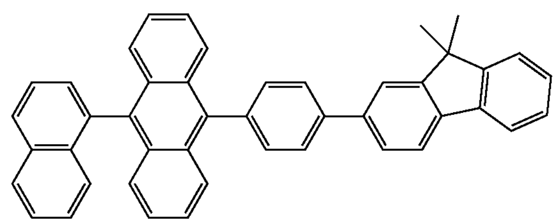
H133
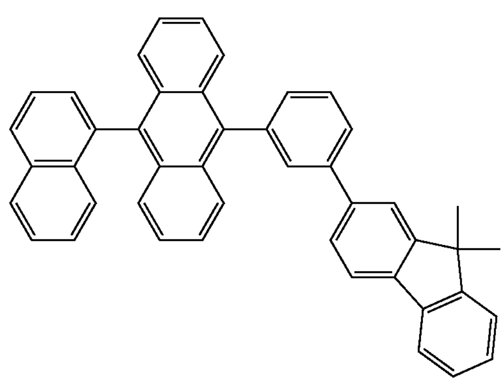

-continued
H134
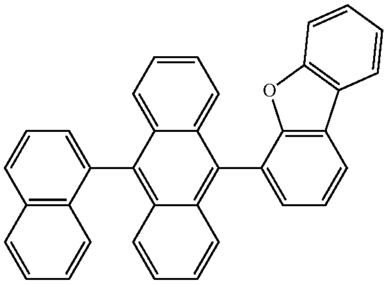
H135
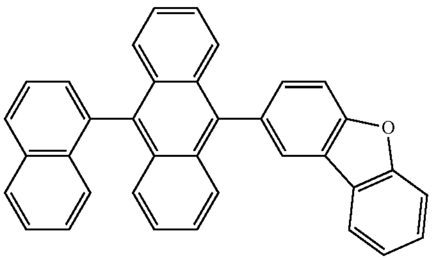
H136
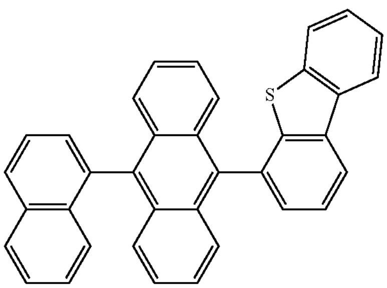
H137
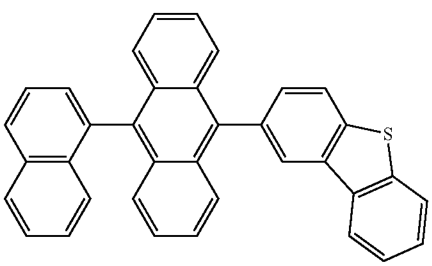
H138
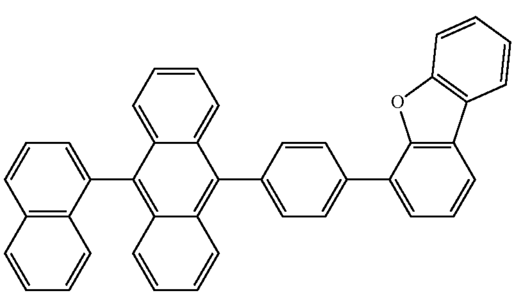
-continued
H139
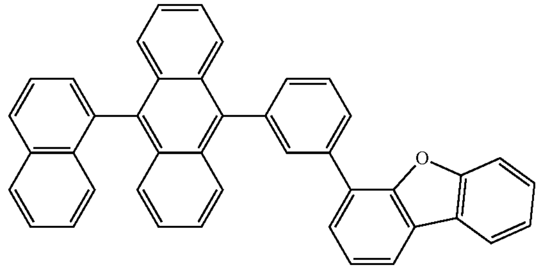
H140
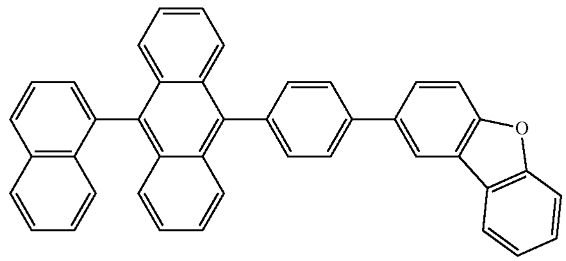
H141
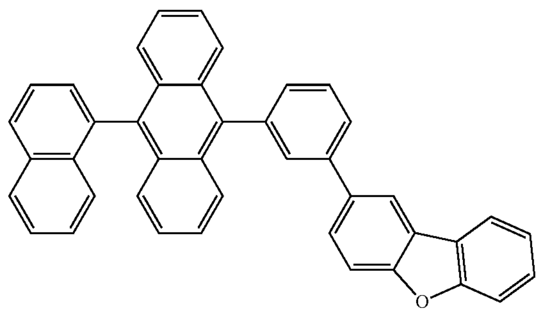
H142
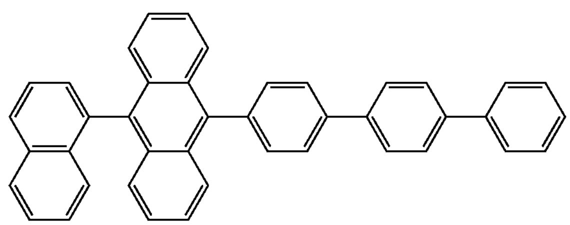
H143
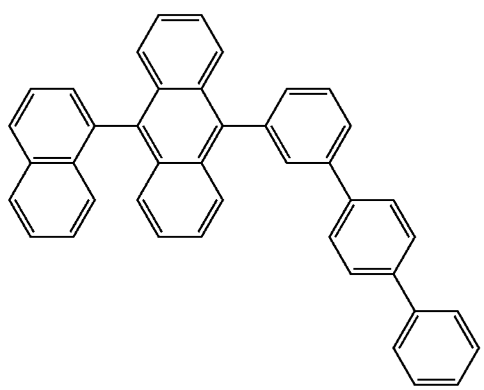

-continued
H144
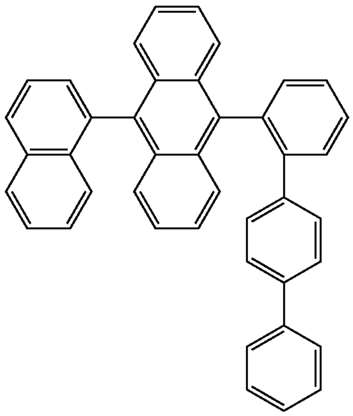
H145
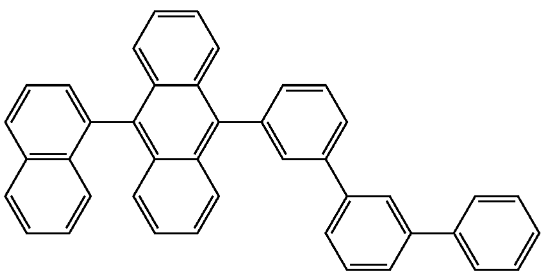
H146
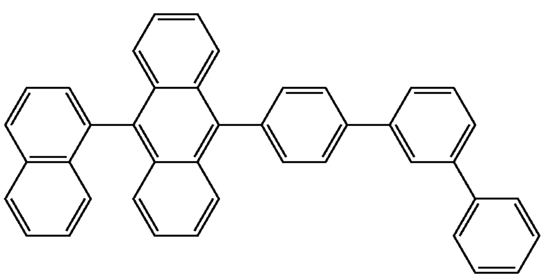
H147
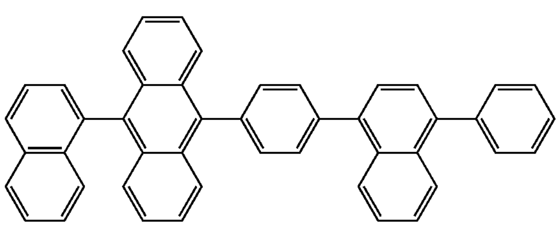
H148
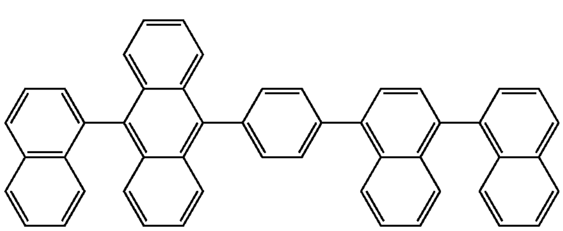
-continued
H149
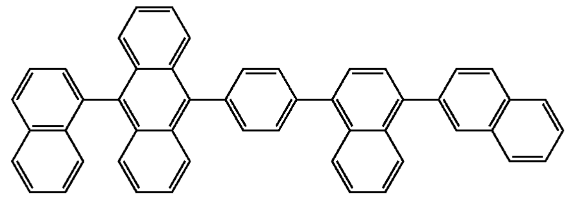
H150
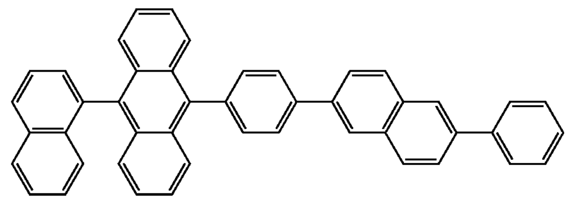
H151
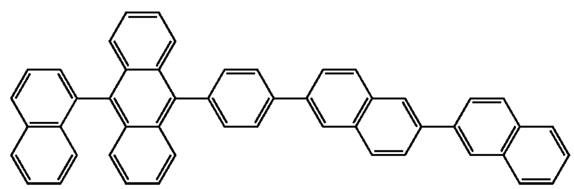
H152
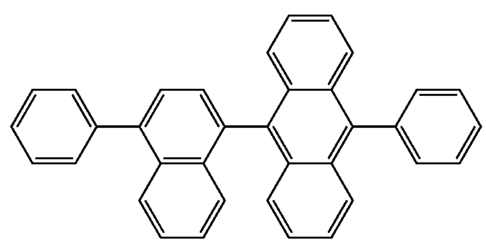
H153
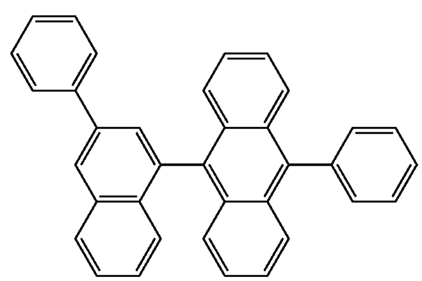
H154
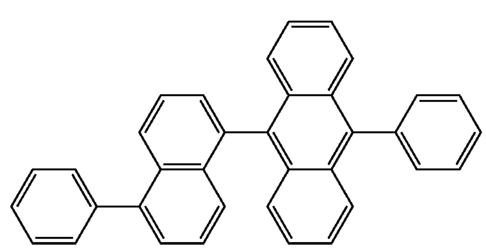

-continued
H155
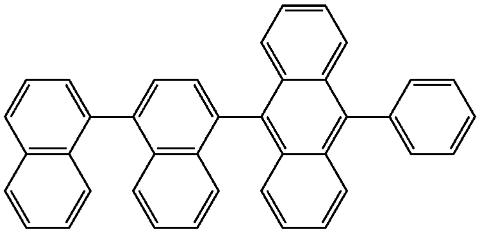
H156
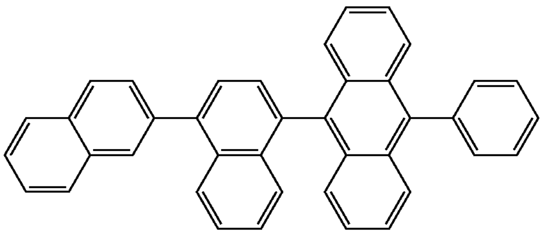
H157
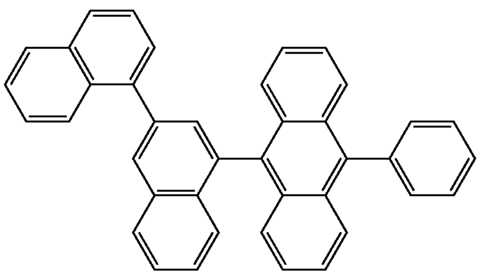
H158
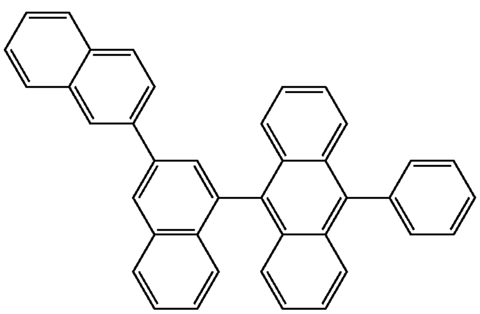
H159
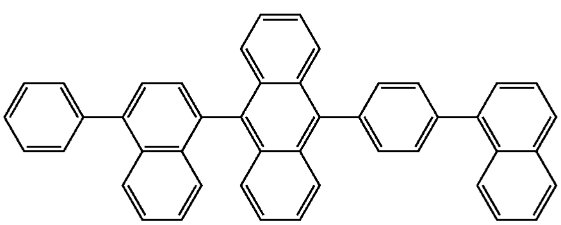
H160
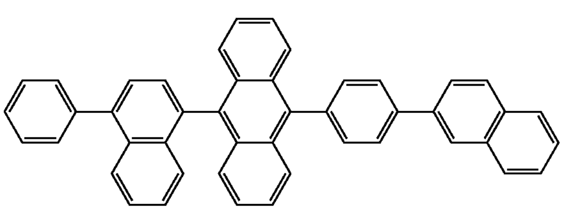
-continued
H161
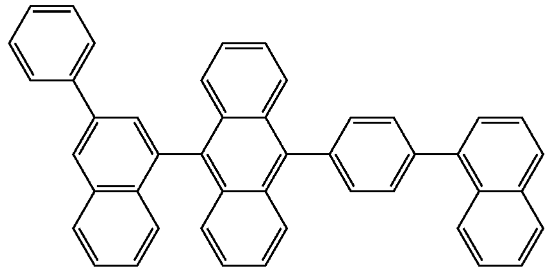
H162
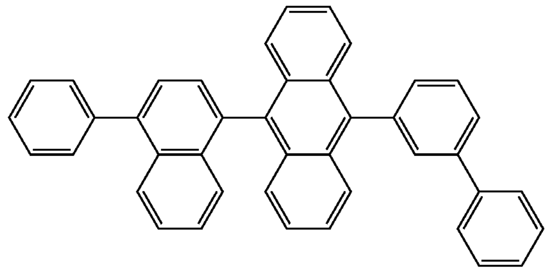
H163
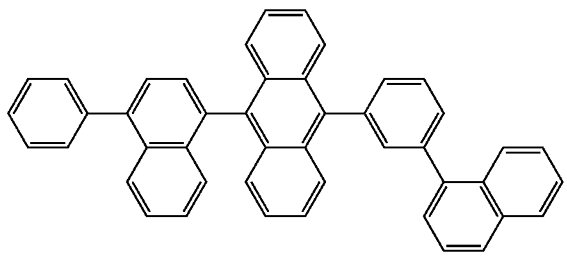
H164
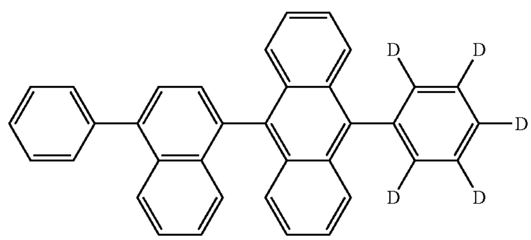
H165
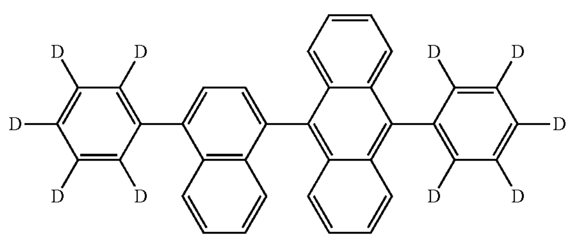
H166
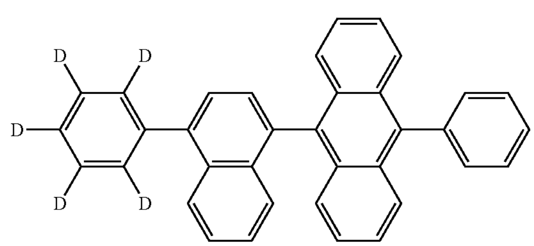

-continued
H167
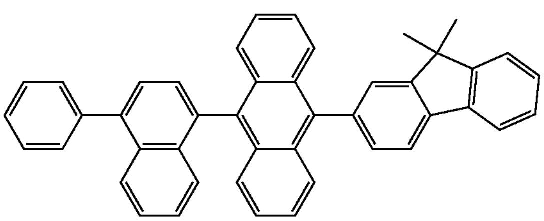
H168
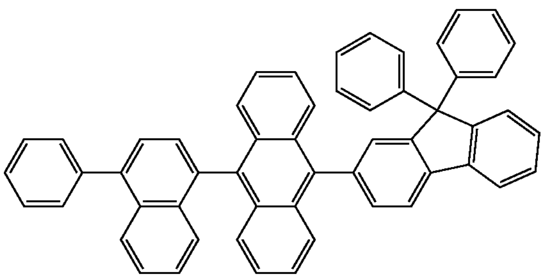
H169
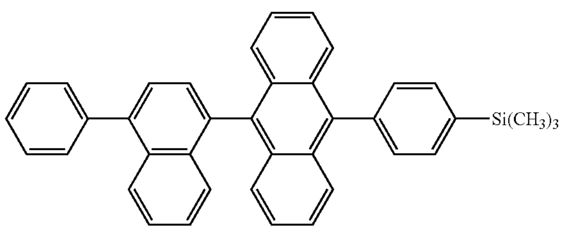
H170
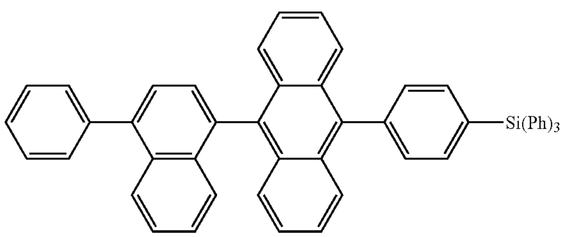
H171
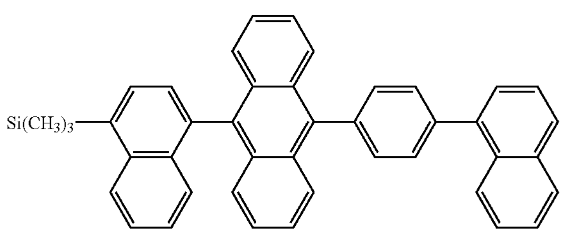
H172
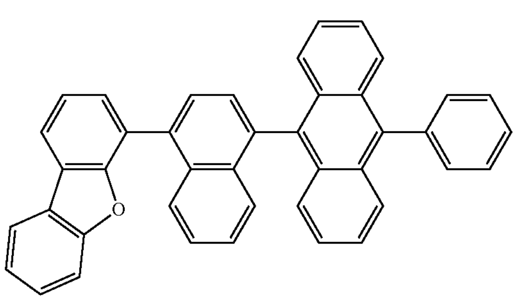
-continued
H173
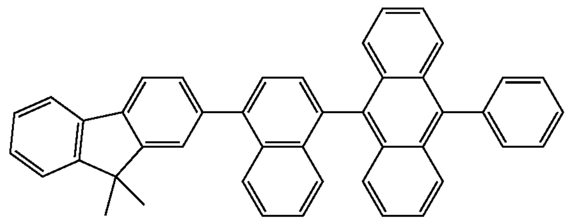
H174
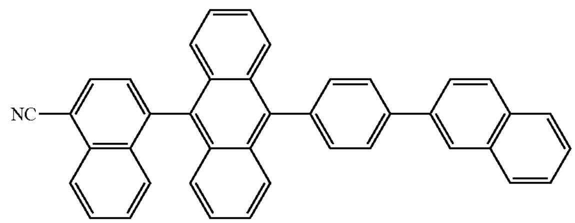
H175
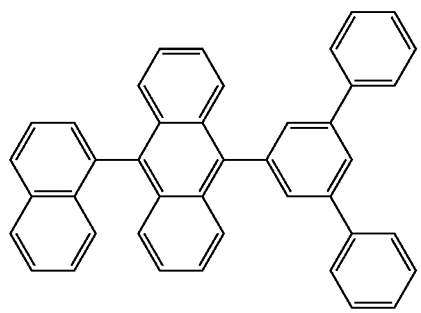
H176
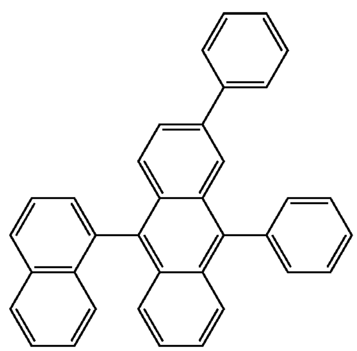
H177
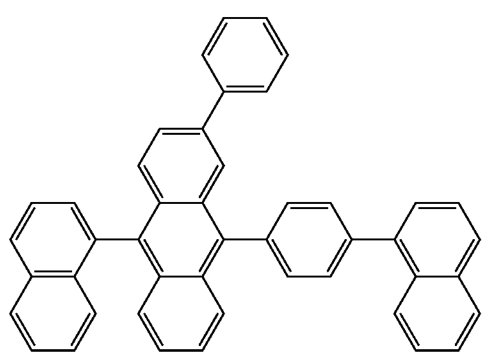

-continued
H178
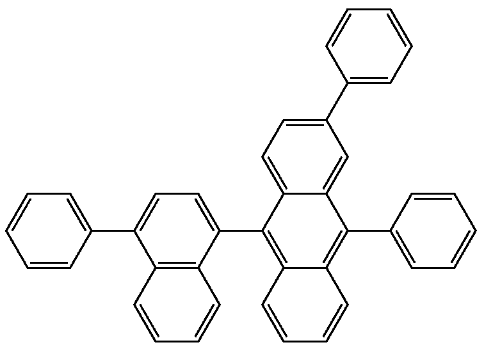
H179
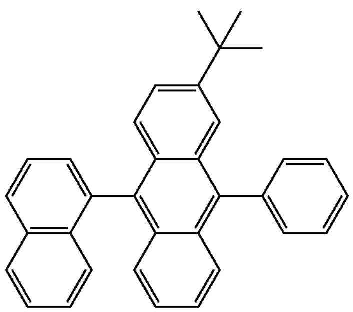
H180
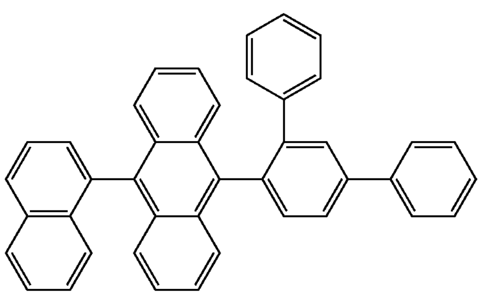
H181
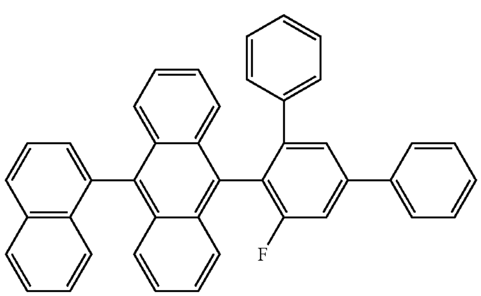
H182
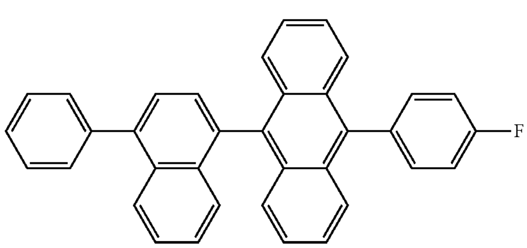
-continued
H183
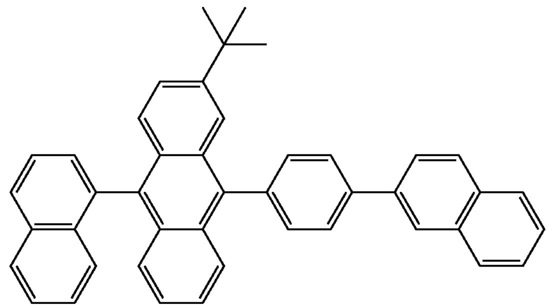
H184
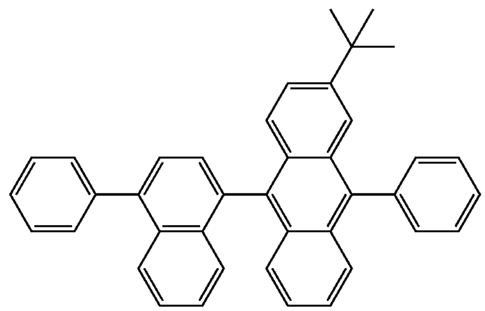
H185
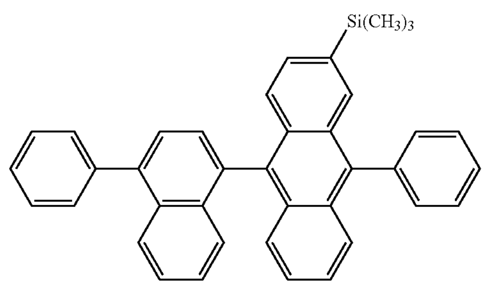
H186
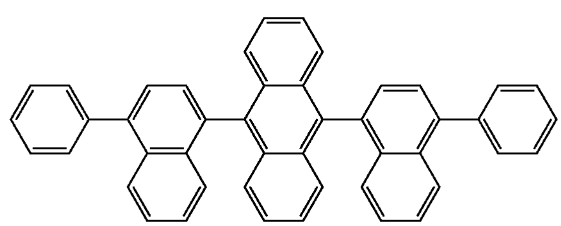
H187
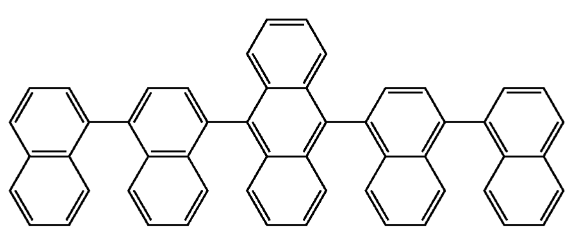

-continued
H188
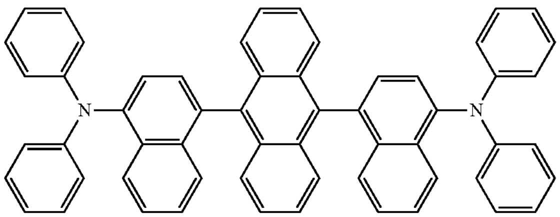
H201
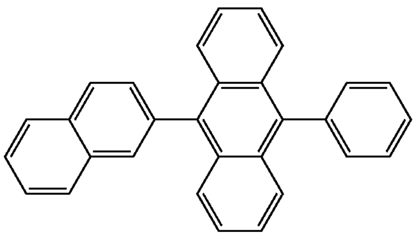
H202
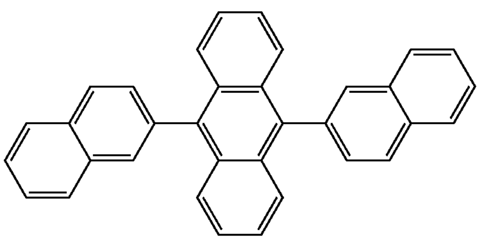
H203
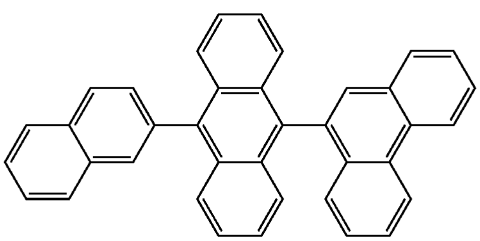
H204
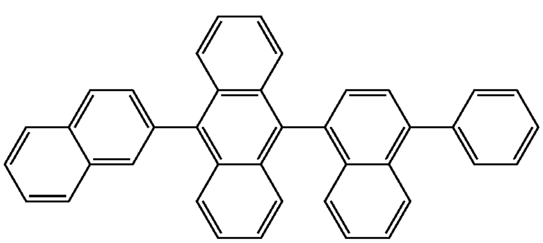
H205
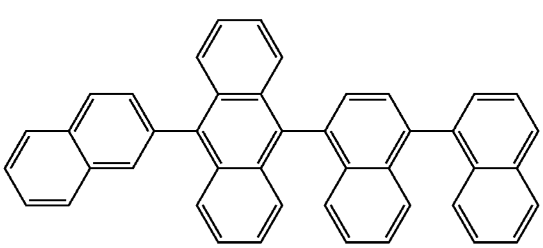
-continued
H206
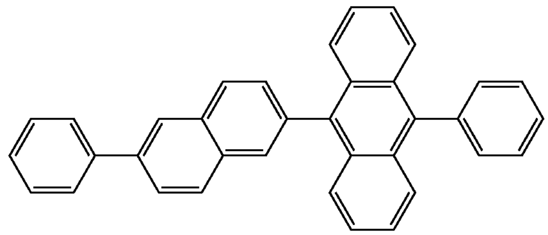
H207
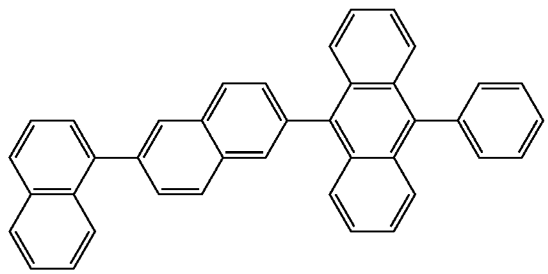
H208
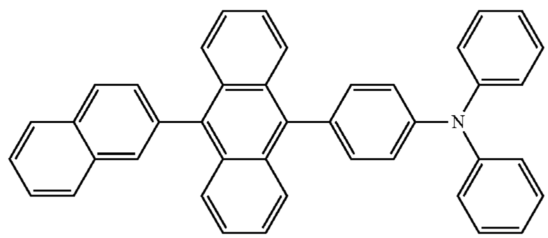
H209
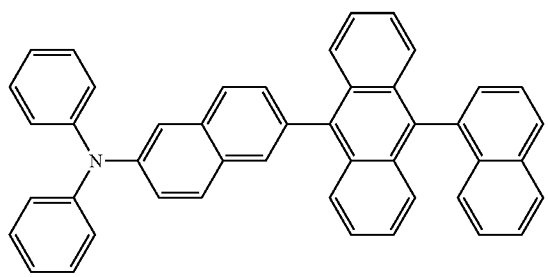
H210
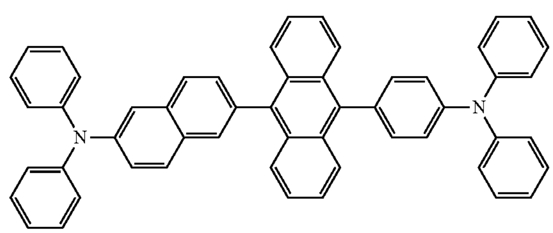
H211
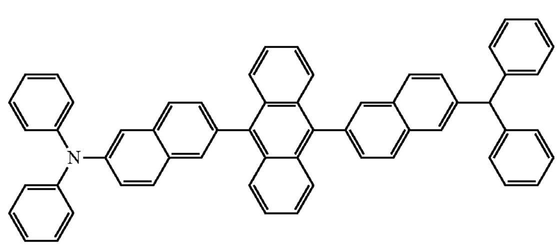

-continued

H212

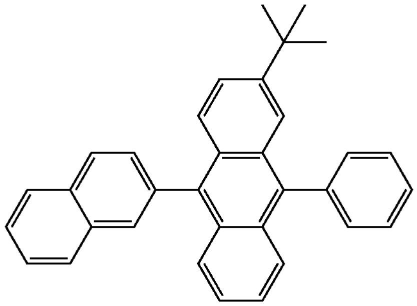

H213

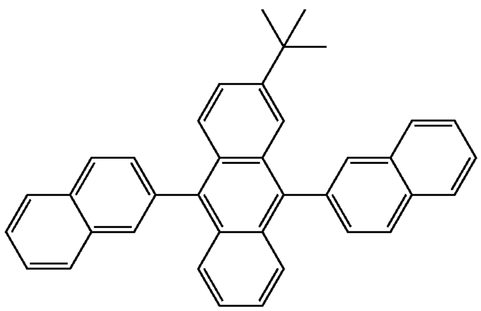

H214

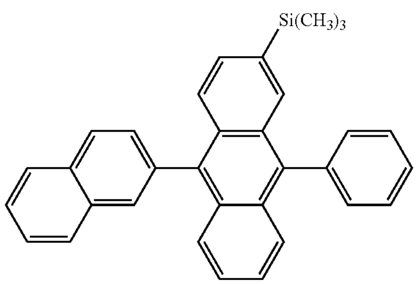

H215

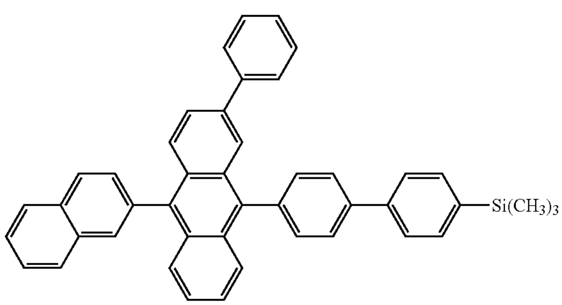

H216

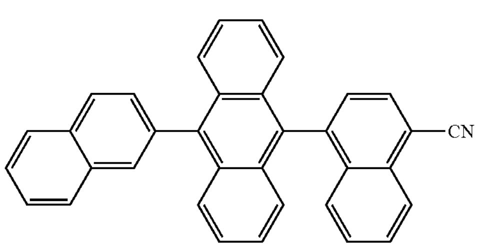

-continued

H217

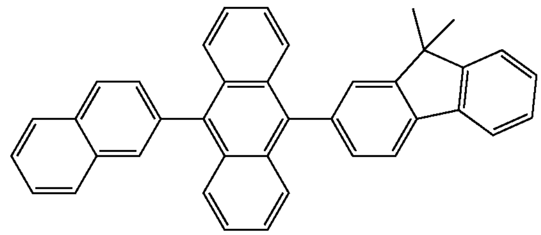

H218

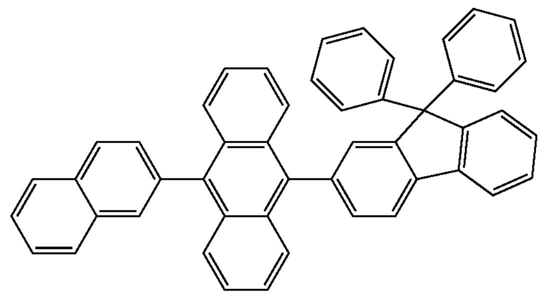

In some embodiments, the EML of the organic light-emitting device may include the amine-based compound represented by Formula 1 as a dopant.

The EML of the organic light-emitting device may further include a fluorescent dopant and/or a phosphorescent dopant, in addition to the amine-based compound represented by Formula 1.

The phosphorescent dopant may include an organic metal complex represented by Formula 401.

Formula 401

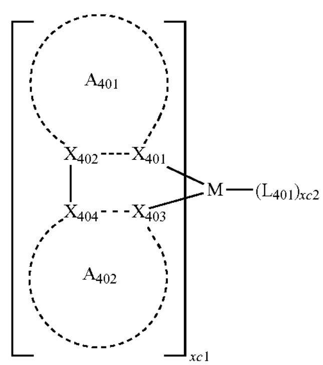

In Formula 401,

M may be selected from iridium (Ir), platinum (Pt), osmium (Os), titanium (Ti), zirconium (Zr), hafnium (Hf), europium (Eu), terbium (Tb), and thulium (Tm), $X_{401}$ to $X_{404}$ may be each independently a nitrogen atom or a carbon atom, $A_{401}$ and $A_{402}$ rings may be each independently selected from a substituted or unsubstituted benzene group, a substituted or unsubstituted naphthalene group, a substituted or unsubstituted fluorene group, a substituted or unsubstituted spiro-fluorene group, a substituted or unsubstituted indene group, a substituted or unsubstituted pyrrole group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazole group, a substituted or unsubstituted benzimidazole group, a substituted or unsubstituted benzofuran group, a substituted or unsubstituted benzothiophene group, a substituted or unsubstituted isobenzothiophene group, a substituted or unsubstituted benzooxazole group, a substituted or unsubstituted isobenzooxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group, at least one substituent of the substituted benzene group, the substituted naphthalene group, the substituted fluorene group, the substituted spiro-fluorene group, the substituted indene group, the substituted pyrrole group, the substituted thiophene group, the substituted furan group, the substituted imidazole group, the substituted pyrazole group, the substituted thiazole group, the substituted isothiazole group, the substituted oxazole group, the substituted isoxazole group, the substituted pyridine group, the substituted pyrazine group, the substituted pyrimidine group, the substituted pyridazine group, the substituted quinoline group, the substituted isoquinoline group, the substituted benzoquinoline group, the substituted quinoxaline group, the substituted quinazoline group, the substituted carbazole group, the substituted benzimidazole group, the substituted benzofuran group, the substituted benzothiophene group, the substituted isobenzothiophene group, the substituted benzooxazole group, the substituted isobenzooxazole group, the substituted triazole group, the substituted oxadiazole group, the substituted triazine group, the substituted dibenzofuran group, and the substituted dibenzothiophene group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$), a $C_3$-$C_{10}$ cycloalkyl group, a $C_1$-$C_{10}$ heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$), and —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be selected from 1, 2, or 3; and xc2 may be selected from 0, 1, 2, or 3, where $Q_{401}$ to $Q_{407}$, $Q_{411}$ to $Q_{417}$, and $Q_{421}$ to $Q_{427}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

In some embodiments, $L_{401}$ may be a monovalent, divalent, or trivalent organic ligand. For example, $L_{401}$ may be selected from a halogen ligand (for example, $Cl^-$ or $F^-$), a diketone ligand (for example, acetylacetonate, 1,3-diphenyl-1,3-propanedionate, 2,2,6,6-tetramethyl-3,5-heptanedionate, or hexafluoroacetonate), a carboxylic acid ligand (for example, picolinate, dimethyl-3-pyrazole carboxylate, or benzoate), a carbon monoxide ligand, an isonitrile ligand, a cyano ligand, and a phosphorous ligand (for example, phosphine, phosphite or phosphate), but $L_{401}$ is not limited thereto When $A_{401}$ in Formula 401 has at least two substituents, the at least two substituents of $A_{401}$ may be linked to each other to form a saturated or unsaturated ring.

When $A_{402}$ in Formula 401 has at least two substituents, the at least two substituents of $A_{402}$ may be linked to each other to form a saturated or unsaturated ring.

When xc1 in Formula 401 is 2 or greater, the plurality of ligands in Formula 401, represented by

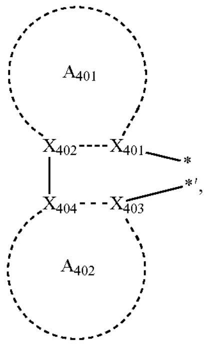

may be identical to or different from each other. When xc1 in Formula 401 is 2 or greater, $A_{401}$ and/or $A_{402}$ of one ligand may be respectively linked to $A_{401}$ and/or $A_{402}$ of an adjacent ligand directly (for example, via a single bond) or via a linking group (for example, a $C_1$-$C_5$ alkylene group, a $C_2$-$C_5$ alkenylene group, —N(R')— (where R' is a $C_1$-$C_{10}$ alkyl group or a $C_6$-$C_{20}$ aryl group), or C(═O)—).

The phosphorescent dopant may include at least one of Compounds PD1 to PD74, but is not limited thereto.

PD1

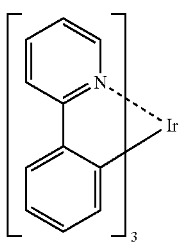

PD2

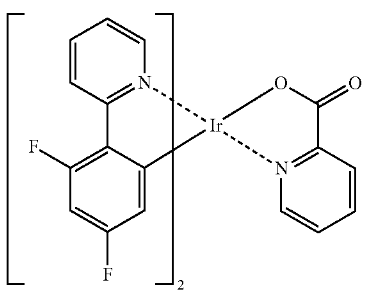

PD3

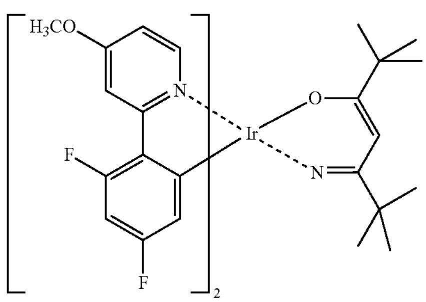

-continued

PD4

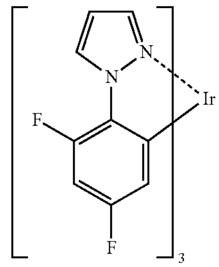

PD5

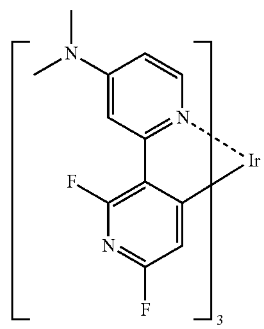

PD6

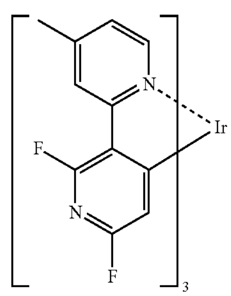

PD7

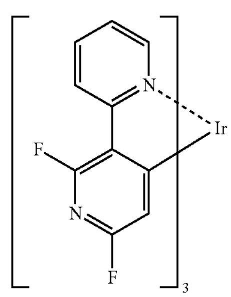

PD8

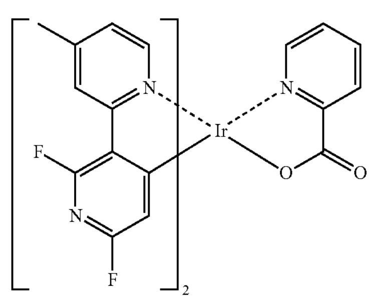

-continued
PD9
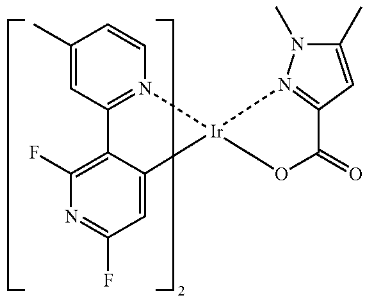
PD10
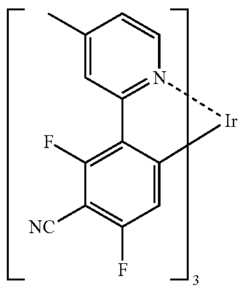
PD11
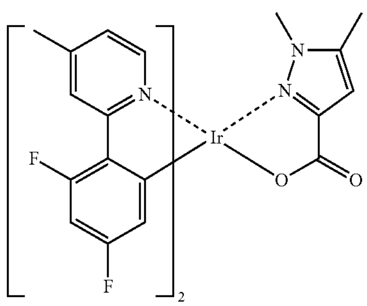
PD12
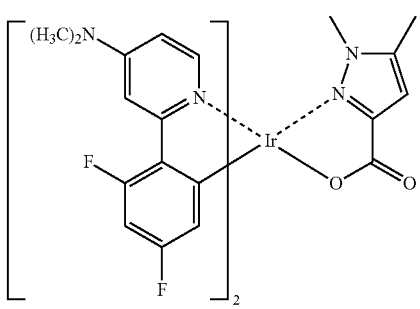
PD13
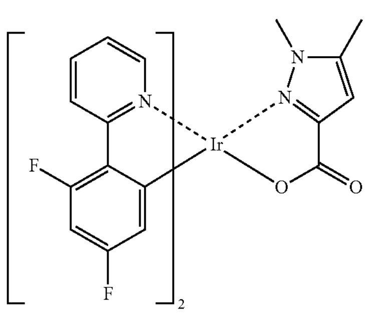
-continued
PD14
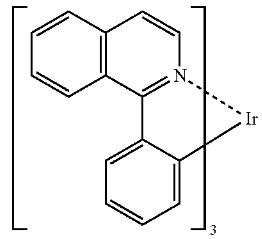
PD15
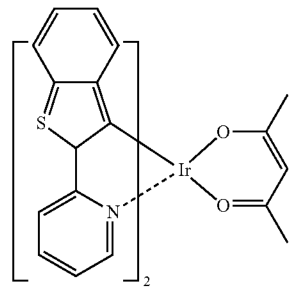
PD16
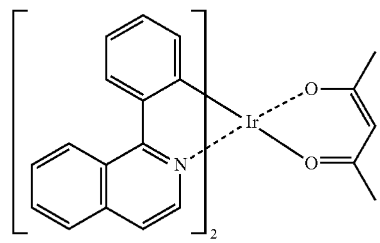
PD17
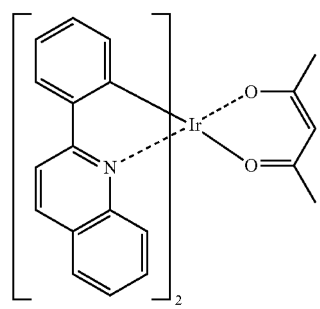
PD18
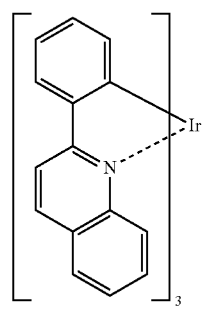

-continued
PD19
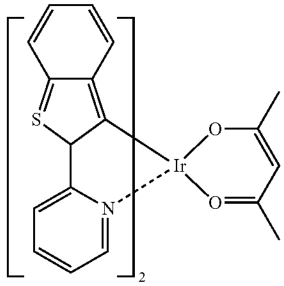
PD20
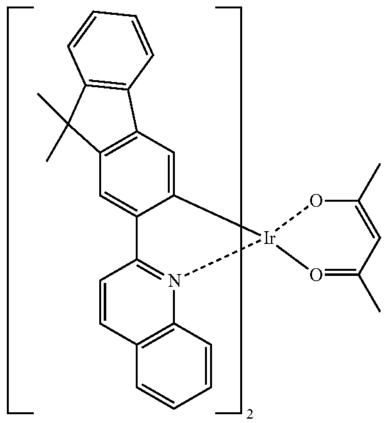
PD21
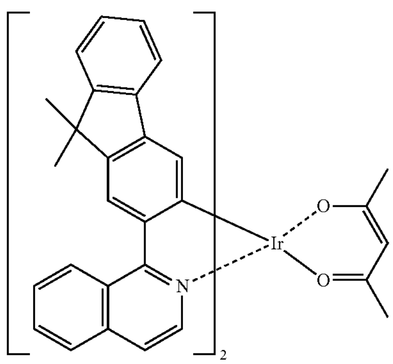
PD22
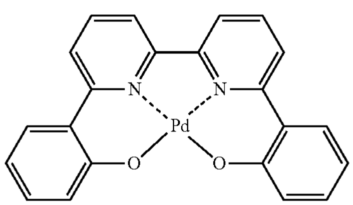
PD23
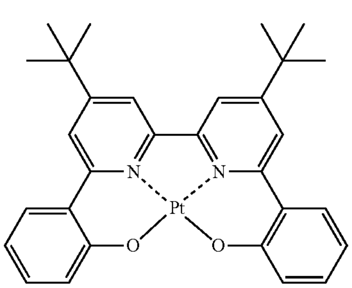
-continued
PD24
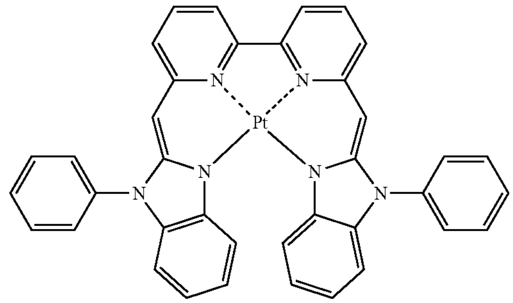
PD25
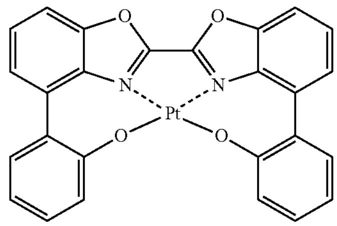
PD26
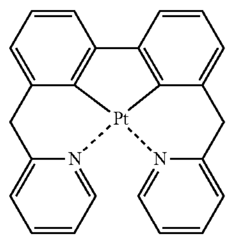
PD27
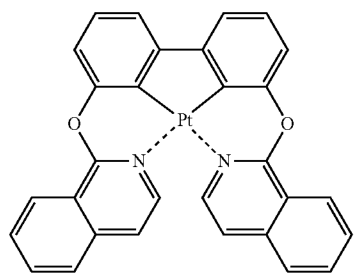
PD28
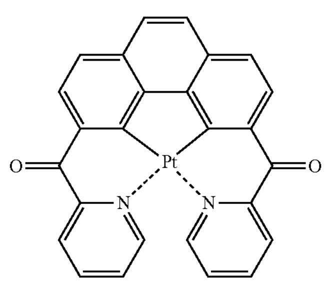
PD29
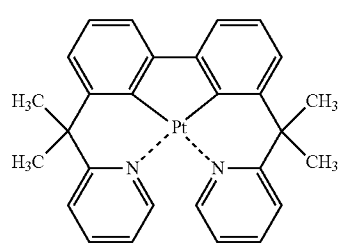

-continued
PD30
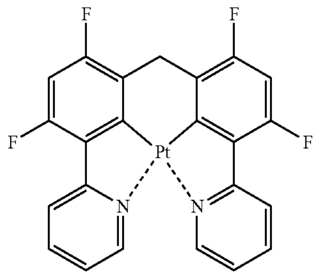
PD31
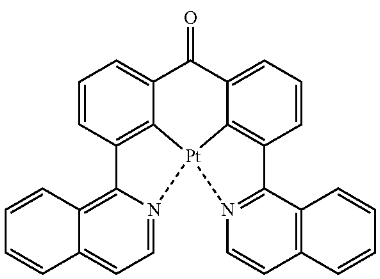
PD32
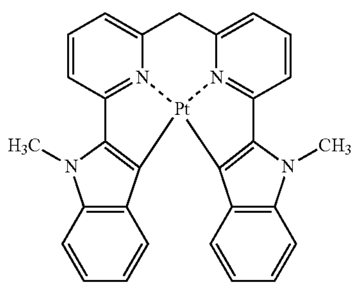
PD33
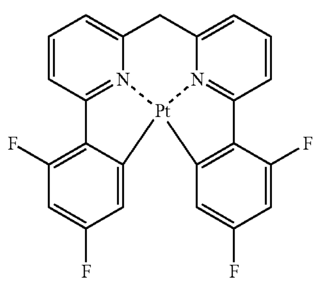
PD34
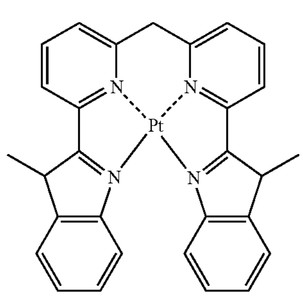
-continued
PD35
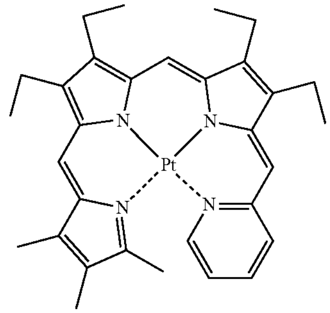
PD36
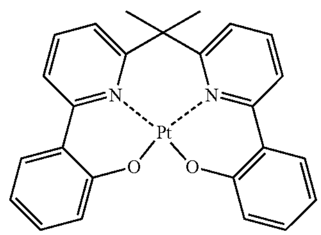
PD37
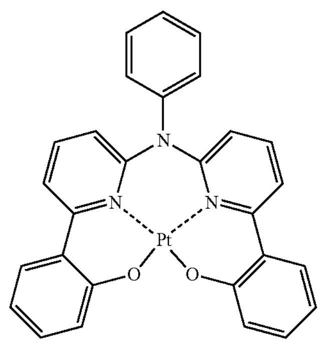
PD38
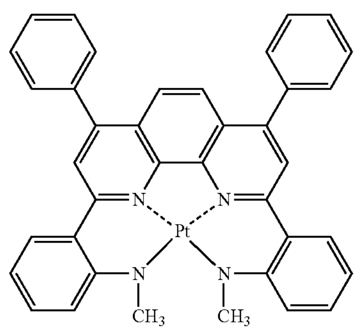
PD39
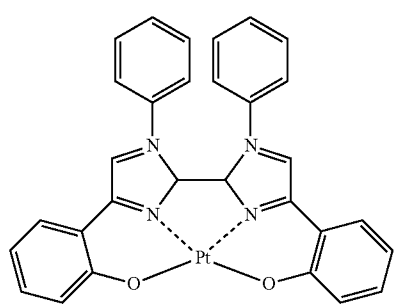

-continued
PD40
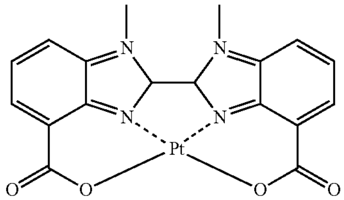
PD41
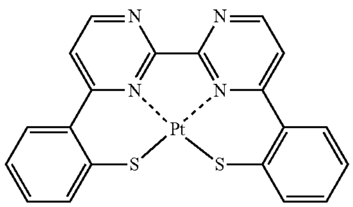
PD42
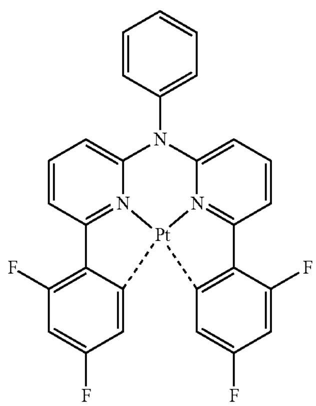
PD43
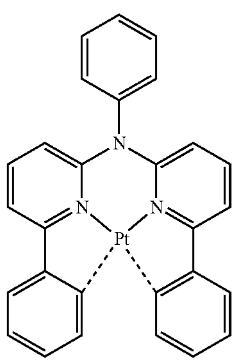
PD44
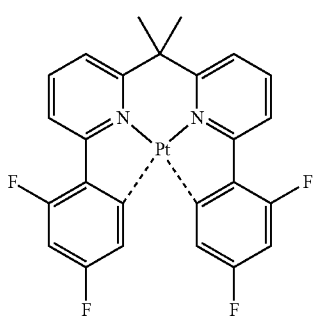
-continued
PD45
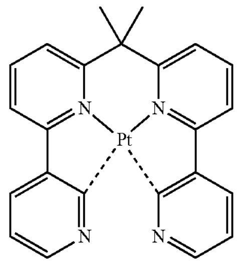
PD46
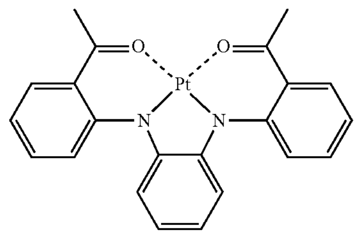
PD47
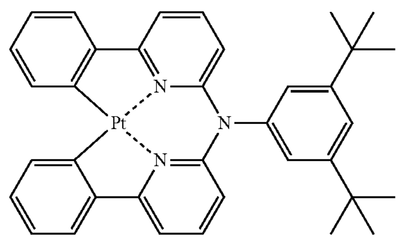
PD48
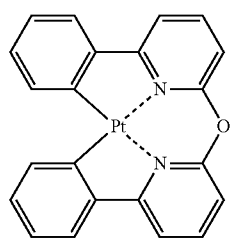
PD49
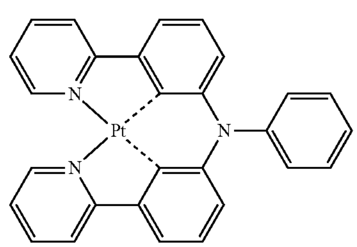
PD50
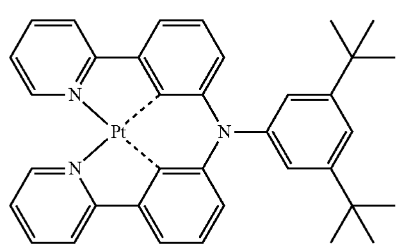

-continued
PD51
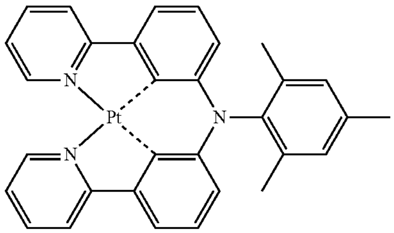
PD52
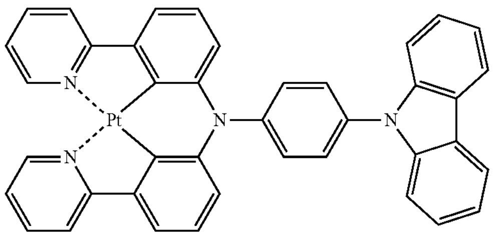
PD53
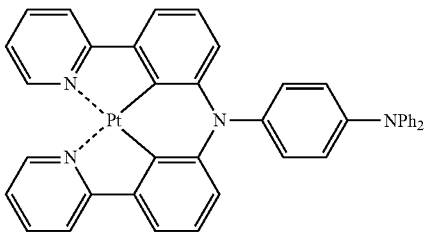
PD54
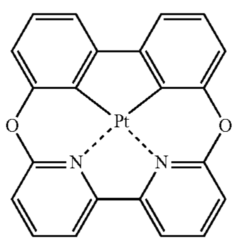
PD55
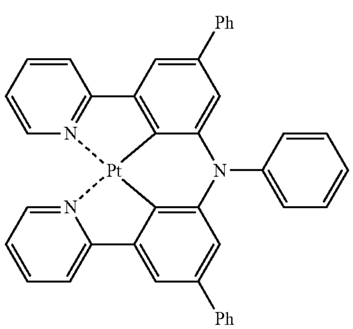
PD56
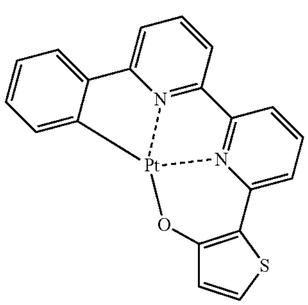
-continued
PD57
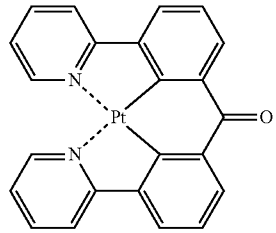
PD58
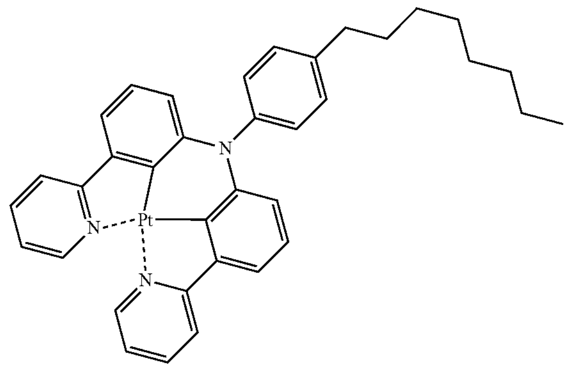
PD59
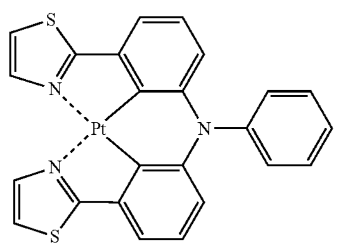
PD60
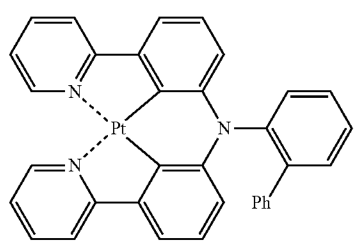
PD61
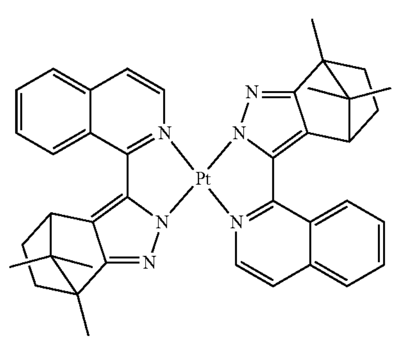

PD62
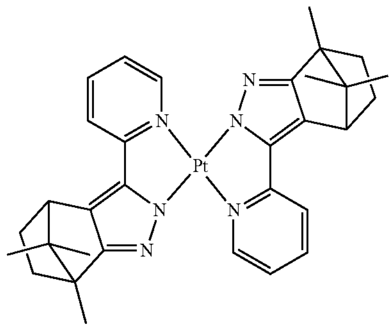
PD63
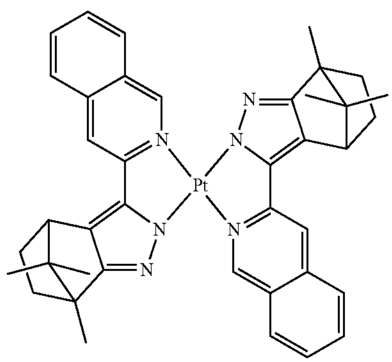
PD64
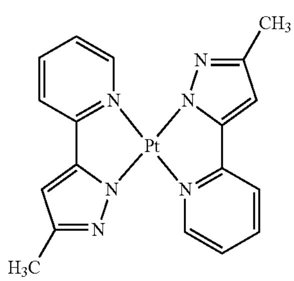
PD65
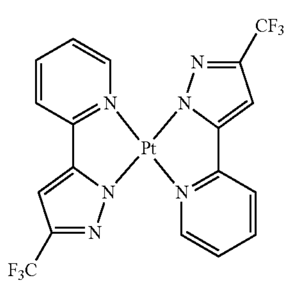
PD66
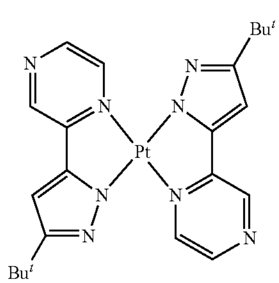
PD67
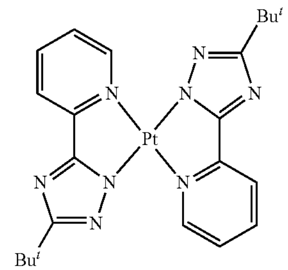
PD68
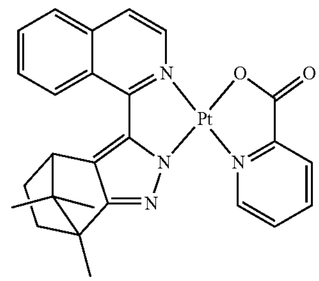
PD69
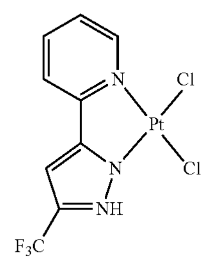
PD70
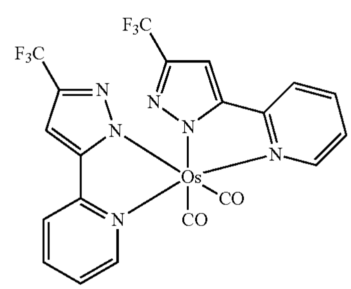
PD71
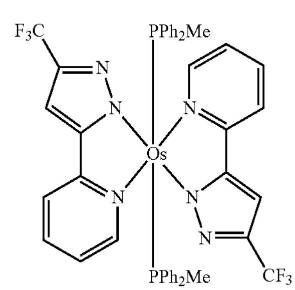

-continued
PD72
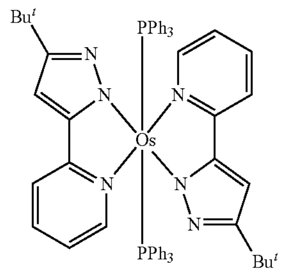
PD73
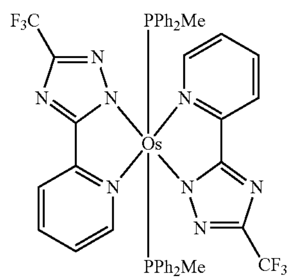
-continued
PD74
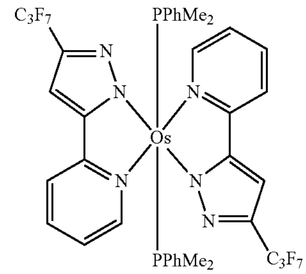
In some embodiments, the phosphorescent dopant may include PtOEP.
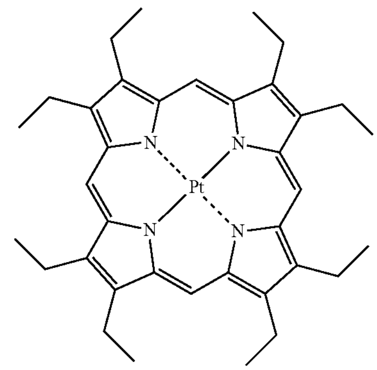
PtOEP
The fluorescent dopant may include at least one of DPAVBi, BDAVBi, TBPe, DCM, DCJTB, Coumarin 6, and a C545T below.
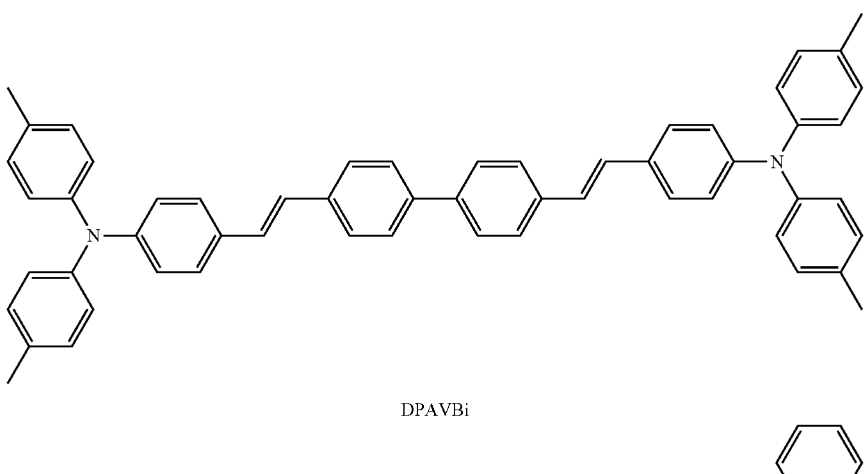
DPAVBi
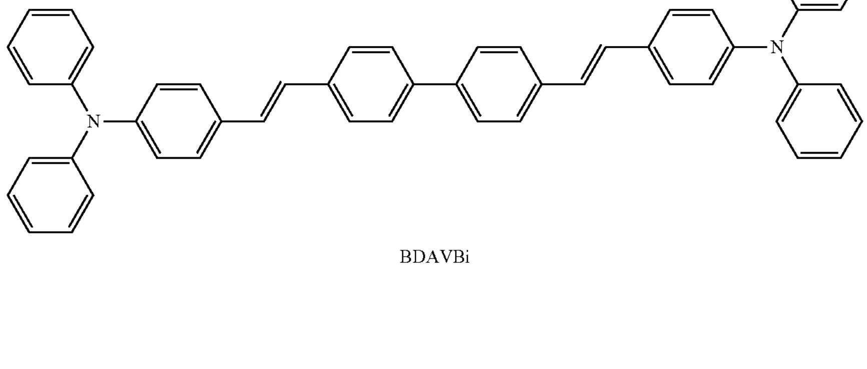
BDAVBi -continued

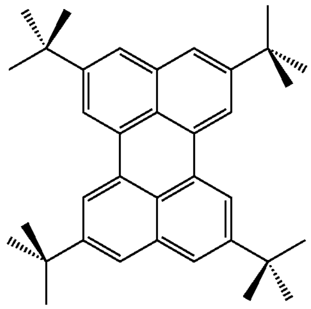

TBPe

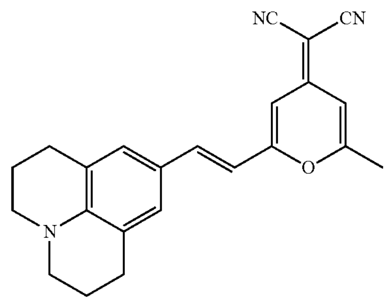

DCM

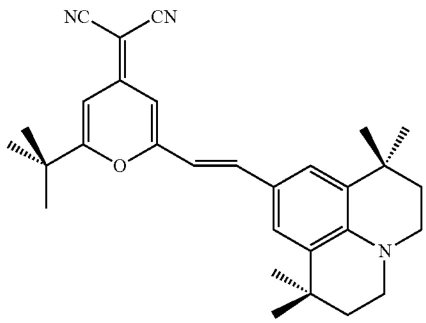

DCJTB

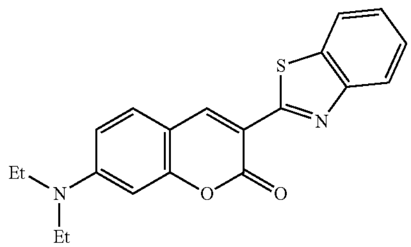

Coumarin 6

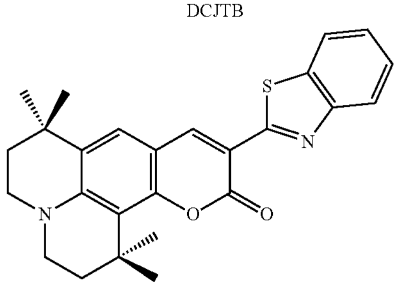

C545T

In some embodiments, the fluorescent dopant may include a compound represented by Formula 501.

Formula 501

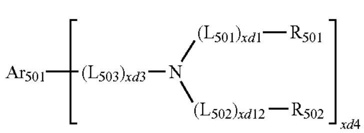

In Formula 501, $Ar_{501}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a pentaphene, and an indenoanthracene, and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$), where $Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{501}$ to $L_{503}$ may be each independently defined as $L_{201}$ described above;

$R_{501}$ and $R_{502}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3; and xd4 may be selected from 1, 2, 3, and 4.

For example, the fluorescent dopant may include at least one of Compounds FD1 to FD8.

FD1

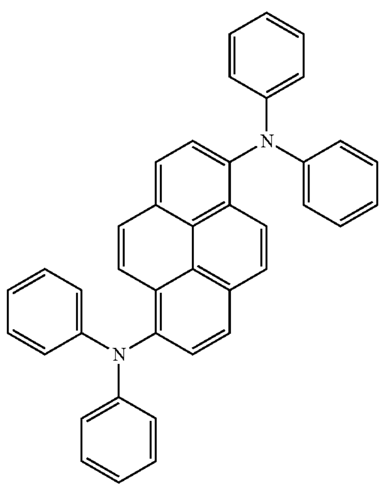

FD2

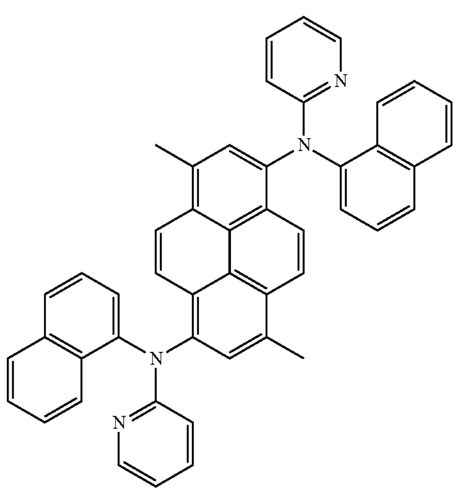

-continued

FD3

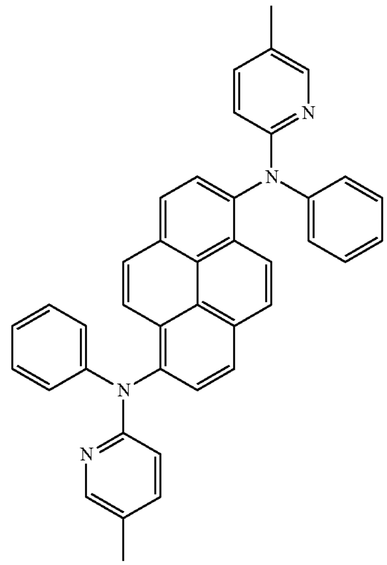

FD4

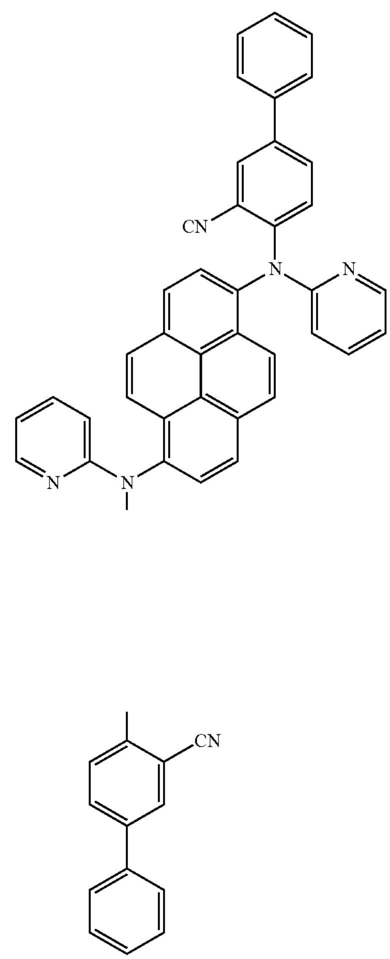

-continued

FD5

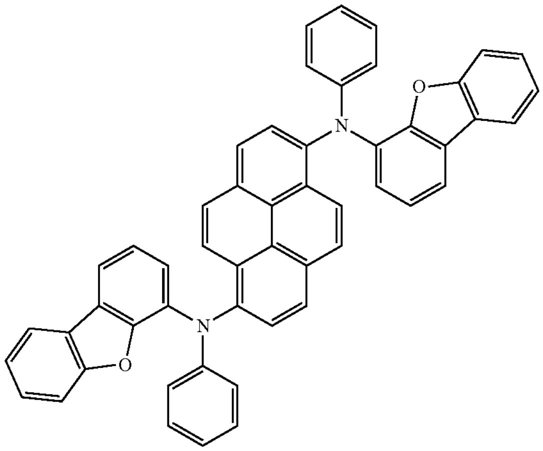

FD6

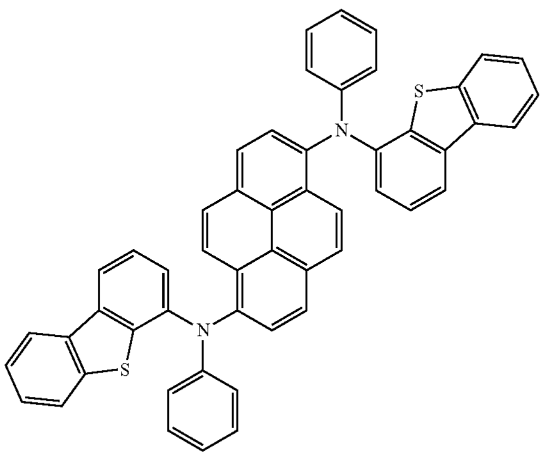

FD7

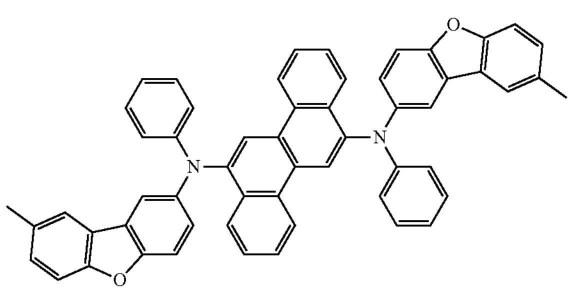

FD8

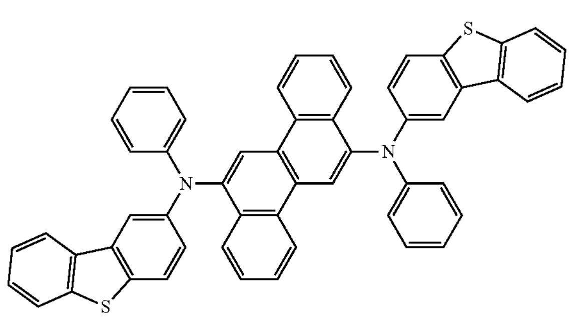

An amount of the dopant in the EML may be from about 0.01 parts by weight to about 15 parts by weight based on 100 parts by weight of the host, but the amount of the dopant is not limited to this range.

A thickness of the EML may be from about 100 Å to about 1,000 Å, and in some embodiments, from about 200 Å to about 600 Å. When the thickness of the EML is within any of these ranges, the EML may have good light emitting ability without a substantial increase in driving voltage.

In some embodiments, the electron transport region may be formed on the EML.

The electron transport region may include at least one selected from a HBL, an ETL, and an EIL. However, embodiments of the present disclosure are not limited thereto.

In some embodiments, the electron transport region may have a structure of ETL/EIL or a structure of HBL/ETL/EIL, wherein the layers forming the structure of the electron transport region may be sequentially stacked on the EML in the order stated above. However, embodiments of the present disclosure are not limited thereto:

The electron transport region may include a HBL. In embodiments where the EML includes a phosphorescent dopant, the HBL may prevent diffusion of triplet excitons or holes from the EML into the ETL.

When the electron transport region includes a HBL, the HBL may be formed on the EML by any of a variety of methods, for example, by vacuum deposition, spin coating, casting, Langmuir-Blodgett (LB) deposition, inkjet printing, laser printing, laser induced thermal imaging (LITI), or the like. When the HBL is formed by vacuum deposition or spin coating, the deposition and coating conditions for forming the HBL may be similar to the above-described deposition and coating conditions for forming the HIL.

In some embodiments, the HBL may include at least one of BCP and Bphen illustrated below. However, embodiments of the present disclosure are not limited thereto.

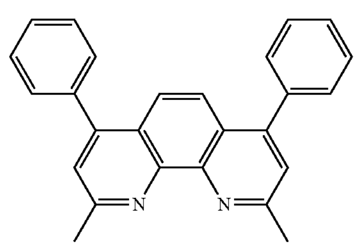

BCP

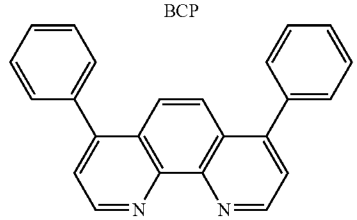

Bphen

A thickness of the HBL may be from about 20 Å to about 1,000 Å, and in some embodiments, from about 30 Å to about 300 Å. When the thickness of the HBL is within any of these ranges, the HBL may have improved hole blocking ability without a substantial increase in driving voltage.

The electron transport region may include an ETL. The ETL may be formed on the EML or on the HBL by any of a variety of methods, for example, by vacuum deposition, spin coating, casting, Langmuir-Blodgett (LB) deposition, inkjet printing, laser printing, laser induced thermal imaging (LITI), or the like. When the ETL is formed by vacuum deposition or spin coating, the deposition and coating conditions for forming the ETL may be similar to the above-described deposition and coating conditions for forming the HIL.

The ETL may include at least one selected from BCP, Bphen, $Alq_3$, Balq, TAZ, and NTAZ.

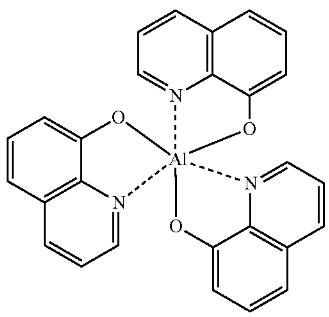

$Alq_3$

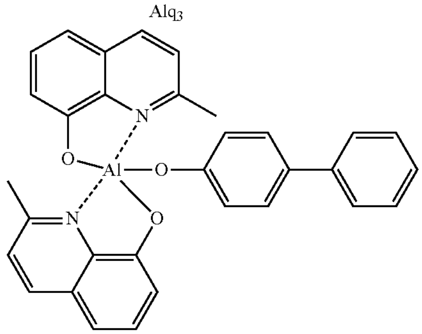

Balq

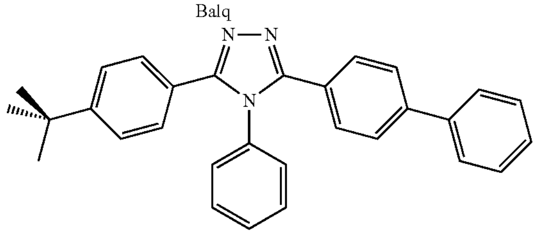

TAZ

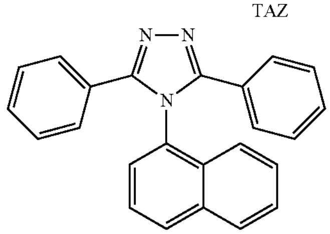

NTAZ

In some embodiments, the ETL may include at least one compound represented by Formula 601.

$$Ar_{601}\text{-}[(L_{601})_{xe1}\text{-}E_{601}]_{xe2} \qquad \text{Formula 601}$$

In Formula 601, $Ar_{601}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), where $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{601}$ may be defined as $L_{201}$ described above, $E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a benzocarbazolyl group, and a dibenzocarbazolyl group, and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3, and xe2 may be selected from 1, 2, 3, and 4.

In some embodiments, the ETL may include at least one compound represented by Formula 602.

Formula 602

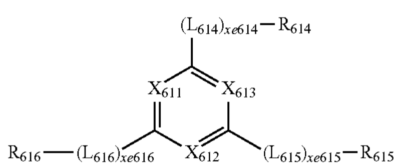

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one of $X_{611}$ to $X_{613}$ may be N, $L_{611}$ to $L_{616}$ may be defined as $L_{201}$ described above, $R_{611}$ to $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may be each independently selected from, 0, 1, 2, and 3.

The compound of Formula 601 and the compound of Formula 602 may each independently include at least one of Compounds ET1 to ET15.

ET1

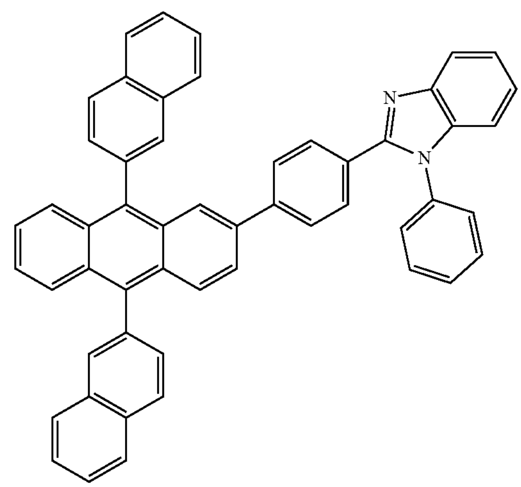

ET2

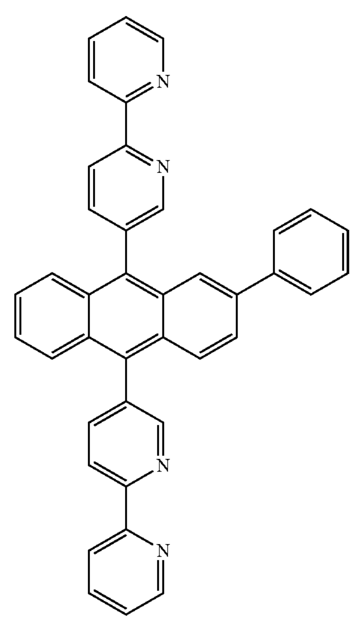

ET3
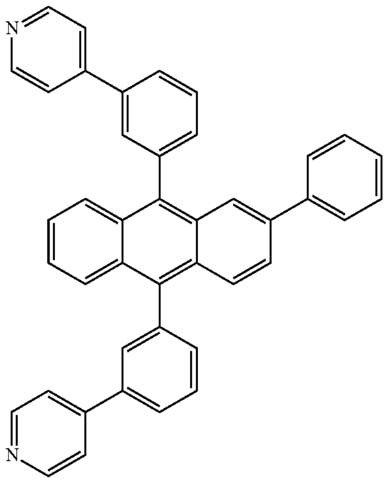
ET4
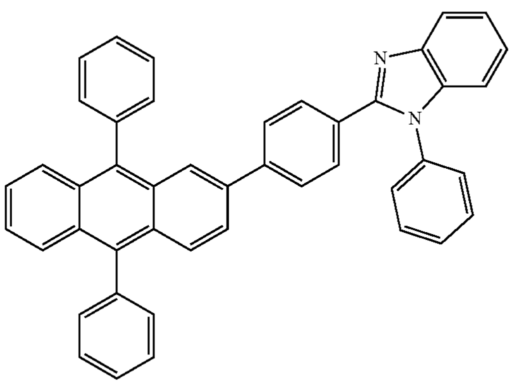
ET5
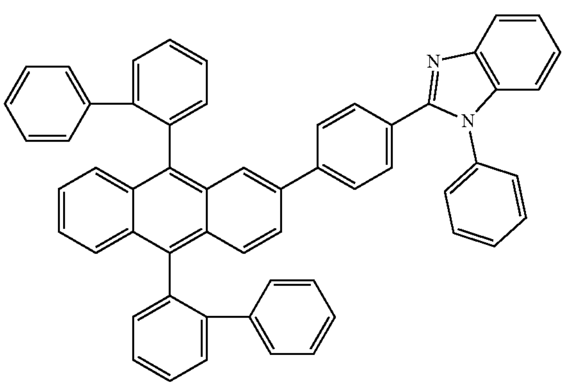
ET6
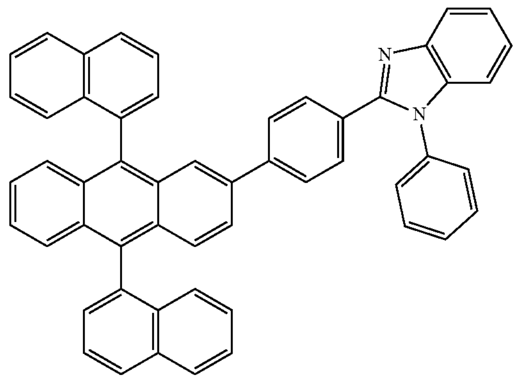
ET7
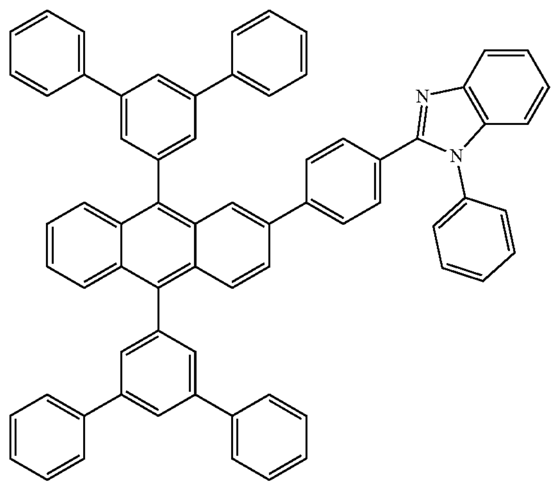
ET8
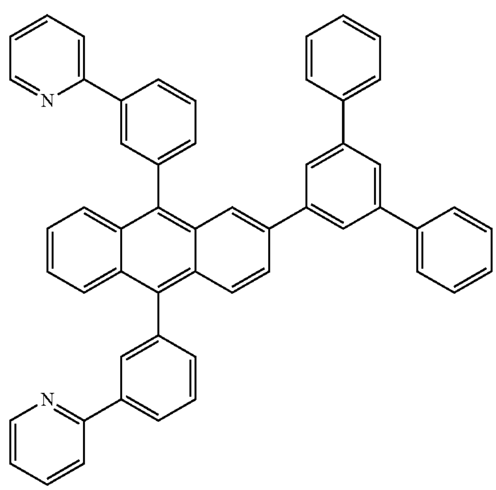

ET9
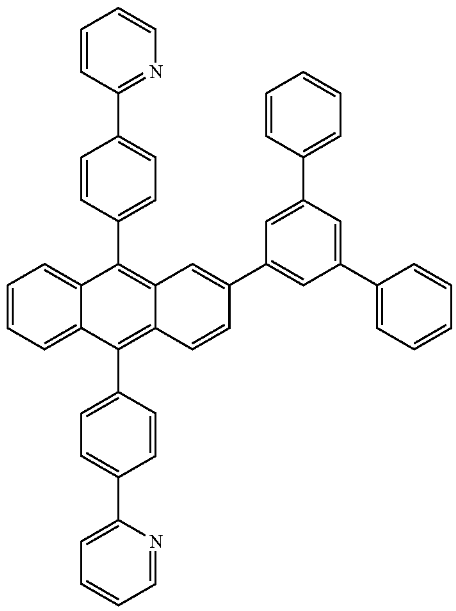
ET10
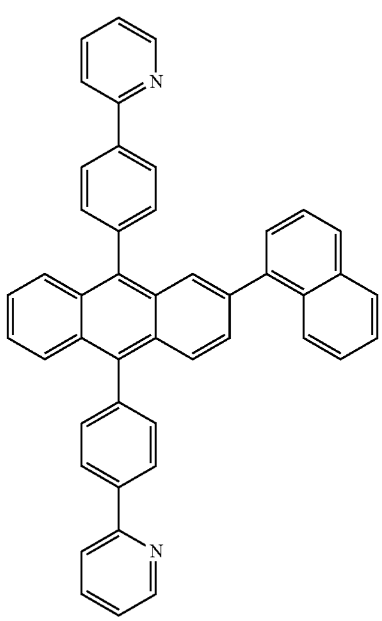
ET11
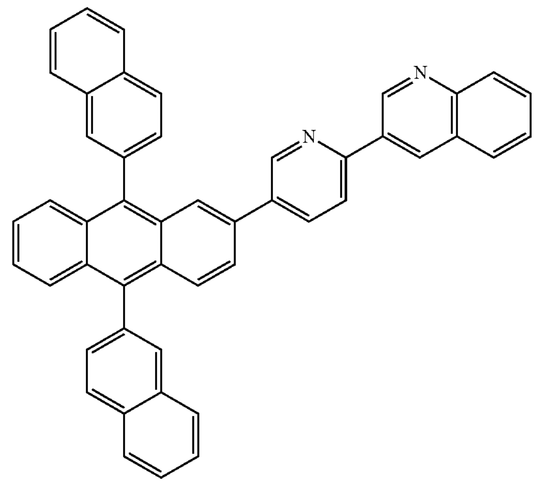
ET12
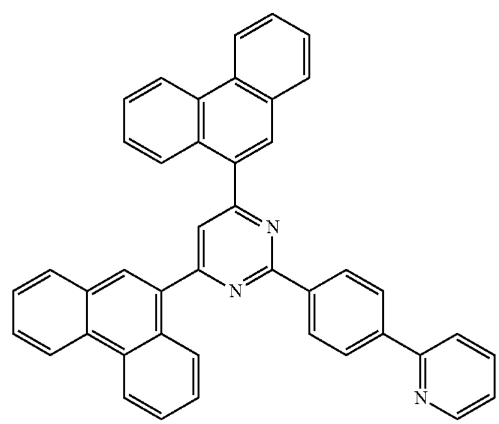
ET13
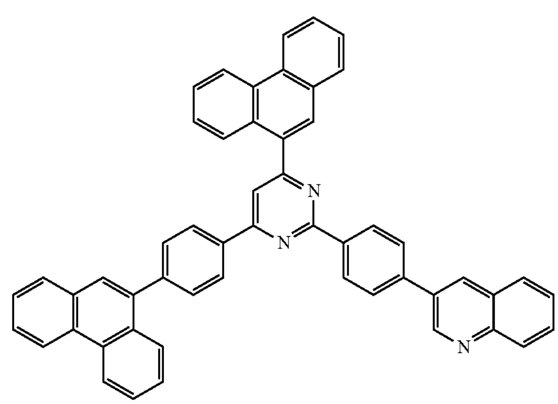

-continued

ET14

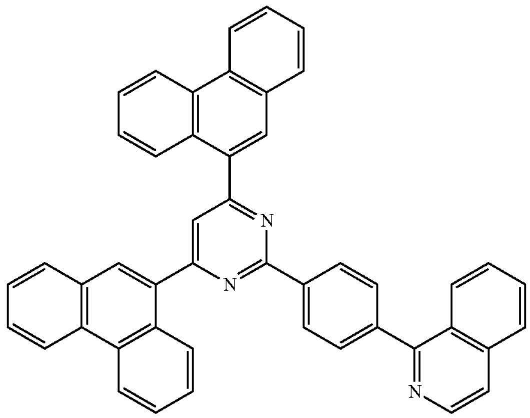

ET15

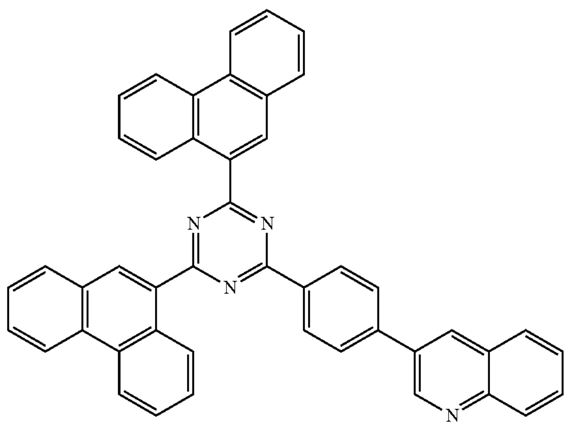

A thickness of the ETL may be from about 100 Å to about 1,000 Å, and in some embodiments, from about 150 Å to about 500 Å. When the thickness of the ETL is within any of these ranges, the ETL may have satisfactory electron transporting ability without a substantial increase in driving voltage.

In some embodiments, the ETL may further include a metal-containing material, in addition to the above-described materials.

The metal-containing material may include a lithium (Li) complex. Non-limiting examples of the Li complex include a lithium quinolate (LiQ) complex such as Compound ET-D1, and Compound ET-D2.

ET-D1

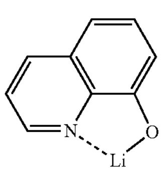

-continued

ET-D2

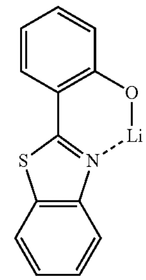

The electron transport region may include an EIL. In some embodiments, the EIL may facilitate injection of electrons from the second electrode 190.

The EIL may be formed on the ETL by any of a variety of methods, for example, by vacuum deposition, spin coating, casting, Langmuir-Blodgett (LB) deposition, inkjet printing, laser printing, laser induced thermal imaging (LITI), or the like. When the EIL is formed by vacuum deposition or spin coating, the deposition and coating conditions for forming the EIL may be similar to the above-described deposition and coating conditions for forming the HIL.

The EIL may include at least one selected from LiF, NaCl, CsF, $Li_2O$, BaO, and LiQ.

A thickness of the EIL may be from about 1 Å to about 100 Å, and in some embodiments, from about 3 Å to about 90 Å. When the thickness of the EIL is within any of these ranges, the EIL may have satisfactory electron injection ability without a substantial increase in driving voltage.

The second electrode 190 may be positioned on the organic layer 150 described above. The second electrode 190 may be a cathode and may function as an electron injecting electrode. A material for forming the second electrode 190 may be a metal, an alloy, an electrically conductive compound, which all have a low-work function, or a mixture thereof. Non-limiting examples of materials for forming the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, a material for forming the second electrode 190 may be ITO or IZO. The second electrode 190 may be a reflective electrode, a semi-transmissive electrode, or a transmissive electrode.

Although the organic light-emitting device as illustrated in the drawing has been described above, embodiments of the present disclosure are not limited thereto.

As used herein, a $C_1$-$C_{60}$ alkyl group refers to a linear or branched aliphatic hydrocarbon monovalent group having 1 to 60 carbon atoms in the main carbon chain. Non-limiting examples of the $C_1$-$C_{60}$ alkyl group include a methyl group, an ethyl group, a n-propyl group, an iso-propyl group, a butyl group, an isobutyl group, a sec-butyl group, a tert-butyl group, a pentyl group, an iso-amyl group, and a hexyl group. A $C_1$-$C_{60}$ alkylene group refers to a divalent group having the same structure as the $C_1$-$C_{60}$ alkyl group.

As used herein, a $C_1$-$C_{60}$ alkoxy group refers to a monovalent group represented by —$OA_{101}$ (where $A_{101}$ is the $C_1$-$C_{60}$ alkyl group as described above). Non-limiting examples of the $C_1$-$C_{60}$ alkoxy group include a methoxy group, an ethoxy group, and an isopropyloxy group.

As used herein, a $C_2$-$C_{60}$ alkenyl group refers to a hydrocarbon group including at least one carbon-carbon double bond at one or more positions along a carbon chain of the $C_2$-$C_{60}$ alkyl group (e.g., in the middle or at either terminal end of the carbon chain of the $C_2$-$C_{60}$ alkyl group). Non-limiting examples of the $C_2$-$C_{60}$ alkenyl group include an ethenyl group, a propenyl group, and a butenyl group. A $C_2$-$C_{60}$ alkenylene group refers to a divalent group having the same structure as the $C_2$-$C_{60}$ alkenyl group.

As used herein, a $C_2$-$C_{60}$ alkynyl group refers to a hydrocarbon group including at least one carbon-carbon triple bond at one or more positions along a carbon chain of the $C_2$-$C_{60}$ alkyl group (e.g., in the middle or at either terminal end of the carbon chain of the $C_2$-$C_{60}$ alkyl group). Non-limiting examples of the $C_2$-$C_{60}$ alkynyl group include an ethynyl group, and a propynyl group. A $C_2$-$C_{60}$ alkynylene group as used herein refers to a divalent group having the same structure as the $C_2$-$C_{60}$ alkynyl group.

As used herein, a $C_3$-$C_{10}$ cycloalkyl group refers to a monovalent, monocyclic hydrocarbon group having 3 to 10 carbon atoms as ring-forming atoms. Non-limiting examples of the $C_3$-$C_{10}$ cycloalkyl group include a cyclopropyl group, a cyclobutyl group, a cyclopentyl group, a cyclohexyl group, and a cycloheptyl group. A $C_3$-$C_{10}$ cycloalkylene group refers to a divalent group having the same structure as the $C_3$-$C_{10}$ cycloalkyl group.

As used herein, a $C_1$-$C_{10}$ heterocycloalkyl group refers to a monovalent monocyclic group having 1 to 10 carbon atoms and at least one hetero atom selected from N, O, P, and S as ring-forming atoms. Non-limiting examples of the $C_1$-$C_{10}$ heterocycloalkyl group include a tetrahydrofuranyl group and a tetrahydrothiophenyl group. A $C_1$-$C_{10}$ heterocycloalkylene group refers to a divalent group having the same structure as the $C_1$-$C_{10}$ heterocycloalkyl group.

As used herein, a $C_3$-$C_{10}$ cycloalkenyl group refers to a monovalent monocyclic non-aromatic group having 3 to 10 carbon atoms as ring-forming atoms and at least one carbon-carbon double bond in the ring. Non-limiting examples of the $C_3$-$C_{10}$ cycloalkenyl group include a cyclopentenyl group, a cyclohexenyl group, and a cycloheptenyl group. A $C_3$-$C_{10}$ cycloalkenylene group refers to a divalent group having the same structure as the $C_3$-$C_{10}$ cycloalkenyl group.

As used herein, a $C_1$-$C_{10}$ heterocycloalkenyl group refers to a monovalent monocyclic group having 1 to 10 carbon atoms and at least one hetero atom selected from N, O, P, and S as ring-forming atoms, and at least one carbon-carbon double bond in the ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group as used herein refers to a divalent group having the same structure as the $C_1$-$C_{10}$ heterocycloalkenyl group.

As used herein, a $C_6$-$C_{60}$ aryl group refers to a monovalent, aromatic carbocyclic group having 6 to 60 carbon atoms as ring-forming atoms, and a $C_6$-$C_{60}$ arylene group refers to a divalent, aromatic carbocyclic group having 6 to 60 carbon atoms as ring-forming atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include at least two rings, the rings may be fused to each other.

As used herein, a $C_1$-$C_{60}$ heteroaryl group refers to a monovalent, aromatic carbocyclic group having 1 to 60 carbon atoms and at least one hetero atom selected from N, O, P, and S as ring-forming atoms. A $C_1$-$C_{60}$ heteroarylene group refers to a divalent, aromatic carbocyclic group having 1 to 60 carbon atoms and at least one hetero atom selected from N, O, P, and S as ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include at least two rings, the rings may be fused to each other.

As used herein, a $C_6$-$C_{60}$ aryloxy group refers to a group represented by —$OA_{102}$ (where $A_{102}$ is the $C_6$-$C_{60}$ aryl group as described above), and a $C_6$-$C_{60}$ arylthio group refers to a group represented by —$SA_{103}$ (where $A_{103}$ is the $C_6$-$C_{60}$ aryl group as described above).

As used herein, a monovalent non-aromatic condensed polycyclic group refers to a monovalent group that includes at least two rings condensed to each other, the rings including only carbon atoms as ring-forming atoms, and does not have overall aromaticity. A non-limiting example of the monovalent non-aromatic condensed polycyclic group is a fluorenyl group. As used herein, a divalent non-aromatic condensed polycyclic group refers to a divalent group having the same structure as the monovalent non-aromatic condensed polycyclic group.

As used herein, a monovalent non-aromatic condensed heteropolycyclic group refers to a monovalent group that includes at least two rings condensed to each other, the rings including carbon atoms and at least one hetero atom selected from N, O, P and S as ring-forming atoms, and does not have overall aromaticity. A non-limiting example of the monovalent non-aromatic condensed heteropolycyclic group is a carbazolyl group. As used herein, a divalent non-aromatic condensed heteropolycyclic group refers to a divalent group having the same structure as the monovalent non-aromatic condensed heteropolycyclic group.

Acronym "Ph" as used herein refers to phenyl, acronym "Me" as used herein refers to methyl, acronym "Et" as used herein refers to ethyl, and acronym "ter-Bu" or "$Bu^t$" as used herein refers to tert-butyl.

One or more embodiments of the present disclosure directed to amine-based compounds and organic light-emitting devices including the same, will now be described with reference to the following examples. However, these examples are only for illustrative purposes and are not intended to limit the scope of the one or more embodiments of the present disclosure. In the following synthesis examples, the expression "B' instead of 'A' was used" or "13' instead of 'A' was included" indicates that 'B' and 'A' were included in equivalent amounts.

EXAMPLES

Synthesis Example 1

Synthesis of Compound 9

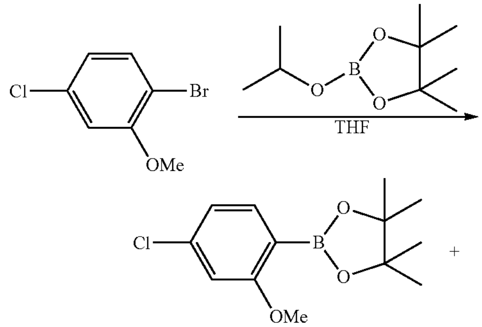

9-1

-continued

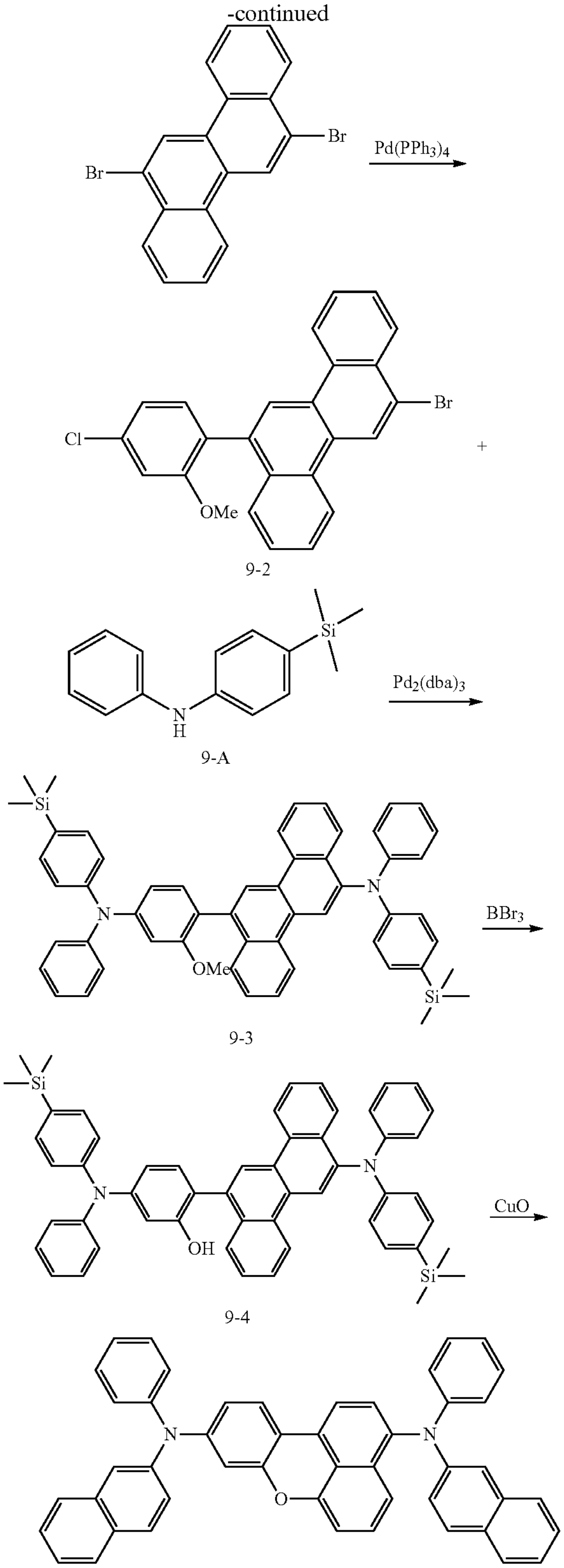

Synthesis of Intermediate 9-1

After 5.2 g (23.6 mmol) of 2-bromo-5-chloroanisole was dissolved in 100 mL of tetrahydrofuran, 10 mL of n-BuLi (25.0 mmol, 2.5M in hexane) was slowly dropwise added thereto at about −78° C. After the resulting solution was stirred at the same temperature for about 1 hour, 9.3 mL (50.0 mmol) of 2-isoproxy-4,4,5,5,-tetramethyl-1,3,2-dioxaborolane was slowly dropwise added thereto, and then stirred first at about −78° C. for about 1 hour and then at room temperature for about 24 hours. After the reaction was completed, 50 mL of a 10% HCl aqueous solution and 50 mL of $H_2O$ were added thereto, followed by extraction (three times) with 80 mL of diethyl ether. An organic phase was collected, and dried using magnesium sulfate, and the solvent was evaporated. The resulting residue was purified using silica gel column chromatography to obtain 5.83 g of Intermediate 9-1 (Yield: 92%). This compound was identified using liquid chromatography-mass spectroscopy (LC-MS).

$C_{13}H_{18}BClO_3$: $M^+$ 268.1

Synthesis of Intermediate 9-2

5.90 g (22.0 mmol) of Intermediate 9-1, 16.9 g (44.0 mmol) of 1,4-dibromochrysene, 1.27 g (1.1 mmol) of tetrakis(triphenylphosphine)palladium ($Pd(PPh_3)_4$), and 4.50 g (33 mmol) of $K_2CO_3$ were dissolved in 200 mL of a mixed solution of tetrahydrofuran (THF) and $H_2O$ (2:1 by volume), and the resulting mixture was then stirred at about 70° C. for about 5 hours. The resulting reaction solution was cooled down to room temperature, and 60 mL of water was added thereto, followed by extraction (three times) with 60 mL of ethylether. An organic phase was collected, and dried using magnesium sulfate, and the solvent was evaporated. The resulting residue was purified using silica gel column chromatography to obtain 6.30 g of Intermediate 9-2 (Yield: 64%). This compound was identified using LC-MS.

$C_{25}H_{16}BrClO$: $M^+$ 446.0

Synthesis of Intermediate 9-3

8.92 g (20.0 mmol) of Intermediate 9-2, 9.65 g (40.0 mmol) of Intermediate 9-A, 0.37 g (0.4 mmol) of $Pd_2(dba)_3$, 0.08 g (0.4 mmol) of $(t\text{-}Bu)_3P$, and 5.76 g (60.0 mmol) of t-BuOK were dissolved in 90 mL of toluene to obtain a mixture, which was then stirred at about 85° C. for 12 hours. The resulting reaction solution was cooled down to room temperature, followed by extraction (three times) with 50 mL of water and 50 mL of diethylether. An organic phase was collected, and dried using magnesium sulfate, and the solvent was evaporated. The resulting residue was purified using silica gel column chromatography to obtain 13.5 g of Intermediate 9-3 (Yield: 83%). This compound was identified using LC-MS.

$C_{55}H_{52}N_2OSi_2$ $M^+$ 812.4

Synthesis of Intermediate 9-4

After 1.62 g (2.00 mmol) of Intermediate 9-3 was dissolved in 10 mL of dichloromethane, 0.33 mL (3.5 mmol) of $BBr_3$ was slowly dropwise added thereto at about −78° C. The temperature of the resulting reaction solution was then raised to room temperature, and the reaction solution was stirred at room temperature for about 24 hours. After the reaction was completed, 5 mL of MeOH and 10 mL of $H_2O$ were added thereto, followed by extraction (three times) with 10 mL of dichloromethane. An organic phase was collected, and dried using magnesium sulfate, and the solvent was evaporated. The resulting residue was purified using silica gel column chromatography to obtain 1.20 g of Intermediate 9-4 (Yield: 75%). This compound was identified using LC-MS.

$C_{54}H_{50}N_2OSi_2$: $M^+$ 798.3

Synthesis of Compound 9

1.60 g (2.00 mmol) of Intermediate 9-4 was dissolved in 10 mL of dimethylformamide (DMF), and 0.48 g (6.0 mmol) of CuO was dropwise added thereto at room temperature. The resulting reaction solution was stirred at about 140° C. for about 48 hours. After the reaction was completed, the reaction product was filtered using a Celite to obtain an organic phase. 10 mL of $H_2O$ was added to the organic phase, followed by extraction (three times) with 10 mL of ethylacetate. An organic phase was collected, and dried using magnesium sulfate, and the solvent was evaporated. The resulting residue was purified using silica gel column chromatography to obtain 1.39 g of Compound 9 (Yield: 87%). This compound was identified using $^1$H nuclear magnetic resonance (NMR, $CDCl_3$, 400 MHz) and mass spectroscopy/fast atom bombardment (MS/FAB).

δ=8.60-8.58 (m, 1H), 8.31-8.29 (m, 1H), 8.20-8.18 (m, 1H), 7.96-7.94 (m, 1H), 7.84-7.74 (m, 5H), 7.65-7.56 (m, 4H), 7.32-7.24 (m, 5H), 6.96-6.94 (m, 1H), 6.90-6.81 (m, 4H), 6.74-6.70 (m, 3H), 6.65-6.60 (m, 2H), 6.51-6.45 (m, 2H), 0.24 (s, 18H)

$C_{54}H_{48}N_2OSi_2$: $M^+$ calc. 796.33. found 796.34.

Synthesis Example 2

Synthesis of Compound 1

1-A

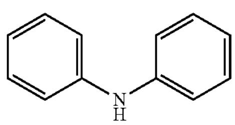

Compound 1 was synthesized as Compound 9 in Synthesis Example 1, except that Intermediate 1-A, instead of Intermediate 9-A, was used. This compound was identified using $^1$H NMR ($CDCl_3$, 400 MHz) and MS/FAB.

δ=8.23-8.21 (m, 1H), 8.09 (d, 1H), 8.02 (d, 1H), 7.81-7.77 (m, 1H), 7.63-7.48 (m, 5H), 7.12-7.02 (m, 9H), 6.76-6.74 (m, 1H), 6.66-6.61 (m, 4H), 6.50 (dd, 1H), 6.30-6.25 (m, 4H), 6.15-6.10 (m, 4H)

$M^+$ calc. 652.25. found 652.26.

Synthesis Example 3

Synthesis of Compound 3

3-A

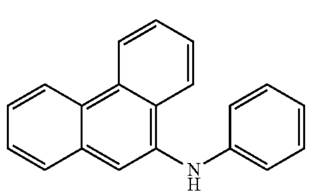

Compound 3 was synthesized as Compound 9 in Synthesis Example 1, except that Intermediate 3-A, instead of Intermediate 9-A, was used. This compound was identified using $^1$H NMR ($CDCl_3$, 400 MHz) and MS/FAB.

δ=8.62-8.60 (m, 1H), 8.51-8.47 (m, 3H), 8.38 (d, 1H), 8.20-8.16 (m, 2H), 7.97-7.85 (m, 1H), 7.82-7.79 (m, 1H), 7.71-7.49 (m, 14H), 7.43-7.39 (m, 2H), 7.16-7.01 (m, 6H), 6.85-6.77 (m, 4H), 6.66 (dd, 1H), 6.52-6.49 (m, 2H), 6.45-6.41 (m, 2H)

$M^+$ calc. 852.31. found 852.32.

Synthesis Example 4

Synthesis of Compound 8

8-A

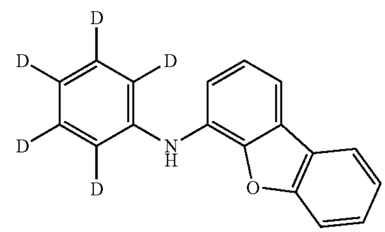

Compound 8 was synthesized as Compound 9 in Synthesis Example 1, except that Intermediate 8-A, instead of Intermediate 9-A, was used. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 2H), 7.84-7.79 (m, 2H), 7.72-7.67 (m, 3H), 7.63-7.54 (m, 5H), 7.48-7.40 (m, 4H), 7.32-7.30 (m, 1H), 7.23-7.14 (m, 4H), 6.92-6.90 (m, 1H), 6.71 (dd, 1H)

$M^+$ calc. 842.34. found 842.34.

Synthesis Example 5

Synthesis of Compound 11

11-A

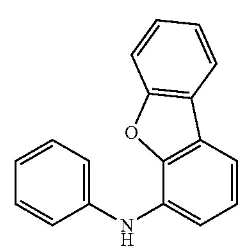

Compound 11 was synthesized as Compound 9 in Synthesis Example 1, except that Intermediate 11-A, instead of Intermediate 9-A, was used. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 1H), 7.84-7.79 (m, 2H), 7.72-7.68 (m, 3H), 7.63-7.54 (m, 6H), 7.48-7.40 (m, 4H), 7.32-7.14 (m, 9H), 6.92-6.90 (m, 1H), 6.85-6.80 (m, 2H), 6.72 (dd, 1H), 6.56-6.53 (m, 2H), 6.53-6.50 (m, 2H)

$C_{60}H_{36}N_2O_3$: $M^+$ calc. 832.27. found 832.28.

Synthesis Example 6

Synthesis of Compound 14

14-A

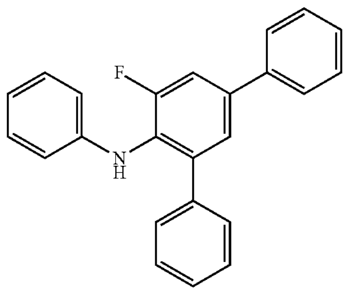

Compound 14 was synthesized as Compound 9 in Synthesis Example 1, except that Intermediate 14-A, instead of Intermediate 9-A, was used. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.92-7.88 (m, 3H), 7.84-7.70 (m, 21H), 7.64-7.60 (m, 4H), 7.34-7.22 (m, 7H), 6.93-6.88 (m, 2H), 6.80-6.78 (m, 1H), 6.67 (dd, 1H), 6.55-6.52 (m, 2H), 6.45-6.42 (m, 2H)

$M^+$ calc. 992.36. found 992.37.

Synthesis Example 7

Synthesis of Compound 18

18-A

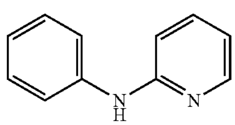

Compound 18 was synthesized as Compound 9 in Synthesis Example 1, except that Intermediate 18-A, instead of Intermediate 9-A, was used. This compound was identified using $^1$H NMR ($CDCl_3$, 400 MHz) and MS/FAB.

δ=8.60-8.58 (m, 1H), 8.47-8.42 (m, 2H), 8.30-8.28 (m, 1H), 8.20-8.15 (m, 2H), 7.94-7.89 (m, 1H), 7.72-7.65 (m, 4H), 7.55-7.50 (m, 2H), 7.38-7.30 (m, 5H), 7.25-7.20 (m, 2H), 7.08-7.05 (m, 1H), 6.99-6.92 (m, 2H), 6.89-6.81 (m, 4H), 6.76 (dd, 1H), 6.67-6.63 (m, 2H)

$M^+$ calc. 654.24. found 654.25.

Synthesis Example 8

Synthesis of Compound 21

21-A

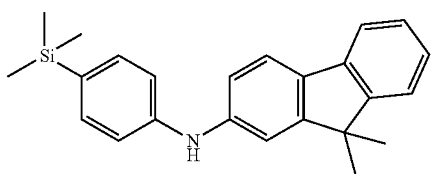

Compound 21 was synthesized as Compound 9 in Synthesis Example 1, except that Intermediate 21-A, instead of Intermediate 9-A, was used. This compound was identified using $^1$H NMR ($CDCl_3$, 400 MHz) and MS/FAB.

δ=8.60-8.58 (m, 1H), 8.30-8.26 (m, 2H), 8.20-8.18 (m, 1H), 7.82-7.76 (m, 3H), 7.68-7.54 (m, 6H), 7.41-7.30 (m, 6H), 7.22-7.16 (m, 5H), 6.99 (dd, 1H), 6.92-6.86 (m, 4H), 6.75-6.65 (m, 5H), 1.61 (m, 12H), 0.21 (m, 18H)

$M^+$ calc. 1028.46. found 1028.46.

Synthesis Example 9

Synthesis of Compound 23

23-A

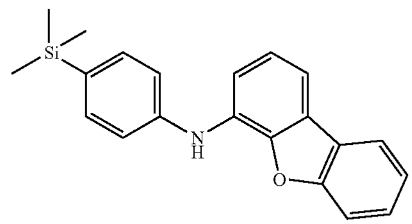

Compound 23 was synthesized as Compound 9 in Synthesis Example 1, except that Intermediate 23-A, instead of Intermediate 9-A, was used. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 1H), 7.84-7.80 (m, 2H), 7.72-7.66 (m, 3H), 7.61-7.54 (m, 6H), 7.48-7.34 (m, 8H), 7.21 (dd, 1H), 7.13-7.04 (m, 4H), 6.93-6.86 (m, 3H), 6.73-6.70 (m, 3H), 0.24 (m, 18H)

$M^+$ calc. 976.35. found 976.36.

Synthesis Example 10

Synthesis of Compound 26

26-A

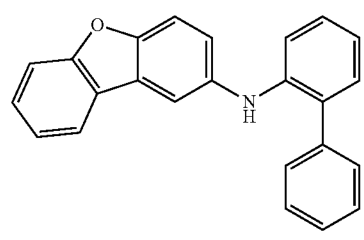

Compound 26 was synthesized as Compound 9 in Synthesis Example 1, except that Intermediate 26-A, instead of Intermediate 9-A, was used. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.84-7.80 (m, 2H), 7.73-7.70 (m, 4H), 7.64-7.40 (m, 22H), 7.32-7.20 (m, 5H), 7.11-7.06 (m, 2H), 6.87-6.81 (m, 3H), 6.73-6.70 (m, 1H), 6.62-6.56 (m, 2H)

$M^+$ calc. 984.34. found 984.35.

Synthesis Example 11

Synthesis of Compound 31

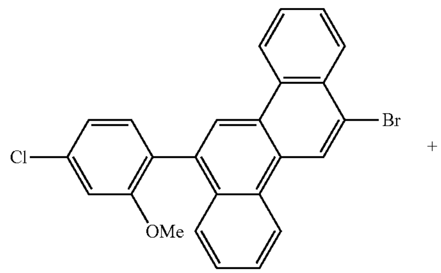

9-2

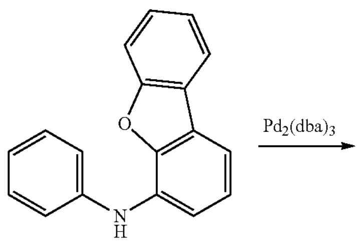

11-A

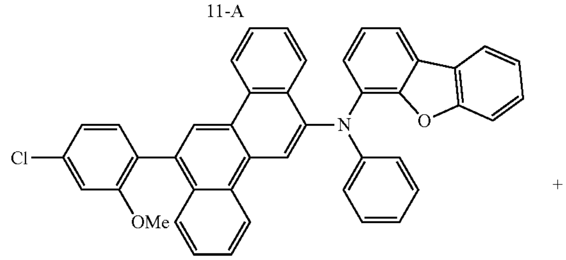

31-3

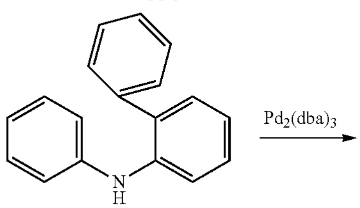

31-A

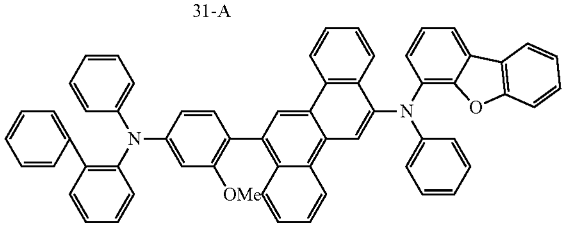

31-4

Compound 31 was synthesized as Compound 9 in Synthesis Example 1, except that Intermediate 11-A and Intermediate 31-A were used to synthesize Intermediate 31-4, instead of using Intermediate 9-A to synthesize Intermediate 9-3. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 1H), 7.84-7.82 (m, 1H), 7.73-7.71 (m, 1H), 7.63-7.40 (m, 13H), 7.21-6.94 (m, 10H), 6.82-6.80 (m, 1H), 6.75-6.71 (m, 3H), 6.51 (dd, 1H), 6.43-6.35 (m, 4H)

$C_{60}H_{38}N_2O_2$: $M^+$ calc. 818.29. found 818.30.

Synthesis Example 12

Synthesis of Compound 32

32-A

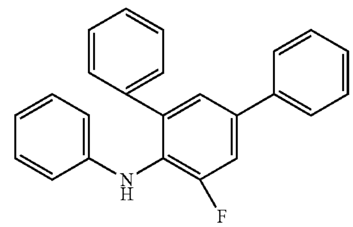

Compound 32 was synthesized as Compound 9 in Synthesis Example 1, except that Intermediate 32-A, instead of Intermediate 9-A used to synthesize Intermediate 9-3, and Intermediate 31-A were used. This compound was identified using $^1$H NMR ($CDCl_3$, 400 MHz) and MS/FAB.

δ=8.60-8.58 (m, 1H), 8.32-8.30 (m, 1H), 8.20-8.18 (m, 1H), 7.72-7.70 (m, 2H), 7.66-7.40 (m, 20H), 7.21-6.96 (m, 9H), 6.92-6.90 (m, 1H), 6.85-6.78 (m, 3H), 6.61 (dd, 1H), 6.49-6.46 (m, 2H), 6.40-6.36 (m, 2H)

$C_{66}H_{43}FN_2O$: $M^+$ calc. 898.34. found 898.35.

Synthesis Example 13

Synthesis of Compound 35

Compound 35 was synthesized as Compound 9 in Synthesis Example 1, except that Intermediate 11-A and Intermediate 9-A were used, instead of using Intermediate 9-A to synthesize Intermediate 9-3. This compound was identified using $^1$H NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 1H), 7.84-7.82 (m, 1H), 7.72-7.70 (m, 1H), 7.63-7.52 (m, 6H), 7.48-7.36 (m, 4H), 7.21-7.14 (m, 7H), 6.96-6.94 (m, 1H), 6.90-6.82 (m, 4H), 6.73 (dd, 1H), 6.67-6.62 (m, 2H), 6.53-6.50 (m, 2H), 0.24 (m, 9H)

$M^+$ calc. 814.30. found 814.31.

Synthesis Example 14

Synthesis of Compound 38

38-A

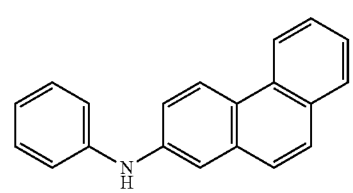

Compound 38 was synthesized as Compound 9 in Synthesis Example 1, except that Intermediate 38-A and Intermediate 9-A were used, instead of using Intermediate 9-A to synthesize Intermediate 9-3. This compound was identified using $^1$H NMR ($CDCl_3$, 400 MHz) and MS/FAB.

δ=8.60-8.58 (m, 1H), 8.30-8.28 (m, 1H), 8.23-8.21 (m, 1H), 8.20-8.18 (m, 1H), 7.96-7.89 (m, 2H), 7.82-7.80 (m, 1H), 7.72-7.70 (m, 1H), 7.65-7.40 (m, 9H), 7.40-7.36 (m,

2H), 7.22-7.13 (m, 5H), 7.01-6.95 (m, 2H), 6.91-6.81 (m, 4H), 6.73 (dd, 1H), 6.57-6.54 (m, 2H), 6.45-6.41 (m, 2H), 0.24 (m, 9H)

$M^+$ calc. 824.32. found 824.33.

Synthesis Example 15

Synthesis of Compound 48

48-A

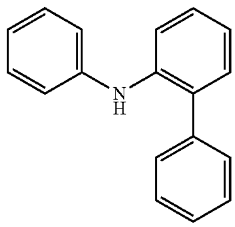

Compound 48 was synthesized as Compound 9 in Synthesis Example 1, except that Intermediate 48-A and Intermediate 11-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.31-8.29 (m, 1H), 8.20-8.18 (m, 1H), 7.84-7.82 (m, 1H), 7.72-7.53 (m, 11H), 7.48-7.40 (m, 4H), 7.28-7.04 (m, 10H), 6.96-6.94 (m, 1H), 6.82-6.80 (m, 1H), 6.75-6.70 (m, 2H), 6.61 (dd, 1H), 6.48-6.44 (m, 2H), 6.27-6.25 (m, 2H)

$M^+$ calc. 818.29. found 818.30.

Synthesis Example 16

Synthesis of Compound 49

Compound 49 was synthesized as Compound 9 in Synthesis Example 1, except that Intermediate 14-A and Intermediate 11-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.32-8.30 (m, 1H), 8.20-8.18 (m, 1H), 7.84-7.82 (m, 1H), 7.70-7.40 (m, 21H), 7.22-7.04 (m, 8H), 6.92-6.90 (m, 1H), 6.85-6.78 (m, 2H), 6.70 (dd, 1H), 6.56-6.53 (m, 2H), 6.35-6.32 (m, 2H)

$M^+$ calc. 912.32. found 912.33.

Synthesis Example 17

Synthesis of Compound 50

50-A

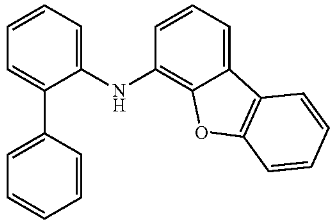

Compound 50 was synthesized as Compound 9 in Synthesis Example 1, except that Intermediate 50-A and Intermediate 11-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.32-8.30 (m, 1H), 8.20-8.18 (m, 1H), 7.84-7.75 (m, 3H), 7.72-7.67 (m, 3H), 7.61-7.54 (m, 10H), 7.49-7.40 (m, 5H), 7.29-7.00 (m, 11H), 6.92-6.90 (m, 1H), 6.83 (t, 1H), 6.71 (dd, 1H), 6.66-6.63 (m, 2H)

$M^+$ calc. 908.30. found 908.31.

Synthesis Example 18

Synthesis of Compound 57

Compound 57 was synthesized as Compound 9 in Synthesis Example 1, except that Intermediate 1-A and Intermediate 50-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.30-8.28 (m, 1H), 8.10-8.08 (m, 1H), 7.84-7.79 (m, 2H), 7.72-7.70 (m, 3H), 7.63-7.54 (m, 9H), 7.49-7.40 (m, 4H), 7.20-6.92 (m, 11H), 6.85-6.81 (m, 2H), 6.74-6.72 (m, 1H), 6.61 (t, 1H), 6.52-6.48 (m, 2H)

$M^+$ calc. 818.29. found 818.30.

Synthesis Example 19

Synthesis of Compound 60

Compound 60 was synthesized as Compound 9 in Synthesis Example 1, except that Intermediate 48-A and Intermediate 50-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.33-8.29 (m, 1H), 8.10-8.08 (m, 1H), 7.84-7.82 (m, 1H), 7.72-7.70 (m, 1H), 7.65-7.50 (m, 14H), 7.47-7.40 (m, 5H), 7.20-7.10 (m, 5H), 7.05-6.90 (m, 7H), 6.78-6.76 (m, 1H), 6.72 (t, 1H), 6.64-6.62 (m, 1H), 6.41 (dd, 1H), 6.34-6.32 (m, 2H)

$M^+$ calc. 894.32. found 894.33.

Synthesis Example 20

Synthesis of Compound 63

Compound 63 was synthesized as Compound 9 in Synthesis Example 1, except that Intermediate 38-A and Intermediate 50-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.30-8.28 (m, 1H), 8.23-8.21 (m, 1H), 8.10-8.08 (m, 1H), 7.99-7.89 (m, 2H), 7.84-7.76 (m, 2H), 7.72-7.69 (m, 2H), 7.65-7.40 (m, 17H), 7.30-7.02 (m, 9H), 6.91-6.89 (m, 1H), 6.80 (t, 1H), 6.52-6.48 (m, 2H), 6.40-6.38 (m, 1H), 6.35 (dd, 1H)

$M^+$ calc. 918.32. found 918.33.

Synthesis Example 21

Synthesis of Compound 70

Compound 70 was synthesized as Compound 9 in Synthesis Example 1, except that Intermediate 14-A and Intermediate 1-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.32-8.30 (m, 1H), 8.22-8.20 (m, 1H), 7.72-7.49 (m, 16H), 7.43-7.40 (m, 1H), 7.32-7.22 (m,

8H), 7.16-7.14 (m, 1H), 7.06-6.98 (m, 3H), 6.82-6.80 (m, 1H), 6.70-6.62 (m, 4H), 6.52-6.48 (m, 2H)

$M^+$ calc. 822.30. found 822.31.

Synthesis Example 22

Synthesis of Compound 73

73-A

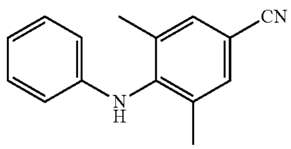

Compound 73 was synthesized as Compound 9 in Synthesis Example 1, except that Intermediate 32-A and Intermediate 73-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.32-8.30 (m, 1H), 8.20-8.18 (m, 1H), 7.72-7.49 (m, 16H), 7.43-7.40 (m, 1H), 7.31-7.29 (m, 2H), 7.22-7.20 (m, 6H), 7.13-7.08 (m, 2H), 6.96-6.94 (m, 1H), 6.85 (dd, 1H), 6.72-6.68 (m, 2H), 6.62-6.58 (m, 2H), 2.25 (s, 6H)

$C_{63}H_{42}FN_3O$: $M^+$ calc. 875.33. found 875.34.

Synthesis Example 23

Synthesis of Compound 75

75-A

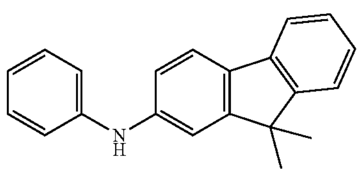

Compound 75 was synthesized as Compound 9 in Synthesis Example 1, except that Intermediate 48-A and Intermediate 75-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.33-8.30 (m, 1H), 8.20-8.18 (m, 1H), 7.78-7.76 (m, 1H), 7.68-7.52 (m, 10H), 7.47-7.44 (m, 2H), 7.35-7.30 (m, 1H), 7.19-6.98 (m, 10H), 6.87-6.84 (m, 2H), 6.72-6.60 (m, 3H), 6.53-6.51 (m, 2H), 6.44-6.41 (m, 2H), 6.35-6.30 (m, 2H), 1.61 (s, 6H)

$M^+$ calc. 843.35. found 843.35.

Synthesis Example 24

Synthesis of Compound 77

Compound 77 was synthesized as Compound 9 in Synthesis Example 1, except that Intermediate 11-A and Intermediate 75-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.31-8.29 (m, 1H), 8.20-8.18 (m, 1H), 7.94-7.90 (m, 1H), 7.84-7.54 (m, 10H), 7.45-7.40 (m, 2H), 7.35-7.30 (m, 1H), 7.24-7.04 (m, 9H), 6.97 (dd, 1H), 6.91-6.89 (m, 1H), 6.76-6.70 (m, 2H), 6.63-6.61 (m, 2H), 6.43-6.41 (m, 2H), 6.33-6.30 (m, 2H), 1.63 (s, 6H)

$M^+$ calc. 858.32. found 858.33.

Synthesis Example 25

Synthesis of Compound 79

79-A

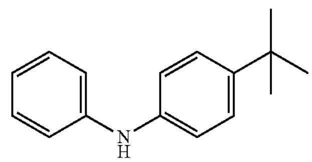

Compound 79 was synthesized as Compound 9 in Synthesis Example 1, except that Intermediate 79-A and Intermediate 75-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.30-8.28 (m, 1H), 8.20-8.18 (m, 1H), 7.81-7.77 (m, 2H), 7.65 (dd, 1H), 7.63-7.54 (m, 5H), 7.36-7.33 (m, 1H), 7.25-7.21 (m, 2H), 7.14-7.02 (m, 7H), 6.86 (dd, 1H), 6.77-6.75 (m, 1H), 6.65-6.62 (m, 2H), 6.53-6.50 (m, 2H), 6.46-6.42 (m, 2H), 6.33-6.31 (m, 2H), 6.22-6.19 (m, 2H), 1.63 (s, 6H), 1.50 (s, 9H)

$M^+$ calc. 824.38. found 824.39.

Synthesis Example 26

Synthesis of Compound 84

84-A

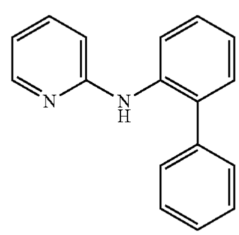

Compound 84 was synthesized as Compound 9 in Synthesis Example 1, except that Intermediate 11-A and Intermediate 84-A were used, instead of using Intermediate 9-A to synthesize Intermediate 9-3. This compound was identified using $^1H$ NMR ($CDCl_3$, 400 MHz) and MS/FAB.

δ=8.60-8.58 (m, 1H), 8.31-8.29 (m, 1H), 8.20-8.18 (m, 1H), 8.07-8.05 (m, 1H), 7.94-7.92 (m, 1H), 7.84-7.82 (m, 1H), 7.72-7.70 (m, 1H), 7.63-7.40 (m, 14H), 7.31-7.26 (m, 2H), 7.16-6.94 (m, 7H), 6.81-6.75 (m, 2H), 6.63-6.57 (m, 2H), 6.49-6.47 (m, 1H), 6.43-6.40 (m, 2H)

$M^+$ calc. 819.29. found 819.30.

Synthesis Example 27

Synthesis of Compound 86

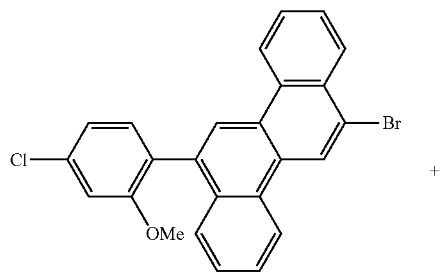

9-2

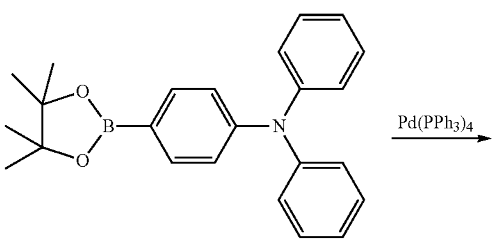

86-A

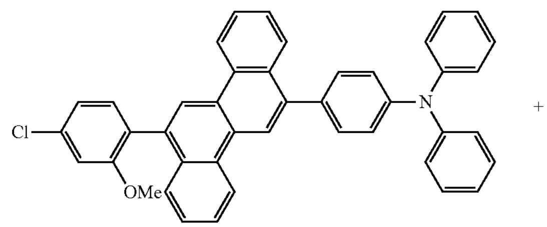

86-1

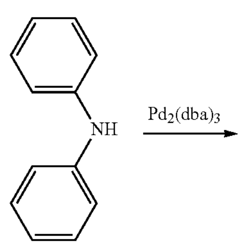

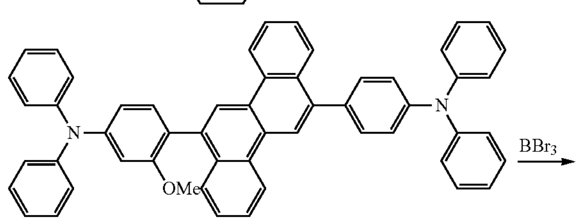

86-2

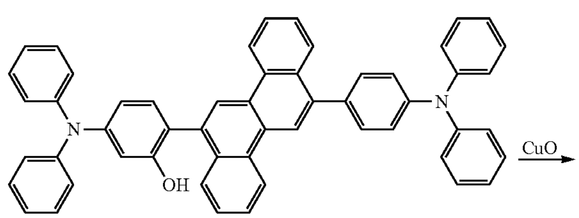

86-3

-continued

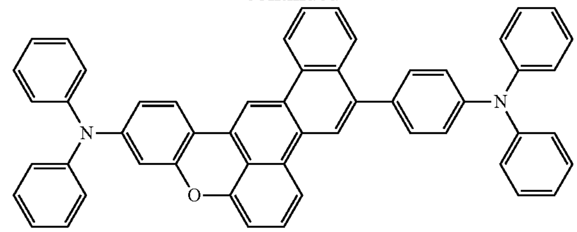

86

Synthesis of Intermediate 86-1

Intermediate 86-1 was synthesized as Intermediate 9-2 in Synthesis Example 1, except that Intermediate 86-A and Intermediate 9-2, instead of Intermediate 9-1 and dibromocrysene, respectively, were used. This compound was identified using LC-MS.

$C_{43}H_{30}ClNO$: $M^+$ 611.2

Synthesis of Intermediate 86-2

Intermediate 86-2 was synthesized as Intermediate 9-3 in Synthesis Example 1, except that Intermediate 1-A and Intermediate 86-1, instead of Intermediate 9-A and Intermediate 9-2, respectively, were used. This compound was identified using LC-MS.

$C_{55}H_{40}N_2O$: $M^+$ 744.3

Synthesis of Intermediate 86-3

Intermediate 86-3 was synthesized as Intermediate 9-4 in Synthesis Example 1, except that Intermediate 86-2, instead of Intermediate 9-3 used to synthesize Intermediate 9-4, was used. This compound was identified using LC-MS.

$C_{54}H_{38}N_2O$: $M^+$ 730.3

Synthesis of Compound 86

Compound 86 was synthesized as in the synthesis of Compound 9 in Synthesis Example 1, except that Intermediate 86-3, instead of Intermediate 9-4 used to synthesize Compound 9, was used. This compound was identified using $^1H$ NMR ($CDCl_3$, 400 MHz) and MS/FAB.

δ=8.60-8.58 (m, 1H), 8.39-8.37 (m, 1H), 8.32-8.30 (m, 1H), 8.26-8.24 (m, 1H), 7.79-7.77 (m, 1H), 7.67-7.56 (m, 3H), 7.53-7.49 (m, 2H), 7.18-7.03 (m, 10H), 6.96-6.93 (m, 2H), 6.86-6.84 (m, 1H), 6.76-6.72 (m, 4H), 6.62-6.59 (m, 1H), 6.50-6.47 (m, 4H), 6.36-6.32 (m, 4H)

$C_{54}H_{36}N_2O$: $M^+$ calc. 728.28. found 728.29.

Synthesis Example 28

Synthesis of Compound 92

Compound 92 was synthesized as Compound 86 in Synthesis Example 27, except that Intermediate 11-A, instead of Intermediate 1-A used to synthesize Intermediate 86-2, was used. This compound was identified using $^1H$ NMR ($CDCl_3$, 400 MHz) and MS/FAB.

δ=8.60-8.58 (m, 1H), 8.39-8.37 (m, 1H), 8.32-8.30 (m, 1H), 8.26-8.24 (m, 1H), 7.84-7.77 (m, 2H), 7.72-7.62 (m, 4H), 7.53-7.40 (m, 5H), 7.28-7.13 (m, 12H), 6.92-6.90 (m, 1H), 6.85-6.81 (m, 3H), 6.71-6.69 (m, 1H), 6.56-6.52 (m, 2H), 6.40-6.35 (m, 4H)

$M^+$ calc. 818.29. found 818.30.

Synthesis Example 29

Synthesis of Compound 94

94-A

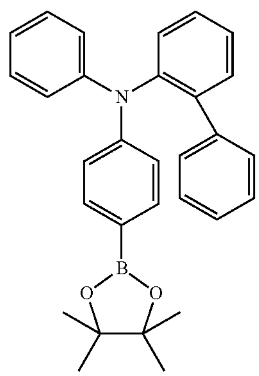

Compound 94 was synthesized as Compound 86 in Synthesis Example 27, except that Intermediate 94-A and Intermediate 11-A, instead of Intermediate 86-A and Intermediate 1-A, respectively, were used. This compound was identified using $^{1}H$ NMR ($CDCl_3$, 400 MHz) and MS/FAB.

δ=8.60-8.58 (m, 1H), 8.39-8.37 (m, 1H), 8.34-8.32 (m, 1H), 8.26-8.24 (m, 1H), 7.84-7.79 (m, 2H), 7.72-7.40 (m, 14H), 7.30-7.02 (m, 14H), 6.95-6.93 (m, 1H), 6.82-6.79 (m, 2H), 6.69 (dd, 1H), 6.56-6.54 (m, 2H), 6.39-6.37 (m, 2H)

$M^+$ calc. 894.32. found 894.32.

Synthesis Example 30

Synthesis of Compound 98

98-A

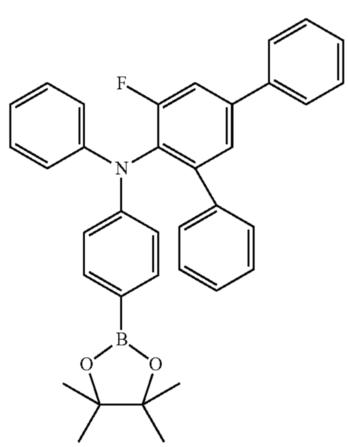

Compound 98 was synthesized as Compound 86 in Synthesis Example 27, except that Intermediate 98-A, instead of Intermediate 86-A, was used. This compound was identified using $^{1}H$ NMR ($CDCl_3$, 400 MHz) and MS/FAB.

δ=8.60-8.58 (m, 1H), 8.37-8.35 (m, 1H), 8.24-8.22 (m, 1H), 8.16-8.12 (m, 1H), 7.79-7.77 (m, 1H), 7.72-7.50 (m, 15H), 7.44-7.42 (m, 1H), 7.28-7.14 (m, 9H), 7.10-7.05 (m, 2H), 6.97-6.95 (m, 1H), 6.86-6.82 (m, 3H), 6.72 (dd, 1H), 6.50-6.45 (m, 4H), 6.40-6.41 (m, 2H)

$M^+$ calc. 898.34. found 898.35.

Synthesis Example 31

Synthesis of Compound 103

Compound 103 was synthesized as Compound 86 in Synthesis Example 27, except that Intermediate 50-A, instead of Intermediate 1-A, was used. This compound was identified using $^{1}H$ NMR ($CDCl_3$, 400 MHz) and MS/FAB.

δ=8.60-8.58 (m, 1H), 8.39-8.37 (m, 1H), 8.24-8.22 (m, 1H), 8.16-8.12 (m, 1H), 7.84-7.79 (m, 2H), 7.72-7.40 (m, 14H), 7.30-7.02 (m, 14H), 6.88-7.82 (m, 2H), 6.74-6.72 (m, 1H), 6.62 (dd, 1H), 6.54-6.50 (m, 4H)

$M^+$ calc. 894.32. found 894.33.

Synthesis Example 32

Synthesis of Compound 107

107-A

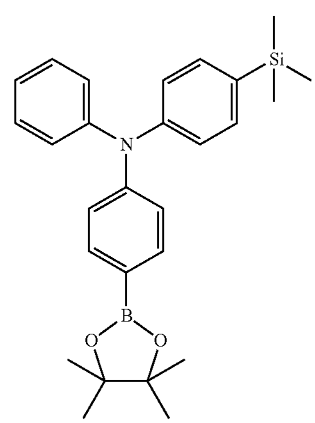

Compound 107 was synthesized as Compound 86 in Synthesis Example 27, except that Intermediate 107-A, instead of Intermediate 86-A, was used. This compound was identified using $^{1}H$ NMR ($CDCl_3$, 400 MHz) and MS/FAB.

δ=8.60-8.58 (m, 1H), 8.39-8.37 (m, 1H), 8.24-8.22 (m, 1H), 8.16-8.14 (m, 1H), 7.79-7.77 (m, 1H), 7.67-7.56 (m, 3H), 7.53-7.49 (m, 2H), 7.40-7.36 (m, 2H), 7.29-7.13 (m, 7H), 7.06-7.02 (m, 2H), 6.96-6.94 (m, 1H), 6.84-6.75 (m, 4H), 6.66-6.59 (m, 3H), 6.40-6.34 (m, 4H), 6.30-6.26 (m, 2H), 0.25 (m, 9H)

$M^+$ calc. 800.32. found 800.33.

Synthesis Example 33

Synthesis of Compound 113

113-A

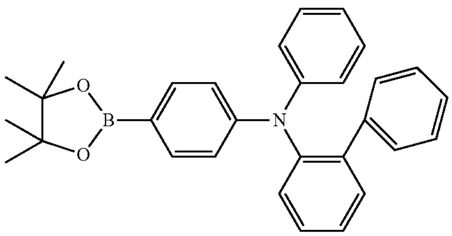

Compound 113 was synthesized as Compound 86 in Synthesis Example 27, except that Intermediate 113-A and Intermediate 31-A, instead of Intermediate 86-A and Intermediate 1-A, respectively, were used. This compound was identified using $^1$H NMR ($CDCl_3$, 400 MHz) and MS/FAB.

δ=8.60-8.58 (m, 1H), 8.39-8.37 (m, 1H), 8.24-8.22 (m, 1H), 8.16-8.14 (m, 1H), 7.79-7.77 (m, 1H), 7.67-7.44 (m, 15H), 7.31-7.09 (m, 14H), 6.95-6.90 (m, 2H), 6.85-6.80 (m, 3H), 6.71 (dd, 1H), 6.58-6.54 (m, 2H), 6.50-6.46 (m, 2H)

$C_{54}H_{36}N_{20}$: $M^+$ calc. 880.35. found 880.36.

Synthesis Example 34

Synthesis of Compound 121

121-A

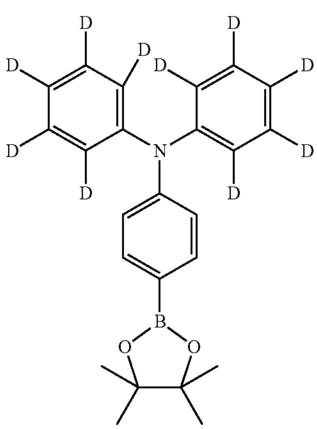

121-B

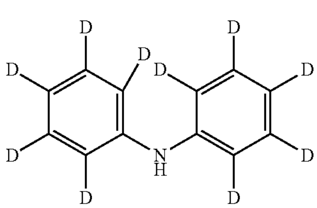

Compound 121 was synthesized as Compound 86 in Synthesis Example 27, except that Intermediate 121-A and Intermediate 121-B, instead of Intermediate 86-A and Intermediate 1-A, respectively, were used. This compound was identified using $^1$H NMR ($CDCl_3$, 400 MHz) and MS/FAB.

δ=8.60-8.58 (m, 1H), 8.39-8.37 (m, 1H), 8.24-8.22 (m, 1H), 8.16-8.14 (m, 1H), 7.79-7.77 (m, 1H), 7.67-7.58 (m, 3H), 7.53-7.49 (m, 2H), 7.38-7.30 (m, 2H), 7.17-7.13 (m, 2H), 6.99-6.97 (m, 1H), 6.82-6.80 (m, 1H)

$M^+$ calc. 748.31. found 748.31.

Synthesis Example 35

Synthesis of Compound 124

17-A

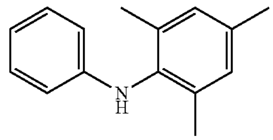

124-A

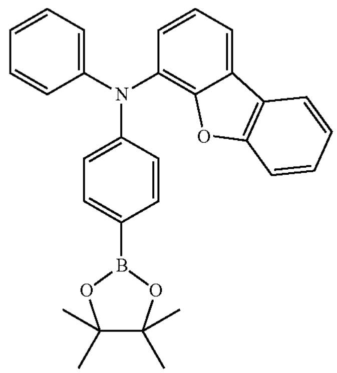

Compound 124 was synthesized as Compound 86 in Synthesis Example 27, except that Intermediate 124-A and Intermediate 17-A, instead of Intermediate 86-A and Intermediate 1-A, respectively, were used. This compound was identified using $^1$H NMR ($CDCl_3$, 400 MHz) and MS/FAB.

δ=8.60-8.58 (m, 1H), 8.39-8.37 (m, 1H), 8.24-8.22 (m, 1H), 8.16-8.14 (m, 1H), 7.84-7.40 (m, 11H), 7.28-7.08 (m, 9H), 6.90-6.88 (m, 1H), 6.85-6.80 (m, 2H), 6.66-6.62 (m, 3H), 6.42 (dd, 1H), 6.35-6.32 (m, 2H), 6.25-6.22 (m, 2H), 2.28 (s, 3H), 2.26 (s, 6H)

$M^+$ calc. 860.34. found 860.35.

Synthesis Example 36

Synthesis of Compound 141

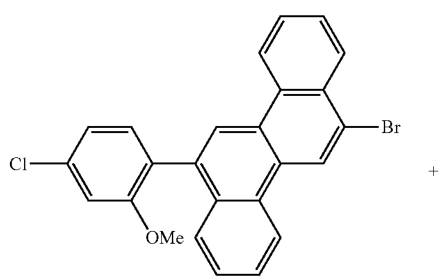

9-2

-continued

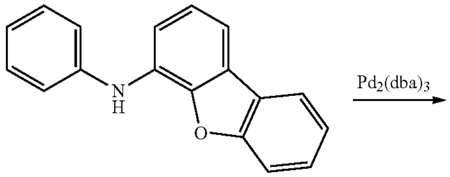

35-A

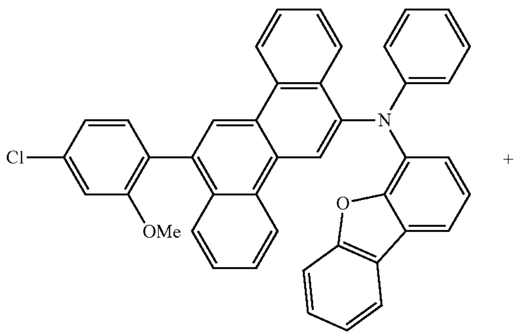

141-1

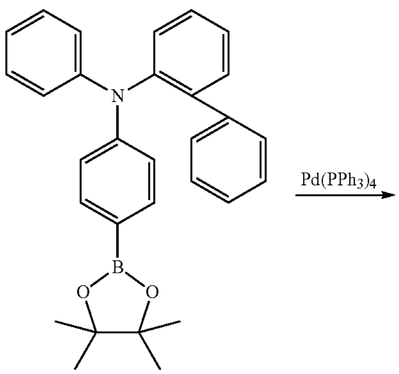

94-A

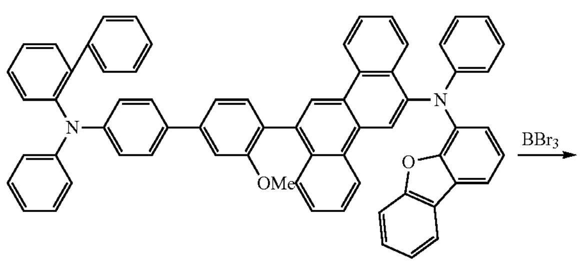

141-2

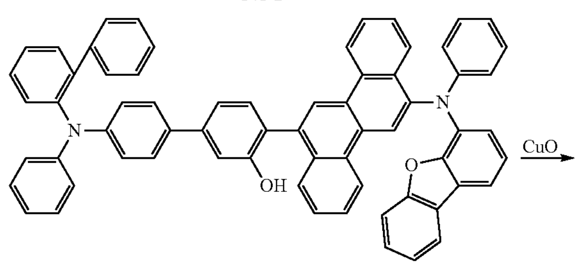

141-3

-continued

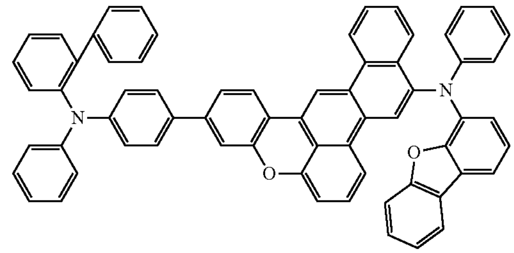

141

Synthesis of Intermediate 141-1

Intermediate 141-1 was synthesized as Intermediate 9-3 in Synthesis Example 1, except that Intermediate 35-A, instead of Intermediate 9-A used to synthesize Intermediate 9-3, was used. This compound was identified using LC-MS.

$C_{42}H_{24}ClNO_2$: M+ 609.2

Synthesis of Intermediate 141-2

Intermediate 141-2 was synthesized as Intermediate 9-2 in Synthesis Example 1, except that Intermediate 94-A and Intermediate 141-1, instead of Intermediate 9-1 and dibromocrysene used to synthesize Intermediate 9-2, respectively, were used. This compound was identified using LC-MS.

C67H46N2O2: M+ 910.3

Synthesis of Intermediate 141-3

Intermediate 141-3 was synthesized as Intermediate 9-4 in Synthesis Example 1, except that Intermediate 141-2, instead of Intermediate 9-3 used to synthesize Intermediate 9-4, was used. This compound was identified using LC-MS.

C66H44$N_2O_2$: M+ 896.3

Synthesis of Compound 141

Compound 141 was synthesized as Compound 9 in Synthesis Example 1, except that Intermediate 141-3, instead of Intermediate 9-4 used to synthesize Compound 9, was used. This compound was identified using $^1$H NMR (CDCl3, 400 MHz) and MS/FAB.

δ=8.65-8.62 (m, 1H), 8.39-8.37 (m, 1H), 8.20-8.18 (m, 1H), 8.01-7.90 (m, 2H), 7.84-7.82 (m, 1H), 7.72-7.70 (m, 1H), 7.63 7.48 (m, 16H), 7.30-7.26 (m, 2H), 7.16-7.04 (m, 8H), 6.95-6.92 (m, 1H), 6.85-6.80 (m, 2H), 6.67-6.62 (m, 2H), 6.53-6.49 (m, 2H), 6.37-6.34 (m, 2H)

M+ calc. 894.32. found 894.33.

Synthesis Example 37

Synthesis of Compound 154

154-A

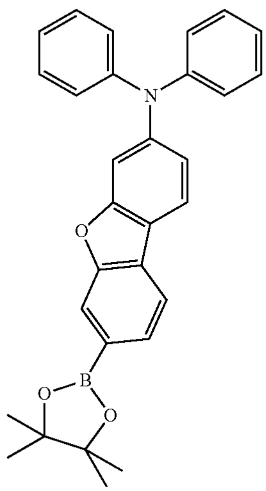

Compound 154 was synthesized as Compound 86 in Synthesis Example 27, except that Intermediate 154-A, instead of Intermediate 86-A, was used. This compound was identified using $^1$H NMR ($CDCl_3$, 400 MHz) and MS/FAB.

δ=8.66-8.64 (m, 1H), 8.36-8.34 (m, 1H), 8.24-8.22 (m, 1H), 8.12-8.02 (m, 2H), 7.97-7.90 (m, 2H), 7.80-7.78 (m, 1H), 7.66 7.56 (m, 4H), 7.45-7.41 (m, 1H), 7.32-7.24 (m, 9H), 7.13-7.11 (m, 1H), 6.97 (dd, 1H), 6.87-6.85 (m, 1H), 6.76-6.72 (m, 4H), 6.63 (dd, 1H), 6.50-6.42 (m, 8H)

$M^+$ calc. 818.29. found 818.30.

Synthesis Example 38

Synthesis of Compound 156

156-A

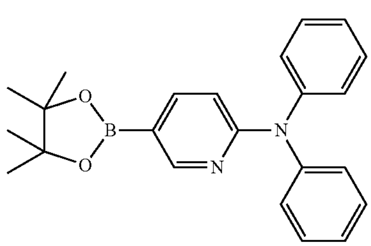

Compound 156 was synthesized as Compound 86 in Synthesis Example 27, except that Intermediate 156-A, instead of Intermediate 86-A, was used. This compound was identified using $^1$H NMR ($CDCl_3$, 400 MHz) and MS/FAB.

δ=8.66-8.64 (m, 1H), 8.32-8.30 (m, 1H), 8.15-8.13 (m, 1H), 8.06-8.04 (m, 1H), 7.94-7.91 (m, 1H), 7.88 (dd, 1H), 7.82 7.80 (m, 1H), 7.67-7.56 (m, 3H), 7.40-7.30 (m, 5H), 7.22-7.14 (m, 5H), 7.05-6.95 (m, 3H), 6.87-6.85 (m, 1H), 6.78-6.59 (m, 7H), 6.40-6.35 (m, 4H)

$C_{53}H_{35}N_3O$: $M^+$ calc. 729.28. found 729.29.

Synthesis Example 39

Synthesis of Compound 157

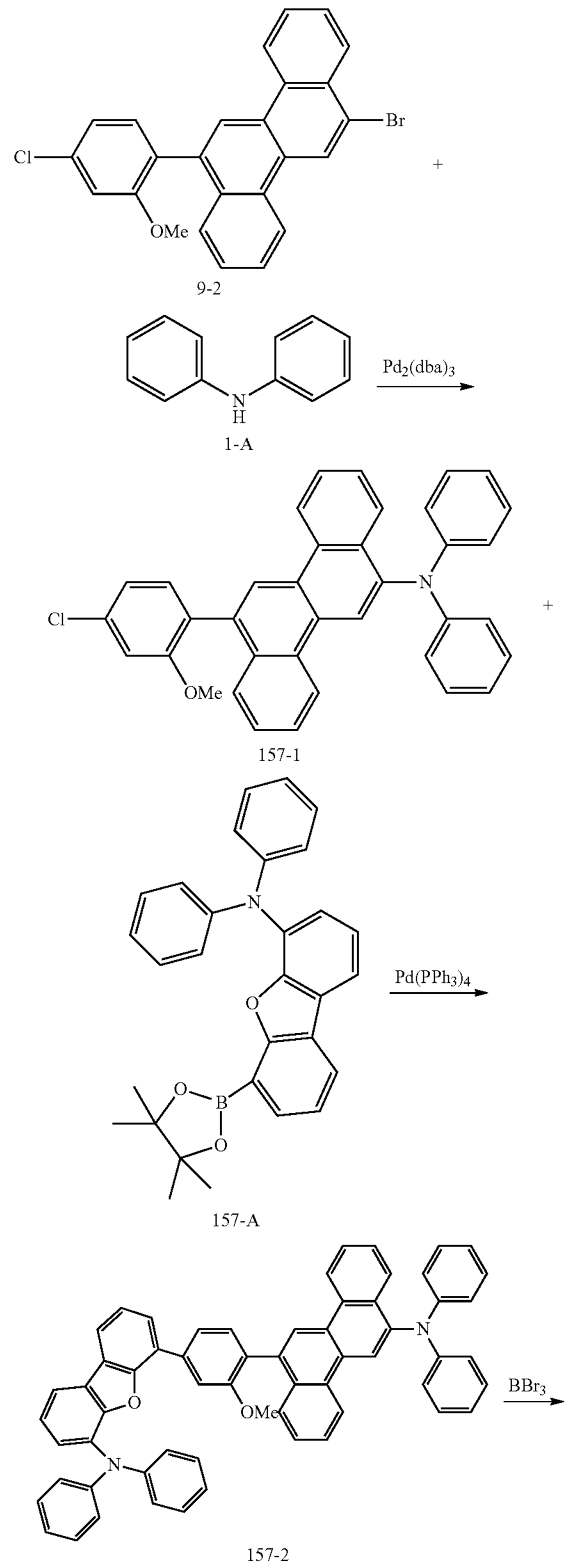

-continued
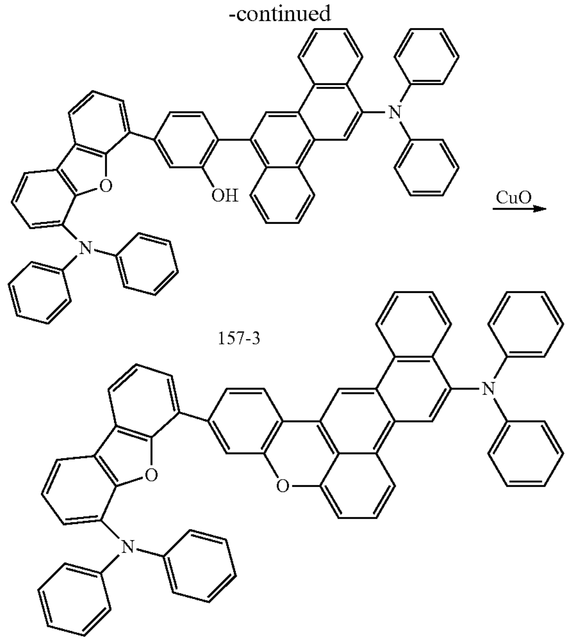
157-3
157
Compound 157 was synthesized as Compound 141 in Synthesis Example 36, except that Intermediate 1-A and Intermediate 157-A, instead of Intermediate 35-A and Intermediate 94-A, respectively, were used.
δ=8.60-8.58 (m, 1H), 8.30-8.28 (m, 1H), 8.20-8.18 (m, 1H), 7.97-7.86 (m, 2H), 7.82-7.78 (m, 2H), 7.65-7.54 (m, 5H), 7.48-7.44 (m, 2H), 7.35 (t, 1H), 7.26-7.19 (m, 10H), 7.08 (t, 1H), 6.85-6.81 (m, 4H), 6.70-6.62 (m, 4H), 6.52-6.46 (m, 4H)
$M^+$ calc. 818.29. found 818.29.
Synthesis Example 40
Synthesis of Compound 160
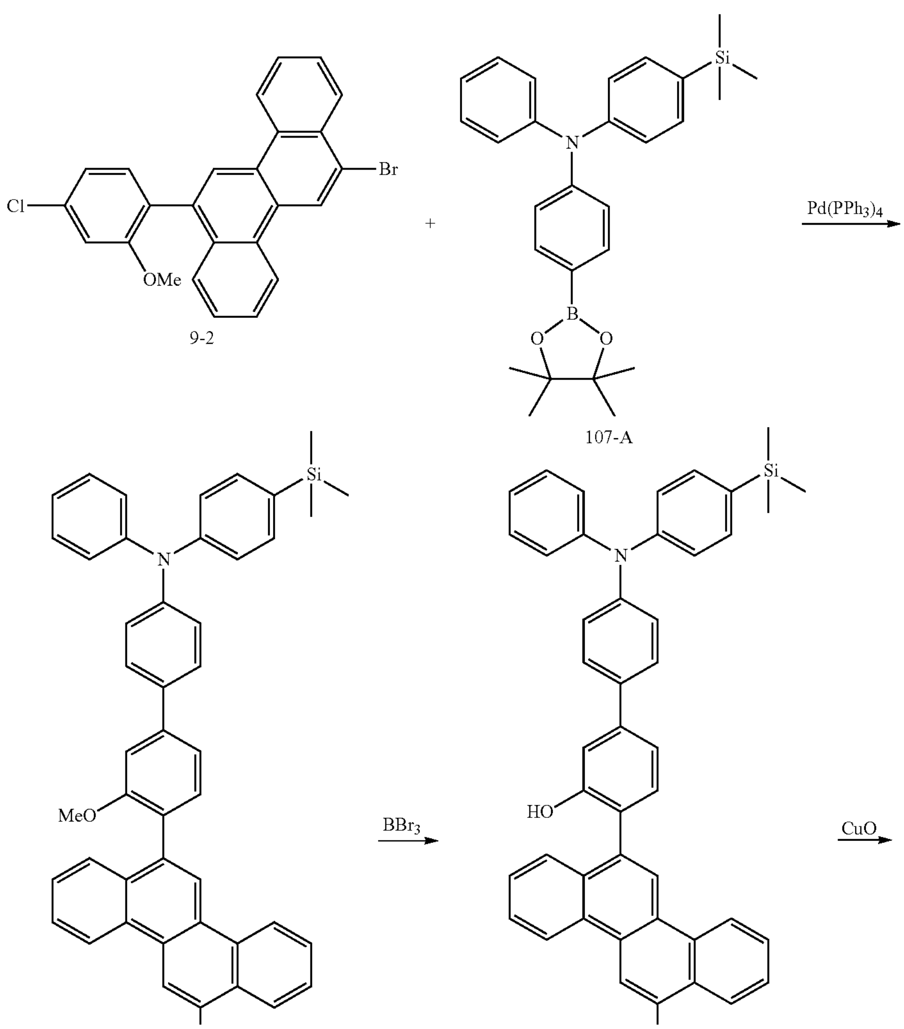
9-2
107-A -continued

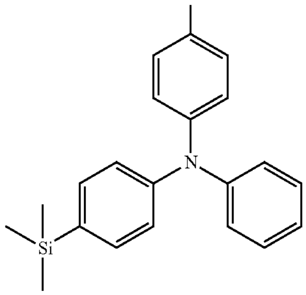

160-1

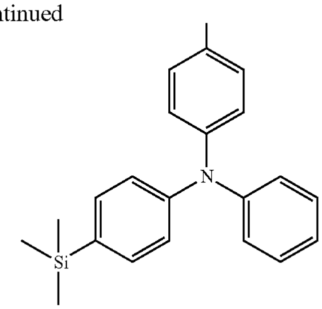

160-3

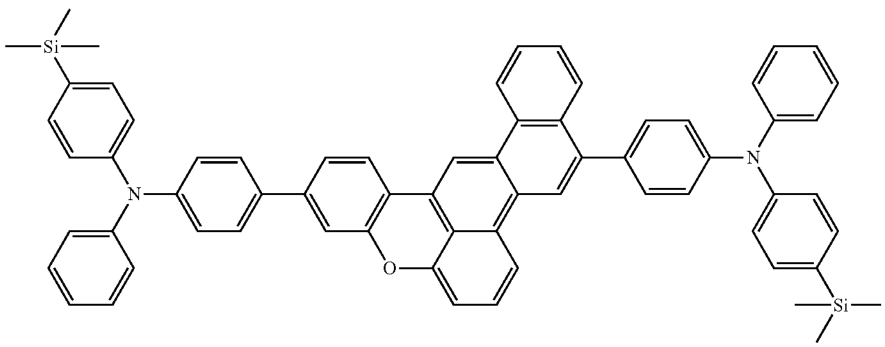

160

Intermediate 160-1 was synthesized as Intermediate 9-2 in Synthesis Example 1, except that Intermediate 107-A and Intermediate 9-2, instead of Intermediate 9-1 and dibromocrysene used to synthesize Intermediate 9-2, respectively, were used. This compound was identified using LC-MS.

$C_{67}H_{60}N_2OSi_2$: $M^+$ 964.4

Synthesis of Intermediate 160-3

Intermediate 160-3 was synthesized as Intermediate 9-4 in Synthesis Example 1, except that Intermediate 160-1, instead of Intermediate 9-3 used to synthesize Intermediate 9-4, was used. This compound was identified using LC-MS.

$C_{66}H_{58}N_2OSi_2$: $M^+$ 950.4

Synthesis of Compound 160

Compound 160 was synthesized as Compound 9 in Synthesis Example 1, except that Intermediate 160-3, instead of Intermediate 9-4 used to synthesize Compound 9, was used. This compound was identified using $^1H$ NMR ($CDCl_3$, 400 MHz) and MS/FAB.

δ=8.56-8.54 (m, 1H), 8.39-8.37 (m, 1H), 8.24-8.22 (m, 1H), 8.16-8.14 (m, 1H), 8.01-7.99 (m, 1H), 7.89-7.87 (m, 1H), 7.77-7.72 (m, 2H), 7.66-7.59 (m, 4H), 7.52-7.45 (m, 6H), 7.38-7.35 (m, 1H), 7.27-7.05 (m, 9H), 6.85-6.82 (m, 2H), 6.76-6.65 (m, 4H), 6.52-6.46 (m, 4H), 0.24 (s, 18H)

$M^+$ calc. 948.39. found 948.40.

Example 1

To manufacture an anode, a Corning ITO glass substrate (having a thickness of 1200 Å) was cut to a size of 50 mm×50 mm×0.7 mm and sonicated for five minutes in each of isopropyl alcohol and pure water, and then cleaned by irradiation of ultraviolet rays for 30 minutes followed by exposure to ozone. The resulting ITO glass substrate was placed into a vacuum deposition device.

HT13 was vacuum-deposited on the anode to form an HIL having a thickness of 600 Å, HT3 was deposited on the HIL to form a HTL having a thickness of about 300 Å, and then ADN and Compound 9 were co-deposited in a weight ratio of 98:2 on the HTL to form an EML having a thickness of about 300 Å.

$Alq_3$ was then deposited on the EML to form an ETL having a thickness of about 300 Å. LiF was deposited on the ETL to form an EIL having a thickness of about 10 Å, and Al was vacuum-deposited on the EIL to form a cathode having a thickness of about 3000 Å, thereby manufacturing an organic light-emitting device.

HT13

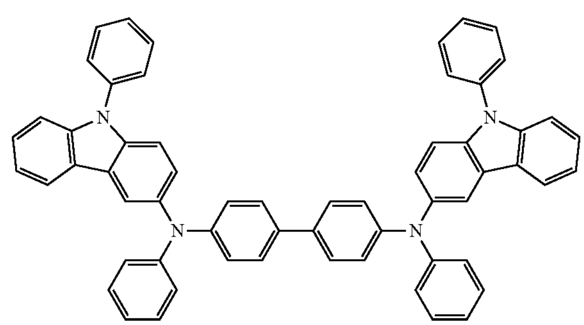

-continued

HT3

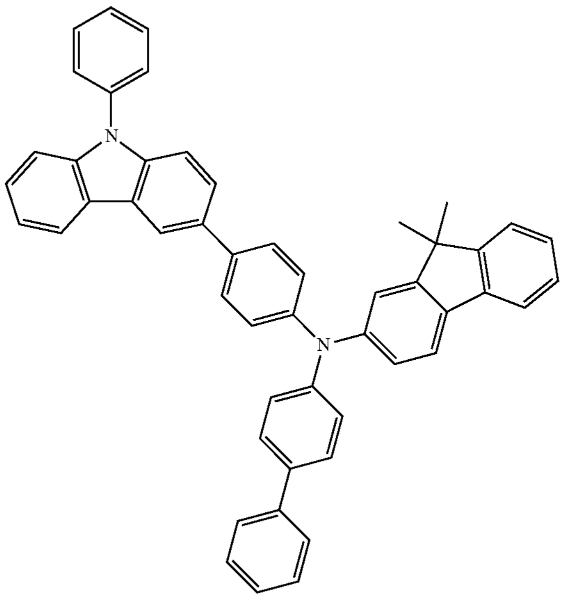

ADN

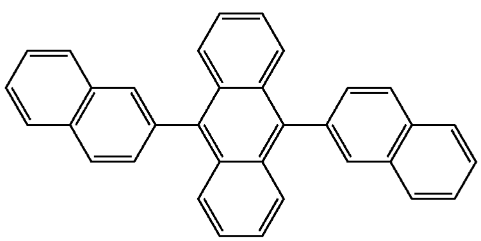

Alq3

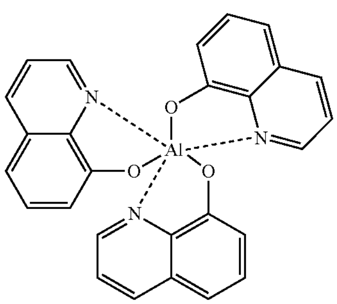

Example 2

An organic light-emitting device was manufactured as in Example 1, except that Compound 11, instead of Compound 9, was used to form the EML.

Example 3

An organic light-emitting device was manufactured as in Example 1, except that Compound 31, instead of Compound 9, was used to form the EML.

Example 4

An organic light-emitting device was manufactured as in Example 1, except that Compound 32, instead of Compound 9, was used to form the EML.

Example 5

An organic light-emitting device was manufactured as in Example 1, except that Compound 73, instead of Compound 9, was used to form the EML.

Example 6

An organic light-emitting device was manufactured as in Example 1, except that Compound 86, instead of Compound 9, was used to form the EML.

Example 7

An organic light-emitting device was manufactured as in Example 1, except that Compound 113, instead of Compound 9, was used to form the EML.

Example 8

An organic light-emitting device was manufactured as in Example 1, except that Compound 156, instead of Compound 9, was used to form the EML.

Comparative Example 1

An organic light-emitting device was manufactured as in Example 1, except that Compound A illustrated below, instead of Compound 9, was used to form the EML.

Compound A

A

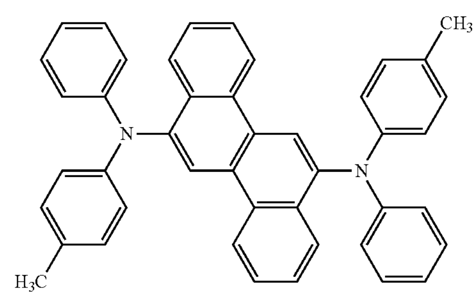

Comparative Example 2

An organic light-emitting device was manufactured as in Example 1, except that Compound B illustrated below, instead of Compound 9, was used to form the EML.

Compound B

B

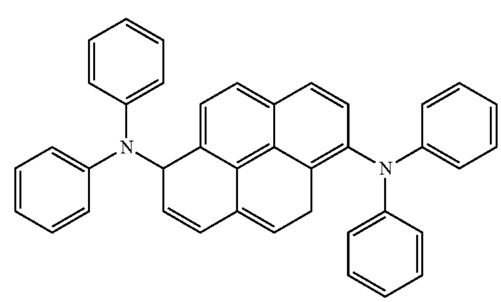

Example 9

An organic light-emitting device was manufactured as in Example 1, except that H109, instead of ADN, was used to form the EML.

Example 10

An organic light-emitting device was manufactured as in Example 9, except that Compound 11, instead of Compound 9, was used to form the EML.

Example 11

An organic light-emitting device was manufactured as in Example 9, except that Compound 31, instead of Compound 9, was used to form the EML.

Example 12

An organic light-emitting device was manufactured as in Example 9, except that Compound 50, instead of Compound 9, was used to form the EML.

Example 13

An organic light-emitting device was manufactured as in Example 9, except that Compound 86, instead of Compound 9, was used to form the EML.

Example 14

An organic light-emitting device was manufactured as in Example 9, except that Compound 156, instead of Compound 9, was used to form the EML.

Example 15

An organic light-emitting device was manufactured as in Example 1, except that Compound H152, instead of ADN, was used to form the EML.

Example 16

An organic light-emitting device was manufactured as in Example 15, except that Compound 11, instead of Compound 9, was used to form the EML.

Example 17

An organic light-emitting device was manufactured as in Example 15, except that Compound 31, instead of Compound 9, was used to form the EML.

Example 18

An organic light-emitting device was manufactured as in Example 15, except that Compound 50, instead of Compound 9, was used to form the EML.

Example 19

An organic light-emitting device was manufactured as in Example 15, except that Compound 73, instead of Compound 9, was used to form the EML.

Example 20

An organic light-emitting device was manufactured as in Example 15, except that Compound 86, instead of Compound 9, was used to form the EML.

Example 21

An organic light-emitting device was manufactured as in Example 15, except that Compound 113, instead of Compound 9, was used to form the EML.

Example 22

An organic light-emitting device was manufactured as in Example 1, except that Compound H167, instead of ADN, was used to form the EML.

Example 23

An organic light-emitting device was manufactured as in Example 22, except that Compound 11, instead of Compound 9, was used to form the EML.

Example 24

An organic light-emitting device was manufactured as in Example 22, except that Compound 31, instead of Compound 9, was used to form the EML.

Example 25

An organic light-emitting device was manufactured as in Example 22, except that Compound 50, instead of Compound 9, was used to form the EML.

Example 26

An organic light-emitting device was manufactured as in Example 22, except that Compound 73, instead of Compound 9, was used to form the EML.

Example 27

An organic light-emitting device was manufactured as in Example 22, except that Compound 86, instead of Compound 9, was used to form the EML.

Example 28

An organic light-emitting device was manufactured as in Example 1, except that Compound H204, instead of ADN, was used to form the EML.

Example 29

An organic light-emitting device was manufactured as in Example 28, except that Compound 11, instead of Compound 9, was used to form the EML.

Example 30

An organic light-emitting device was manufactured as in Example 28, except that Compound 56, instead of Compound 9, was used to form the EML.

Example 31

An organic light-emitting device was manufactured as in Example 1, except that Compound H208, instead of ADN, was used to form the EML.

Example 32

An organic light-emitting device was manufactured as in Example 31, except that Compound 11, instead of Compound 9, was used to form the EML.

Example 33

An organic light-emitting device was manufactured as in Example 31, except that Compound 56, instead of Compound 9, was used to form the EML.

Comparative Example 3

An organic light-emitting device was manufactured as in Example 1, except that Compound H109 instead of AND, and Compound A instead of Compound 9, were used to form the EML.

A

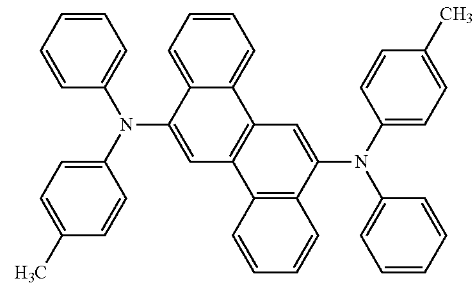

Evaluation Example 1

Driving voltages, current densities, luminances, efficiencies, and half-lifetimes of the organic light-emitting devices of Examples 1 to 33 and Comparative Examples 1 to 3 were evaluated using a Keithley Source-Measure Unit (SMU 236) and a PR650 SpectraScan (Photo Research, Inc.) The results are shown in Tables 1 and 2. Herein, half-lifetime is the time it took for a measured initial luminance (assumed as 100%) to be reduced to 50%.

TABLE 1

| Example | EML dopant | Driving voltage (V) | Current density ($mA/cm^2$) | Luminance ($cd/m^2$) | Efficiency (cd/A) | Emission color | Half-lifetime (hr@ 100 $mA/cm^2$) |
|---|---|---|---|---|---|---|---|
| Example 1 | Compound 9 | 6.34 | 50 | 3,255 | 6.51 | Blue | 353 hr |
| Example 2 | Compound 11 | 6.36 | 50 | 3,315 | 6.63 | Blue | 372 hr |
| Example 3 | Compound 31 | 6.30 | 50 | 3,370 | 6.74 | Blue | 363 hr |
| Example 4 | Compound 32 | 6.29 | 50 | 3,410 | 6.82 | Blue | 367 hr |
| Example 5 | Compound 73 | 6.31 | 50 | 3,300 | 6.60 | Blue | 378 hr |
| Example 6 | Compound 86 | 6.27 | 50 | 3,365 | 6.73 | Blue | 351 hr |
| Example 7 | Compound 113 | 6.21 | 50 | 3,355 | 6.71 | Blue | 366 hr |
| Example 8 | Compound 156 | 6.13 | 50 | 3,275 | 6.55 | Blue | 342 hr |
| Comparative Example 1 | Compound A | 6.92 | 50 | 2.645 | 5.29 | Blue | 253 hr |
| Comparative Example 2 | Compound B | 6.96 | 50 | 2,730 | 5.46 | Blue | 248 hr |

TABLE 2

| Example | Host | Dopant | Driving voltage (V) | Current density ($mA/cm^2$) | Luminance ($cd/m^2$) | Efficiency (cd/A) | Emission color | Half-lifetime (hr @100 $mA/cm^2$) |
|---|---|---|---|---|---|---|---|---|
| Example 9 | Compound H109 | Compound 9 | 6.63 | 50 | 3,225 | 6.75 | Blue | 434 hr |
| Example 10 | Compound H109 | Compound 11 | 6.64 | 50 | 3,225 | 6.77 | Blue | 442 hr |
| Example 11 | Compound H109 | Compound 31 | 6.64 | 50 | 3,310 | 6.82 | Blue | 435 hr |
| Example 12 | Compound H109 | Compound 50 | 6.63 | 50 | 3,365 | 6.84 | Blue | 461 hr |
| Example 13 | Compound H109 | Compound 86 | 6.62 | 50 | 3,335 | 6.87 | Blue | 458 hr |
| Example 14 | Compound H109 | Compound 156 | 6.61 | 50 | 3,375 | 6.90 | Blue | 438 hr |
| Example 15 | Compound H152 | Compound 9 | 6.62 | 50 | 3,295 | 6.79 | Blue | 462 hr |
| Example 16 | Compound H152 | Compound 11 | 6.62 | 50 | 3,350 | 6.90 | Blue | 495 hr |
| Example 17 | Compound H152 | Compound 31 | 6.63 | 50 | 3,325 | 6.85 | Blue | 463 hr |
| Example 18 | Compound H152 | Compound 50 | 6.62 | 50 | 3,360 | 6.92 | Blue | 486 hr |
| Example 19 | Compound H152 | Compound 73 | 6.61 | 50 | 3,320 | 6.84 | Blue | 484 hr |
| Example 20 | Compound H152 | Compound 86 | 6.63 | 50 | 3,395 | 7.01 | Blue | 469 hr |
| Example 21 | Compound H152 | Compound 113 | 6.61 | 50 | 3,345 | 6.95 | Blue | 476 hr |
| Example 22 | Compound H167 | Compound 9 | 6.62 | 50 | 3,310 | 6.72 | Blue | 413 hr |
| Example 23 | Compound H167 | Compound 11 | 6.63 | 50 | 3,355 | 6.91 | Blue | 409 hr |
| Example 24 | Compound H167 | Compound 31 | 6.64 | 50 | 3,380 | 6.86 | Blue | 425 hr |
| Example 25 | Compound H167 | Compound 50 | 6.63 | 50 | 3,400 | 6.90 | Blue | 448 hr |
| Example 26 | Compound H167 | Compound 73 | 6.64 | 50 | 3,350 | 6.83 | Blue | 443 hr |
| Example 27 | Compound H167 | Compound 86 | 6.61 | 50 | 3,360 | 6.92 | Blue | 433 hr |
| Example 28 | Compound H204 | Compound 9 | 6.65 | 50 | 3,290 | 6.58 | Blue | 410 hr |
| Example 29 | Compound H204 | Compound 11 | 6.66 | 50 | 3,310 | 6.62 | Blue | 420 hr |
| Example 30 | Compound H204 | Compound 56 | 6.62 | 50 | 3,315 | 6.63 | Blue | 408 hr |

TABLE 2-continued

| Example | Host | Dopant | Driving voltage (V) | Current density (mA/cm²) | Luminance (cd/m²) | Efficiency (cd/A) | Emission color | Half-lifetime (hr @100 mA/cm²) |
|---|---|---|---|---|---|---|---|---|
| Example 31 | Compound H208 | Compound 9 | 6.59 | 50 | 3,360 | 6.72 | Blue | 411 hr |
| Example 32 | Compound H208 | Compound 11 | 6.58 | 50 | 3,362 | 6.72 | Blue | 416 hr |
| Example 33 | Compound H208 | Compound 56 | 6.60 | 50 | 3,380 | 6.76 | Blue | 405 hr |
| Comparative Example 1 | ADN | Compound A | 6.92 | 50 | 2,645 | 5.29 | Blue | 253 hr |
| Comparative Example 3 | H109 | Compound A | 6.73 | 50 | 2,835 | 5.67 | Blue | 372 hr |

Referring to Tables 1 and 2, the organic light-emitting devices of Examples 1 to 33 showed improved driving voltages, improved luminances, improved efficiencies, and improved half-lifetimes, compared to those of the organic light-emitting devices of Comparative Examples 1 to 3.

According to one or more embodiments of the present disclosure, an organic light-emitting device including the amine-based compound of Formula 1 may have an improved efficiency, a low driving voltage, and improved lifetime characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the drawing, it will be understood by those of ordinary skill in the art that various changes in form and details may be made therein without departing from the spirit and scope of the present disclosure as defined by the following claims and equivalents thereof.

What is claimed is:

1. An amine-based compound represented by Formula 1:

Formula 1

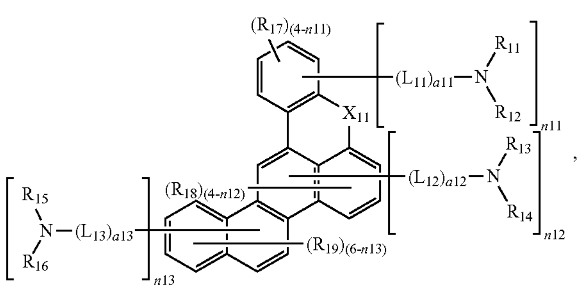

wherein, in Formula 1, $X_{11}$ is an oxygen atom or a sulfur atom;

$L_{11}$ to $L_{13}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a13 are each independently selected from 0, 1, 2, and 3;

$R_{11}$ to $R_{15}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

n11 to n13 are each independently selected from 0, 1, and 2, and a sum of n11, n12, and n13 is selected from 2, 3, 4, 5, and 6;

$R_{17}$ to $R_{19}$ are each independently selected from a hydrogen, a deuterium, F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$); and wherein at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Cl_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$); and $Q_1$ to $Q_3$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The amine-based compound of claim 1, wherein $L_{11}$ to $L_{13}$ are each independently selected from a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group, and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

3. The amine-based compound of claim 1, wherein $L_{11}$ to $L_{13}$ are each independently selected from Formulae 3-1 to 3-31:

3-1

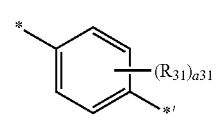

3-2

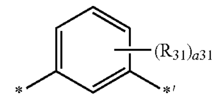

3-3

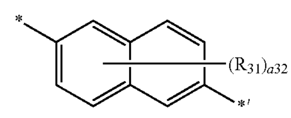

-continued
3-4
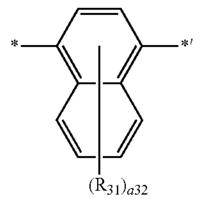
3-5
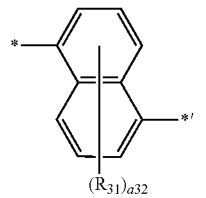
3-6
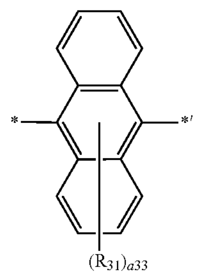
3-7
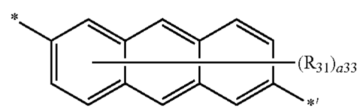
3-8
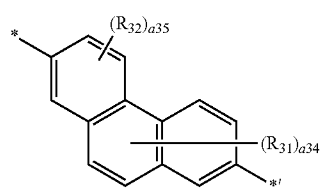
3-9
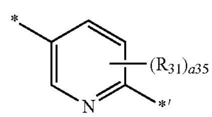
3-10
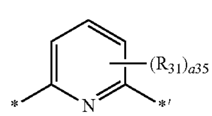
3-11
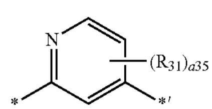
3-12
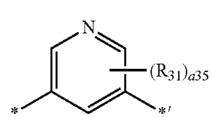
3-13
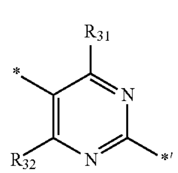
-continued
3-14
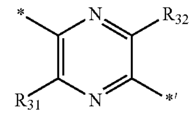
3-15
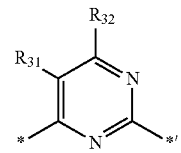
3-16
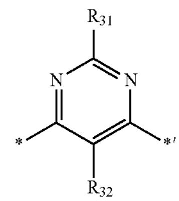
3-17
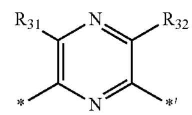
3-18
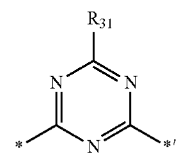
3-19
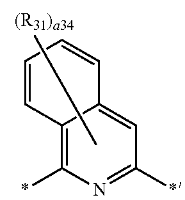
3-20
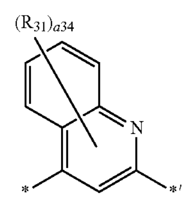
3-21
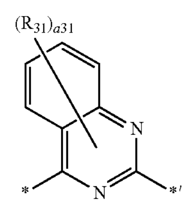
3-22
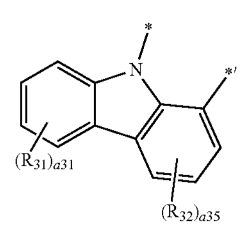

-continued 3-23

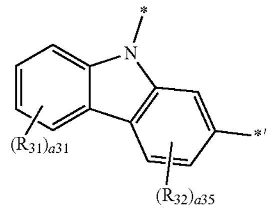

3-24

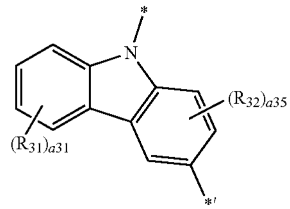

3-25

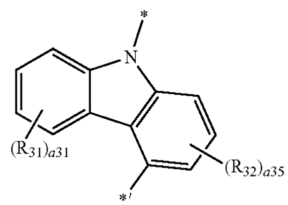

3-26

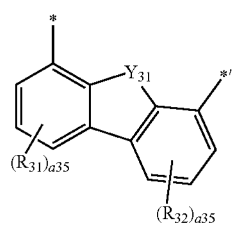

3-27

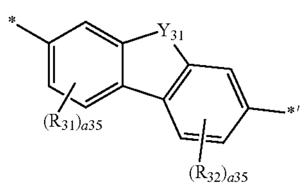

3-28

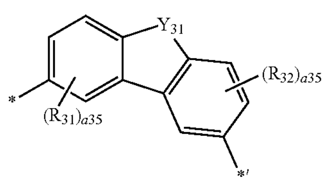

3-29

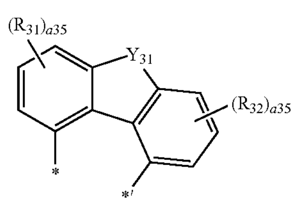

3-30

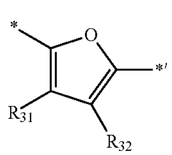

-continued 3-31

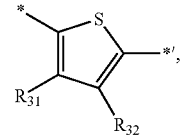

wherein, in Formulae 3-1 to 3-31, $Y_{31}$ is selected from $C(R_{33})(R_{34})$, $N(R_{33})$, O, S, and $Si(R_{33})(R_{34})$;

$R_{31}$ to $R_{34}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 is selected from 1, 2, 3, and 4;

a32 is selected from 1, 2, 3, 4, 5, and 6;

a33 is selected from 1, 2, 3, 4, 5, 6, 7, and 8;

a34 is selected from 1, 2, 3, 4, and 5;

a35 is selected from 1, 2, and 3; and

* and *' each independently indicate a binding site to an adjacent atom.

4. The amine-based compound of claim 1, wherein a11 to a13 are each independently selected from 0 and 1.

5. The amine-based compound of claim 1, wherein $R_{11}$ to $R_{16}$ are each independently selected from a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —Si($Q_{33}$)($Q_{34}$)($Q_{35}$), and a phenyl group, a naphthyl group, a fluorenyl group, a phenanthrenyl group, an anthracenyl group, a triphenylenyl group, a pyrrolyl group, a thiophenyl group, a furanyl group, a pyridinyl group, a pyrazinyl group, a pyrimidinyl group, a quinolinyl group, an isoquinolinyl group, a carbazolyl group, a naphthyridinyl group, a quinoxalinyl group, a quinazolinyl group, a cinnolinyl group, a phenanthridinyl group, an acridinyl group, a phenanthrolinyl group, a phenazinyl group, a benzofuranyl group, a benzothiophenyl group, a triazinyl group, a dibenzofuranyl group, a dibenzothiophenyl group, and a dibenzosilolyl group, each substituted with a $C_1$-$C_{20}$ alkyl group substituted with at least one selected from a deuterium, —F, —Cl, —Br, —I, a cyano group, and a nitro group; and $Q_{33}$ to $Q_{35}$ are each independently selected from a $C_1$-$C_{20}$alkyl group and a $C_6$-$C_{60}$ aryl group.

6. The amine-based compound of claim 1, wherein $R_{11}$ to $R_{16}$ are each independently selected from Formulae 5-1 to 5-33:

5-1

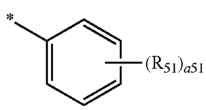

5-2

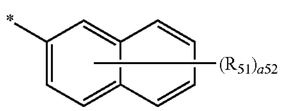

5-3

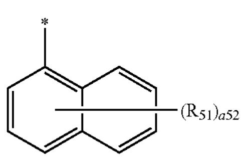

5-4

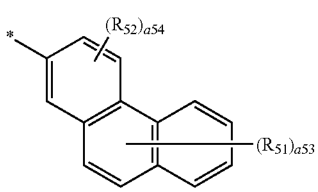

5-5

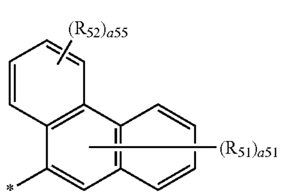

-continued 5-6

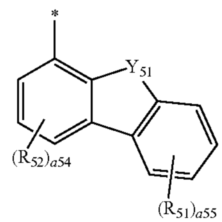

5-7

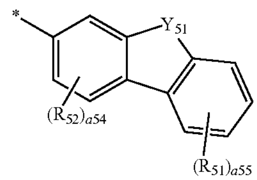

5-8

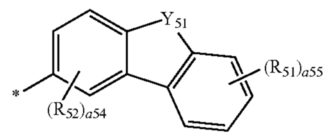

5-9

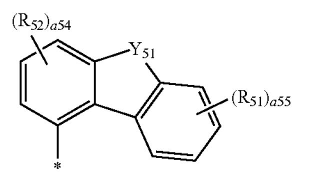

5-10

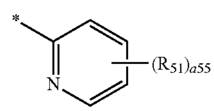

5-11

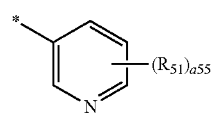

5-12

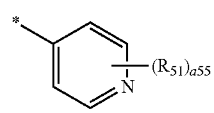

5-13

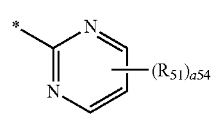

5-14

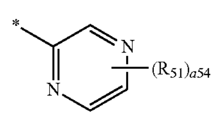

5-15

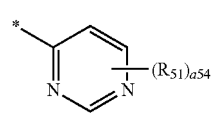

5-16

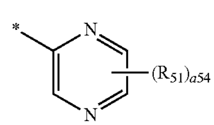

-continued 5-17

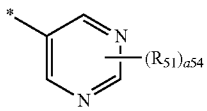

5-18

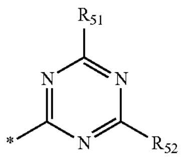

5-19

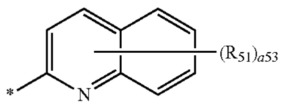

5-20

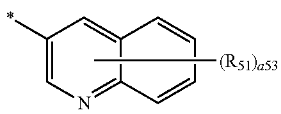

5-21

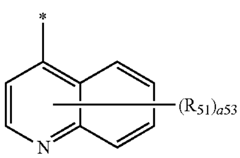

5-22

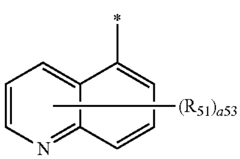

5-23

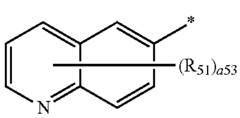

5-24

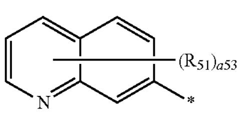

5-25

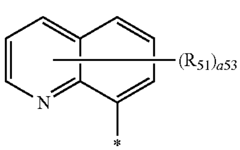

5-26

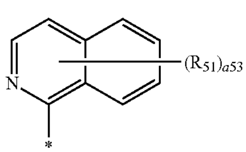

5-27

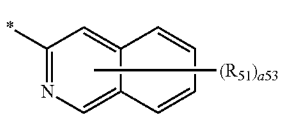

-continued 5-28

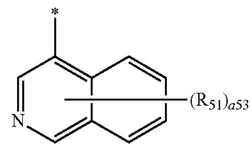

5-29

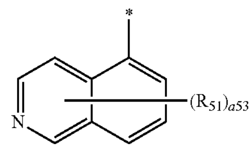

5-30

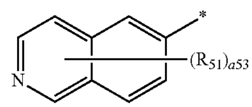

5-31

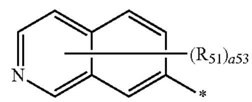

5-32

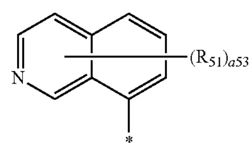

5-33

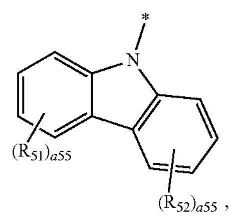

wherein, in Formulae 5-1 to 5-33, $Y_{51}$ is selected from $C(R_{53})(R_{54})$, $N(R_{53})$, O, and S;

$R_{51}$ to $R_{54}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ are each independently selected from a methyl group, an ethyl group, a tert-butyl group, a phenyl group, and a naphthyl group;

a51 is selected from 1, 2, 3, 4, and 5;

a52 is selected from 1, 2, 3, 4, 5, 6, and 7;

a53 is selected from 1, 2, 3, 4, 5, and 6;

a54 is selected from 1, 2, and 3;

a55 is selected from 1, 2, 3, and 4; and

* indicates a binding site to an adjacent atom.

7. The amine-based compound of claim 1, wherein n11 to n13 are each independently selected from 0 and 1.

8. The amine-based compound of claim 1, wherein $R_{17}$ to $R_{19}$ are each a hydrogen.

9. The amine-based compound of claim 1, wherein the amine-based compound is represented by Formula 1-1:

Formula 1-1

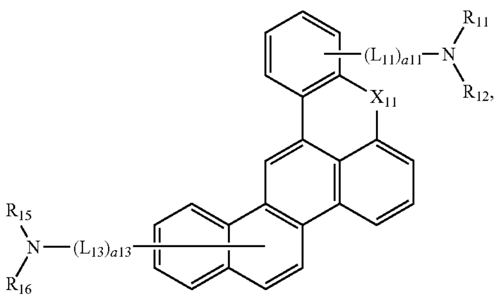

wherein, in Formula 1-1, $X_{11}$, $L_{11}$, $L_{13}$, a11, a13, $R_{11}$, $R_{12}$, $R_{15}$, and $R_{16}$ are as defined in Formula 1.

10. The amine-based compound of claim 1, wherein the amine-based compound is represented by Formula 1-1A:

Formula 1-1A

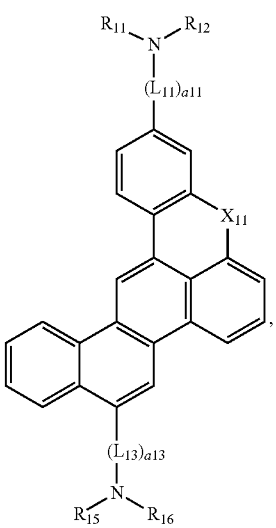

wherein, in Formula 1-1A, $X_{11}$, $L_{11}$, $L_{13}$, a11, a13, $R_{11}$, $R_{12}$, $R_{15}$, and $R_{16}$ are as defined in Formula 1.

11. The amine-based compound of claim 1, wherein the amine-based compound is selected from Compounds 1 to 162:

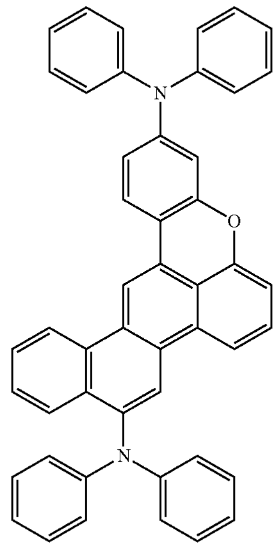

1

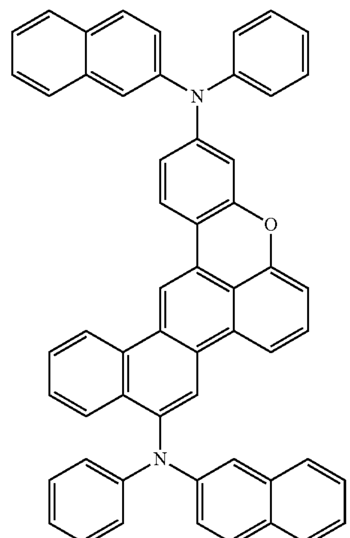

2

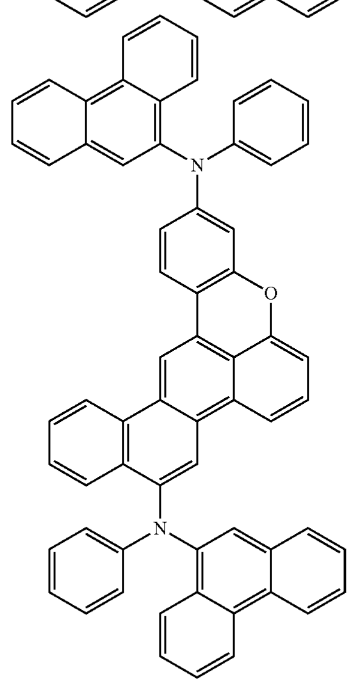

3

4
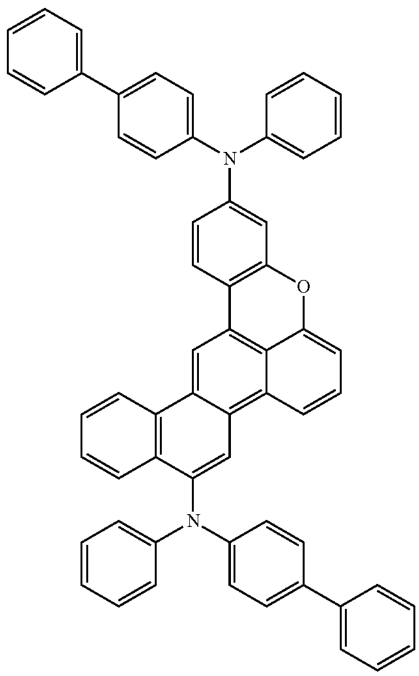
5
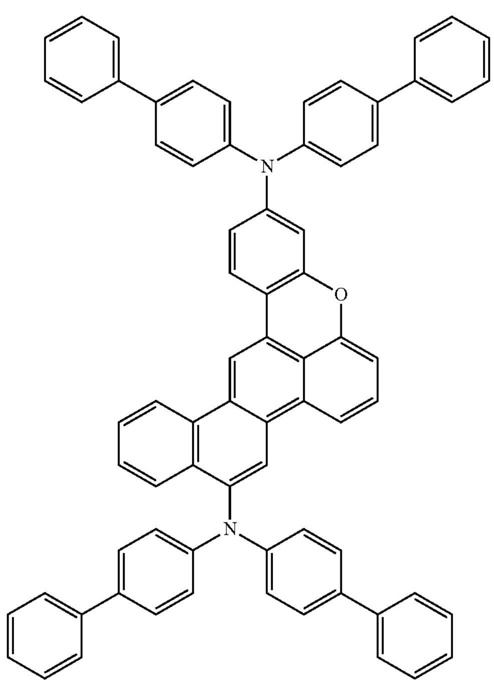
6
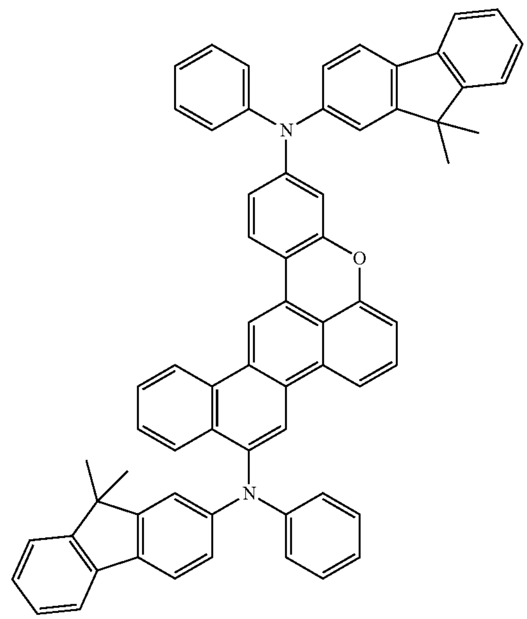
7
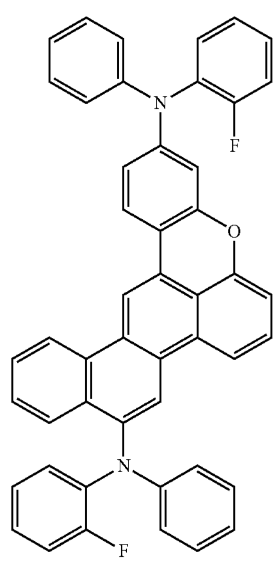

-continued
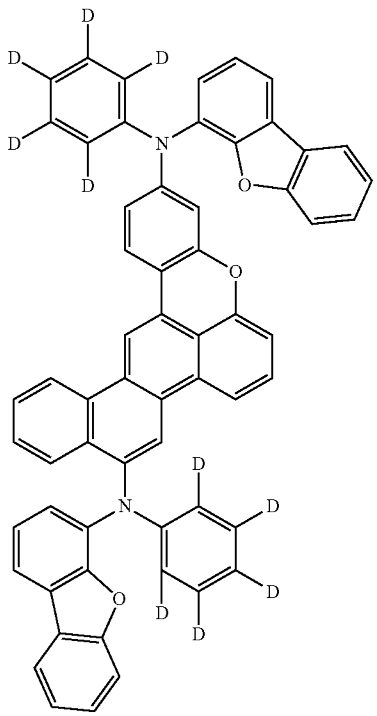
8
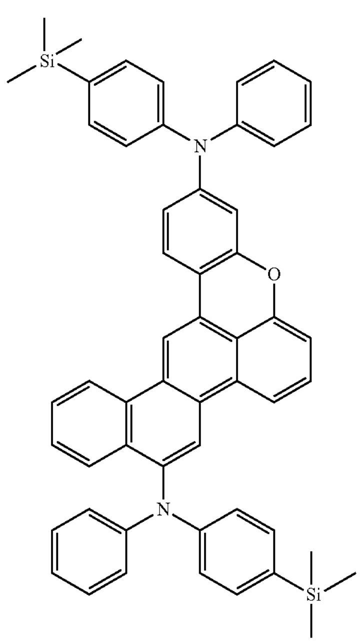
9
-continued
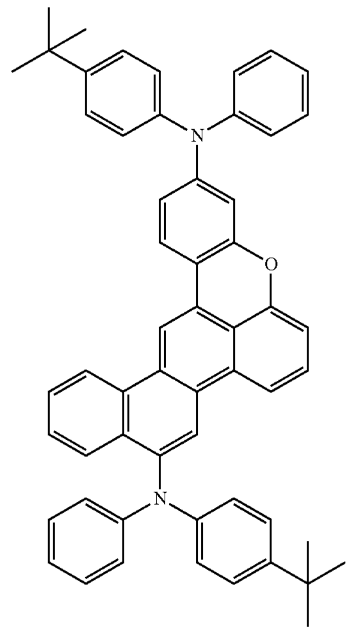
10
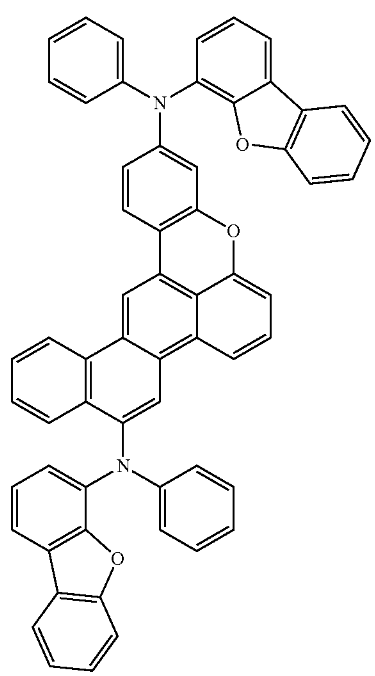
11

12
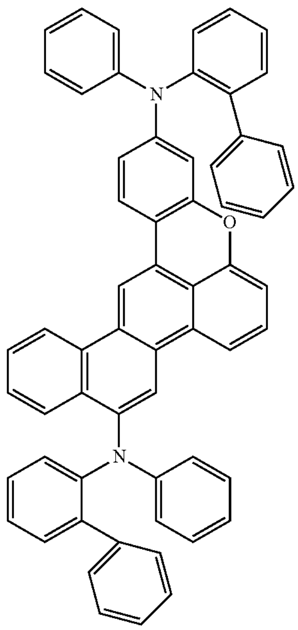
14
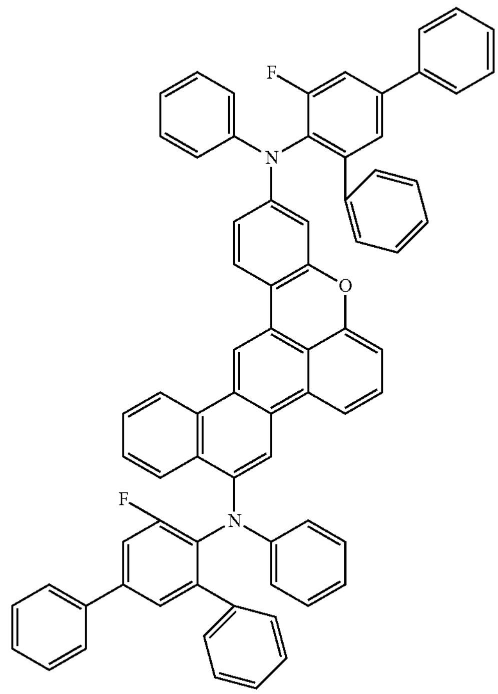
13
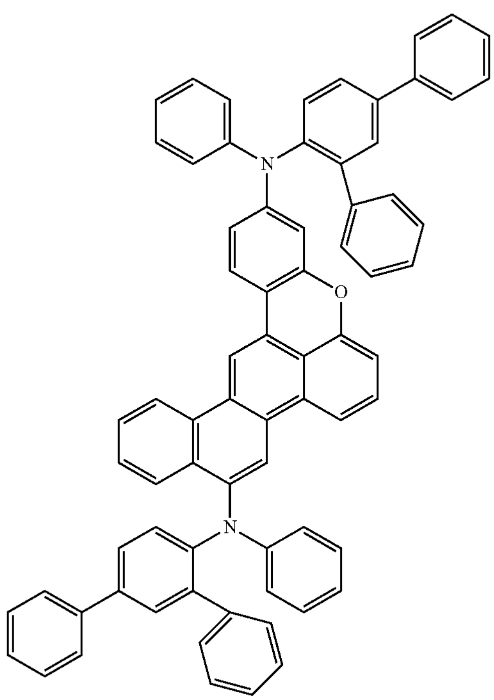
15
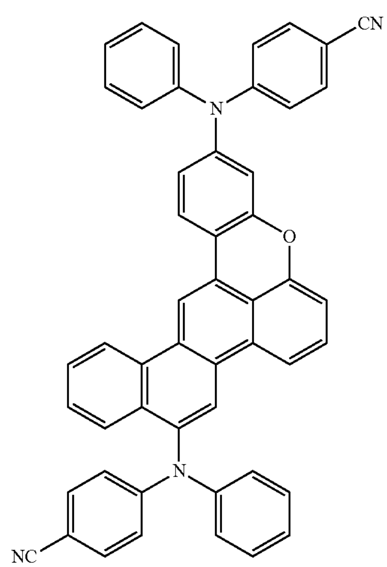

16
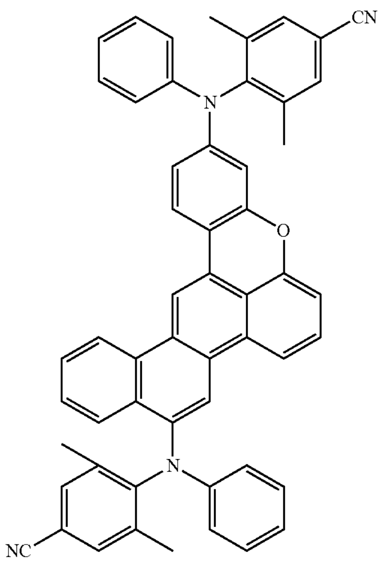
17
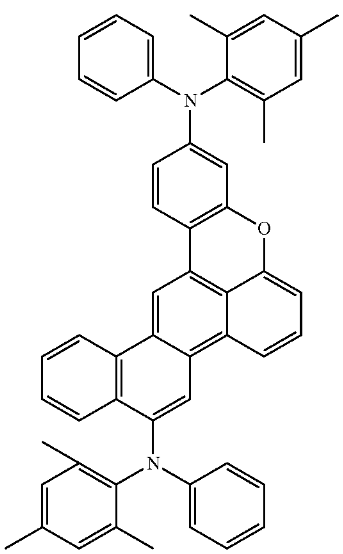
18
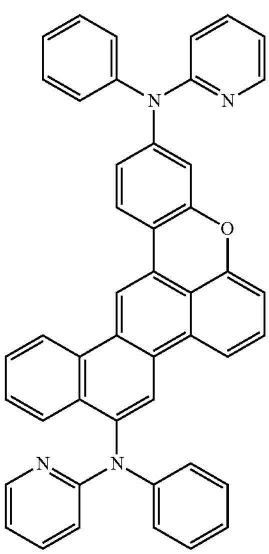
19
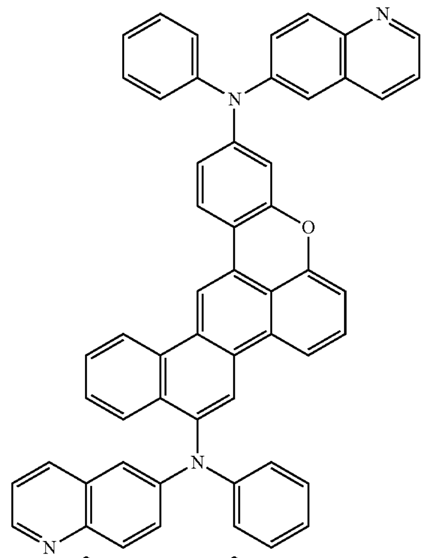
20
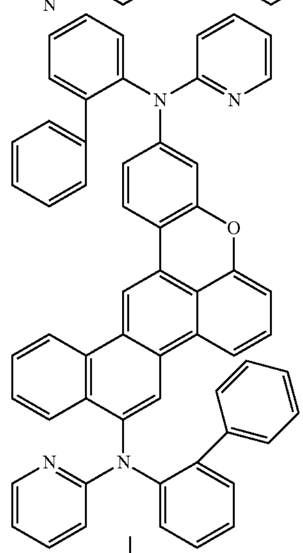
21
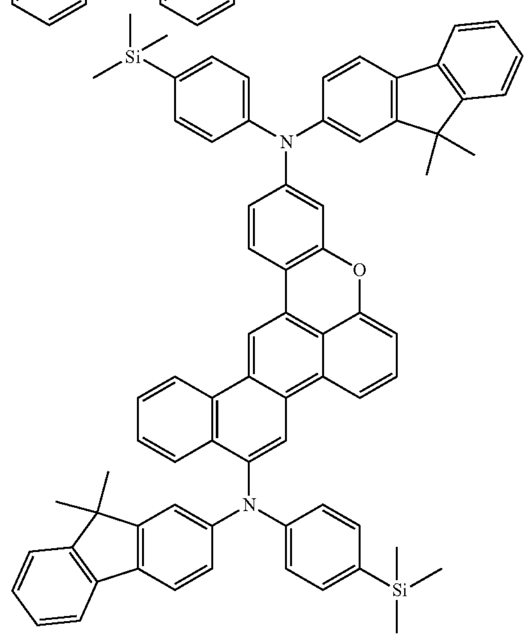

-continued
22
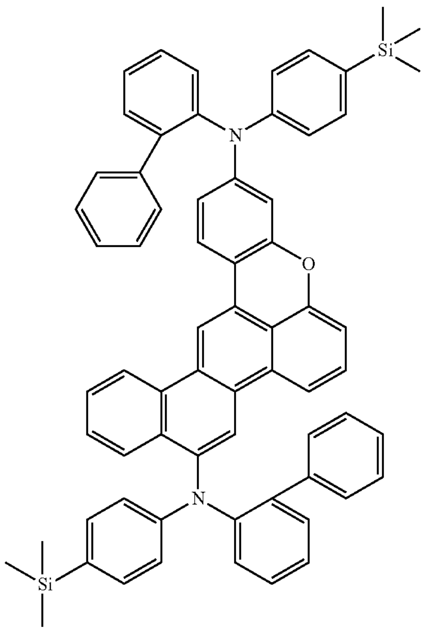
23
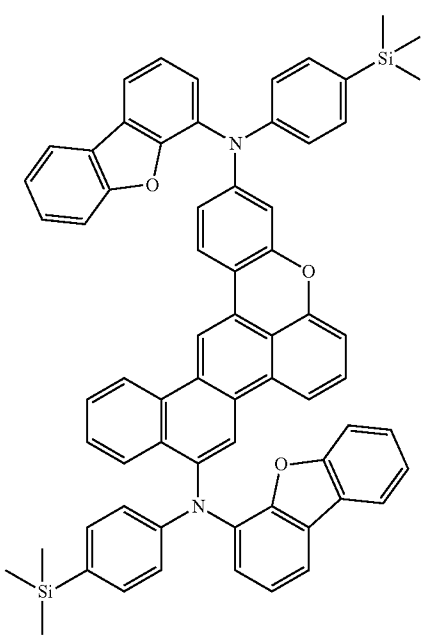
-continued
24
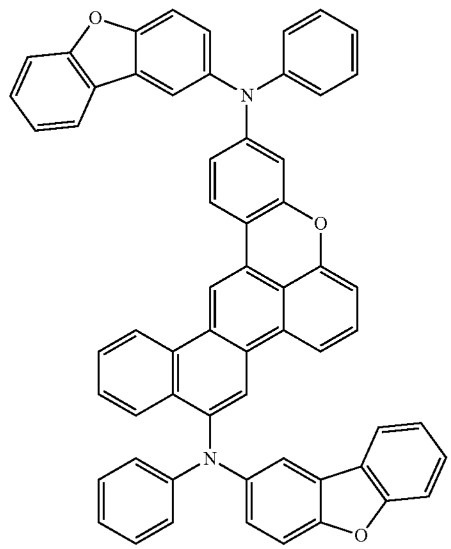
25
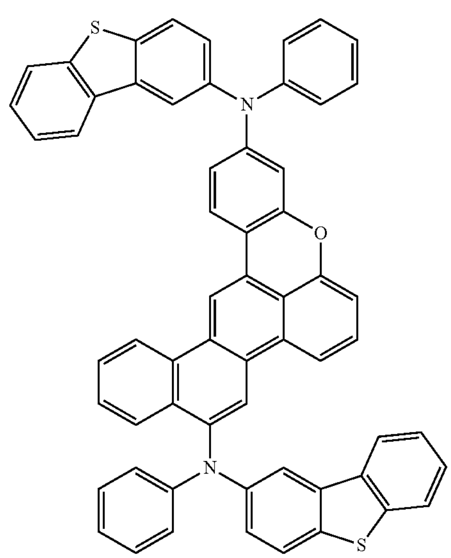

26
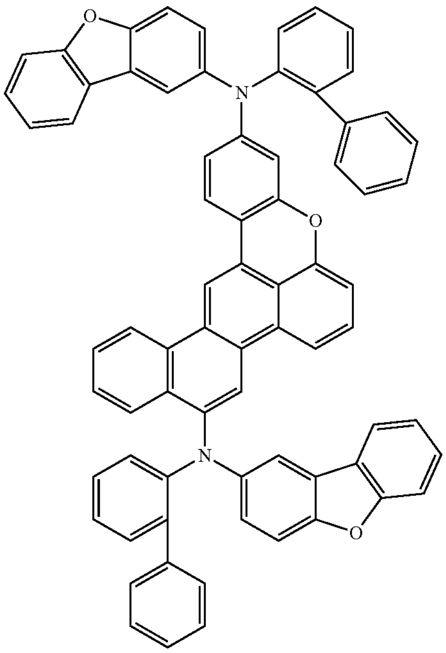
27
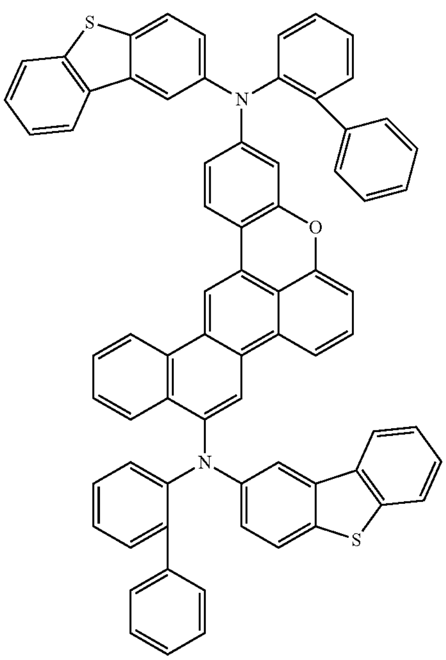
28
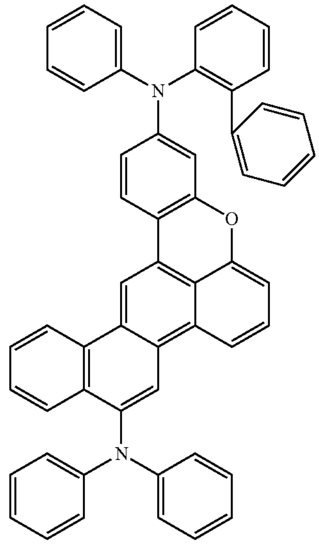
29
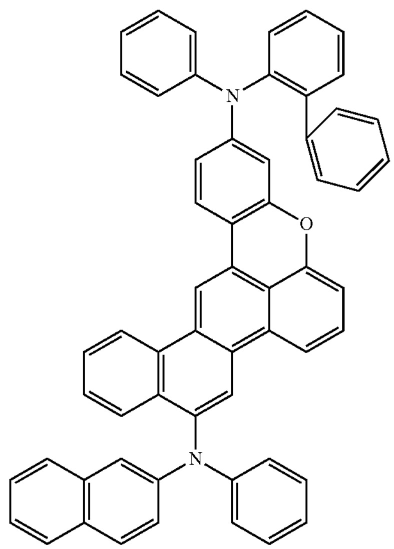
30
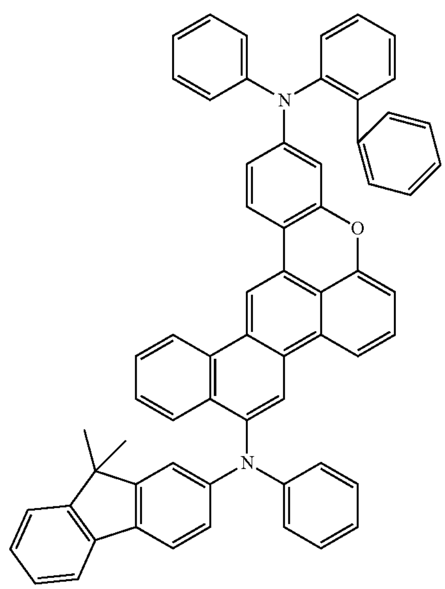

31
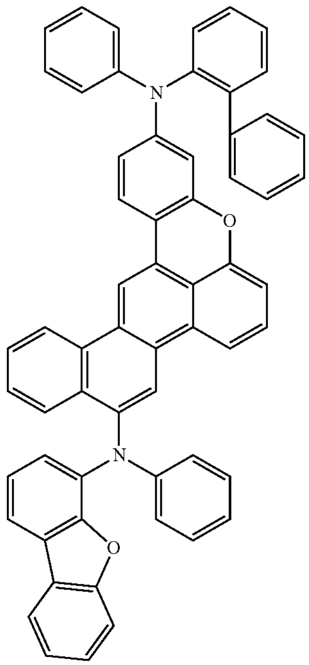
32
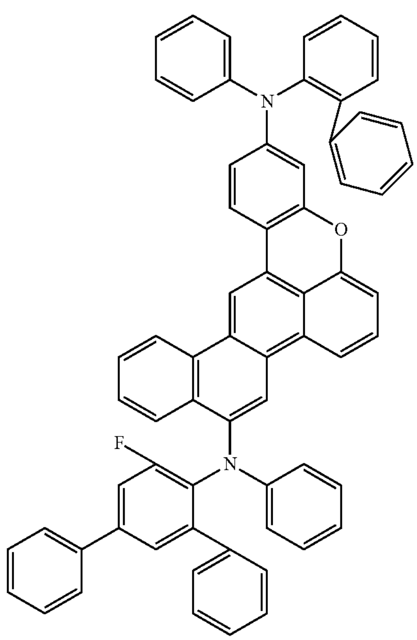
33
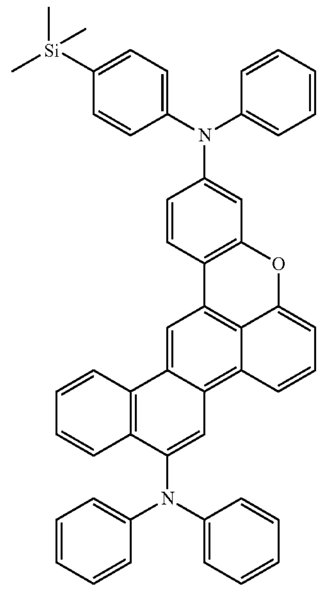
34
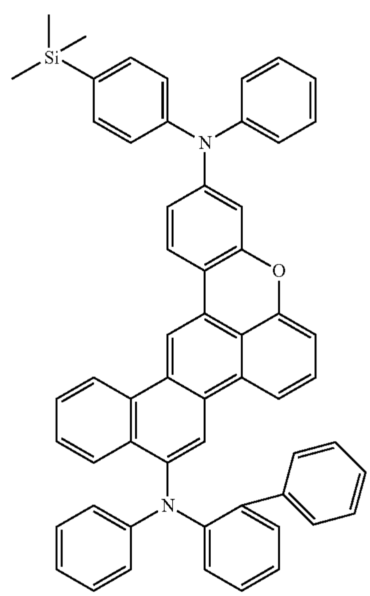

-continued
35
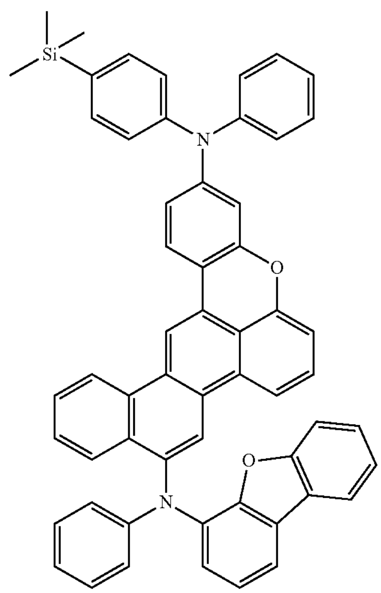
36
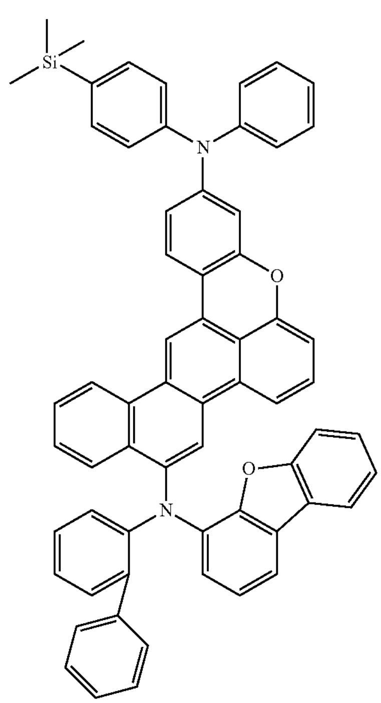
-continued
37
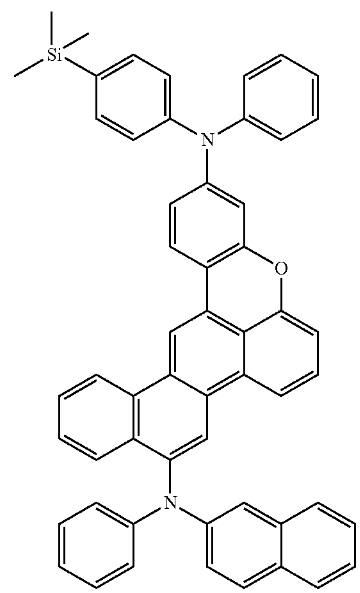
38
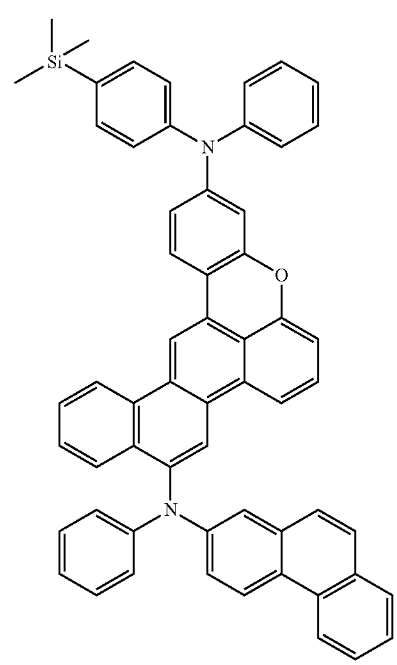

-continued
39
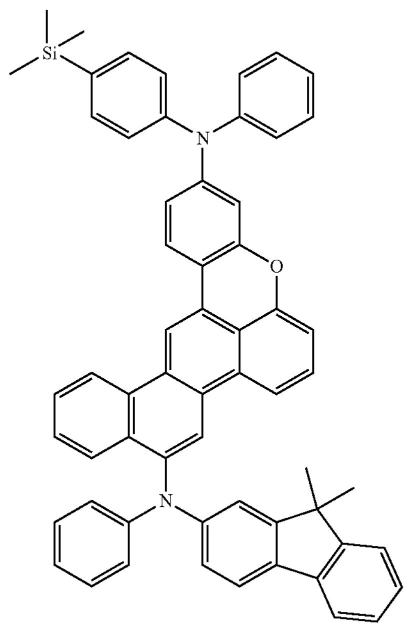
-continued
41
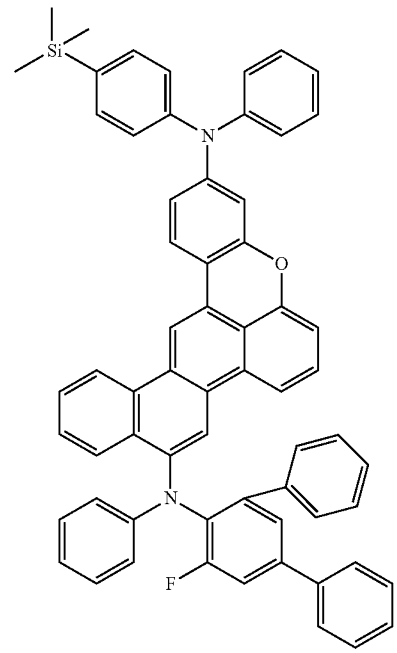
40
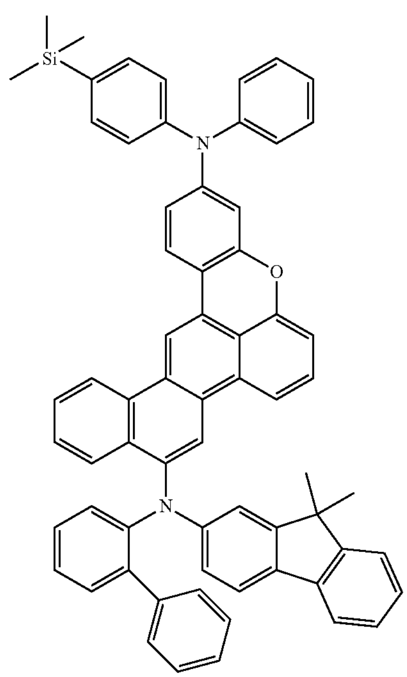
42
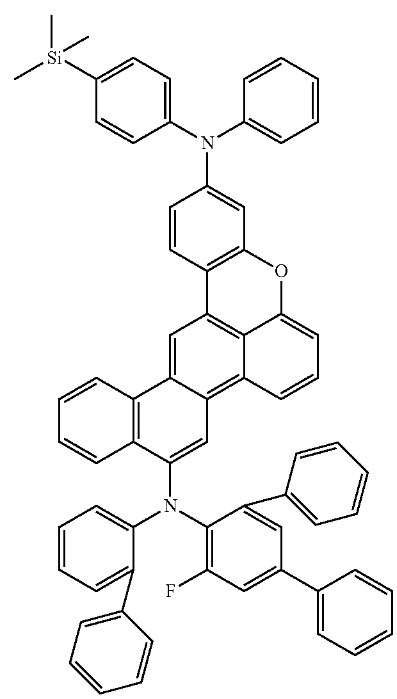

43
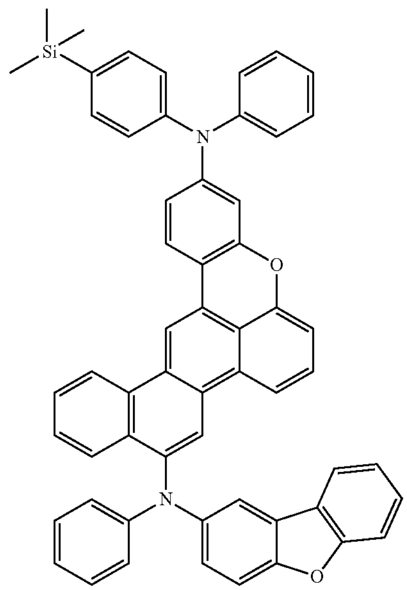
44
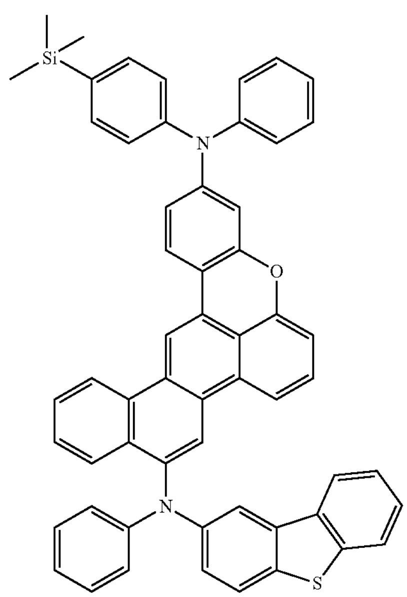
45
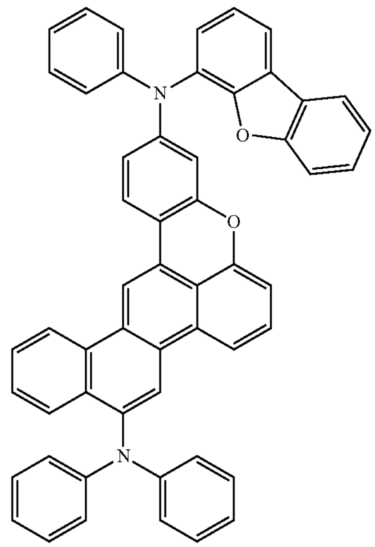
46
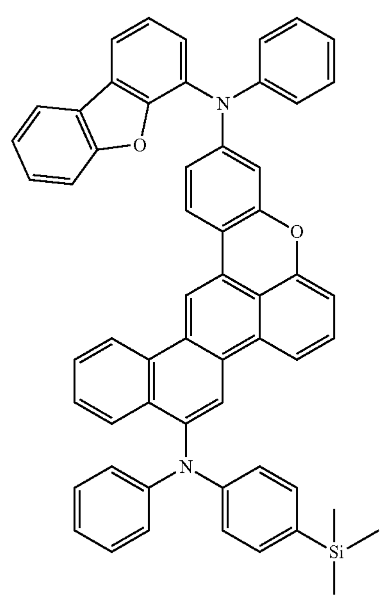

-continued
47
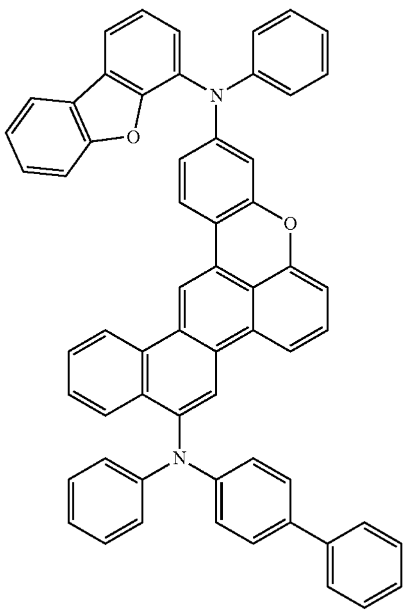
48
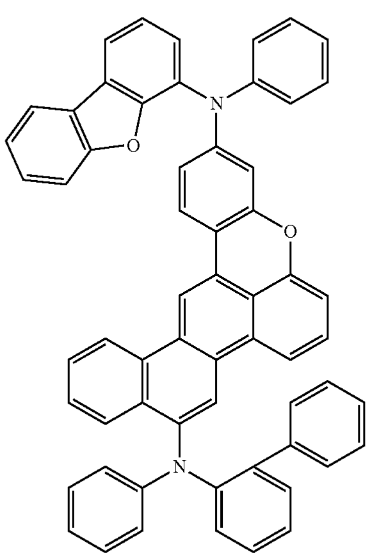
-continued
49
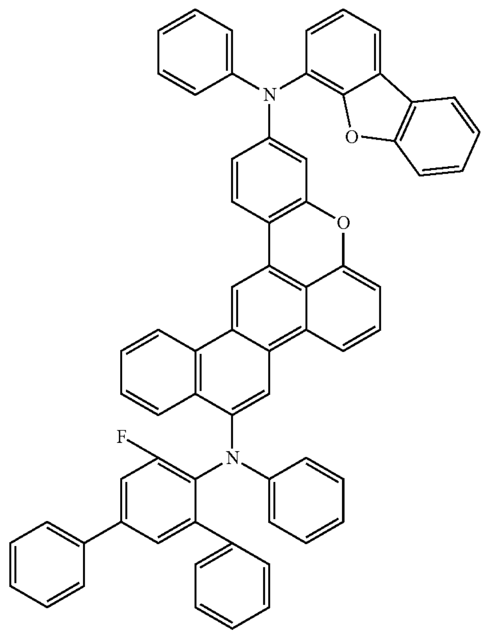
50
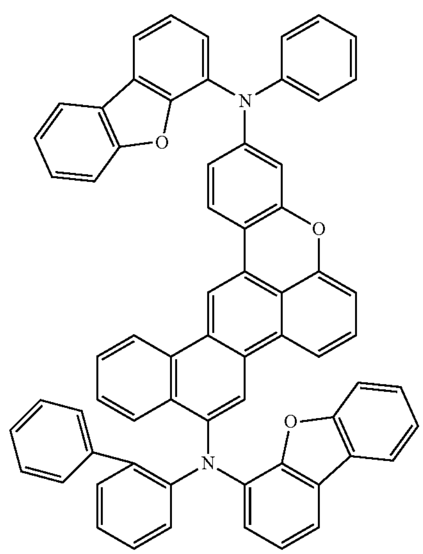

-continued
51
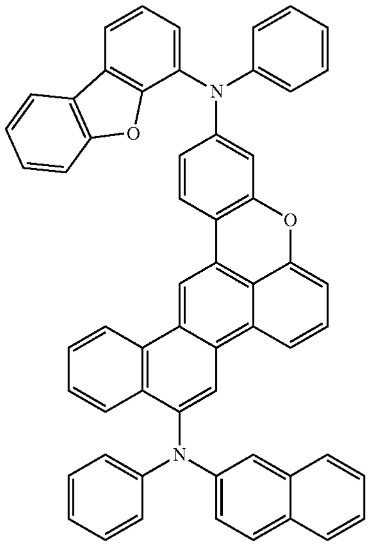
52
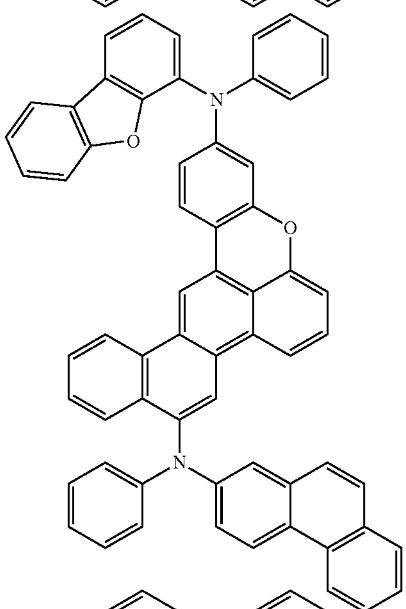
53
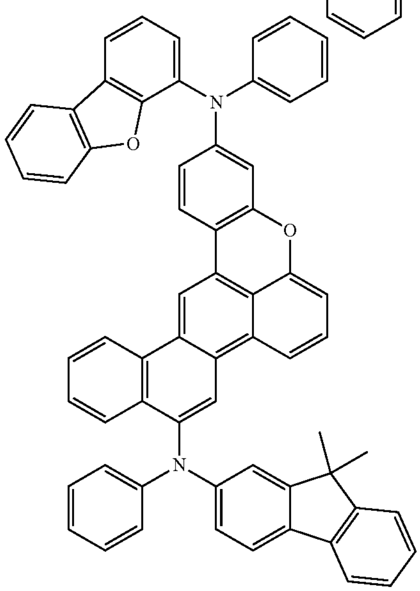
-continued
54
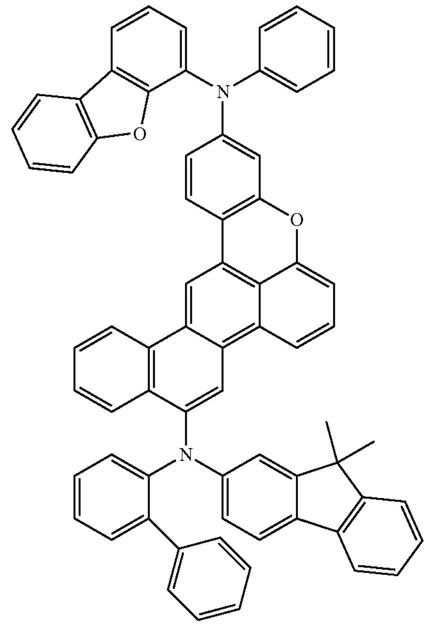
55
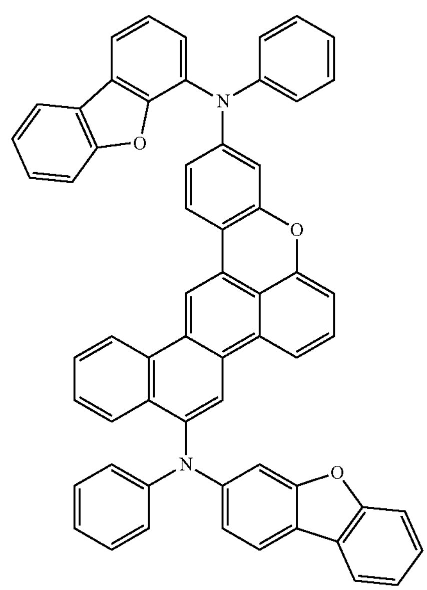

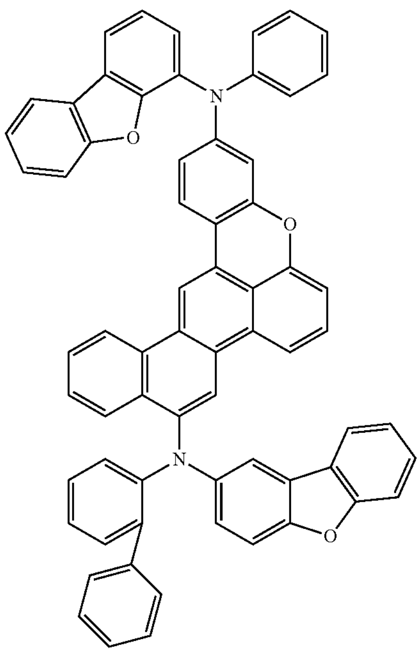
56
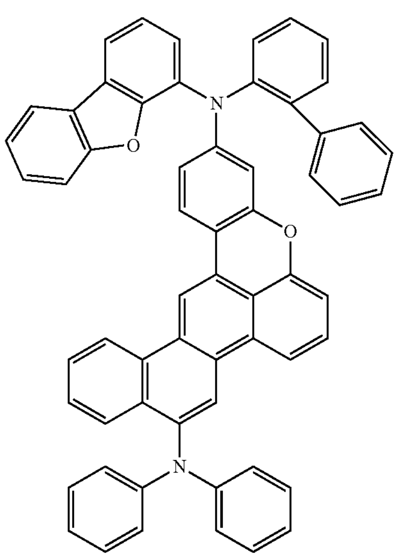
57
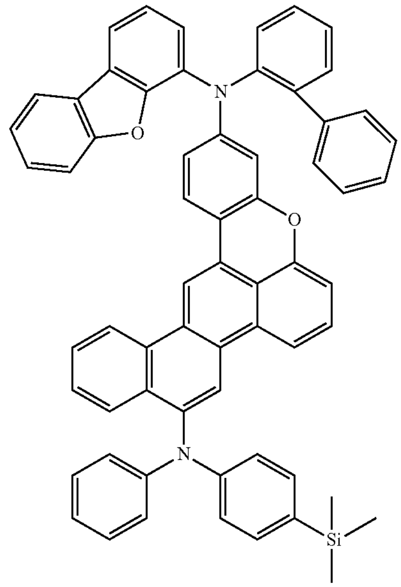
58
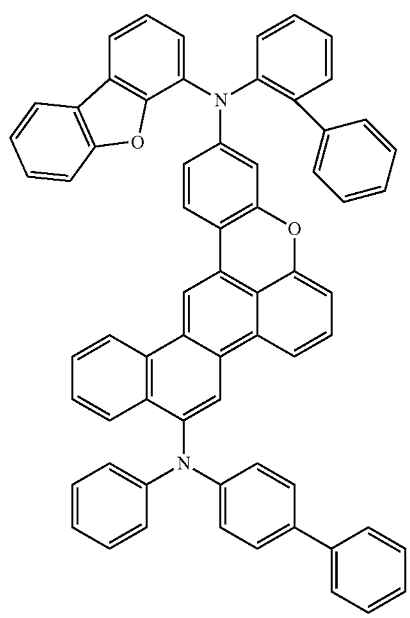
59

-continued
60
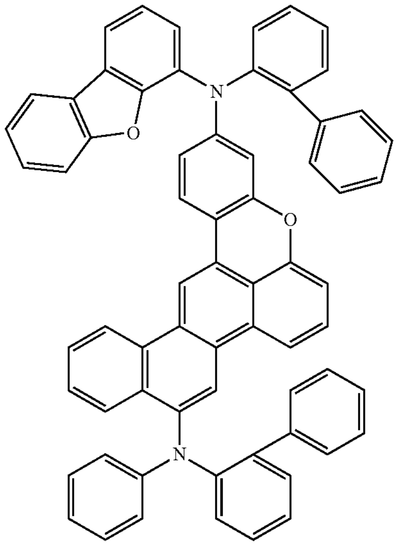
61
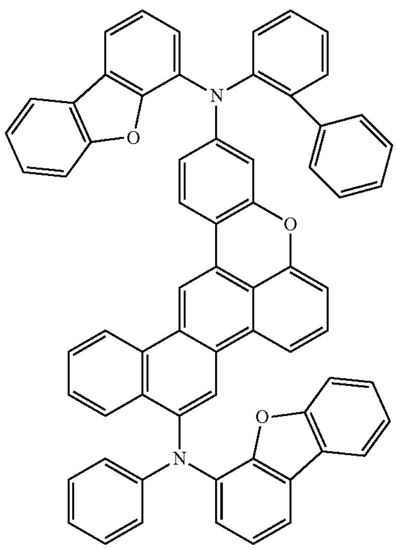
62
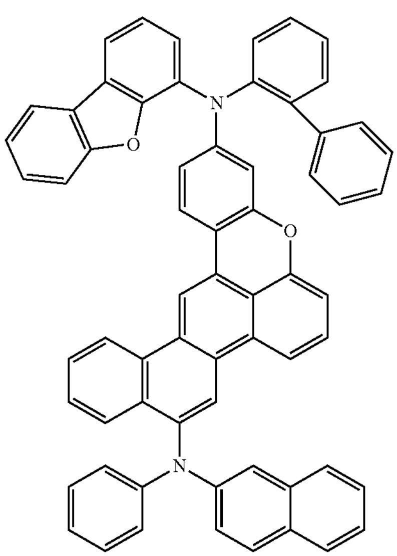
-continued
63
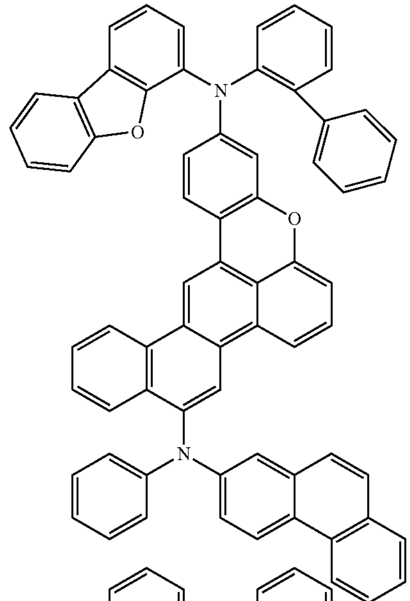
64
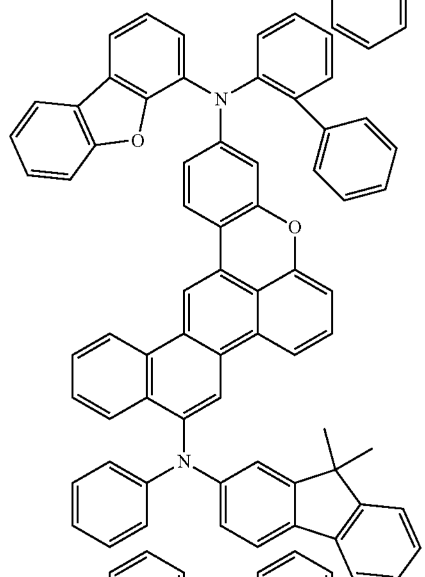
65
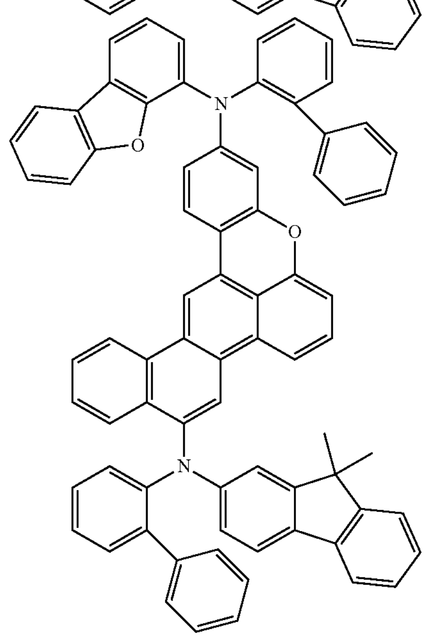

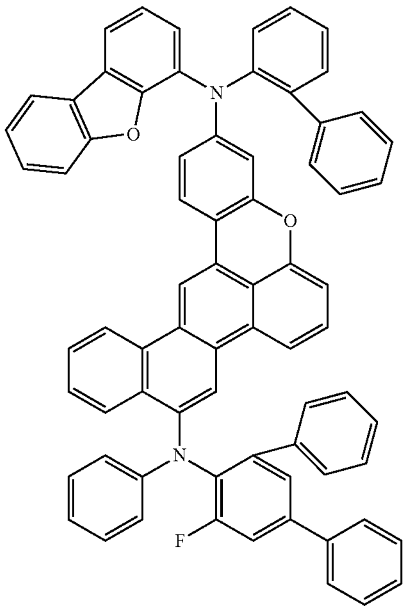
66
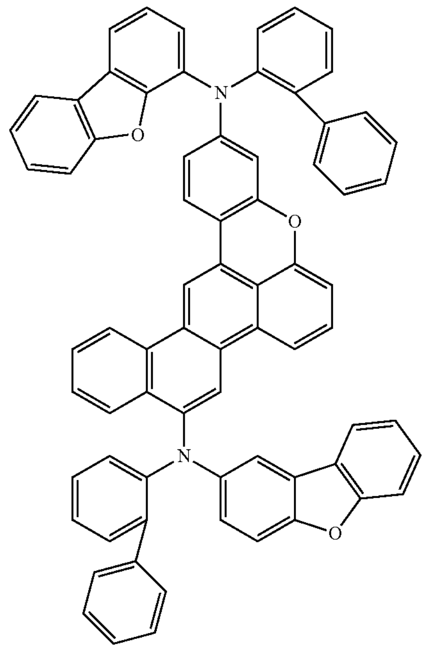
68
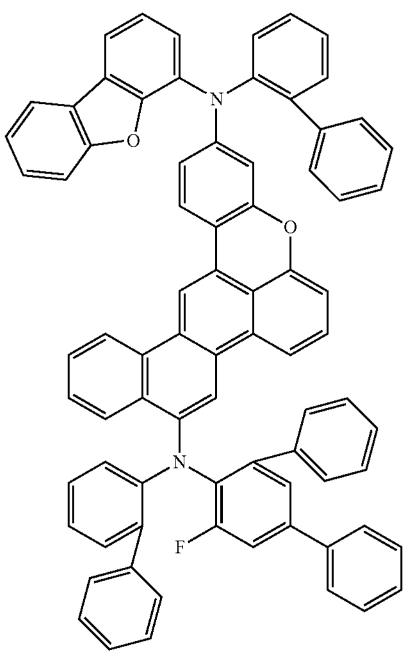
67
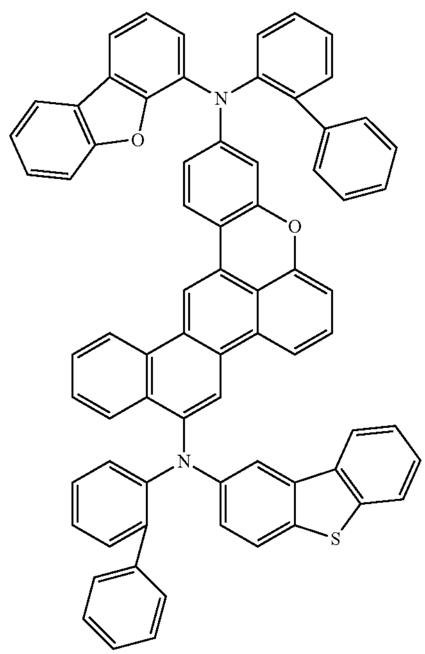
69

70
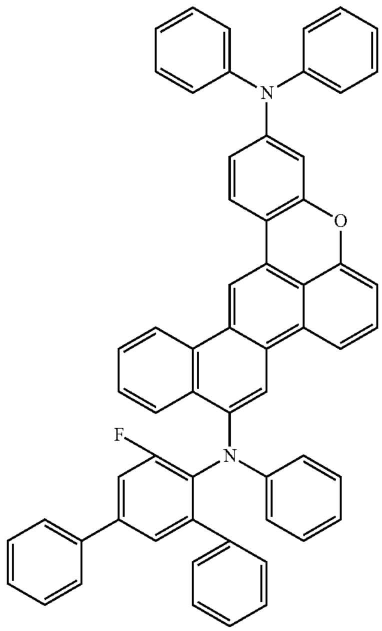
72
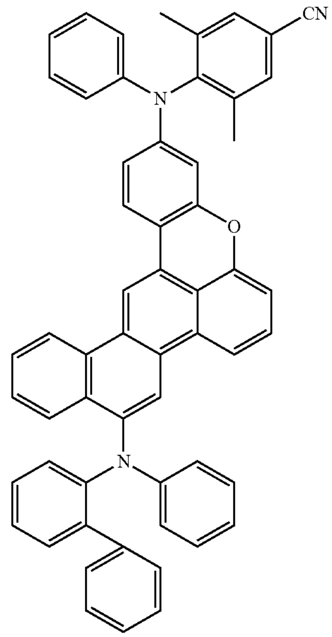
71
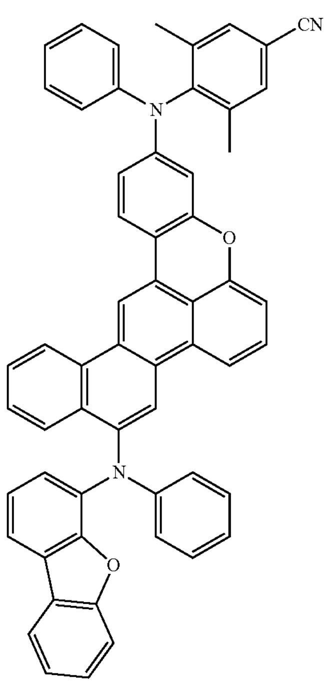
73
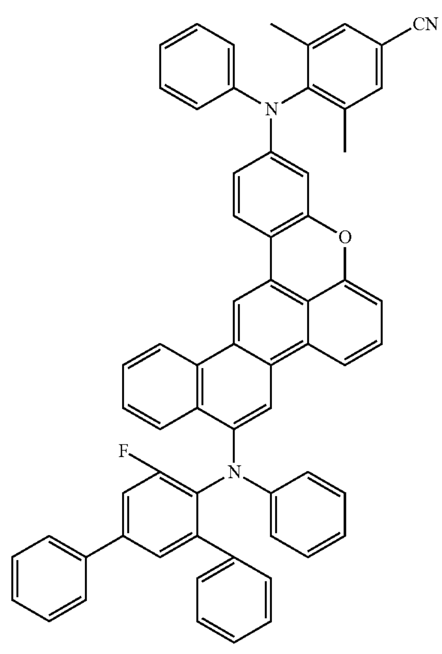

-continued
74
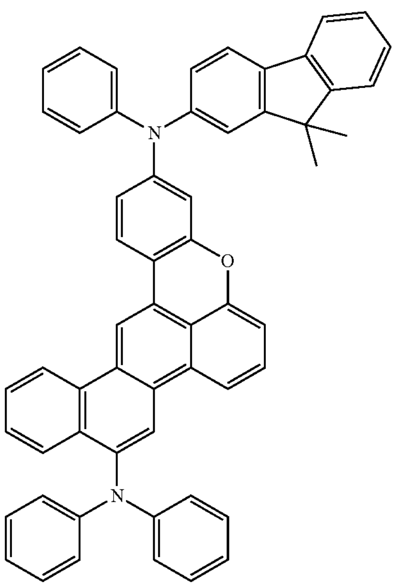
75
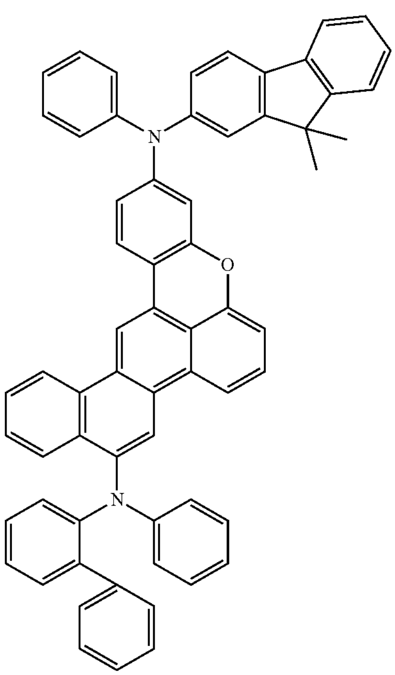
-continued
76
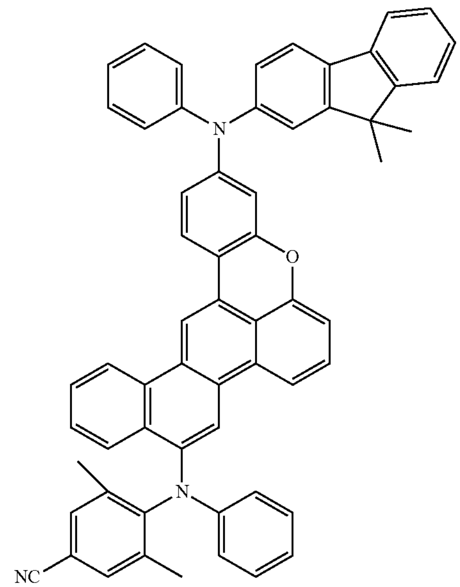
77
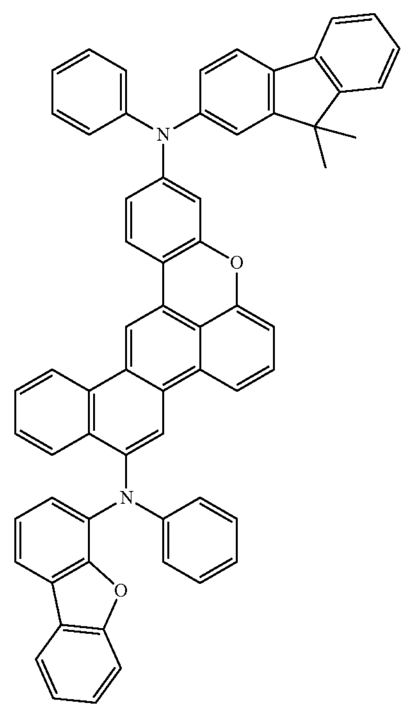

78
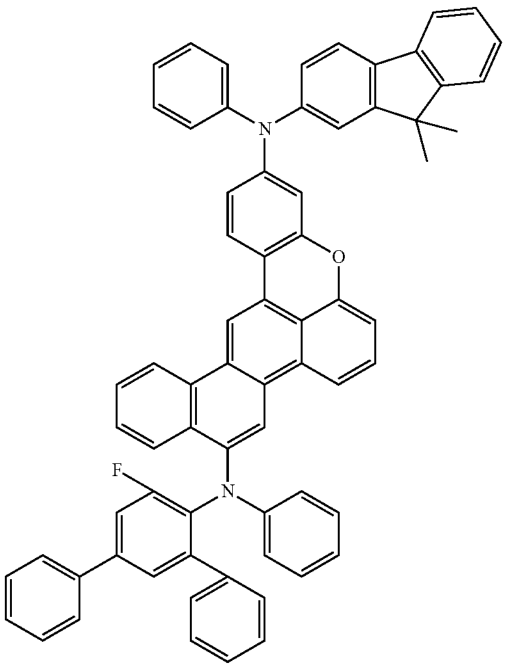
79
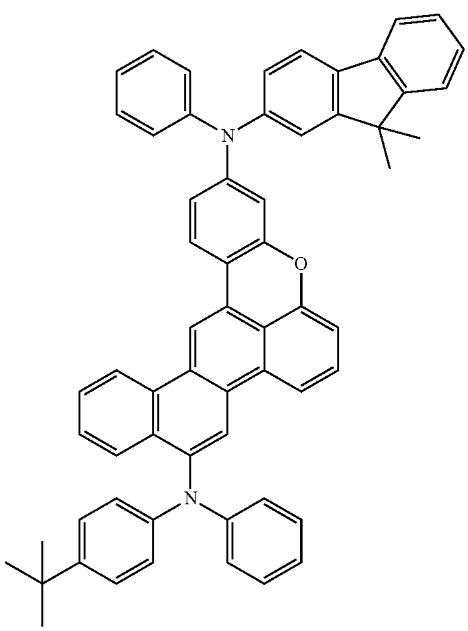
80
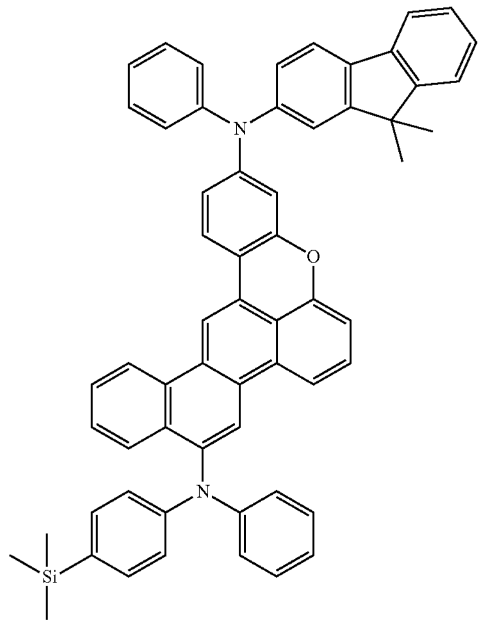
81
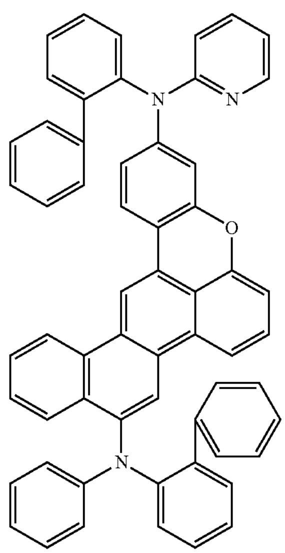

-continued
82
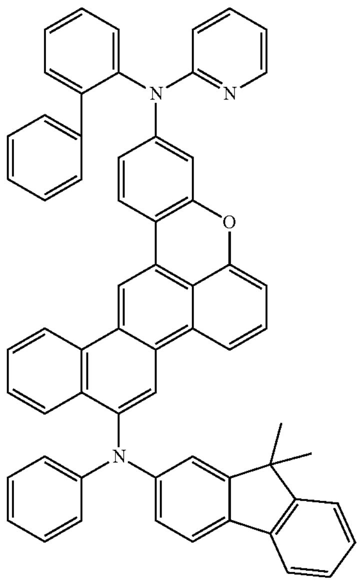
83
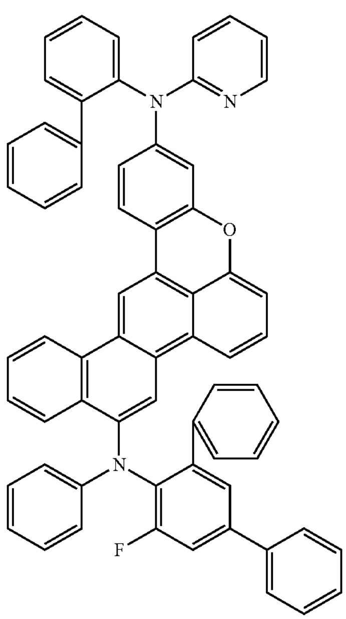
-continued
84
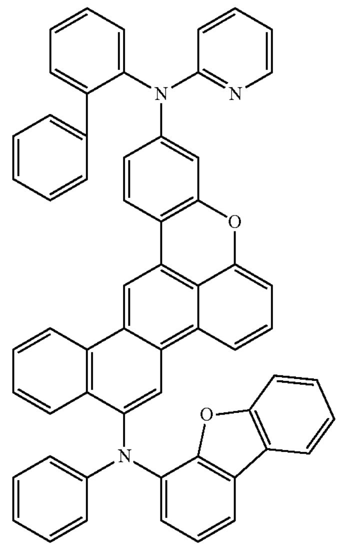
85
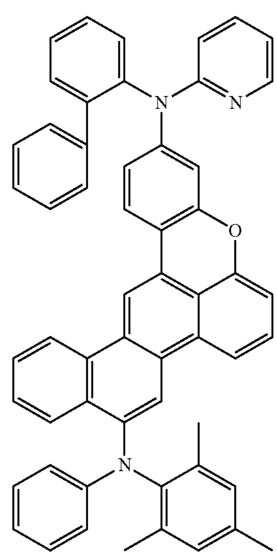

-continued
86
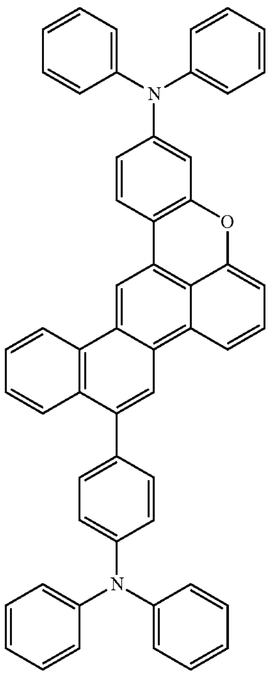
87
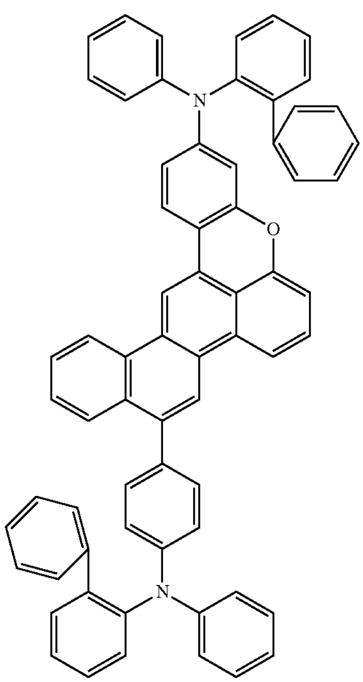
-continued
88
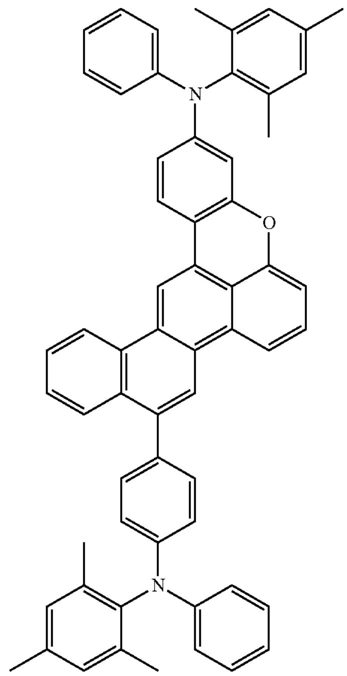
89
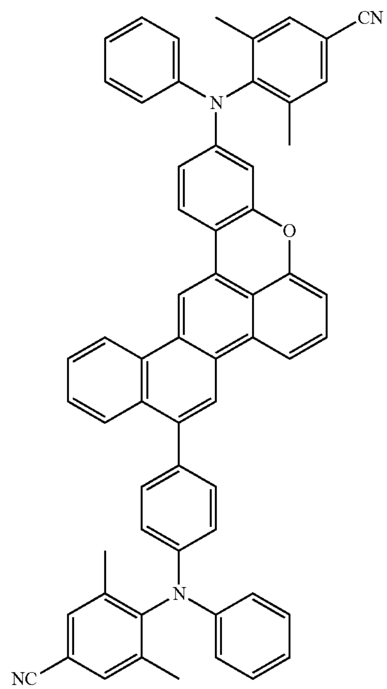

-continued
90
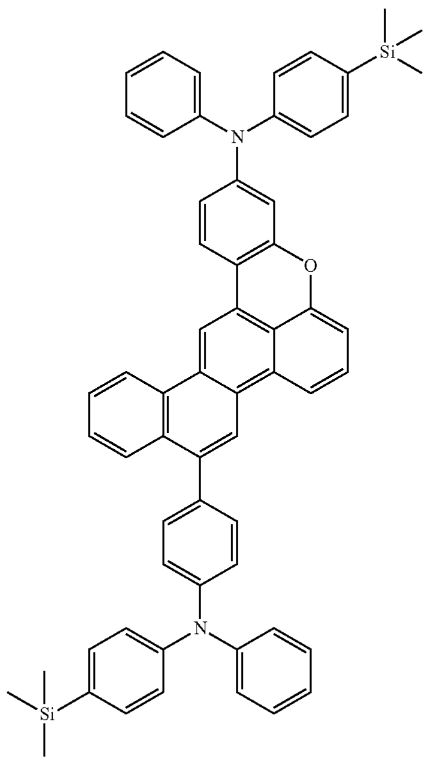
91
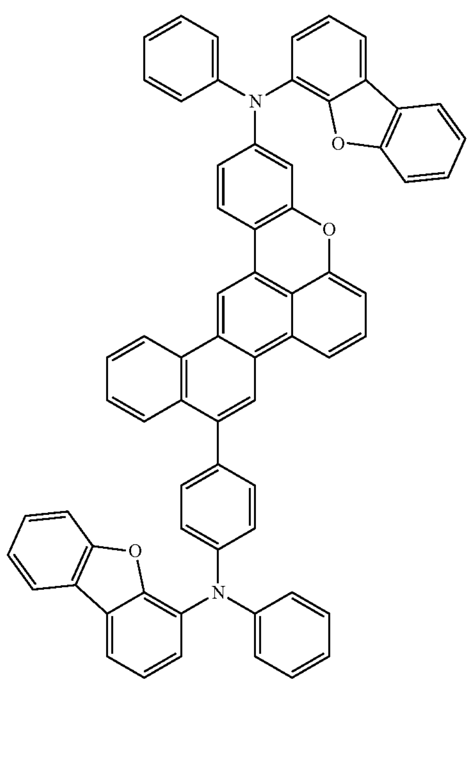
-continued
92
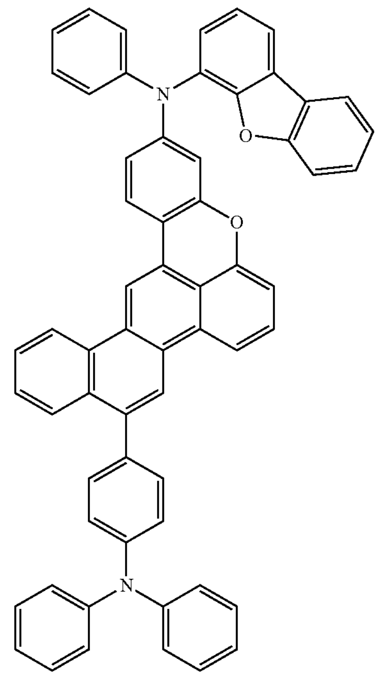
93
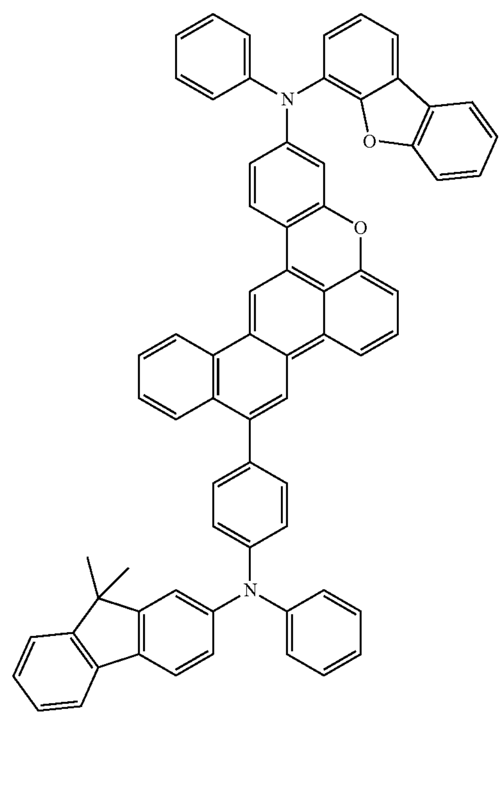

94
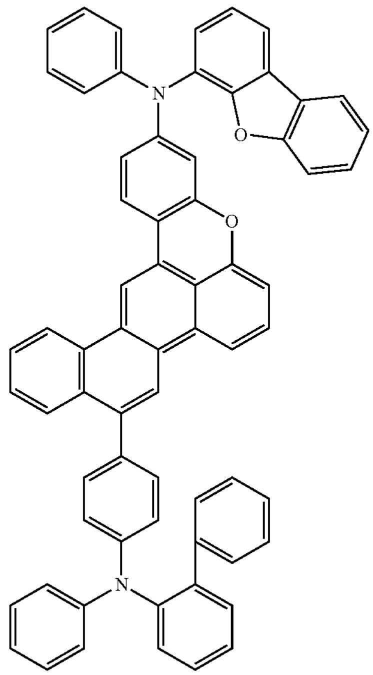
96
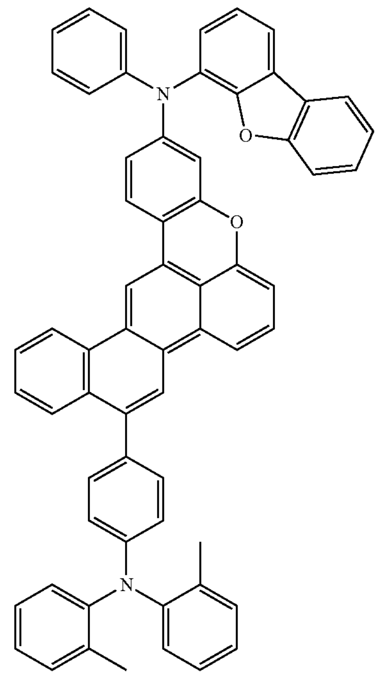
95
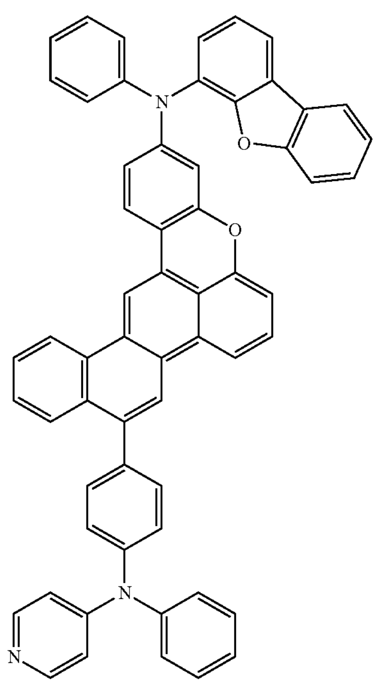
97
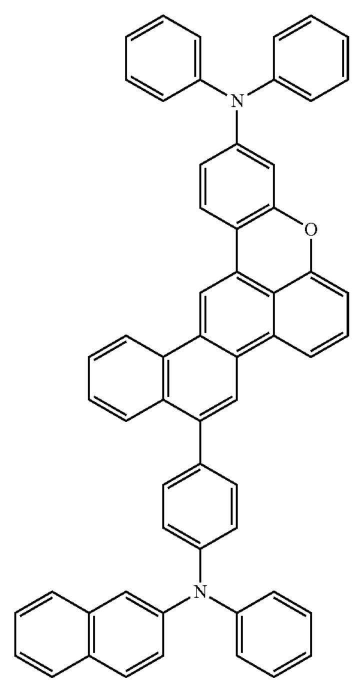

-continued
98
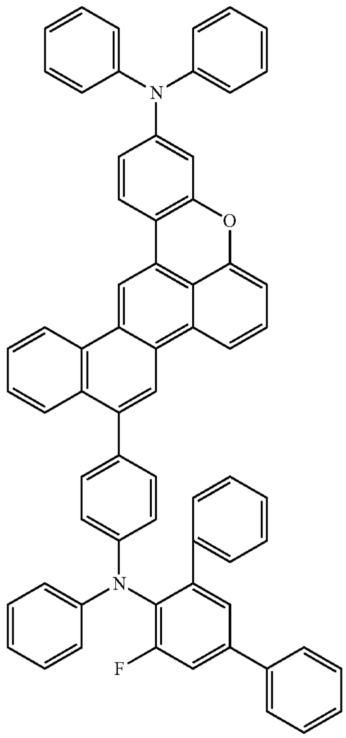
99
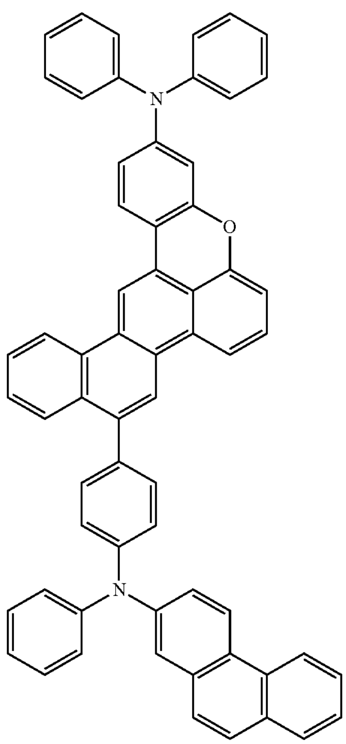
-continued
100
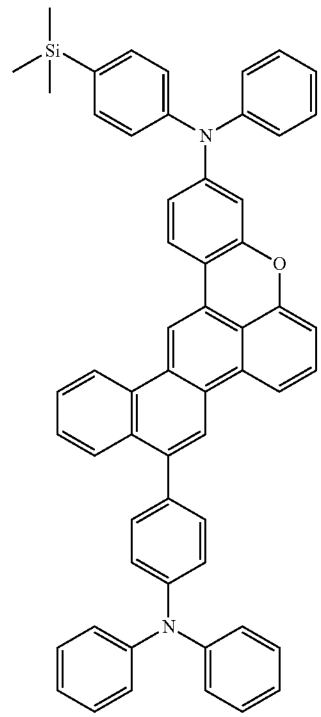
101
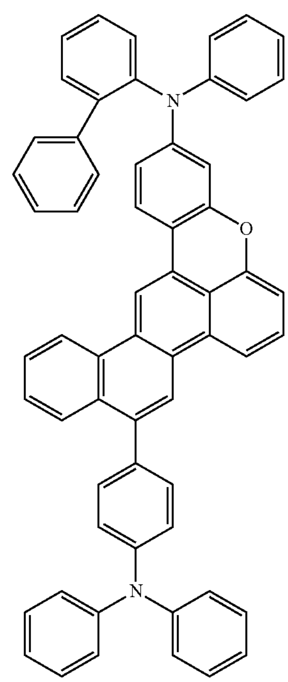

-continued
102
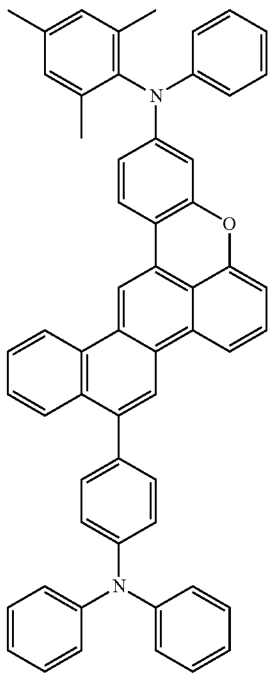
103
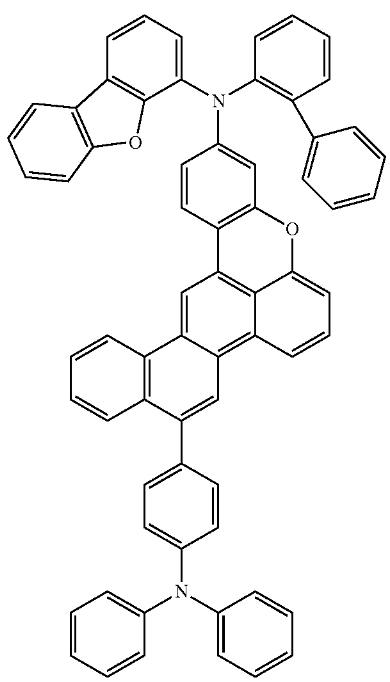
-continued
104
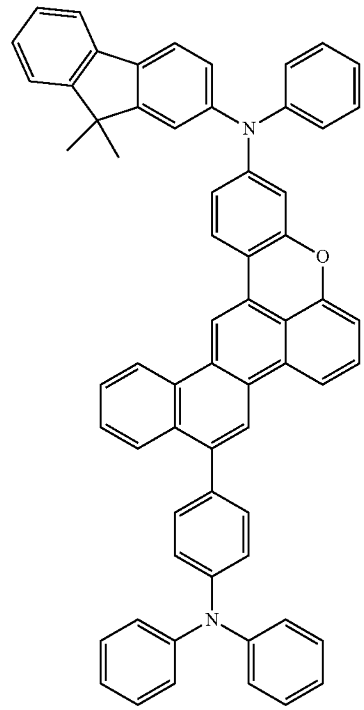
105
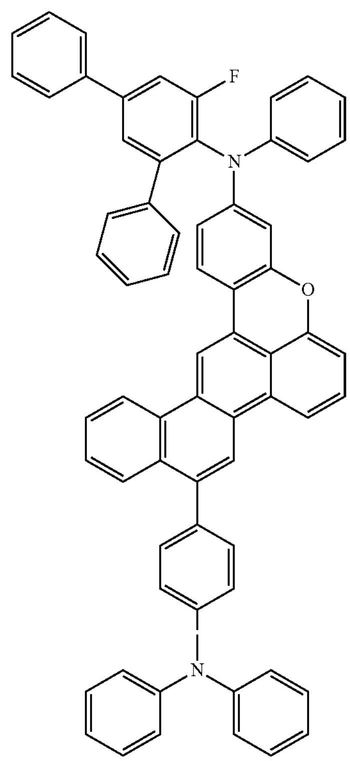

106
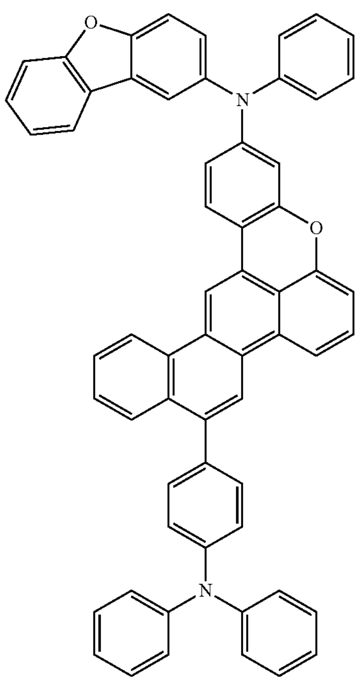
107
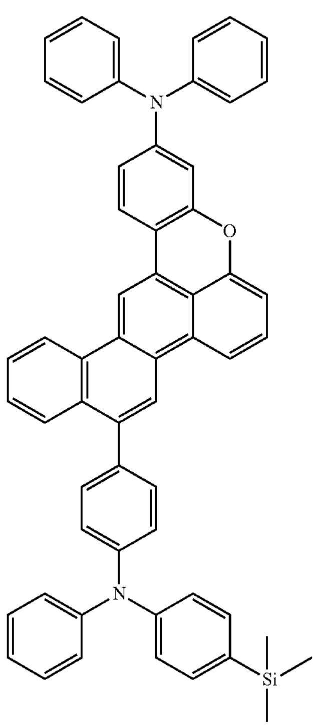
108
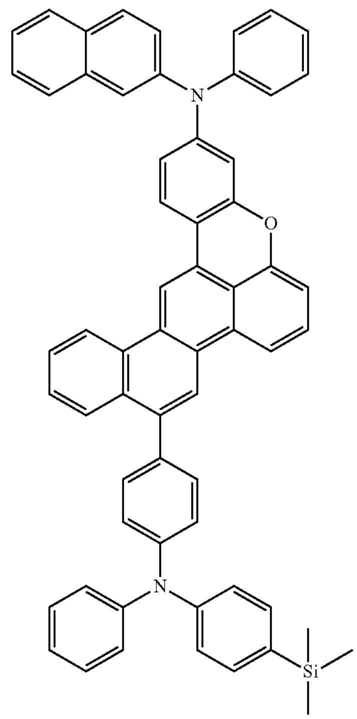
109
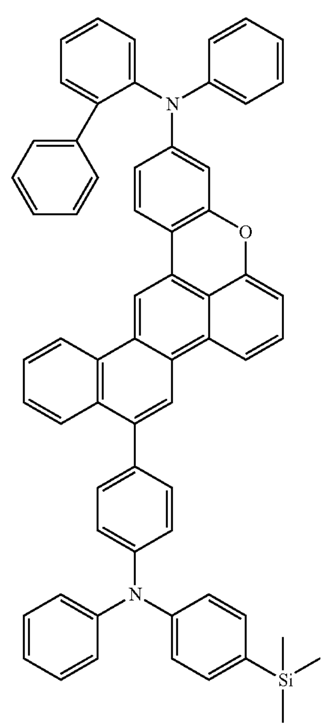

110
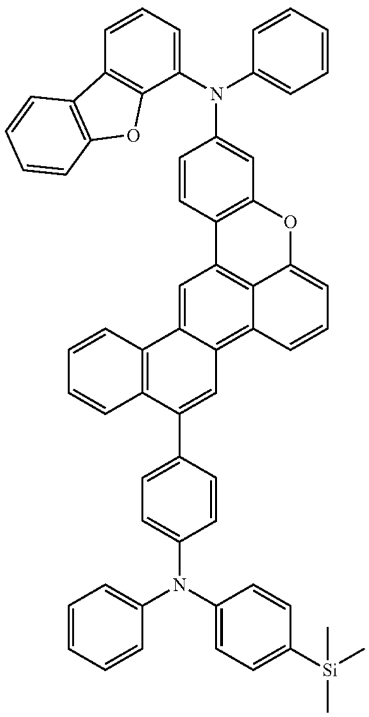
111
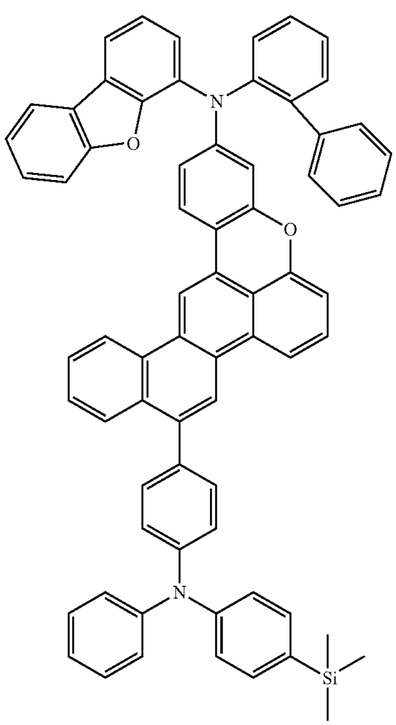
112
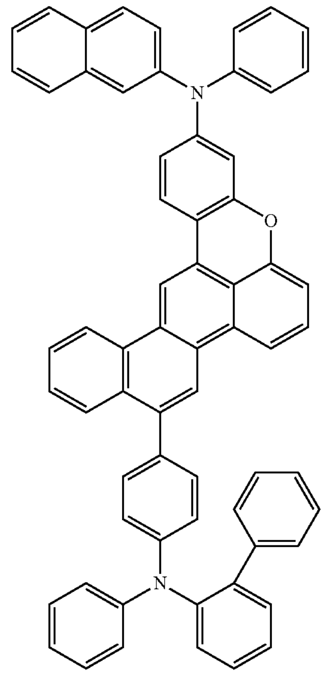
113
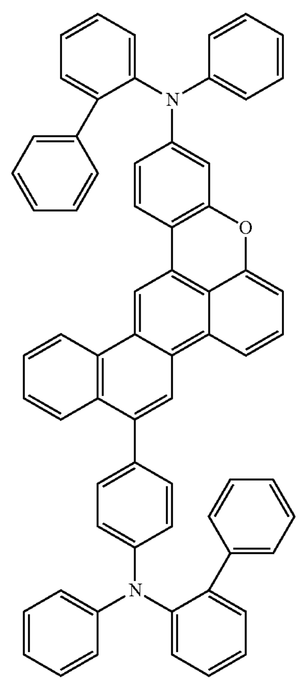

-continued
114
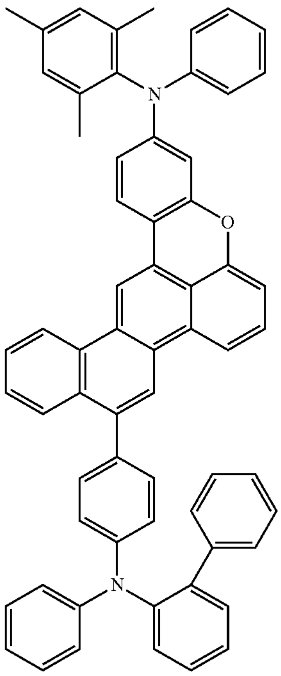
115
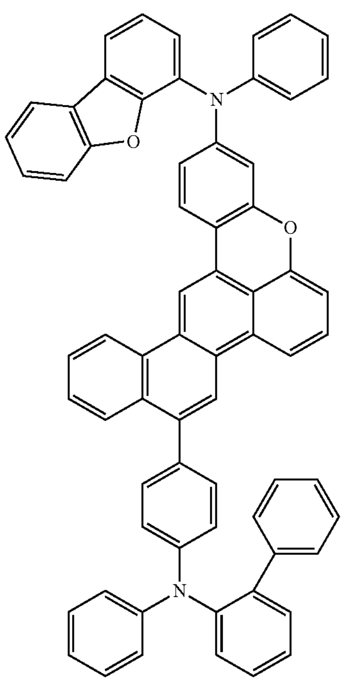
-continued
116
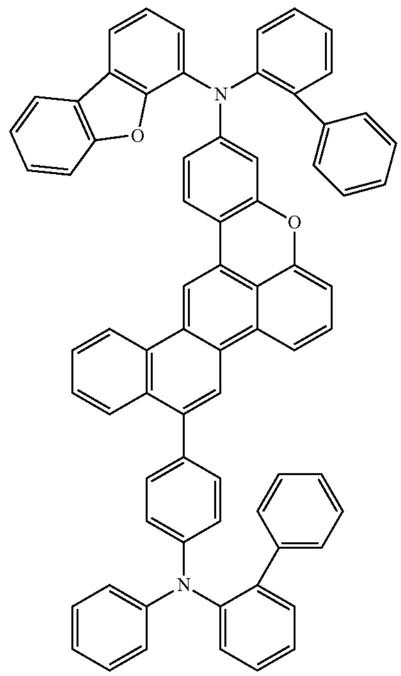
117
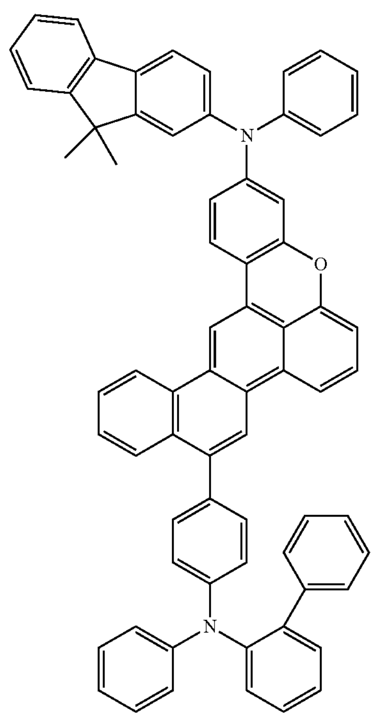

-continued
118
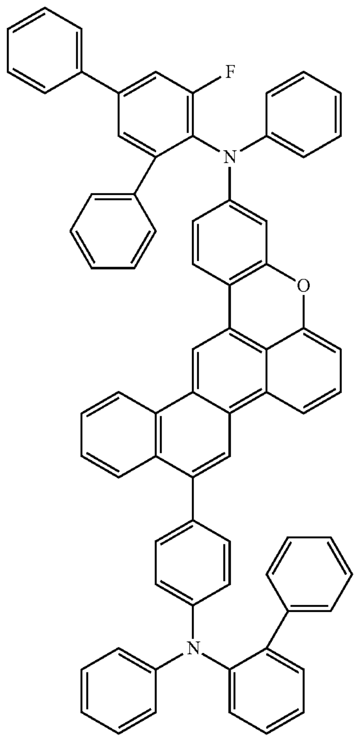
119
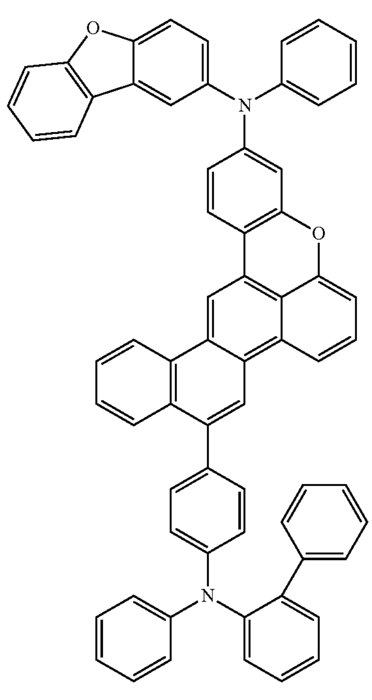
-continued
120
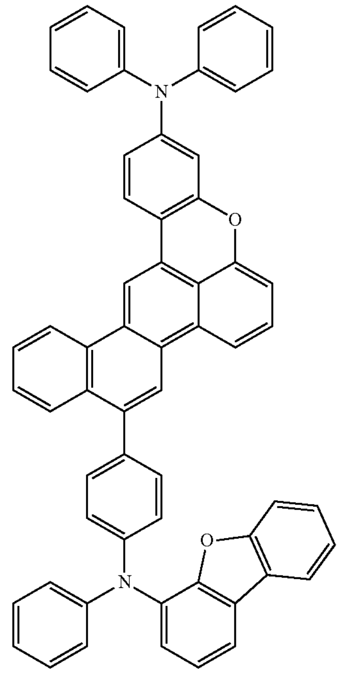
121
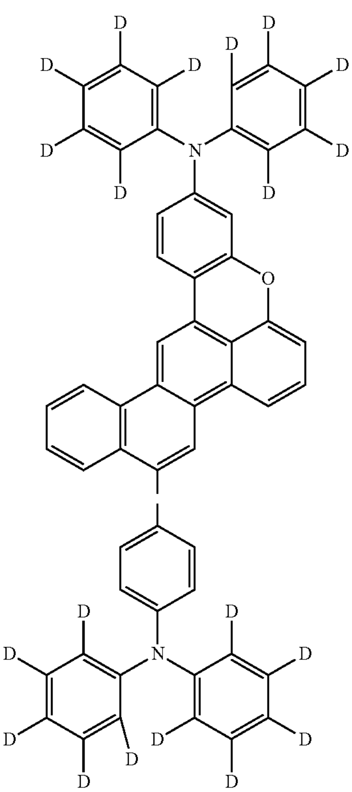

-continued
-continued
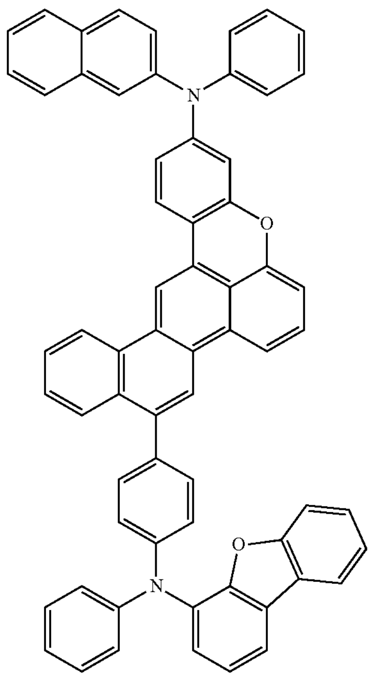
122
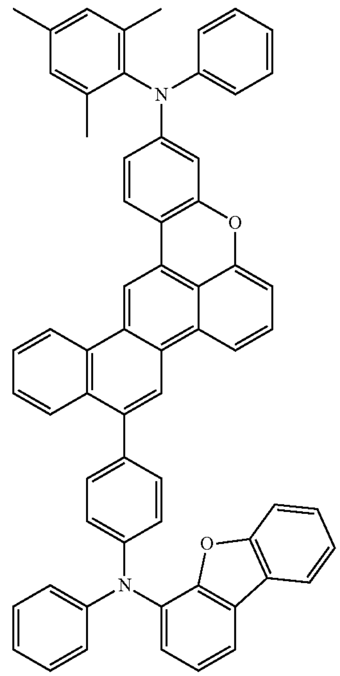
124
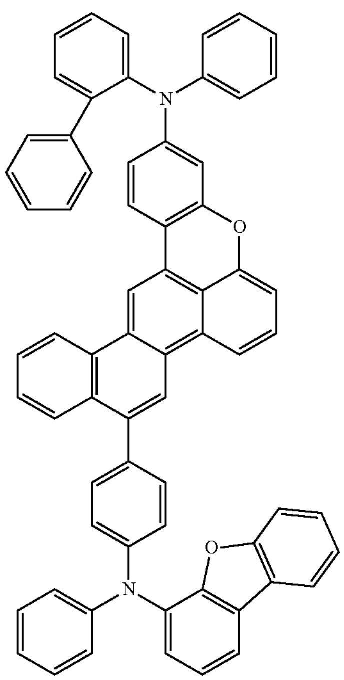
123
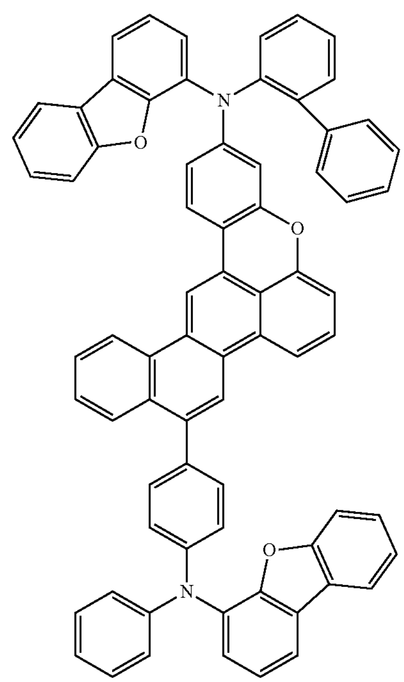
125

126
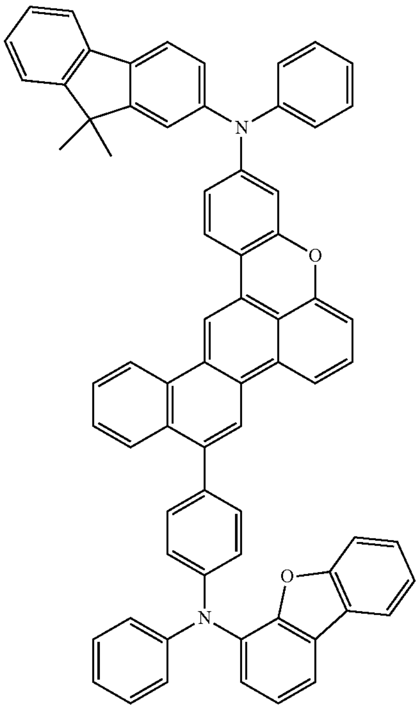
127
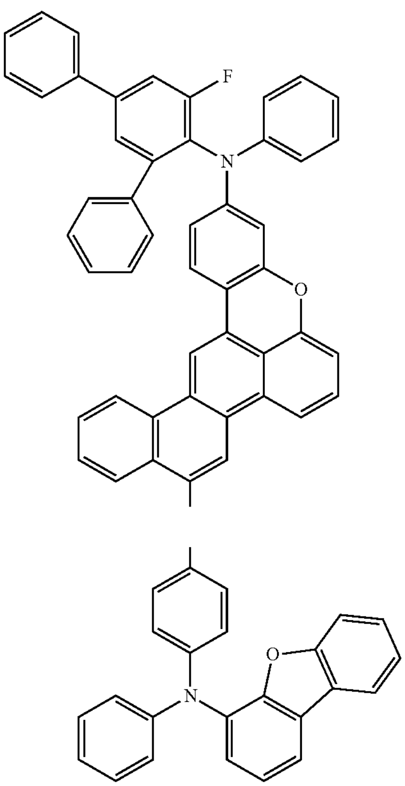
128
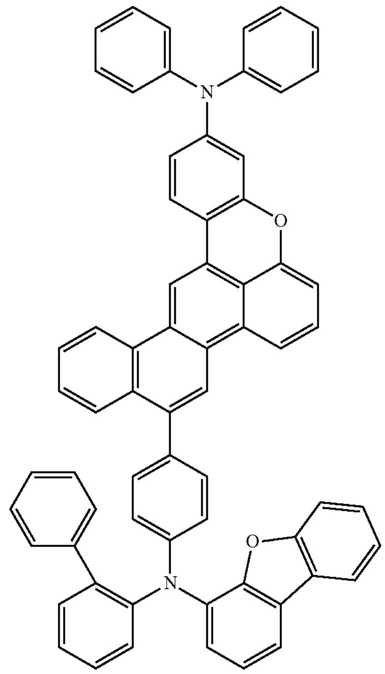
129
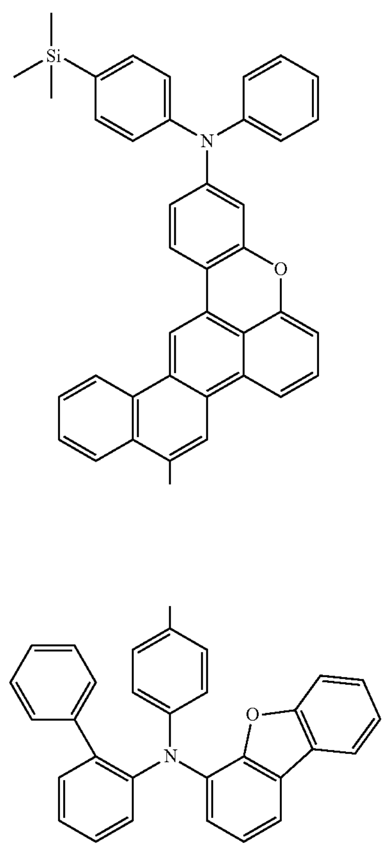

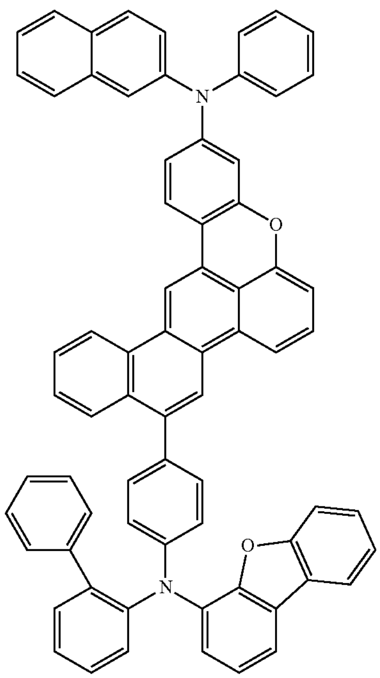
130
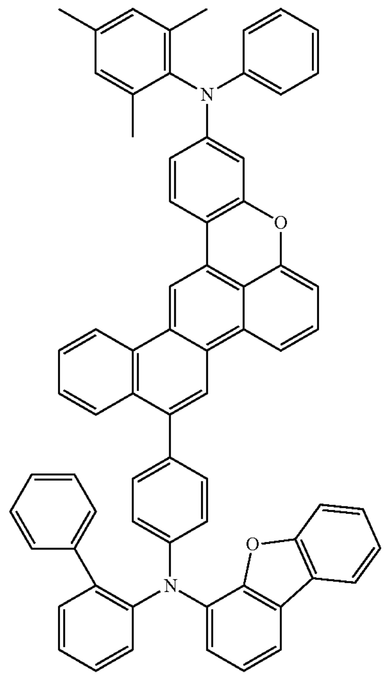
132
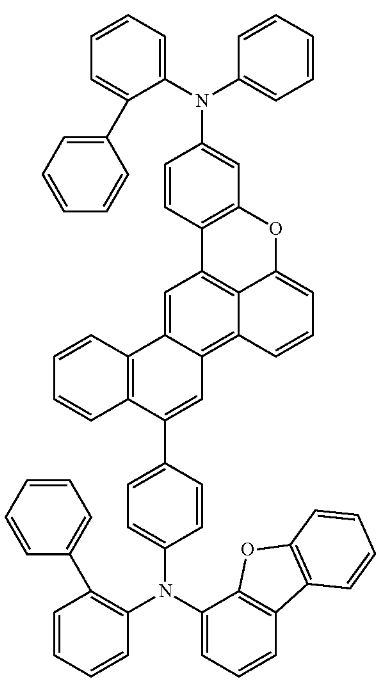
131
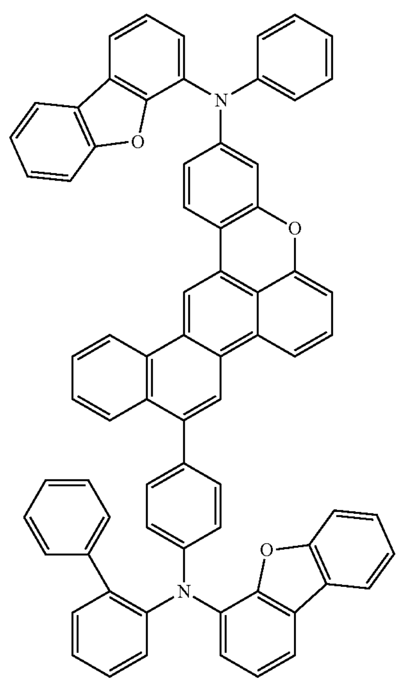
133

134
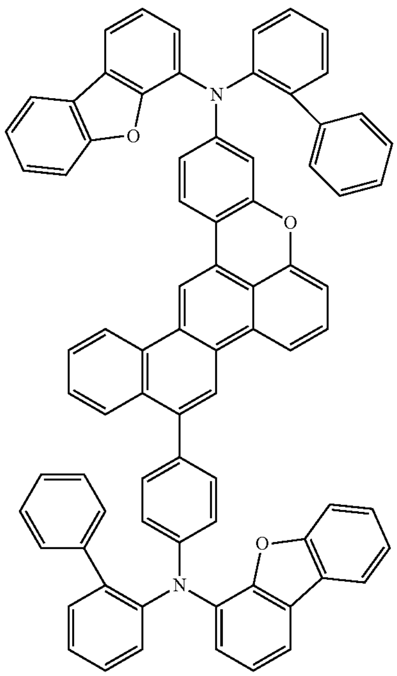
135
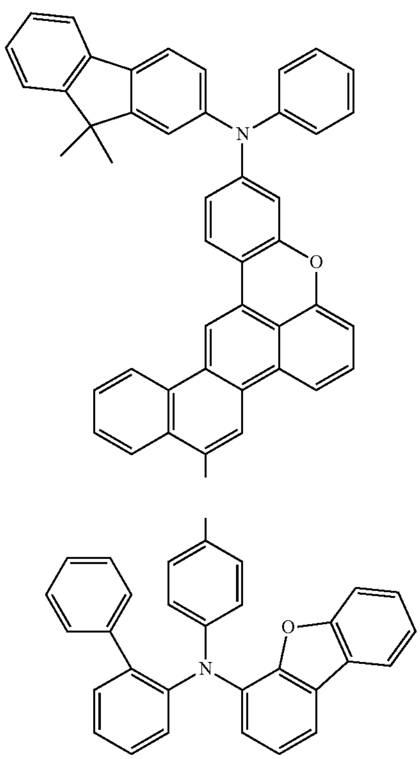
136
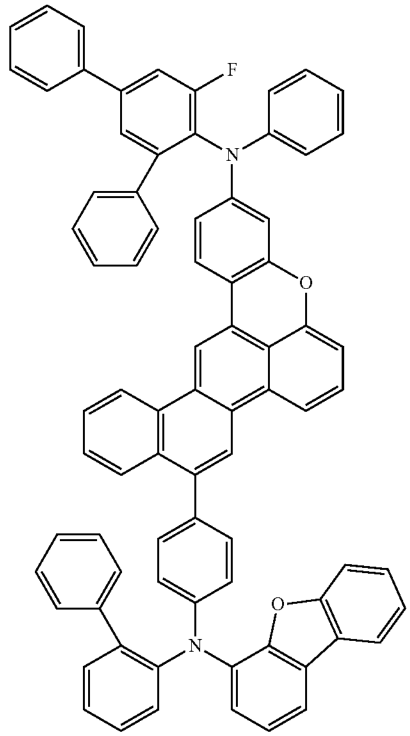
137
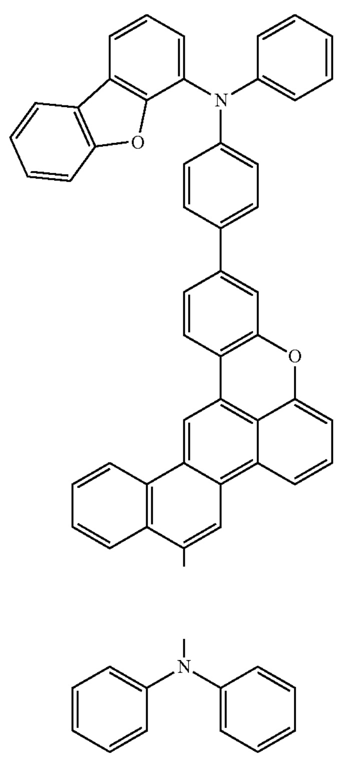

138
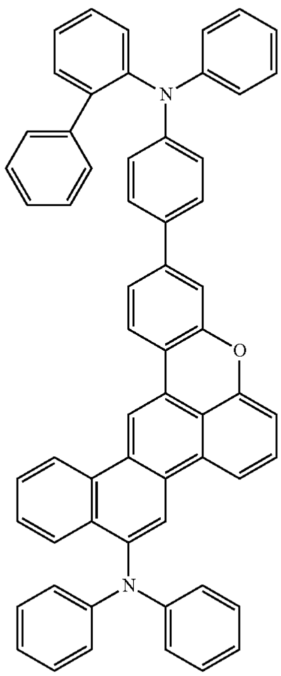
139
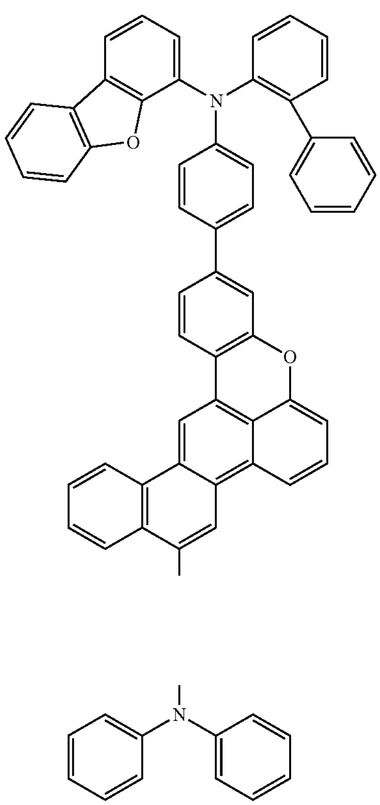
140
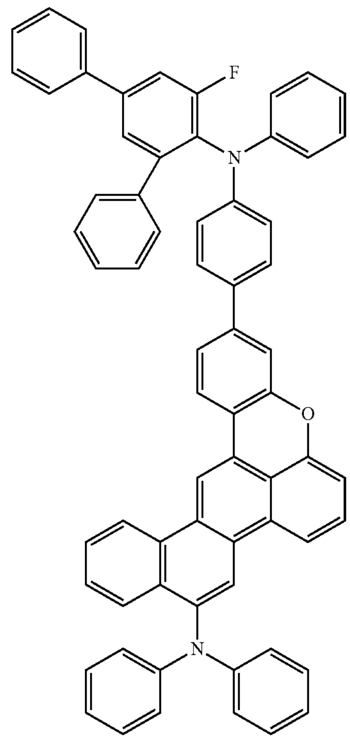
141
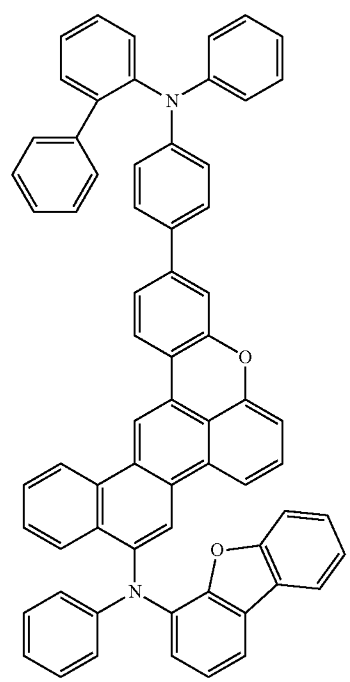

-continued
142
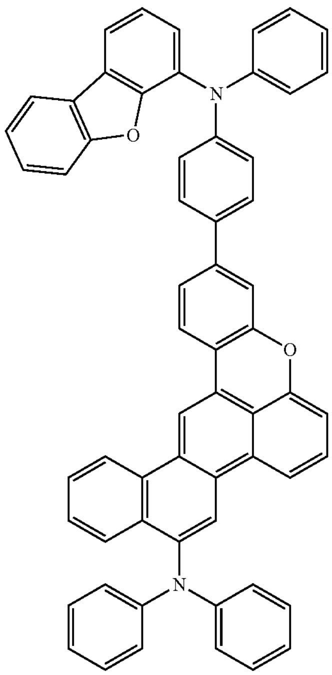
143
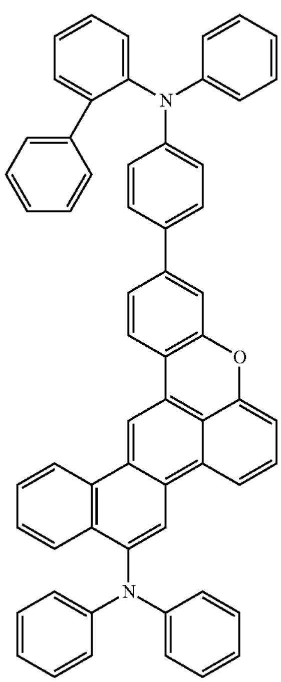
-continued
144
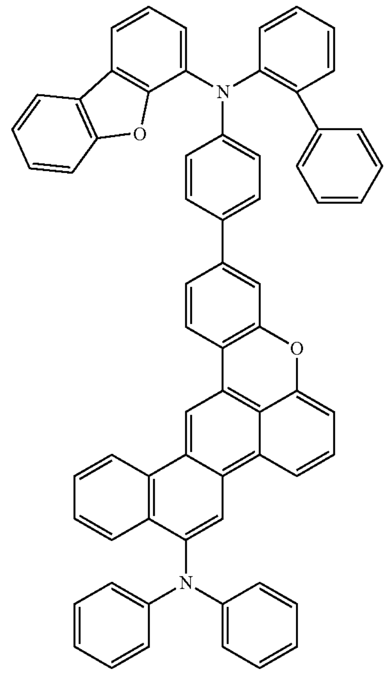
145
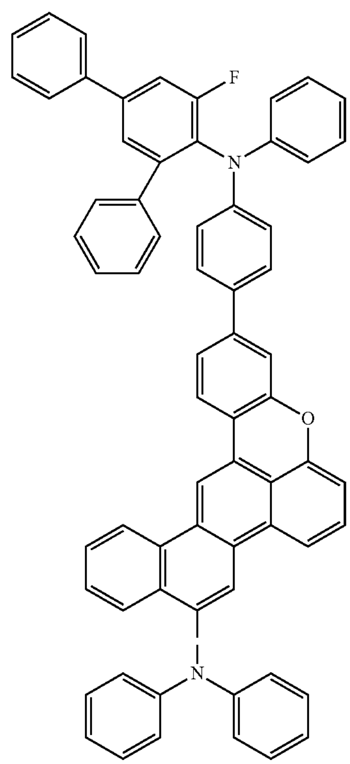

-continued
146
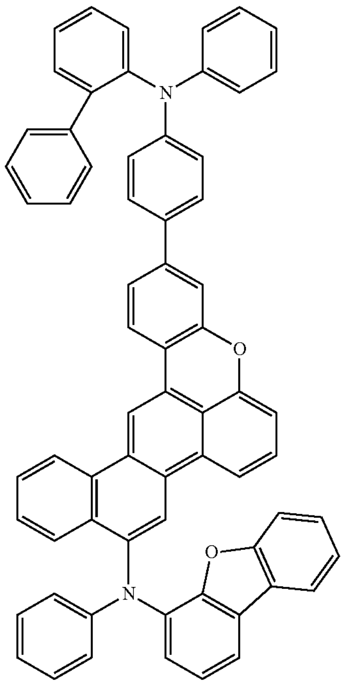
148
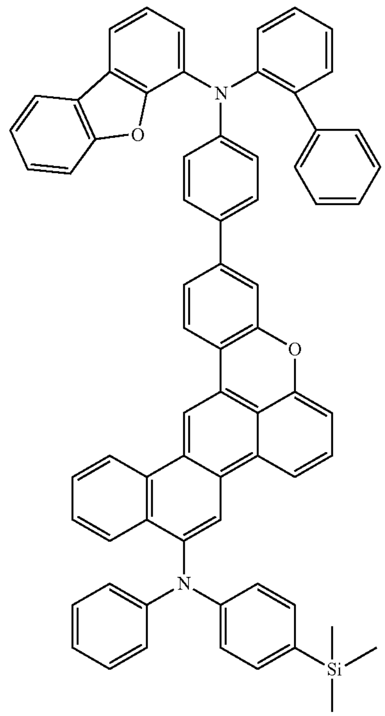
147
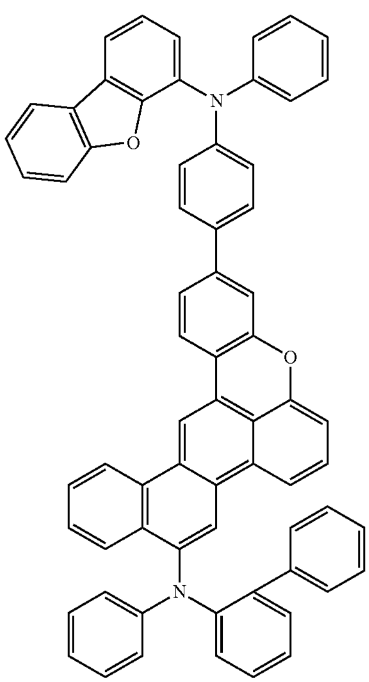
149
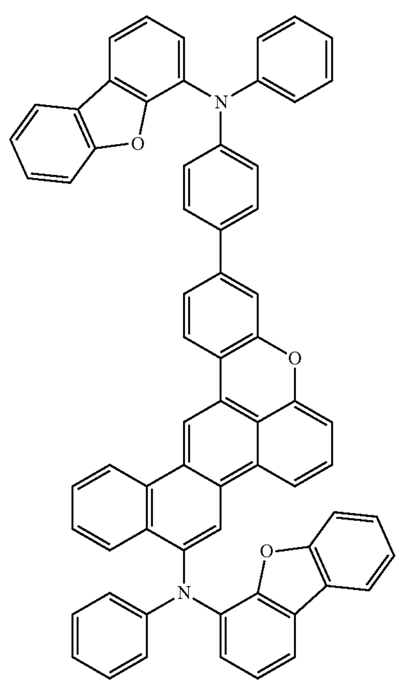

-continued
150
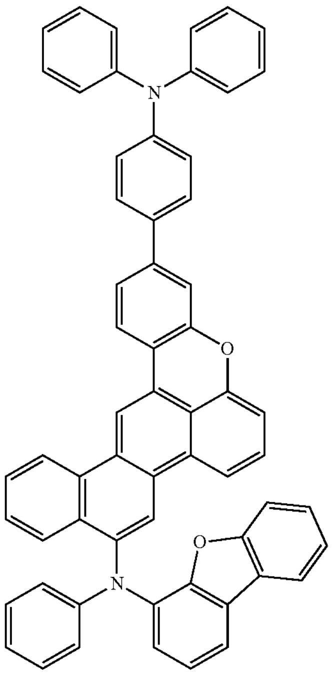
151
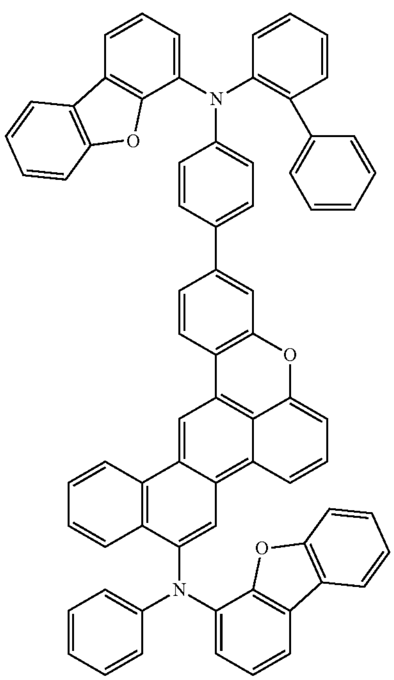
-continued
152
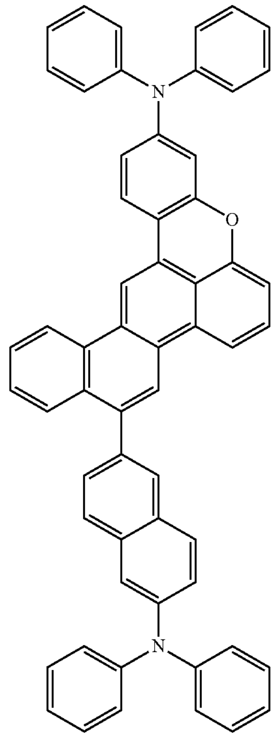
153
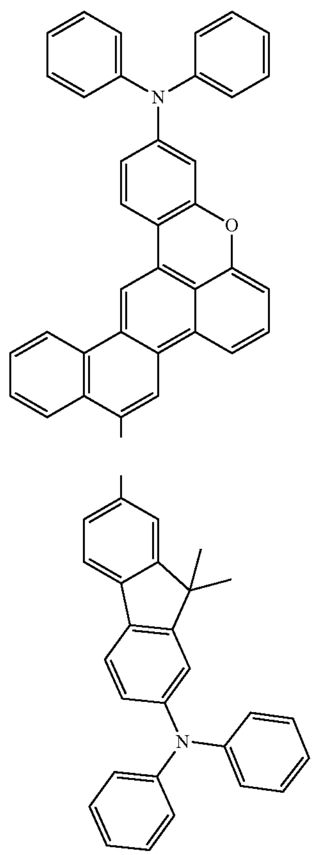

-continued
154
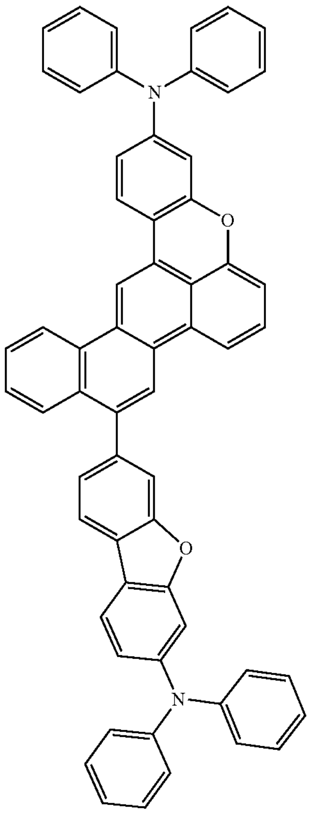
155
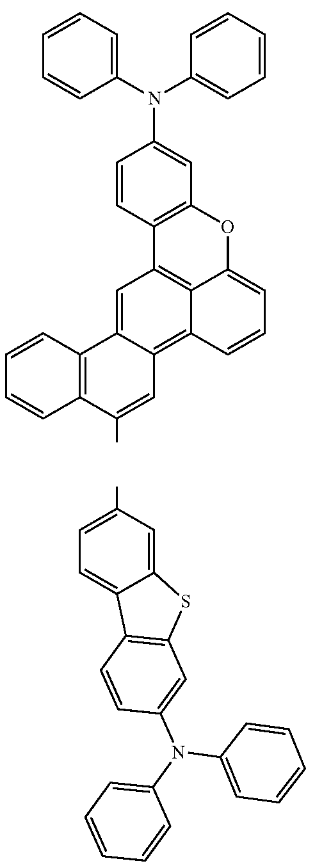
-continued
156
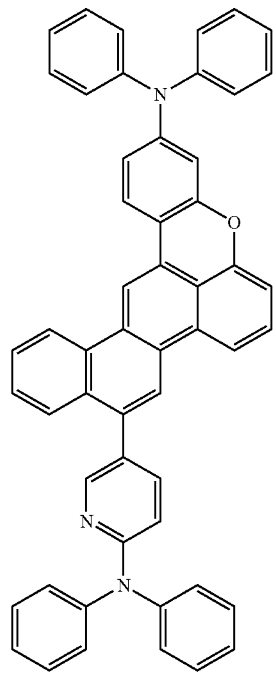
157
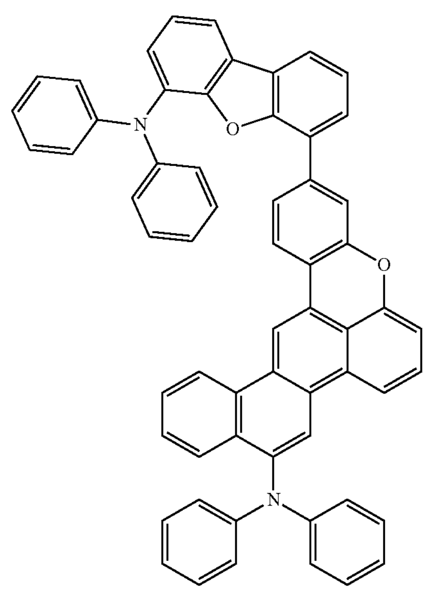

-continued
158
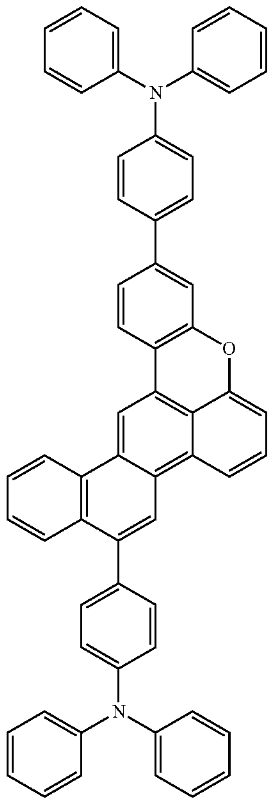
159
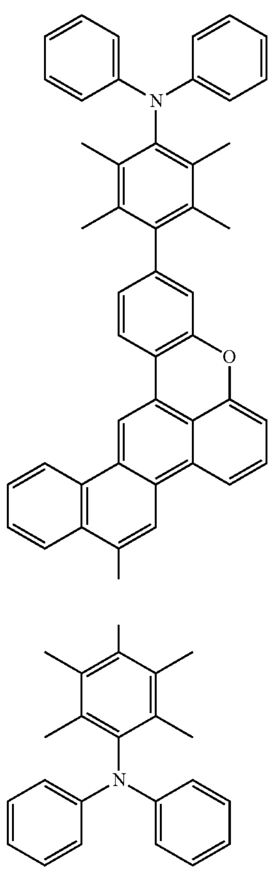
-continued
160
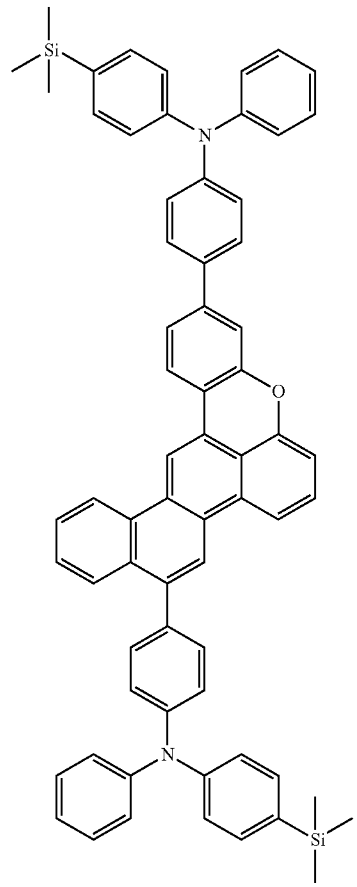
161
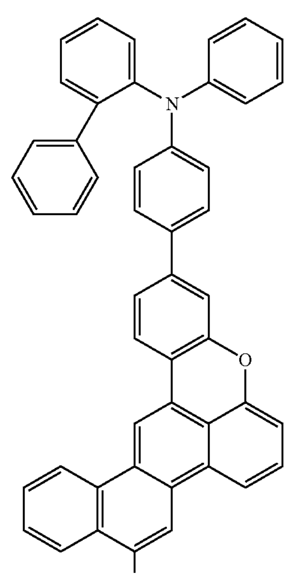

-continued

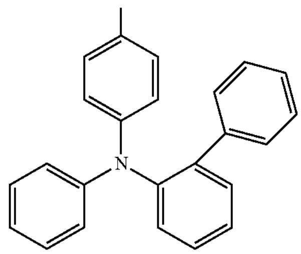

162

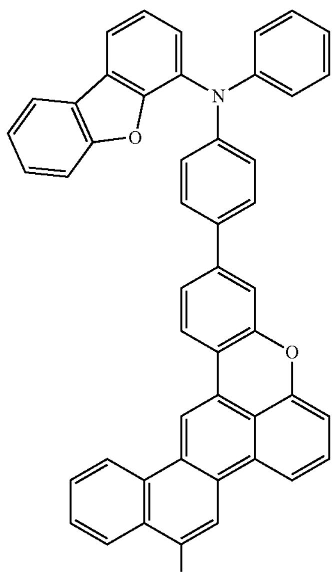

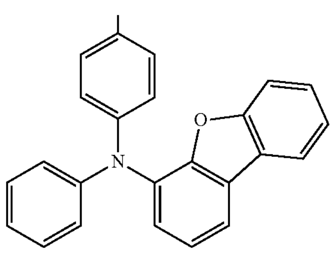

12. An organic light-emitting device comprising:

a first electrode;

a second electrode; and an organic layer between the first electrode and the second electrode, the organic layer comprising an emission layer and at least one of the amine-based compounds of claim 1.

13. The organic light-emitting device of claim 12, wherein the emission layer further comprises a host, and wherein the amine-based compound is a dopant.

14. The organic light-emitting device of claim 13, wherein the host is an anthracene-based compound represented by Formula 2:

Formula 2

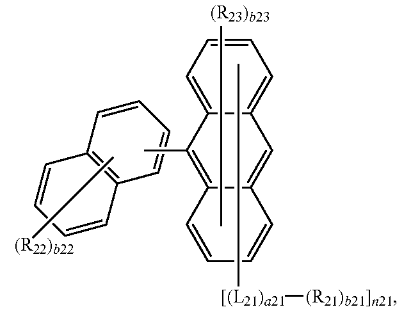

wherein, in Formula 2, $L_{21}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a21 is selected from 0, 1, 2, and 3;

$R_{21}$ to $R_{23}$ are each independently selected from a hydrogen, a deuterium, F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

b21 to b23 are each independently selected from 1, 2, 3, 4, 5, and 6;

n21 is selected from 1, 2, and 3; and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_1$-$C_{60}$ alkoxy group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$), and —N($Q_{31}$)($Q_{32}$), —Si($Q_{33}$)($Q_{34}$)($Q_{35}$), and —B($Q_{36}$)($Q_{37}$); and $Q_1$ to $Q_7$, $Q_{11}$ to $Q_{17}$, $Q_{21}$ to $Q_{27}$, and $Q_{31}$ to $Q_{37}$ are each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

15. The organic light-emitting device of claim 14, wherein $L_{21}$ is selected from groups represented by Formulae 3-1 to 3-8 and Formulae 3-22 to 3-29:

3-1

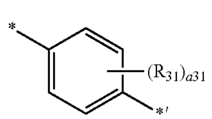

-continued 3-2

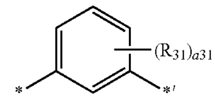

3-3

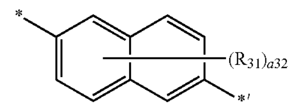

3-4

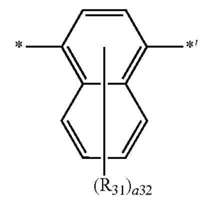

3-5

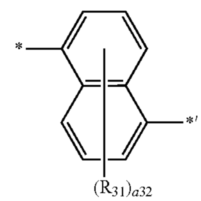

3-6

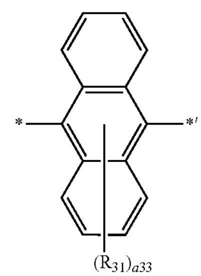

3-7

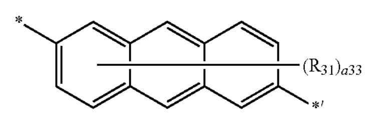

3-8

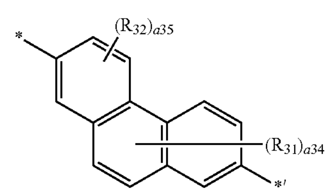

3-22

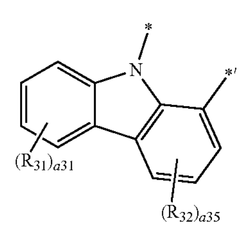

-continued 3-23

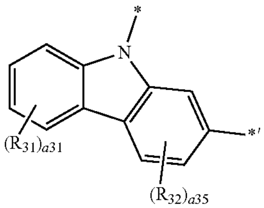

3-24

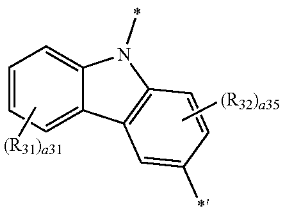

3-25

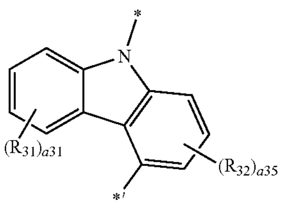

3-26

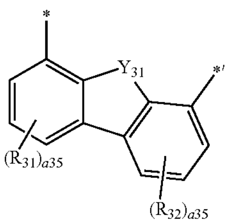

3-27

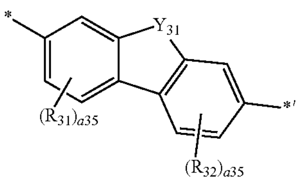

3-28

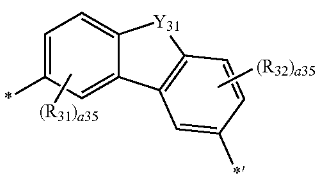

3-29

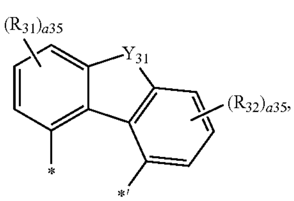

wherein, in Formulae 3-1 to 3-8, and Formulae 3-22 to 3-29, $Y_{31}$ is selected from $C(R_{33})(R_{34})$, $N(R_{33})$, O, S, and $Si(R_{33})(R_{34})$;

$R_{31}$ to $R_{34}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a31 is selected from 1, 2, 3, and 4;

a32 is selected from 1, 2, 3, 4, 5, and 6;

a33 is selected from 1, 2, 3, 4, 5, 6, 7, and 8;

a34 is selected from 1, 2, 3, 4, and 5;

a35 is selected from 1, 2, and 3; and

* and *' each independently indicate a binding site to an adjacent atom.

16. The organic light-emitting device of claim 14, wherein $R_{21}$ and $R_{22}$ are each independently selected from a hydrogen, a deuterium, —F, —Cl, —Br, —I, a cyano group, —N(Ph)$_2$, —Si(CH$_3$)$_3$, —Si(Ph)$_3$, and groups represented by Formulae 5-1 to 5-9 and Formula 5-33:

5-1

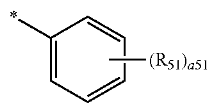

5-2

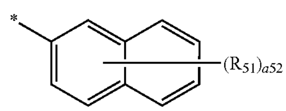

5-3

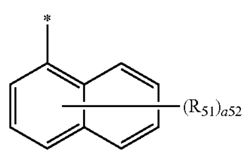

5-4

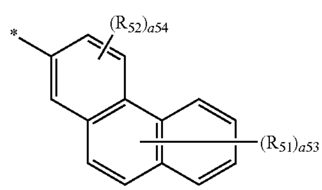

5-5

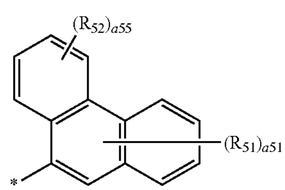

5-6

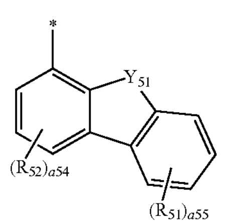

-continued 5-7

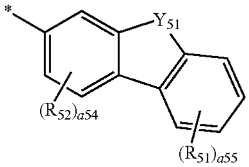

5-8

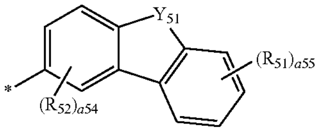

5-9

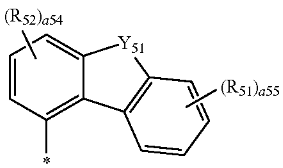

5-33

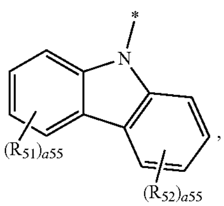

wherein, in Formulae 5-1 to 5-9, and Formula 5-33, $Y_{51}$ is selected from $C(R_{53})(R_{54})$, $N(R_{53})$, O, and S;

$R_{51}$ to $R_{54}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, —$CD_3$, —$CF_3$, $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ are each independently selected from a methyl group, an ethyl group, a ter-butyl group, a phenyl group, and a naphthyl group;

a51 is selected from 1, 2, 3, 4, and 5;

a52 is selected from 1, 2, 3, 4, 5, 6, and 7;

a53 is selected from 1, 2, 3, 4, 5, and 6;

a54 is selected from 1, 2, and 3;

a55 is selected from 1, 2, 3, and 4; and

* indicates a binding site to an adjacent atom.

17. The organic light-emitting device of claim 14, wherein $R_{23}$ is selected from a hydrogen, a methyl group, an ethyl group, a tert-butyl group, a methoxy group, an ethoxy, group, a ter-butoxy group, —$Si(CH_3)_3$, a phenyl group, and a naphthyl group.

18. The organic light-emitting device of claim 14, wherein n21 is 1.

19. The organic light-emitting device of claim 14, wherein the anthracene-based compound is represented by any one of Formulae 2-1 and 2-2:

Formula 2-1

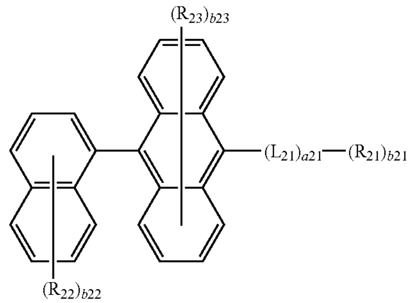

Formula 2-2

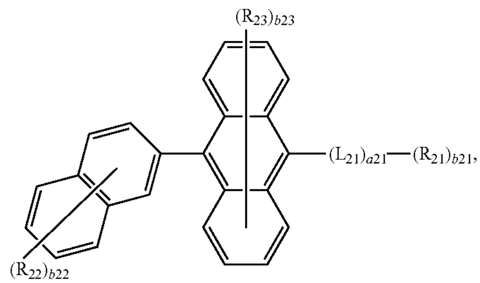

wherein, in Formulae 2-1 and 2-2, $L_{21}$, a21, $R_{21}$ to $R_{23}$, and b21 to b23 are as defined in Formula 2.

20. The organic light-emitting device of claim 14, wherein the anthracene-based compound is any one selected from Compounds H101 to H188 and Compounds H201 to H218:

H101

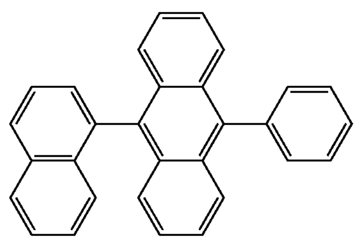

H102

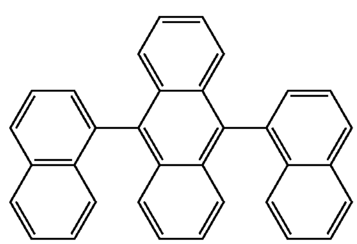

H103

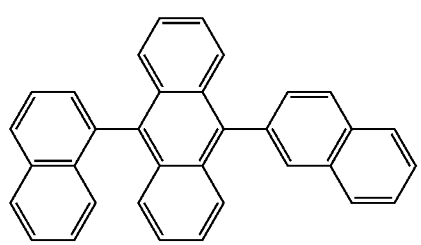

-continued
H104
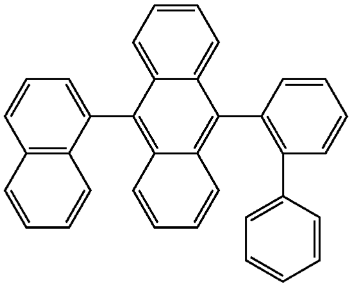
H105
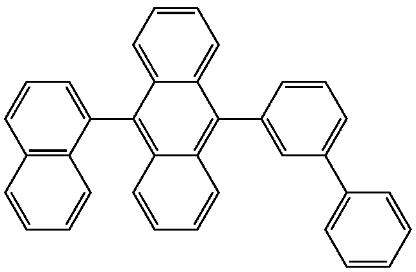
H106
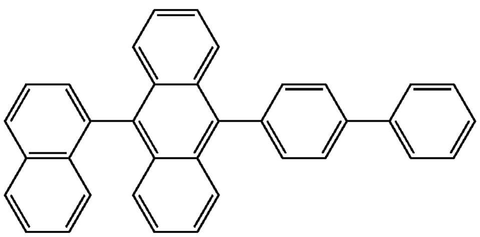
H107
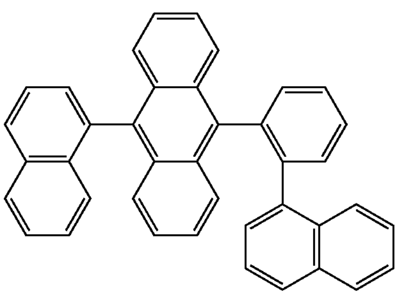
H108
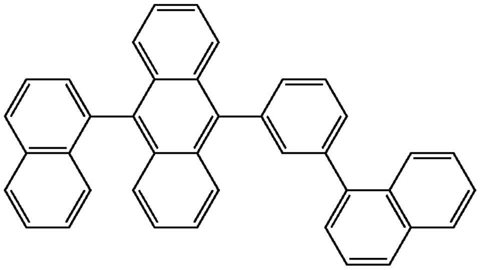
-continued
H109
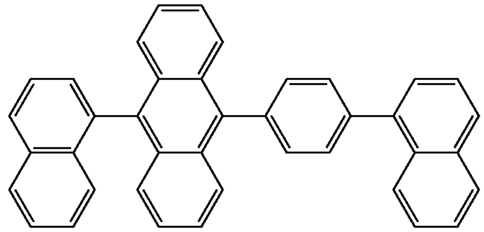
H110
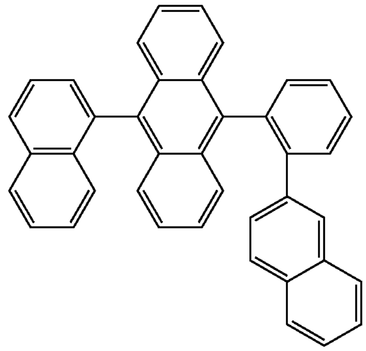
H111
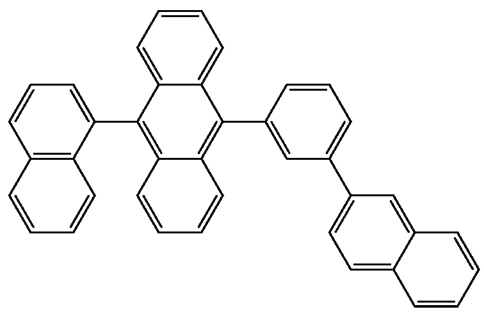
H112
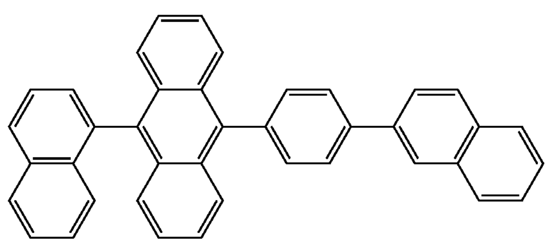
H113
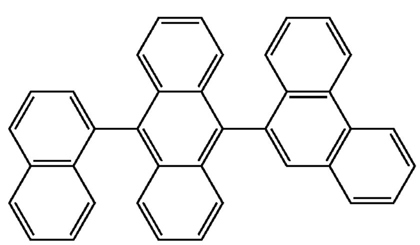

-continued
H114
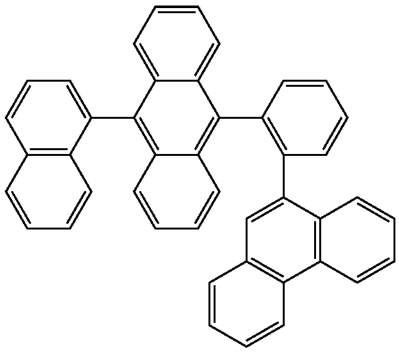
H115
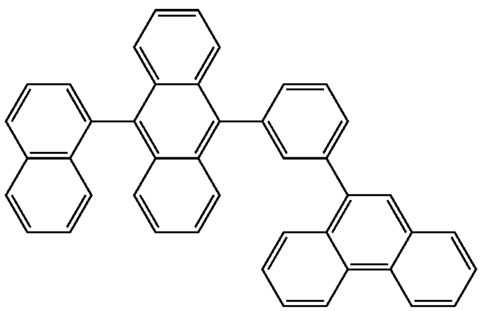
H116
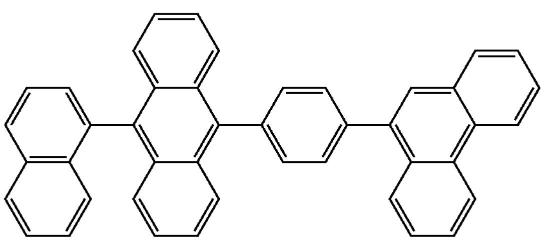
H117
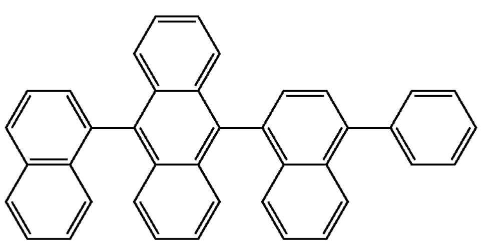
H118
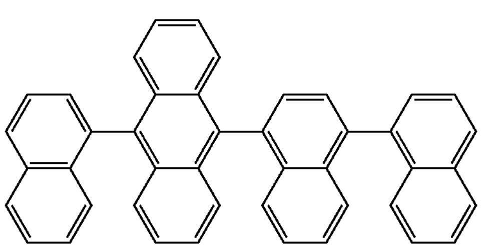
-continued
H119
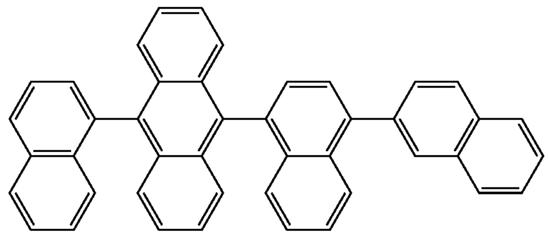
H120
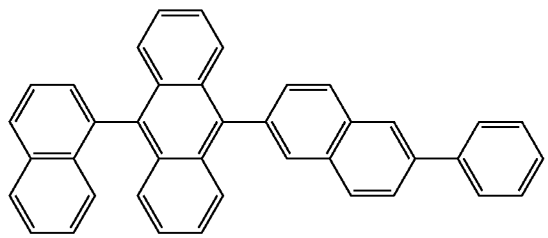
H121
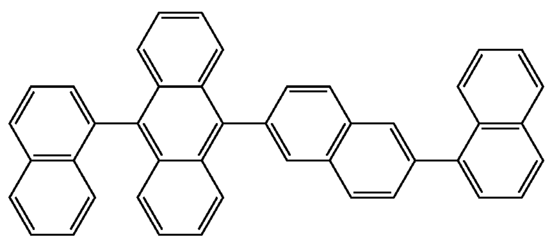
H122
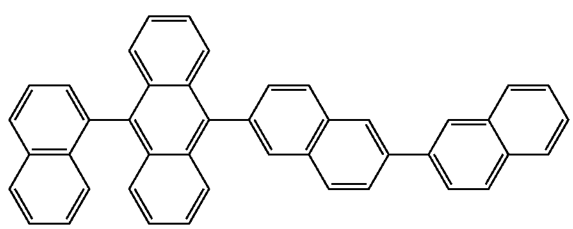
H123
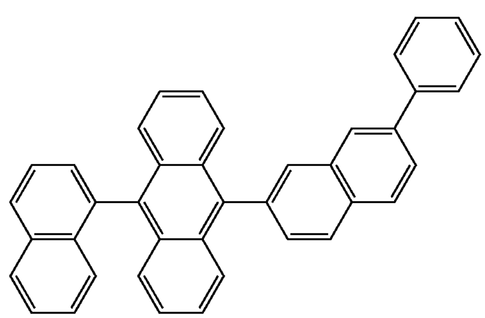

H124
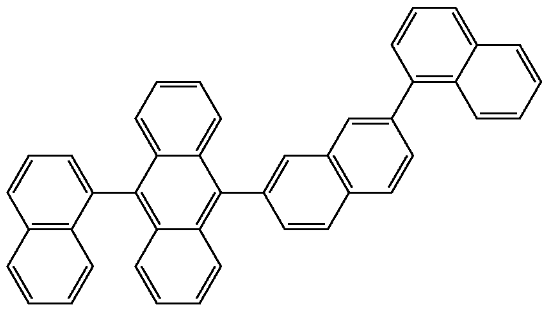
H125
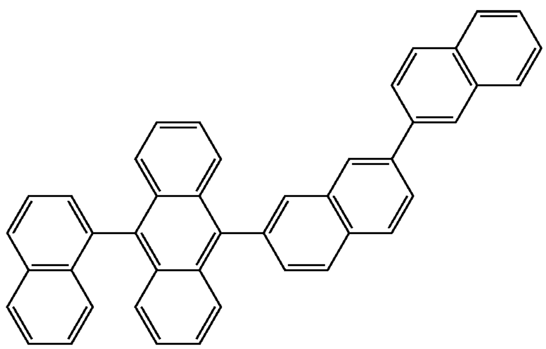
H126
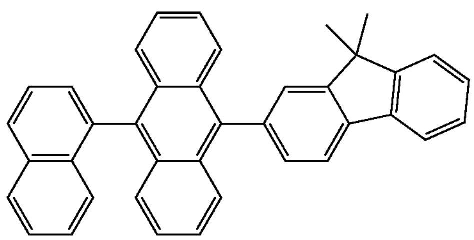
H127
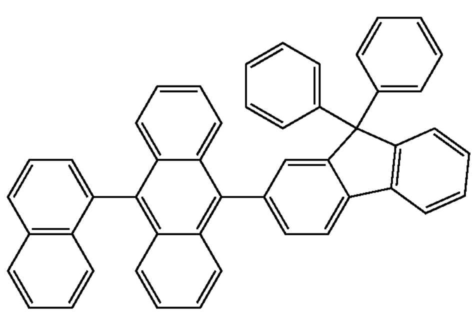
H128
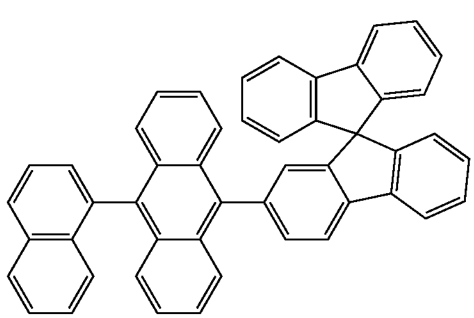
H129
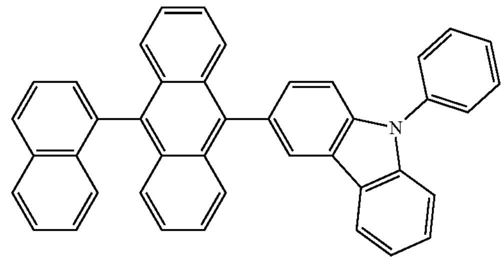
H130
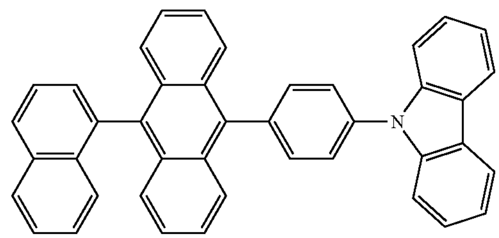
H131
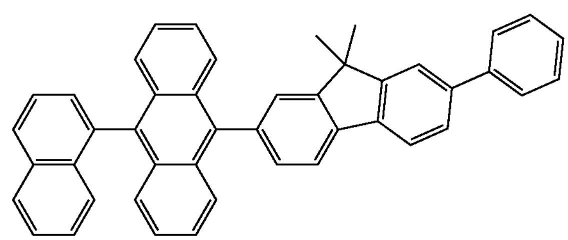
H132
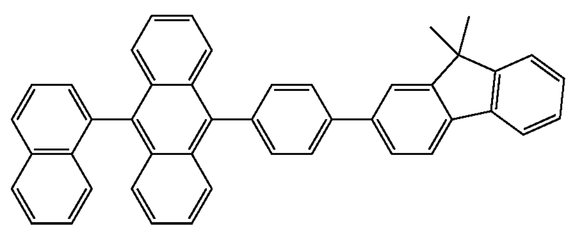
H133
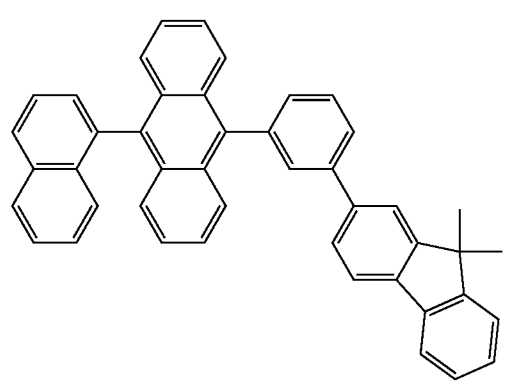

-continued
H134
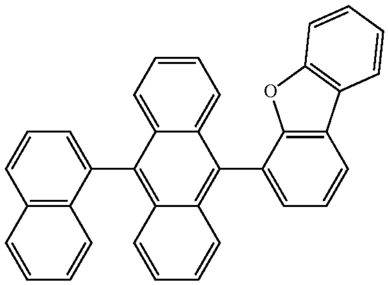
H135
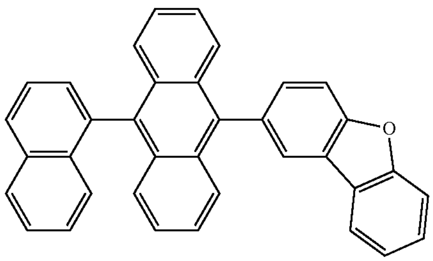
H136
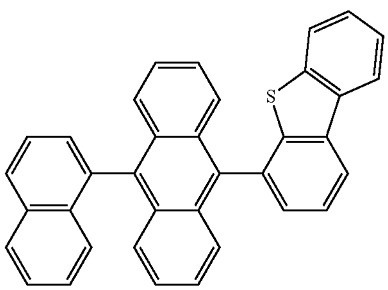
H137
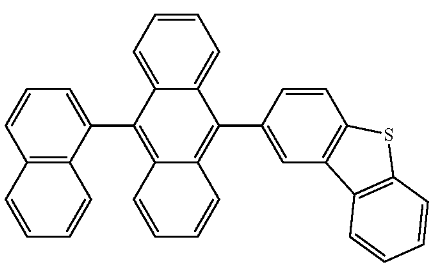
H138
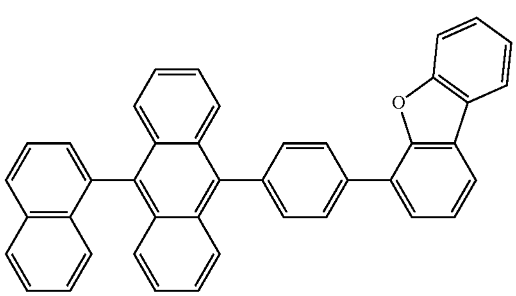
-continued
H139
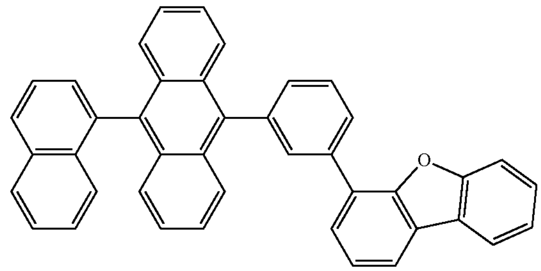
H140
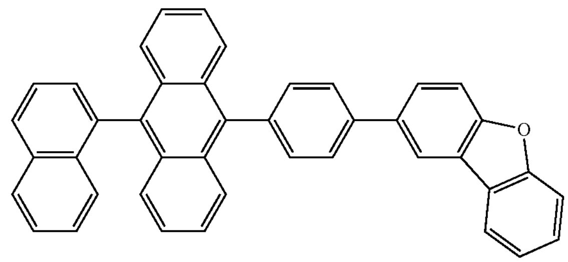
H141
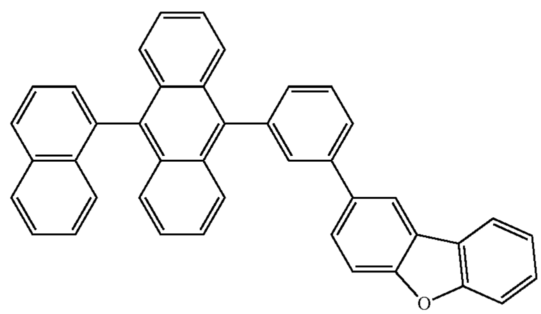
H142
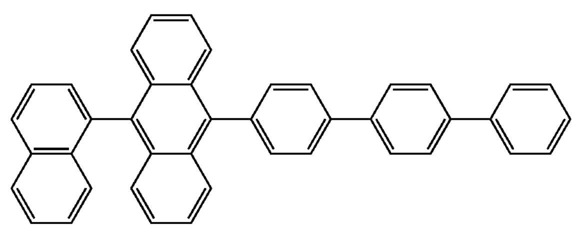
H143
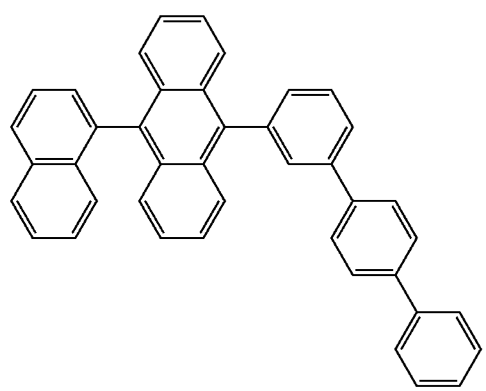

-continued
H144
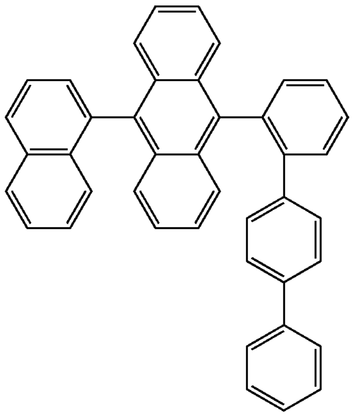
H145
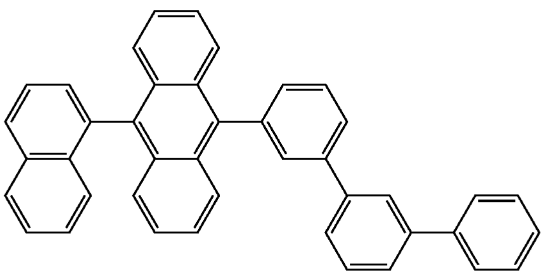
H146
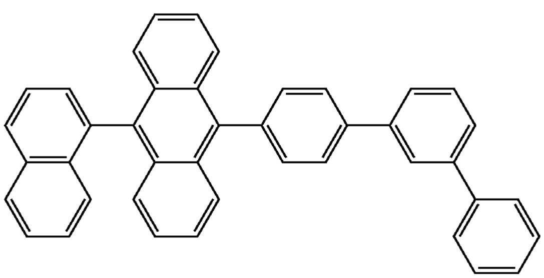
H147
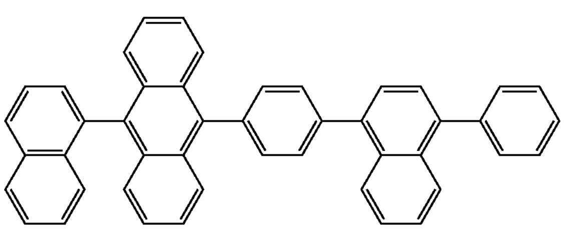
H148
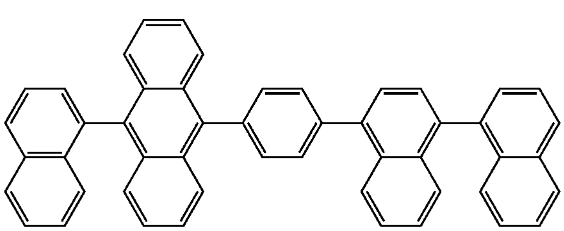
-continued
H149
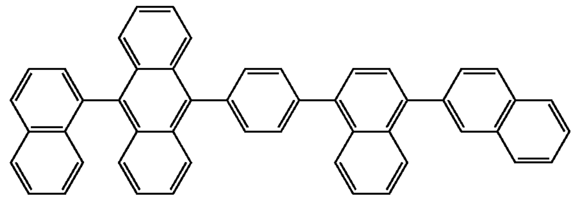
H150
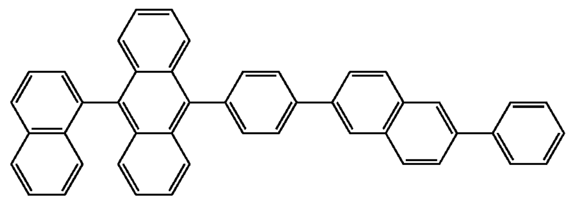
H151
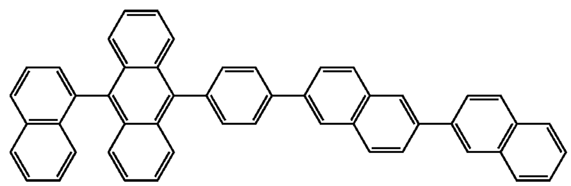
H152
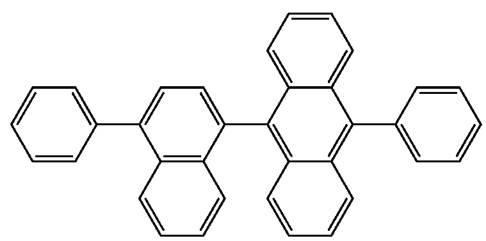
H153
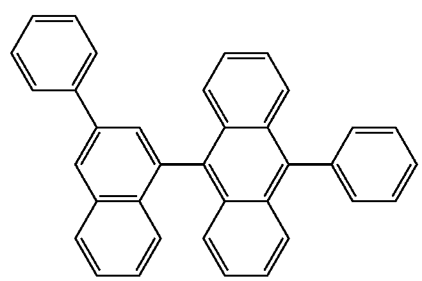
H154
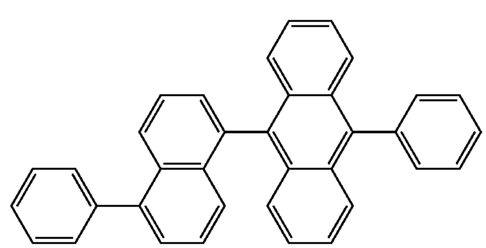

-continued
H155
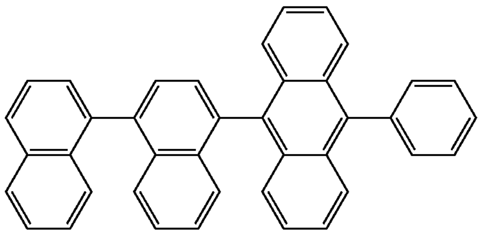
H156
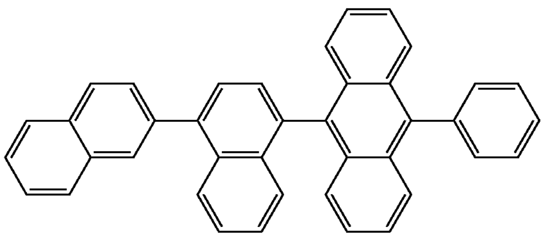
H157
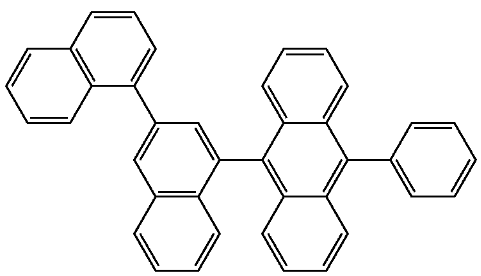
H158
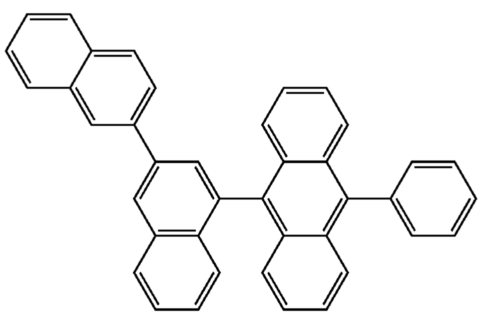
H159
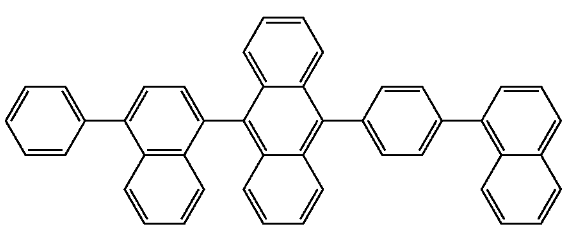
H160
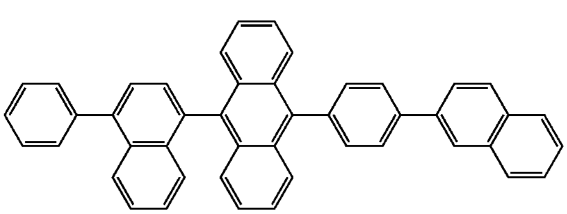
-continued
H161
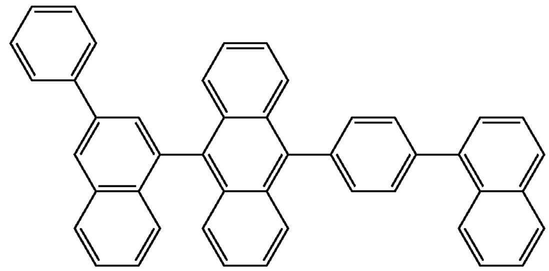
H162
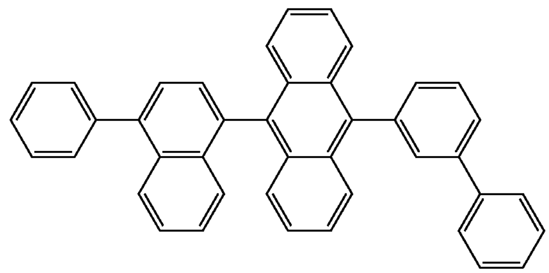
H163
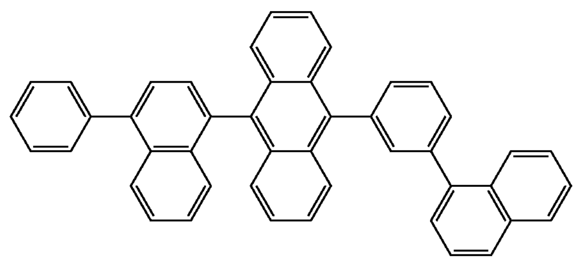
H164
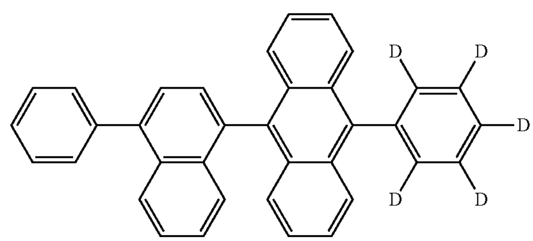
H165
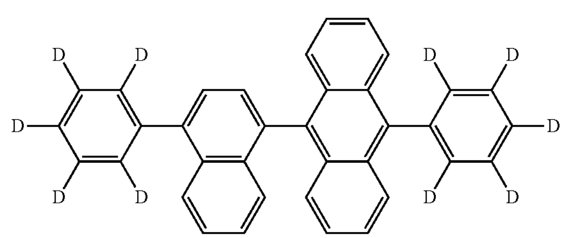
H166
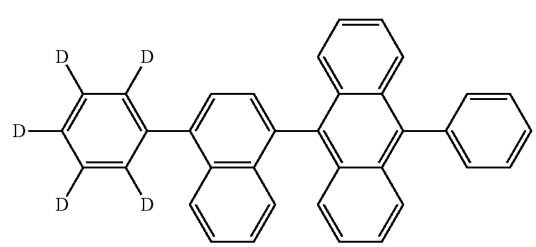

-continued
H167
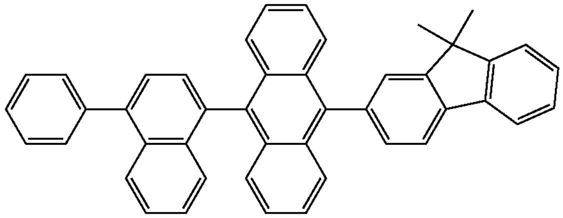
H168
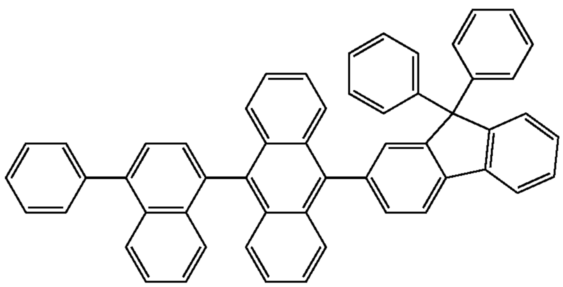
H169
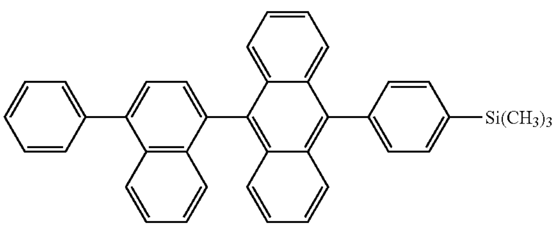
H170
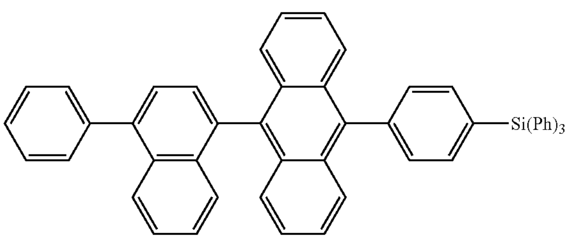
H171
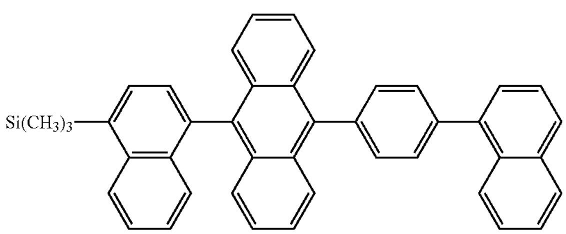
H172
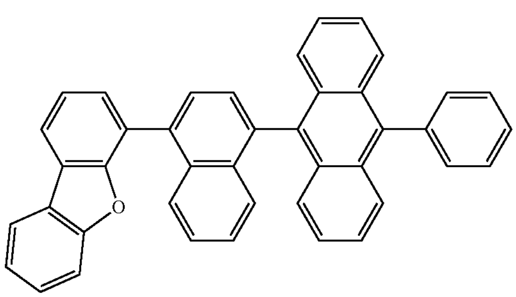
-continued
H173
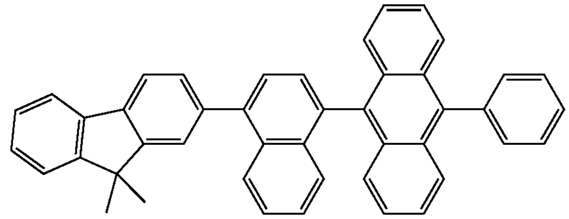
H174
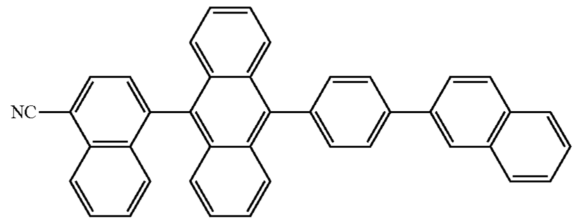
H175
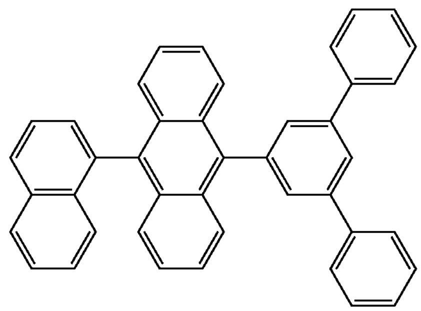
H176
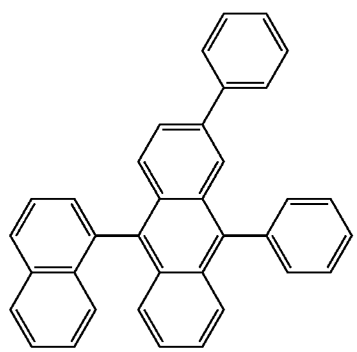
H177
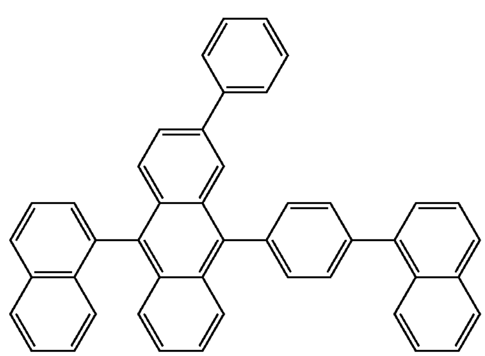

-continued
H178
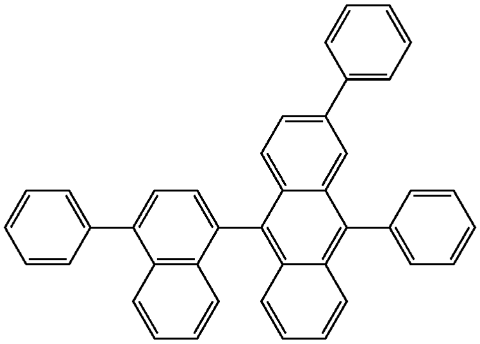
H179
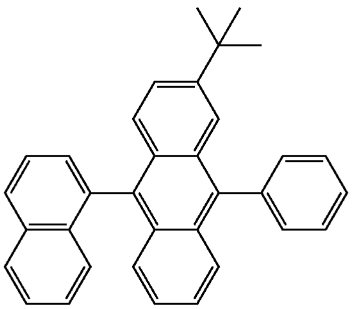
H180
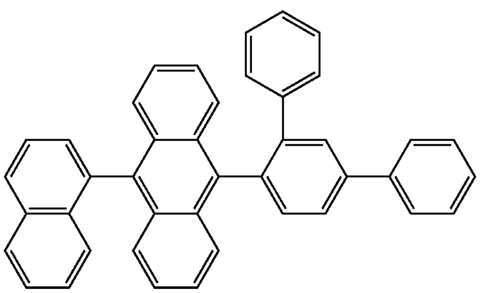
H181
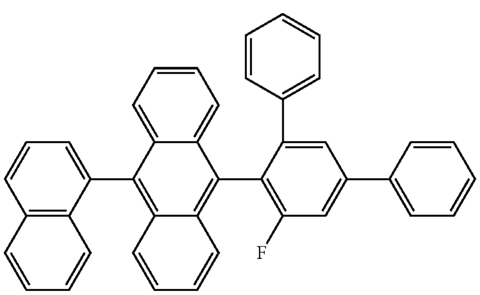
H182
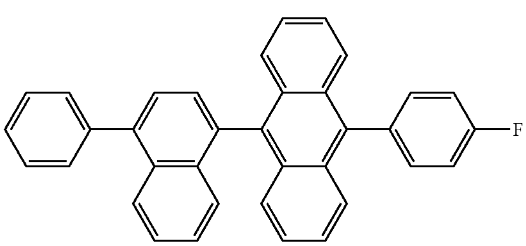
-continued
H183
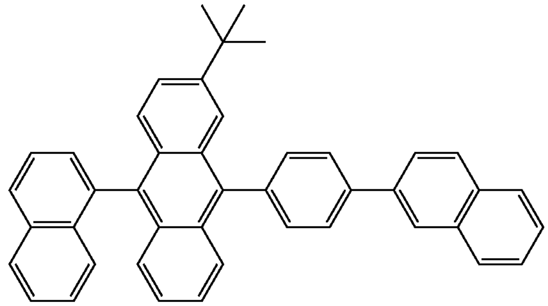
H184
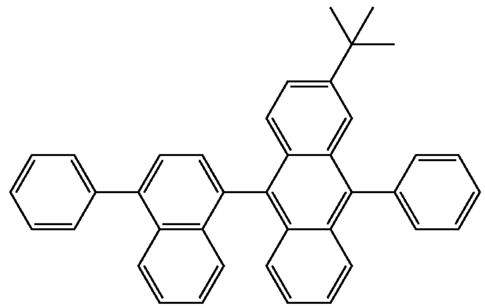
H185
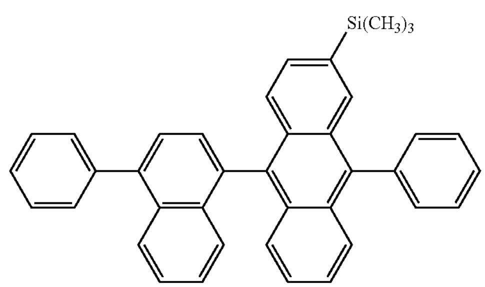
H186
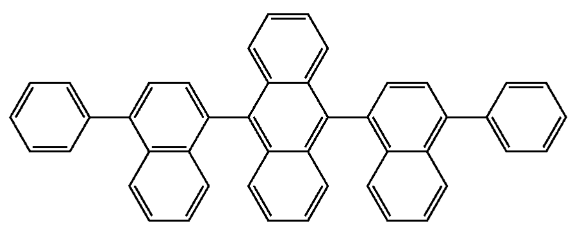
H187
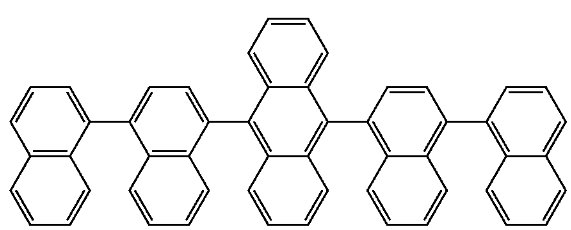

H188
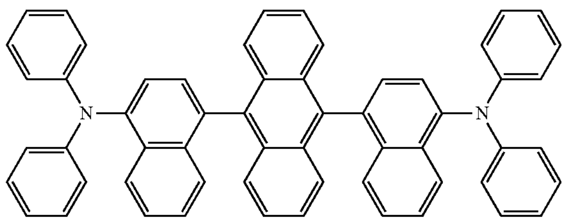
H201
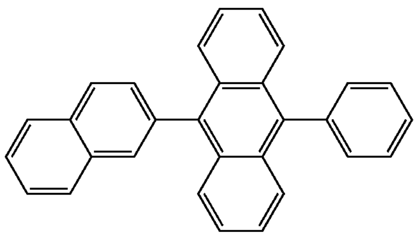
H202
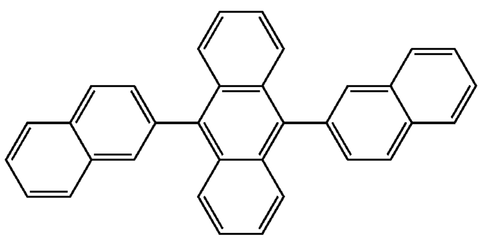
H203
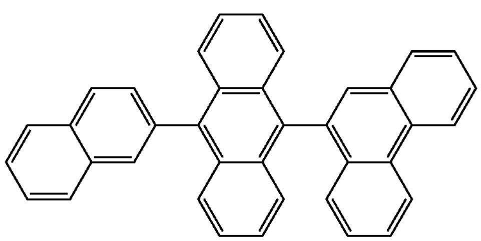
H204
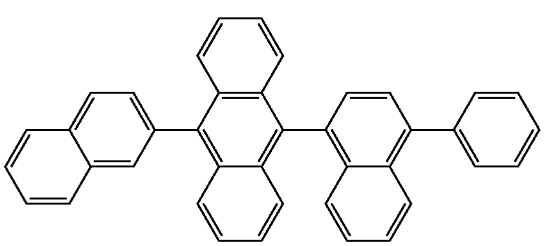
H205
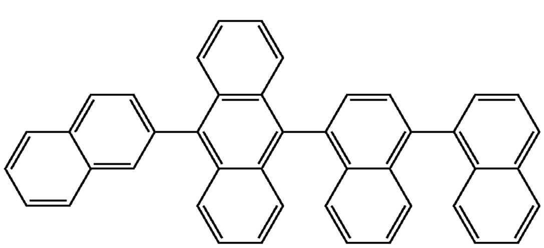
H206
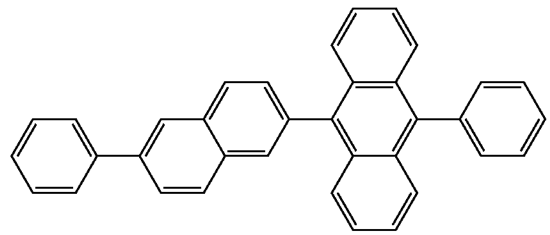
H207
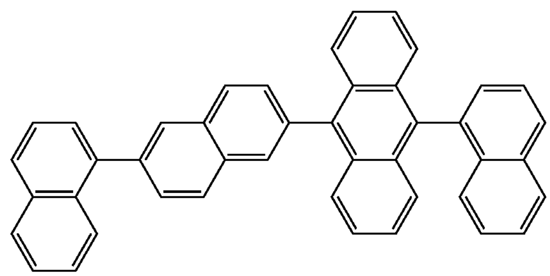
H208
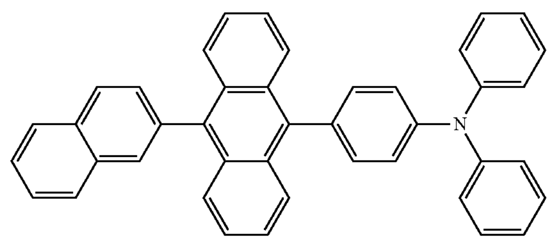
H209
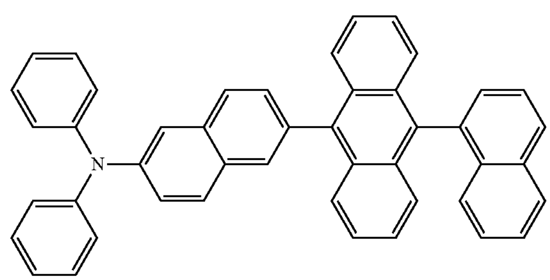
H210
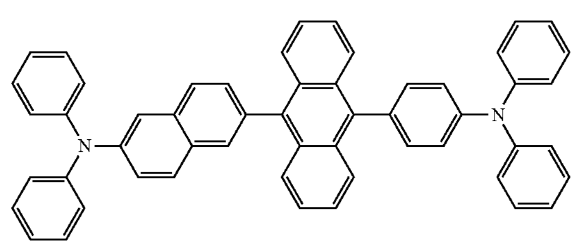

-continued
H211
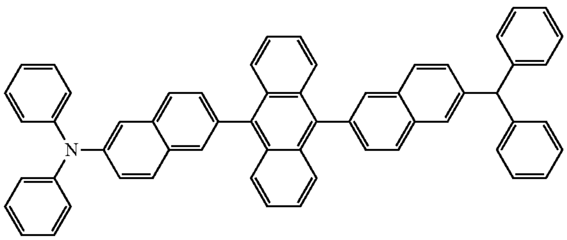
H212
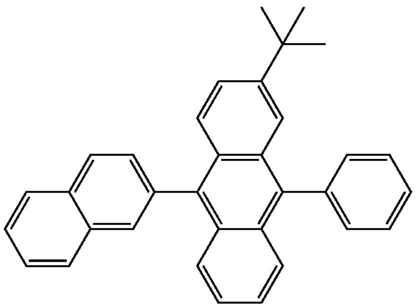
H213
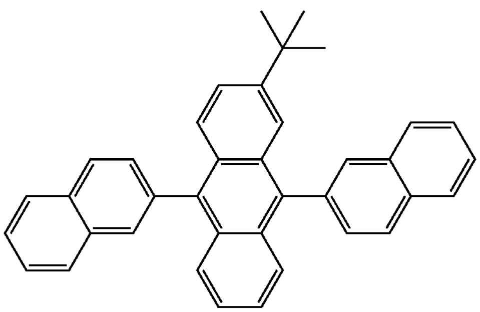
H214
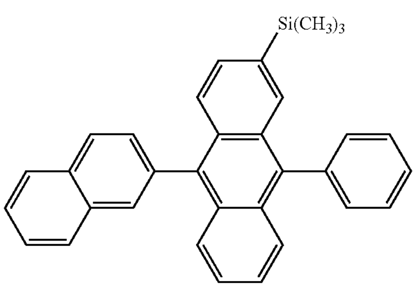
-continued
H215
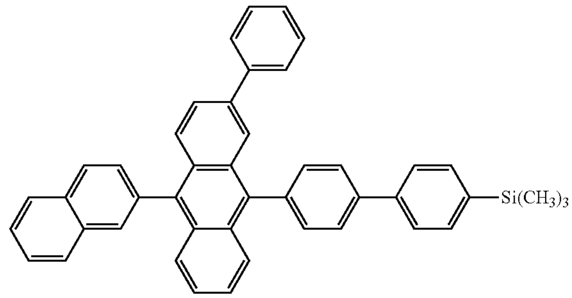
H216
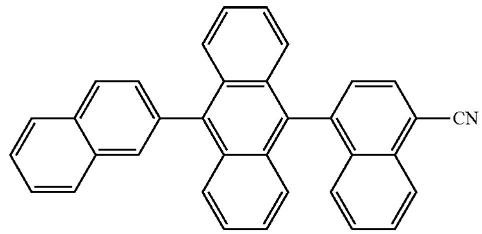
H217
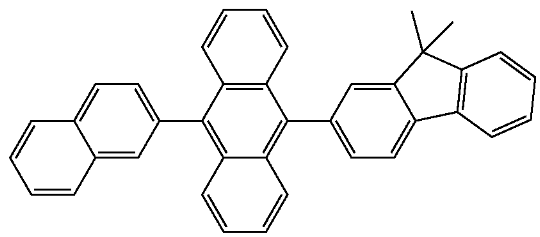
H218
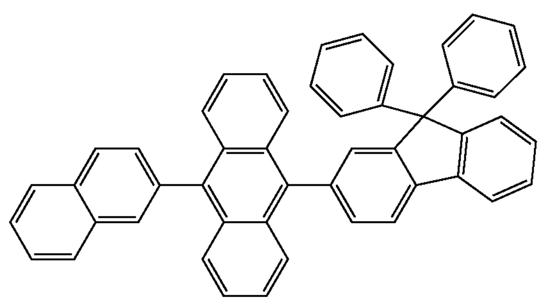
* * * * *